United States Patent
Park et al.

(10) Patent No.: US 10,559,758 B2
(45) Date of Patent: Feb. 11, 2020

(54) ORGANIC LIGHT EMITTING DIODE OF HIGH EFFICIENCY

(71) Applicant: SFC CO., LTD., Cheongju-si (KR)

(72) Inventors: Young-Hwan Park, Cheongju-si (KR); So Young Shim, Daejeon (KR); Seo-Yeon Yoon, Seongnam-si (KR); Chang-Hee Lee, Cheongju-si (KR)

(73) Assignee: SFC CO., LTD., Cheongju-si (KR)

( * ) Notice: Subject to any disclaimer, the term of this patent is extended or adjusted under 35 U.S.C. 154(b) by 231 days.

(21) Appl. No.: 15/739,276

(22) PCT Filed: Jul. 8, 2016

(86) PCT No.: PCT/KR2016/007430
§ 371 (c)(1),
(2) Date: Dec. 22, 2017

(87) PCT Pub. No.: WO2017/010749
PCT Pub. Date: Jan. 19, 2017

(65) Prior Publication Data
US 2018/0182971 A1    Jun. 28, 2018

(30) Foreign Application Priority Data
Jul. 13, 2015    (KR) .................. 10-2015-0099265

(51) Int. Cl.
*H01L 51/52*    (2006.01)
*H01L 51/00*    (2006.01)
(Continued)

(52) U.S. Cl.
CPC .......... *H01L 51/0058* (2013.01); *C09K 11/06* (2013.01); *H01L 51/0073* (2013.01);
(Continued)

(58) Field of Classification Search
None
See application file for complete search history.

(56) References Cited

U.S. PATENT DOCUMENTS

2010/0045170 A1*   2/2010   Lee ................... C07C 13/547
                                                              313/504
2012/0056165 A1*   3/2012   Kawamura ............ C09K 11/06
                                                                257/40

(Continued)

FOREIGN PATENT DOCUMENTS

KR   1020060022676 A   3/2006
KR   1020120092555 A   8/2012

OTHER PUBLICATIONS

International Search Report of PCT/KR2016/007430, English translation, Nov. 4, 2016.

*Primary Examiner* — Robert S Loewe
(74) *Attorney, Agent, or Firm* — STIP Law Group, LLC

(57) ABSTRACT

Disclosed herein is an organic light-emitting diode, comprising: a first electrode; a second electrode facing the first electrode; and a light-emitting layer and an electron density control layer in that order between the first electrode and the second electrode, wherein the electron density control layer includes at least one selected from among compounds represented by the following Chemical Formulas A to D, and the light emitting layer includes at least one anthracene compound represented by the following Chemical Formula H. The structures of Chemical Formulas A to D and H are as described in the specification.

12 Claims, 5 Drawing Sheets

(51) Int. Cl.
*C09K 11/06* (2006.01)
*H01L 51/50* (2006.01)
(52) U.S. Cl.
CPC .......... *H01L 51/52* (2013.01); *H01L 51/5004* (2013.01); *H01L 51/5012* (2013.01); *H01L 51/5068* (2013.01); *H01L 51/5072* (2013.01); *H01L 51/5084* (2013.01); *H01L 51/5088* (2013.01); *H01L 51/5092* (2013.01); *H01L 2251/5338* (2013.01); *H01L 2251/5361* (2013.01); *H01L 2251/552* (2013.01)

(56) References Cited

U.S. PATENT DOCUMENTS

| | | | |
|---|---|---|---|
| 2013/0207082 A1* | 8/2013 | Cho | H01L 51/5016 257/40 |
| 2014/0061622 A1* | 3/2014 | Ikeda | H01L 51/0073 257/40 |
| 2014/0191206 A1* | 7/2014 | Cho | C09K 11/06 257/40 |
| 2015/0333266 A1* | 11/2015 | Ito | H01L 51/0052 257/40 |
| 2018/0123055 A1* | 5/2018 | Park | C07D 307/91 |

* cited by examiner

ORGANIC LIGHT EMITTING DIODE OF HIGH EFFICIENCY

CROSS-REFERENCE TO RELATED APPLICATIONS

This application is the U.S. National Phase under 35 U.S.C. § 371 of International Application No. PCT/KR2016/007430 filed on Jul. 8, 2016, which in turn claims the benefit of Korean Application No. 10-2015-0099265, filed on Jul. 13, 2015, the disclosures of which are incorporated by reference into the present application.

TECHNICAL FIELD

The present disclosure relates to an organic light-emitting diode. More particularly, the present disclosure relates to an organic light-emitting diode which has a compound of specific structure used therein and an electron density control layer introduced therein, the electron density control layer having a specific structure for increasing of the organic light-emitting diode, whereby the organic light-emitting diode can be of high luminance efficiency and can effectively operate at a low voltage.

BACKGROUND ART

Organic light-emitting diodes, based on self-luminescence, exhibit the advantages of having a wide viewing angle, excellent contrast, fast response time, high brightness, excellent driving voltage and response rate characteristics, and of allowing for a polychromic display.

A typical organic light-emitting diode includes a positive electrode (anode) and a negative electrode (cathode), facing each other, with an organic emission layer disposed therebetween.

As to the general structure of the organic light-emitting diode, a hole transport layer, a light-emitting layer, an electron transport layer, and a cathode are formed in that order on an anode. Here, all of the hole transport layer, the light-emitting layer, and the electron transport layer are organic films comprising organic compounds.

An organic light-emitting diode having such a structure operates as follows: when a voltage is applied between the anode and the cathode, the anode injects holes which are then transferred to the light-emitting layer via the hole transport layer while electrons injected from the cathode move to the light-emitting layer via the electron transport layer. In the luminescent zone, the carriers such as holes and electrons recombine to produce an exciton. When the exciton returns to the ground state from the excited state, the molecule of the light-emitting layer emits light.

Materials used as the organic layers in organic light-emitting diodes may be divided according to functions into luminescent materials and charge carrier materials, for example, a hole injection material, a hole transport material, an electron injection material, and an electron transport material. The light-emitting mechanism forms the basis of classification of luminescent materials as fluorescent and phosphorescent materials, which use excitons in singlet and triplet states, respectively.

Meanwhile, when a single material is employed as the luminescent material, intermolecular actions cause the maximum luminescence wavelength to shift toward a longer wavelength, resulting in a reduction in color purity and light emission efficiency due to light attenuation. In this regard, a host-dopant system may be used as a luminescent material so as to increase the color purity and the light emission efficiency through energy transfer. This is based on the principle whereby, when a dopant which is smaller in energy band gap than a host forming a light-emitting layer is added in a small amount to the light-emitting layer, excitons are generated from the light-emitting layer and transported to the dopant, emitting light at high efficiency. Here, light with desired wavelengths can be obtained depending on the kind of the dopant because the wavelength of the host moves to the wavelength range of the dopant.

With regard to the efficiency of organic light-emitting diodes, statistically, the probability of forming a singlet state and a triplet state occurs at a ratio of 25%:75%. It would thus be expected that in fluorescent EL devices, only the formation of singlet excitons results in the emission of useful radiation, placing a theoretical limit of 25% on the internal quantum efficiency of such fluorescent EL devices %.

With the aim of solving the disadvantages, Korean Patent No. 10-2012-0092555 A (Aug. 21, 2012) proposes the effective occurrence of a triplet-triplet fusion (TTF) phenomenon accounting for the generation of singlet excitons through the collision and fusion of two triplet excitons. For this, this document discloses an electroluminescence device in which a blocking layer is interposed between a light-emitting layer and an electron injection layer, with an affinity difference between the electron injection layer and the blocking layer. In this regard, the blocking layer is set to have a triplet energy larger than that of the host of the light-emitting layer so as to confine triplet excitons within the light-emitting layer, whereby the effective occurrence of the TTF phenomenon is induced.

As described above, the disclosure set forth in the reference document is designed to cause the effective occurrence of a TTF phenomenon in order to provide high emission efficiency for an organic electroluminescence device. To this end, the blocking layer should include a material that is higher in triplet energy than the host to prevent the annihilation of the triplet excitations generated in the host, and an aromatic heterocyclic compound of a specific fused ring should be employed in the blocking layer.

Another technique for improving luminance efficiency can be found in Korean Patent No. 10-2006-0022676 A (Mar. 10, 2006), which describes an organic electroluminescence device having a blocking layer, disposed between a light-emitting layer and an electron transport layer, for controlling electron density.

In spite of various efforts made to fabricate organic light-emitting diodes having effective luminescence characteristics, however, there is still a continued need to develop organic light-emitting diodes having a higher effective luminance efficiency.

DETAILED DESCRIPTION OF THE INVENTION

Technical Problem

Accordingly, the present disclosure has been made keeping in mind the above problems occurring in the related art, and an object of the present disclosure is to provide an organic light-emitting diode that has high luminous efficiency, wherein a compound of specific structure is used as a host in a light-emitting layer and a compound of specific structure is introduced into an electron density control layer.

Technical Solution

The present disclosure provides an organic light-emitting diodes comprising: a first electrode; a second electrode facing the first electrode; a light-emitting layer and an electron density control layer sequentially arranged between the first electrode and the second electrode wherein the electron density control layer includes at least one of the compounds represented by the following Chemical Formulas A to D and the light-emitting layer includes at least one of the anthracene compounds represented by the following Chemical Formula H:

[Chemical Formula A]

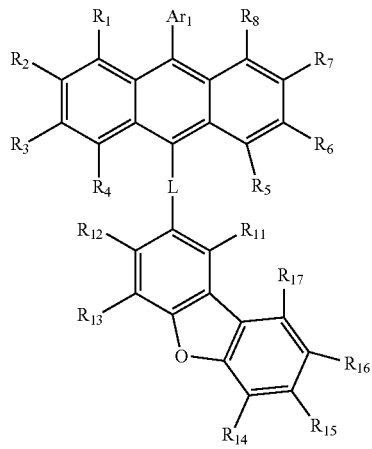

[Chemical Formula B]

$Q_1$:

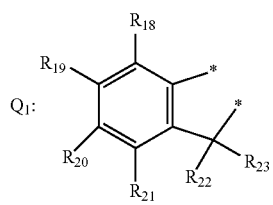

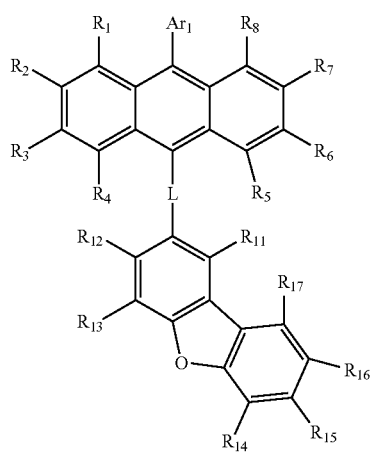

[Chemical Formula C]

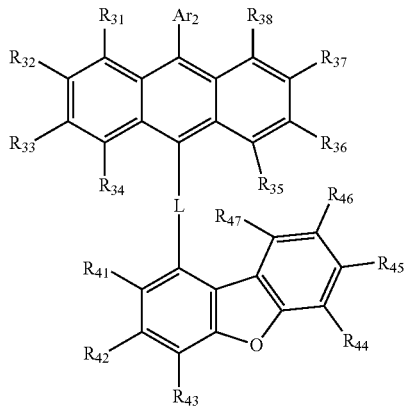

[Chemical Formula D]

$Q_2$:

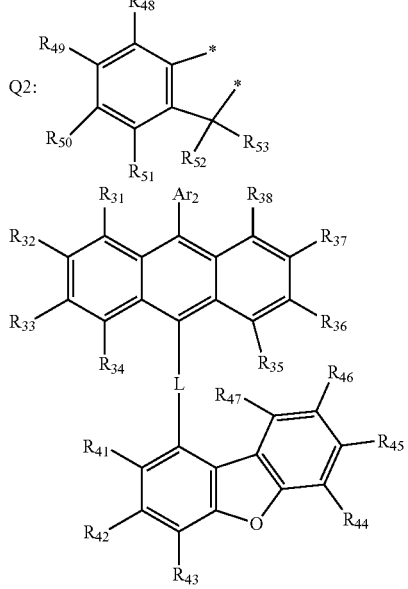

wherein, $R_1$ to $R_8$, $R_{11}$ to $R_{23}$, $R_{31}$ to $R_{38}$, and $R_{41}$ to $R_{53}$, which may be the same or different, are each independently any one selected from among a hydrogen atom, a deuterium atom, a substituted or unsubstituted alkyl of 1 to 30 carbon atoms, a substituted or unsubstituted alkenyl of 2 to 30 carbon atoms, a substituted or unsubstituted alkynyl of 2 to 30 carbon atoms, a substituted or unsubstituted cycloalkyl of 3 to 30 carbon atoms, a substituted or unsubstituted cycloalkenyl of 5 to 30 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 6 to 30 carbon atoms, a substituted or unsubstituted alkylamine of 1 to 30 carbon atoms, a substituted or unsubstituted arylamine of 6 to 30 carbon atoms, a substituted or unsubstituted aryl of 6 to 50 carbon atoms, a substituted or unsubstituted heteroaryl of 2 to 50 carbon atoms bearing O, N, or S as a heteroatom, a cyano, a nitro, a halogen, a substituted or unsubstituted silyl of 1 to 30 carbon atoms, a substituted or unsubstituted germanium of 1 to 30 carbon atoms, a substituted or unsubstituted boron of 1 to 30 carbon atoms, a substituted or unsubstituted aluminum of 1 to 30 carbon atoms, a carbonyl, a phosphoryl, an amino, a thiol, a hydroxy, a selenium, a tellurium, an amide, an ether, and an ester, substituents $Ar_1$ and $Ar_2$, which may be the same or different, are each independently a substituted or unsubstituted aryl of 6 to 50 carbon atoms, or a substituted or unsubstituted heteroaryl of 2 to 50 carbon atoms; and linker L is selected from among a single bond, a substituted or unsubstituted arylene of 6 to 60 carbon atoms, and a substituted or unsubstituted heteroarylene of 2 to 60 carbon atoms, wherein substituents $R_{12}$ and $R_{13}$ or two adjacent ones among substituents $R_{14}$ to $R_{17}$ in Chemical Formula B are respective single bonds for forming a 5-membered ring as a fused ring together with a carbon atom to which substituents $R_{22}$ and $R_{23}$ of Structural Formula $Q_1$ are bonded, and two adjacent ones among substituents $R_{41}$ to $R_{43}$ in Chemical Formula D are respective single bonds for forming a 5-membered ring as a fused ring together with a carbon to which substituents $R_{52}$ and $R_{53}$ of Structural Formula $Q_2$ are bonded, wherein a bond may be formed between substituents $R_{22}$ and $R_{23}$ and between substituents $R_{52}$ and $R_{53}$ to form respective rings,

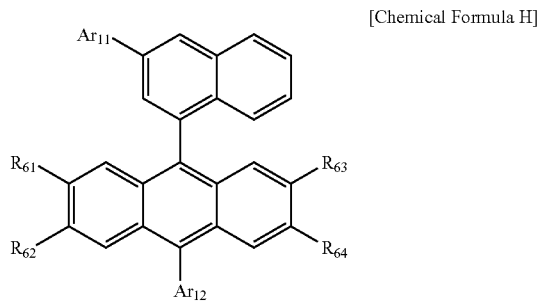

[Chemical Formula H]

wherein, $Ar_{11}$ and $AR_{12}$, which may be the same or different, are each independently selected from among a substituted or unsubstituted aryl of 6 to 50 carbon atoms and a substituted or unsubstituted heteroaryl of 3 to 50 carbon atoms bearing O, N, or S as a heteroatom, $R_{61}$ to $R_{64}$, which may be the same or different, are each independently selected from the group consisting of a hydrogen atom, a deuterium atom, a substituted or unsubstituted alkyl of 1 to 30 carbon atoms, a substituted or unsubstituted alkenyl of 2 to 30 carbon atoms, a substituted or unsubstituted cycloalkyl of 3 to 30 carbon atoms, a substituted or unsubstituted cycloalkenyl of 5 to 30 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 6 to 30 carbon atoms, a substituted or unsubstituted alkylamine of 1 to 30 carbon atoms, a substituted or unsubstituted arylamine of 6 to 30 carbon atoms, a substituted or unsubstituted aryl of 6 to 50 carbon atoms, a substituted or unsubstituted heteroaryl of 3 to 50 carbon atoms bearing O, N, or S as a heteroatom, a substituted or unsubstituted silicon, a substituted or unsubstituted boron, a substituted or unsubstituted silane, a carbonyl, a phosphoryl, an amino, a nitrile, a hydroxy, a nitro, a halogen, an amide, and an ester, with the proviso that a hydrogen atom is positioned on each of the aromatic ring carbon atoms to which none of the substituents $Ar_{11}$, $Ar_{12}$, and $R_{61}$ to $R_{64}$ are bonded, and wherein a bond may be between $R_{61}$ and $R_{62}$ to form a saturated or unsaturated ring and between $R_{63}$ and $R_{64}$ to form a saturated or unsaturated ring.

Advantageous Effects

Employing a specifically structured electron density control layer interposed between a light-emitting layer and an electron transport layer in combination with an anthracene derivative used for the light-emitting layer, the organic light-emitting diode of the present disclosure can exhibit higher luminous efficiency and more effective low-voltage operation, compared to conventional diodes.

MODE FOR CARRYING OUT THE INVENTION

Figure 1:
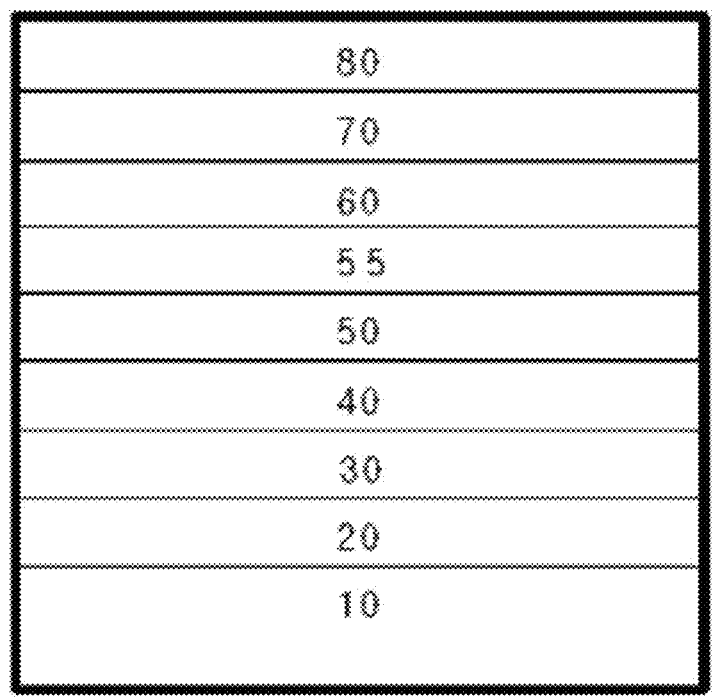
FIG. 1 is a diagram of the structure of an organic light-emitting diode according to some embodiments of the present disclosure.

Hereinafter, some embodiments which can be easily performed by those skilled in the art will be described with reference to the accompanying drawings. In the drawings of the disclosure, sizes and dimensions of structures are illustrated by enlarging or reducing as compared with the actual sizes and dimensions to clarify the disclosure, the known configurations are not illustrated to exhibit characteristic configurations, and the disclosure is not limited to the drawings.

In addition, the size and thickness of each configuration illustrated in the drawings are arbitrarily illustrated for the sake of convenience of explanation, and thus the present disclosure may not be necessarily limited to the illustration. Further, in the drawings, the thickness of layers and regions are illustrated in enlargement for clarity. For the sake of explanation, thicknesses of certain layers and regions are exaggerated.

Throughout the specification, when a portion may "include" a certain constituent element, unless explicitly described to the contrary, it may not be construed to exclude another constituent element but may be construed to further include other constituent elements. Further, throughout the specification, the word "on" means positioning on or below the object portion, but does not essentially mean positioning on the lower side of the object portion based on a gravity direction.

The present disclosure provides an organic light-emitting diodes comprising: a first electrode; a second electrode facing the first electrode; a light-emitting layer and an electron density control layer sequentially arranged between the first electrode and the second electrode wherein the electron density control layer includes at least one of the compounds represented by the following Chemical Formulas A to D and the light-emitting layer includes at least one of the anthracene compounds represented by the following Chemical Formula H:

[Chemical Formula A]

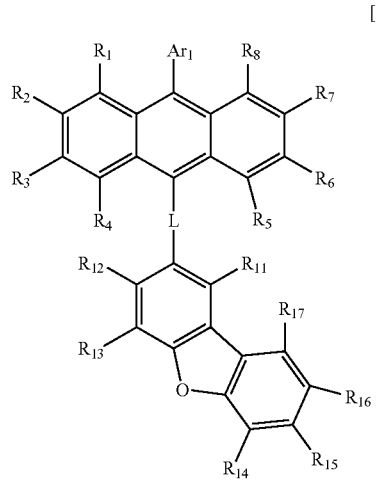

[Chemical Formula B]

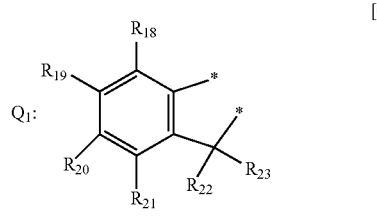

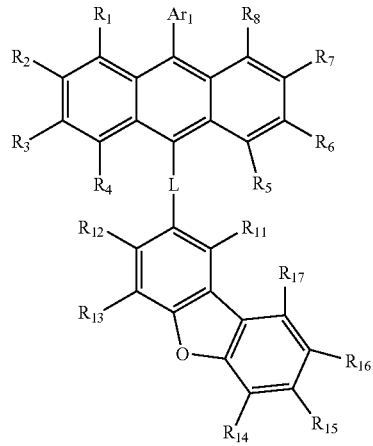

[Chemical Formula C]

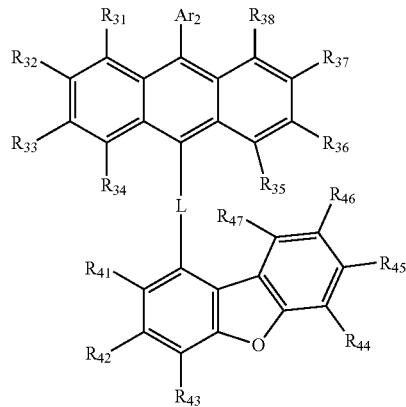

[Chemical Formula D]

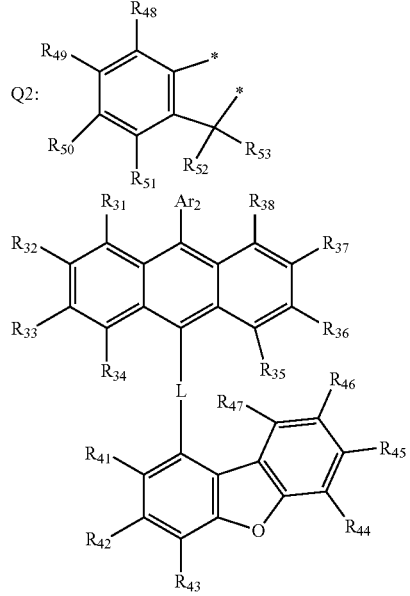

wherein, $R_1$ to $R_8$, $R_{11}$ to $R_{23}$, $R_{31}$ to $R_{38}$, and $R_{41}$ to $R_{53}$, which may be the same or different, are each independently any one selected from among a hydrogen atom, a deuterium atom, a substituted or unsubstituted alkyl of 1 to 30 carbon atoms, a substituted or unsubstituted alkenyl of 2 to 30 carbon atoms, a substituted or unsubstituted alkynyl of 2 to 30 carbon atoms, a substituted or unsubstituted cycloalkyl of 3 to 30 carbon atoms, a substituted or unsubstituted cycloalkenyl of 5 to 30 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 6 to 30 carbon atoms, a substituted or unsubstituted alkylamine of 1 to 30 carbon atoms, a substituted or unsubstituted arylamine of 6 to 30 carbon atoms, a substituted or unsubstituted aryl of 6 to 50 carbon atoms, a substituted or unsubstituted heteroaryl of 2 to 50 carbon atoms bearing O, N, or S as a heteroatom, a cyano, a nitro, a halogen, a substituted or unsubstituted silyl of 1 to carbon atoms, a substituted or unsubstituted germanium of 1 to 30 carbon atoms, a substituted or unsubstituted boron of 1 to 30 carbon atoms, a substituted or unsubstituted aluminum of 1 to 30 carbon atoms, a carbonyl, a phosphoryl, an amino, a thiol, a hydroxy, a selenium, a tellurium, an amide, an ether, and an ester, substituents $Ar_1$ and $Ar_2$, which may be the same or different, are each independently a substituted or unsubstituted aryl of 6 to 50 carbon atoms, or a substituted or unsubstituted heteroaryl of 2 to 50 carbon atoms; and linker L is selected from among a single bond, a substituted or unsubstituted arylene of 6 to 60 carbon atoms, and a substituted or unsubstituted heteroarylene of 2 to 60 carbon atoms, wherein substituents $R_{12}$ and $R_{13}$ or two adjacent ones among substituents $R_{14}$ to $R_{17}$ in Chemical Formula B are respective single bonds for forming a 5-membered ring as a fused ring together with a carbon atom to which substituents $R_{22}$ and $R_{23}$ of Structural Formula $Q_1$ are bonded, and two adjacent ones among substituents $R_{41}$ to $R_{43}$ in Chemical Formula D are respective single bonds for forming a 5-membered ring as a fused ring together with a carbon to which substituents $R_{52}$ and $R_{53}$ of Structural Formula $Q_2$ are bonded, wherein a bond may be formed between substituents $R_{22}$ and $R_{23}$ and between substituents $R_{52}$ and $R_{53}$ to form respective rings,

[Chemical Formula H]

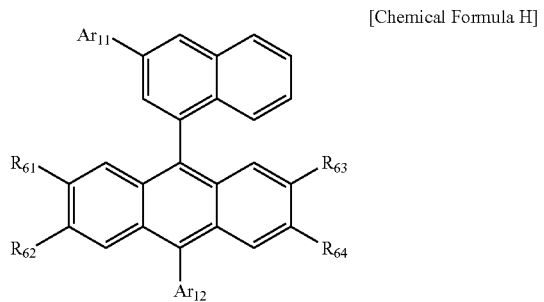

wherein, $Ar_{11}$ and $AR_{12}$, which may be the same or different, are each independently selected from among a substituted or unsubstituted aryl of 6 to 50 carbon atoms and a substituted or unsubstituted heteroaryl of 3 to 50 carbon atoms bearing O, N, or S as a heteroatom, $R_{61}$ to $R_{64}$, which may be the same or different, are each independently selected from the group consisting of a hydrogen atom, a deuterium atom, a substituted or unsubstituted alkyl of 1 to 30 carbon atoms, a substituted or unsubstituted alkenyl of 2 to 30 carbon atoms, a substituted or unsubstituted cycloalkyl of 3 to 30 carbon atoms, a substituted or unsubstituted cycloalkenyl of 5 to 30 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 6 to 30 carbon atoms, a substituted or unsubstituted alkylamine of 1 to 30 carbon atoms, a substituted or unsubstituted arylamine of 6 to 30 carbon atoms, a substituted or unsubstituted aryl of 6 to 50 carbon atoms, a substituted or unsubstituted heteroaryl of 3 to 50 carbon atoms bearing O, N, or S as a heteroatom, a substituted or unsubstituted silicon, a substituted or unsubstituted boron, a substituted or unsubstituted silane, a carbonyl, a phosphoryl, an amino, a nitrile, a hydroxy, a nitro, a halogen, an amide, and an ester, with the proviso that a hydrogen atom is positioned on each of the aromatic ring carbon atoms to which none of the substituents $Ar_{11}$, $AR_{12}$, and $R_{61}$ to $R_{64}$ are bonded, and wherein a bond may be between $R_{61}$ and $R_{62}$ to form a saturated or unsaturated ring and between $R_{63}$ and $R_{64}$ to form a saturated or unsaturated ring, wherein the term 'substituted' in the expression 'substituted or unsubstituted' means having at least one substituent selected from the group consisting of a deuterium atom, a cyano, a halogen, a hydroxy, a nitro, an alkyl of 1 to 24 carbon atoms, a halogenated alkyl of 1 to 24 carbon atoms, an alkenyl of 2 to 24 carbon atoms, an alkynyl of 2 to 24 carbon atoms, a heteroalkyl of 1 to 24 carbon atoms, an aryl of 6 to 24 carbon atoms, an arylalkyl of 7 to 24 carbon atoms, a heteroaryl of 2 to 24 carbon atoms or a heteroarylalkyl of 2 to 24 carbon atoms, an alkoxy of 1 to 24 carbon atoms, an alkylamino of 1 to 24 carbon atoms, an arylamino of 6 to 24 carbon atoms, a hetero arylamino of 2 to 24 carbon atoms, an alkylsilyl of 1 to 24 carbon atoms, an arylsilyl of 6 to 24 carbon atoms, and an aryloxy of 6 to 24 carbon atoms.

The expression indicating the number of carbon atoms, such as "a substituted or unsubstituted alkyl of 1 to 30 carbon atoms", "a substituted or unsubstituted aryl of 5 to 50 carbon atoms", etc. means the total number of carbon atoms of, for example, the alkyl or aryl radical or moiety alone, exclusive of the number of carbon atoms of substituents attached thereto. For instance, a phenyl group with a butyl at the para position falls within the scope of an aryl of 6 carbon atoms, even though it is substituted with a butyl radical of 4 carbon atoms.

As used herein, the term "aryl" means an organic radical derived from an aromatic hydrocarbon by removing one hydrogen that is bonded to the aromatic hydrocarbon. It may be a single or fused aromatic system including a 5- to 7-membered ring, and preferably a 5- to 6-membered ring. Further, the aromatic system may include a fused ring that is formed by adjacent substituents on the aryl radical.

Examples of the aryl include phenyl, naphthyl, biphenyl, terphenyl, anthryl, indenyl, fluorenyl, phenanthryl, triphenylenyl, pyrenyl, perylenyl, chrysenyl, naphthacenyl, and fluoranthenyl, but are not limited thereto.

At least one hydrogen atom of the aryl may be substituted by a deuterium atom, a halogen atom, a hydroxy, a nitro, a cyano, a silyl, an amino (—$NH_2$, —NH(R), —N(R') (R'') wherein R' and R'' are each independently an alkyl of 1 to 10 carbon atoms, in this case, called "alkylamino"), an amidino, a hydrazine, a hydrazone, a carboxyl, a sulfonic acid, a phosphoric acid, an alkyl of 1 to 24 carbon atoms, a halogenated alkyl of 1 to 24 carbon atoms, an alkenyl of 1 to 24 carbon atoms, an alkynyl of 1 to 24 carbon atoms, a heteroalkyl of 1 to 24 carbon atoms, an aryl of 6 to 24 carbon atoms, an arylalkyl of 6 to 24 carbon atoms, a heteroaryl of 2 to 24 carbon atoms, or a heteroarylalkyl of 2 to 24 carbon atoms.

The heteroaryl substituent used in the compound of the present disclosure refers to a cyclic aromatic system of 2 to 24 carbon atoms containing 1 to 4 heteroatoms selected from among N, O, P, Se, TE, Si, Ge, and S. In the aromatic system, two or more rings may be fused. One or more hydrogen atoms on the heteroaryl may be substituted by the same substituents as on the aryl.

Examples of the alkyl substituent useful in the present disclosure include methyl, ethyl, propyl, isopropyl, isobutyl, sec-butyl, tert-butyl, pentyl, iso-amyl, and hexyl. At least one hydrogen atom of the alkyl may be substituted by the same substituent as in the aryl.

Examples of the alkoxy substituent useful in the present disclosure include methoxy, ethoxy, propoxy, isobutyloxy, sec-butyloxy, pentyloxy, iso-amyloxy, and hexyloxy. At least one hydrogen atom of the alkoxy may be substituted by the same substituent as in the aryl.

Representative among examples of the silyl useful in the present disclosure are trimethylsilyl, triethylsilyl, triphenylsilyl, trimethoxysilyl, dimethoxyphenylsilyl, diphenylmethylsilyl, silyl, diphenylvinylsilyl, methylcyclobutylsilyl, and dimethylfurylsilyl. One or more hydrogen atoms of the silyl may be substituted by the same substituent as in the aryl.

In the present disclosure, the phrase "(an organic layer) includes at least one organic compound" may be construed to mean "(an organic layer) may include a single organic compound species or two or more different species of organic compounds falling within the scope of the present disclosure".

Characterized by the sequential deposition of a light-emitting layer and an electron density control layer with the employment of at least one compound selected from among compounds represented by Chemical Formulas A to D in the electron density control layer and the compound represented by the following Chemical Formula H in the light-emitting layer, the organic light-emitting diode of the present disclosure exhibits improved luminance efficiency.

Here, the light-emitting layer of the organic light-emitting diode according to the present disclosure includes a host and a dopant, wherein the compound of Chemical Formula H may be used as the host.

The anthracene compound represented by Chemical Formula H has 1-naphthyl bonded at position 9 on the anthracene ring moiety, and a substituted or unsubstituted aryl of 6 to 50 carbon atoms and a substituted or unsubstituted heteroaryl of 3 to 50 carbon atoms bearing O, N, or S as a heteroatom bonded respectively at position 3 on the 1-naphthyl moiety and at position 10 on the anthracene ring moiety.

In this case, substituents $Ar_{11}$ and $Ar_{12}$ in Chemical Formula H, which may be the same or different, are each independently a substituted or unsubstituted aryl of 6 to 18 carbon atoms.

Concrete examples of the compounds represented by Chemical Formula H in the present disclosure include, but are not limited to, the compounds represented by the following Chemical Formulas 1 to 80:

[Chemical Formula 1]

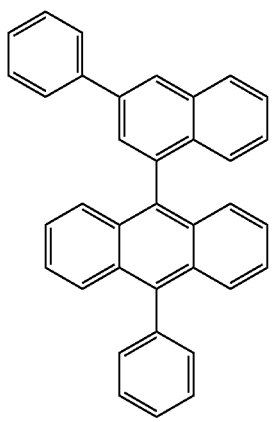

[Chemical Formula 2]

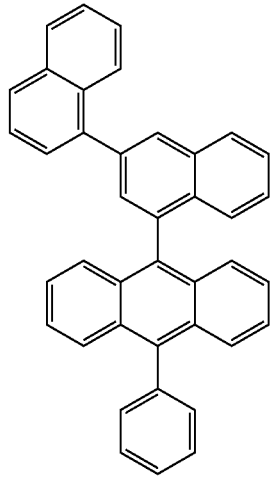

[Chemical Formula 3]

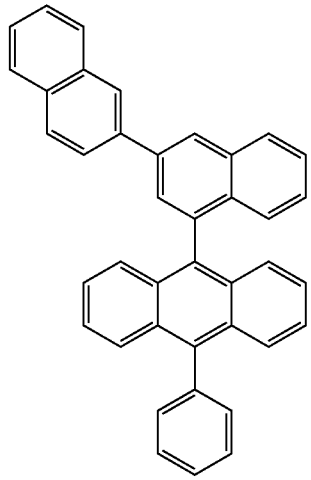

[Chemical Formula 4]

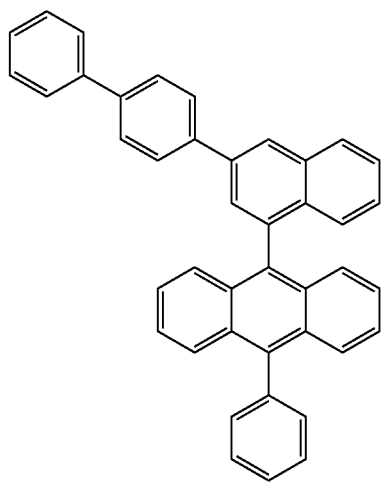

[Chemical Formula 5]
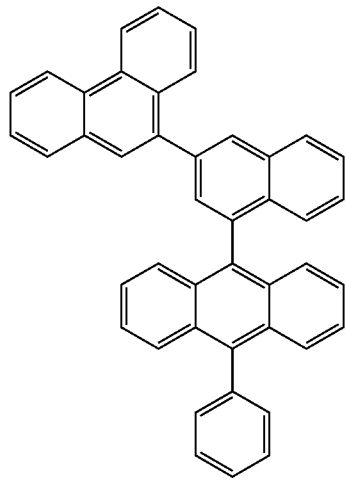
[Chemical Formula 6]
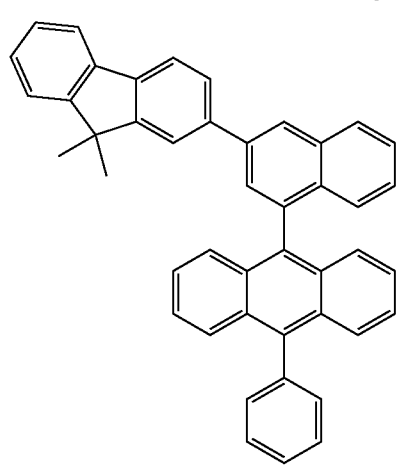
[Chemical Formula 7]
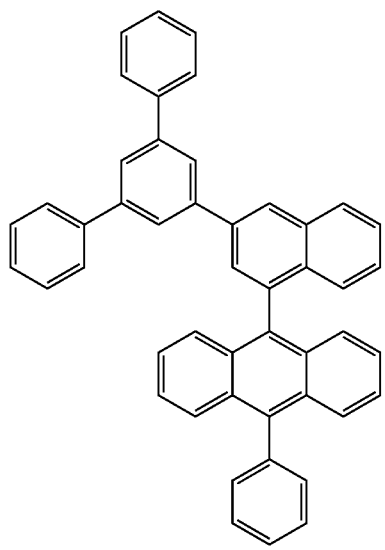
[Chemical Formula 8]
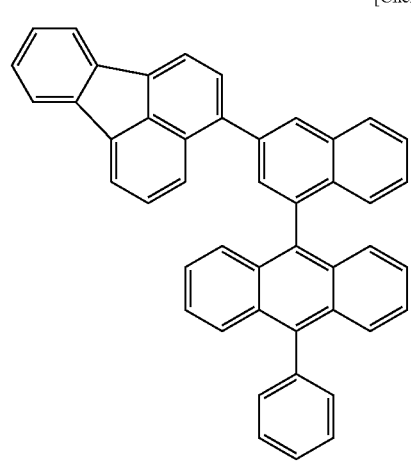
[Chemical Formula 9]
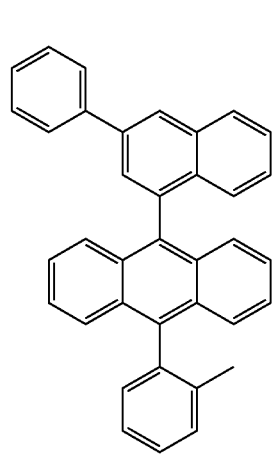
[Chemical Formula 10]
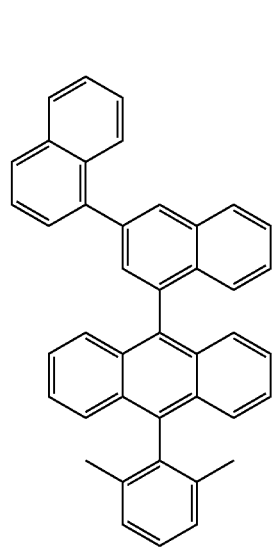

[Chemical Formula 11]
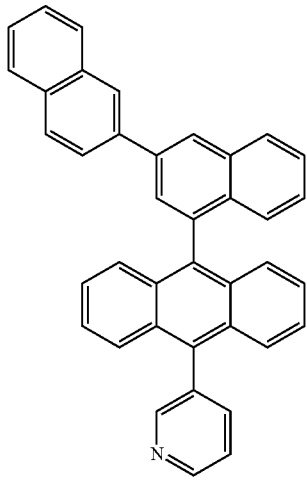
[Chemical Formula 12]
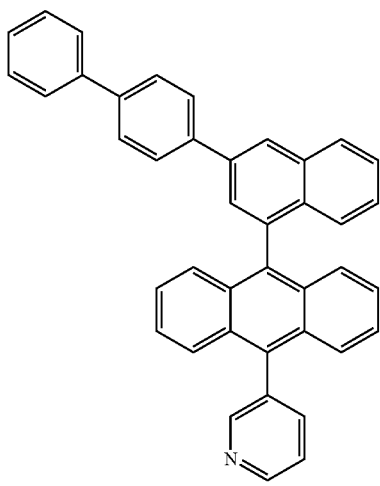
[Chemical Formula 13]
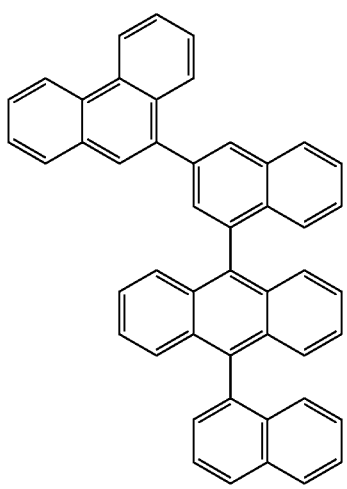
[Chemical Formula 14]
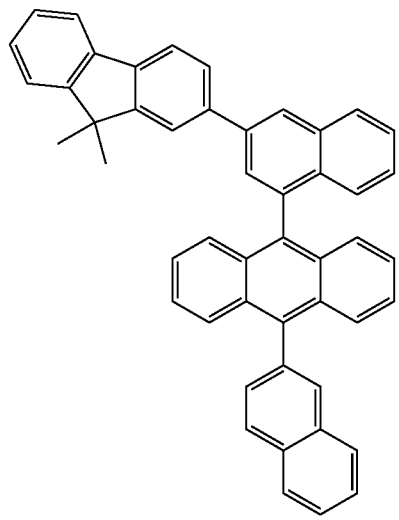
[Chemical Formula 15]
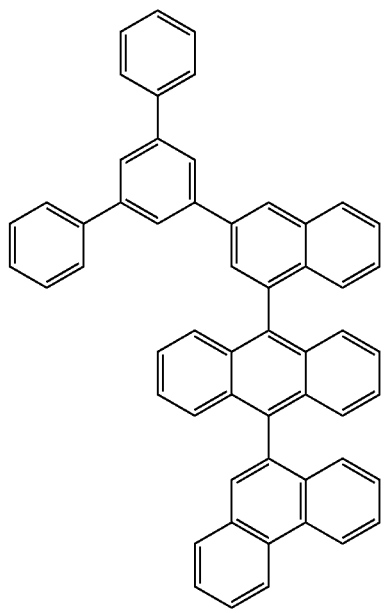

[Chemical Formula 16]
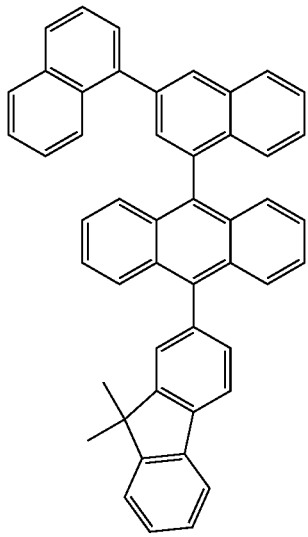
[Chemical Formula 17]
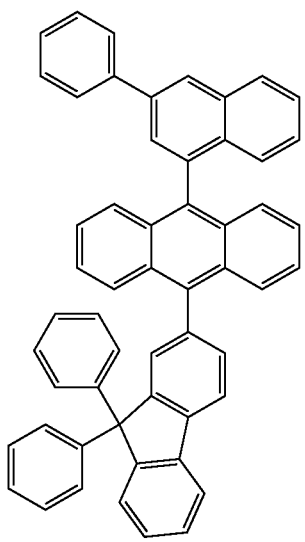
[Chemical Formula 18]
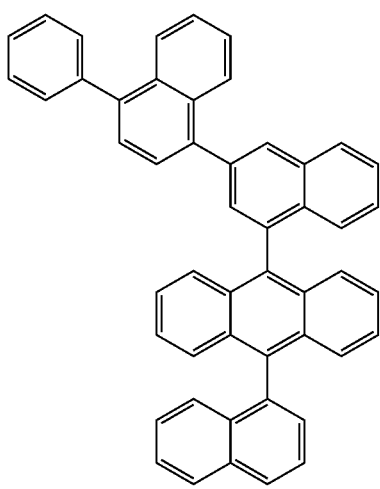
[Chemical Formula 19]
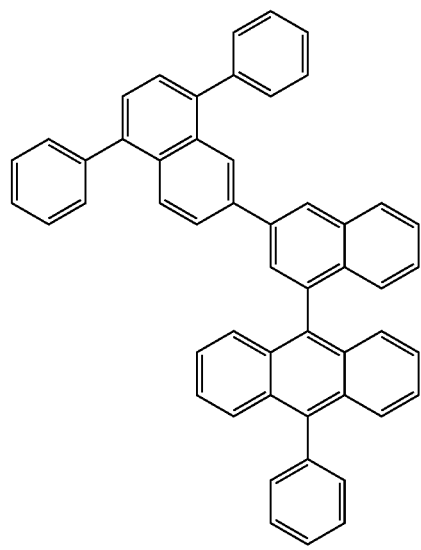
[Chemical Formula 20]
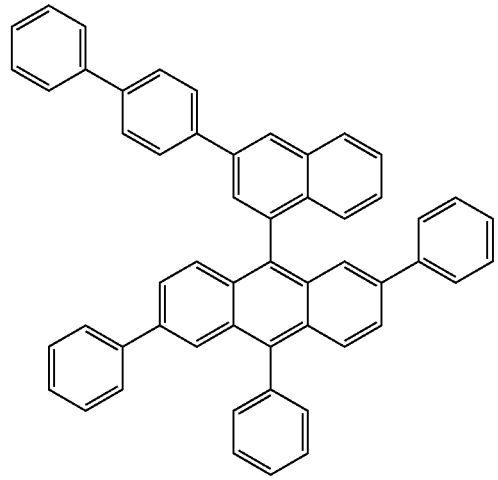
[Chemical Formula 21]
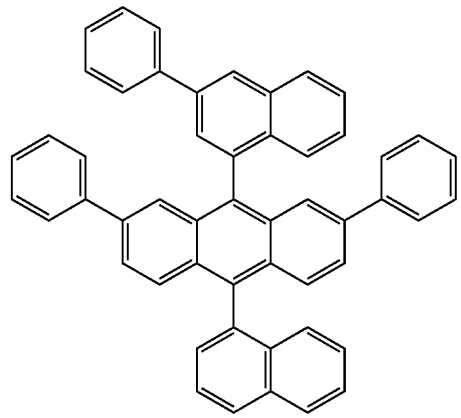

[Chemical Formula 22]
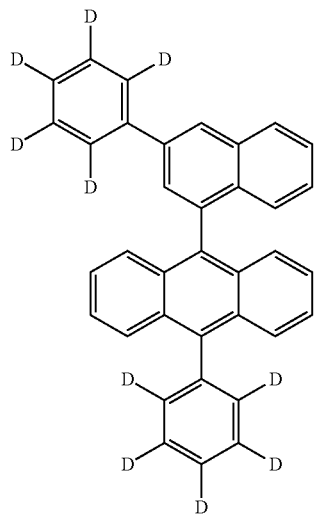
[Chemical Formula 23]
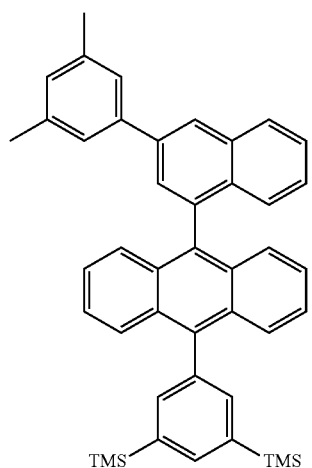
[Chemical Formula 24]
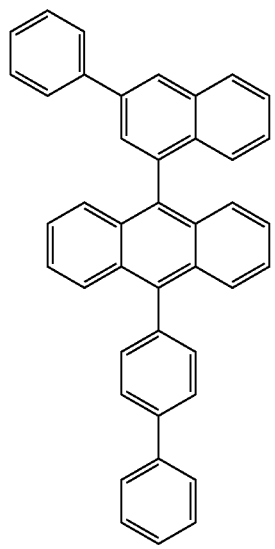
[Chemical Formula 25]
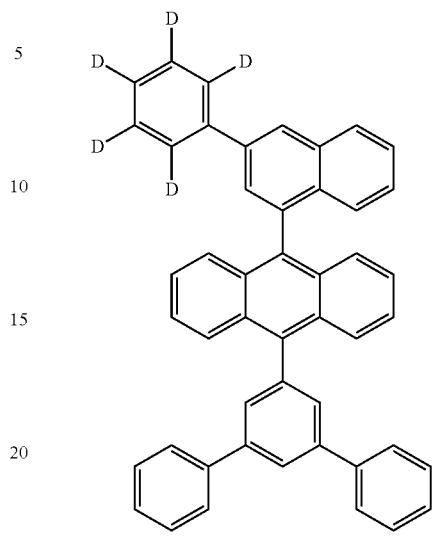
[Chemical Formula 26]
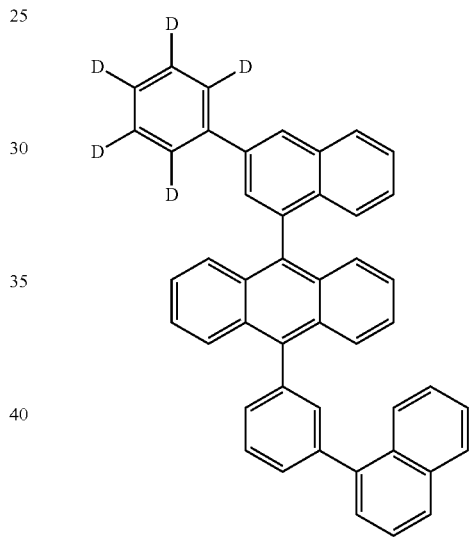
[Chemical Formula 27]
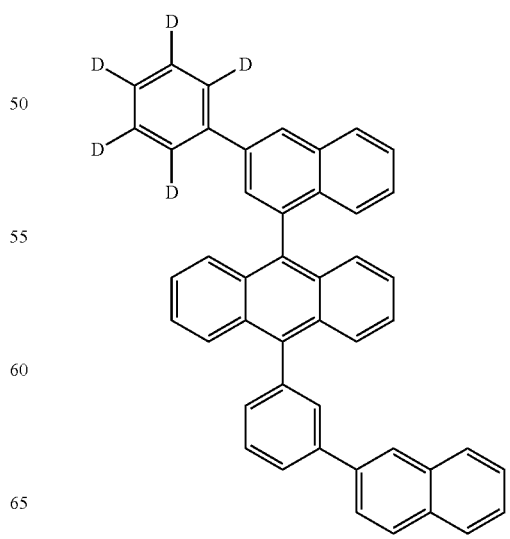

[Chemical Formula 28]
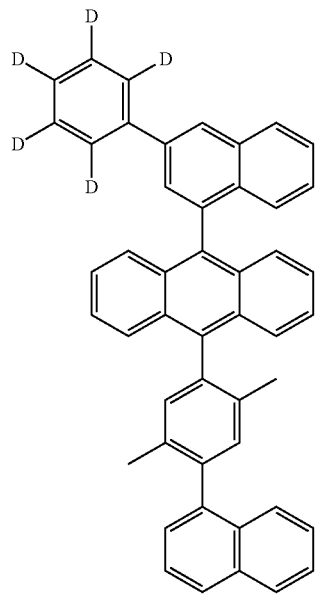
[Chemical Formula 29]
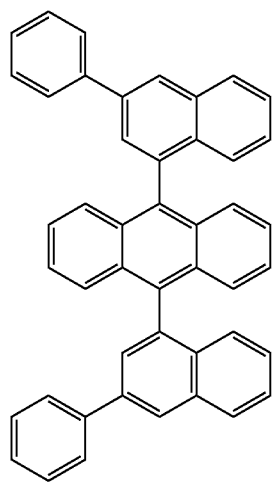
[Chemical Formula 30]
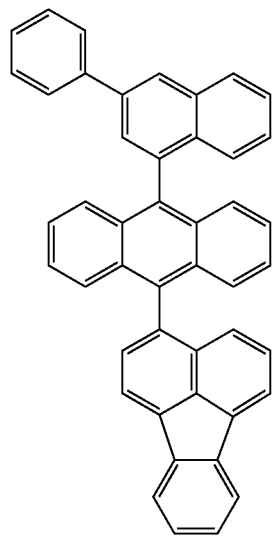
[Chemical Formula 31]
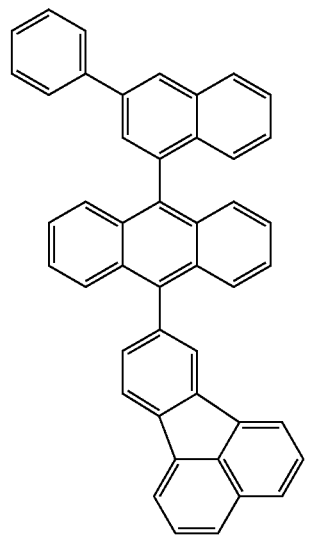
[Chemical Formula 32]
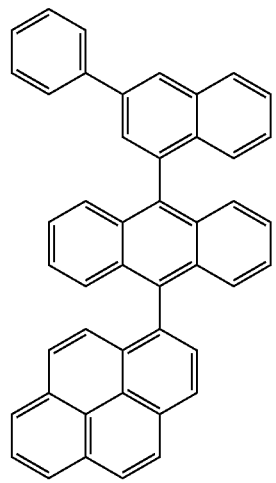
[Chemical Formula 33]
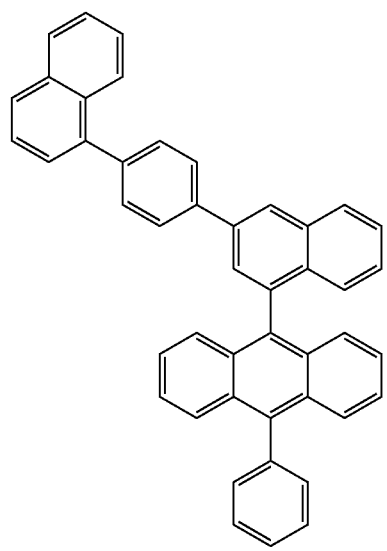

[Chemical Formula 34]
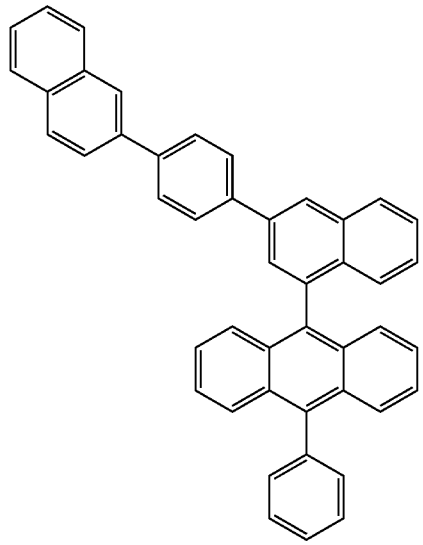
[Chemical Formula 35]
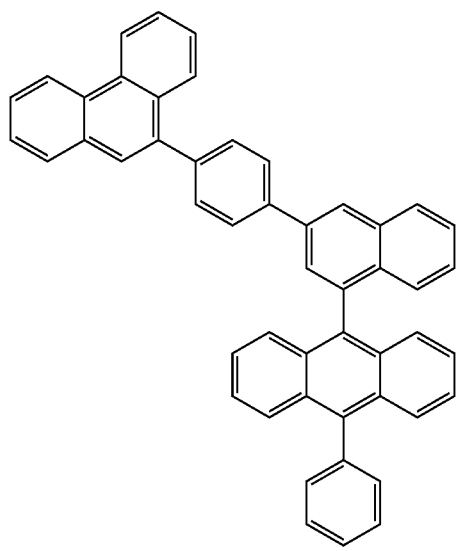
[Chemical Formula 36]
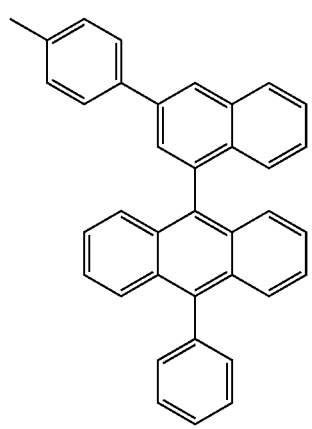
[Chemical Formula 37]
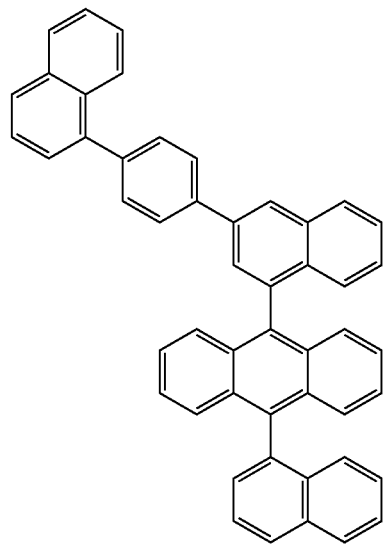
[Chemical Formula 38]
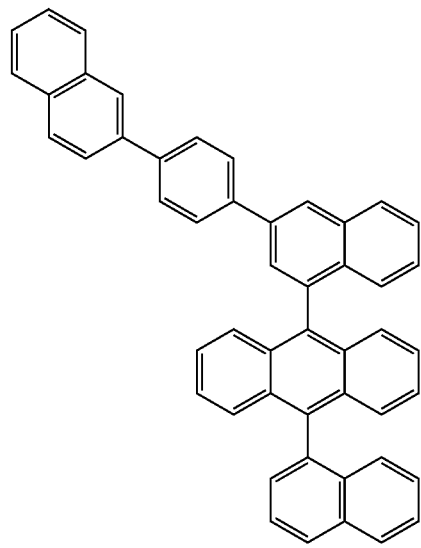

[Chemical Formula 39]
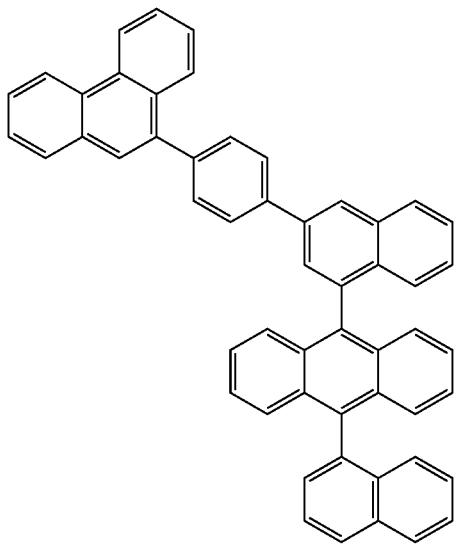
[Chemical Formula 40]
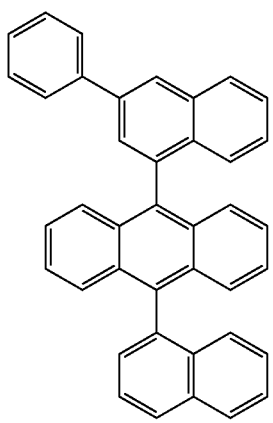
[Chemical Formula 41]
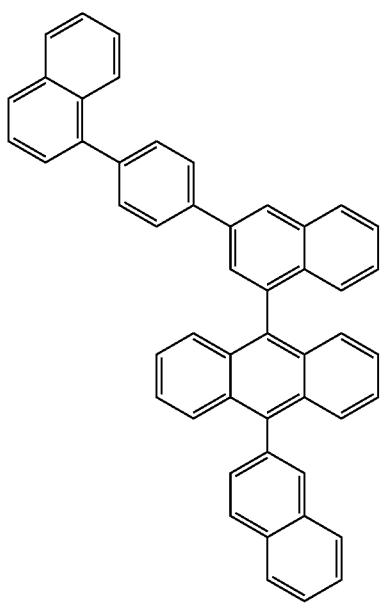
[Chemical Formula 42]
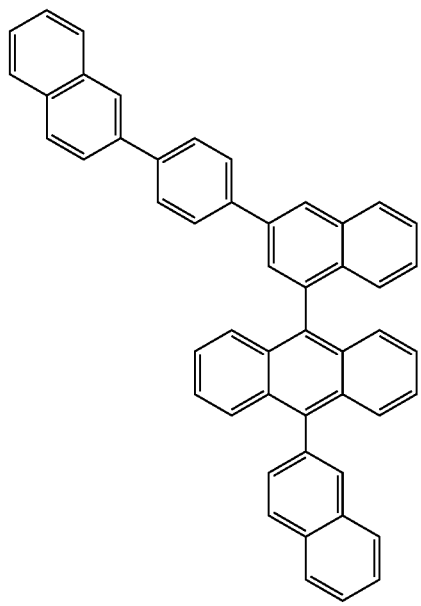
[Chemical Formula 43]
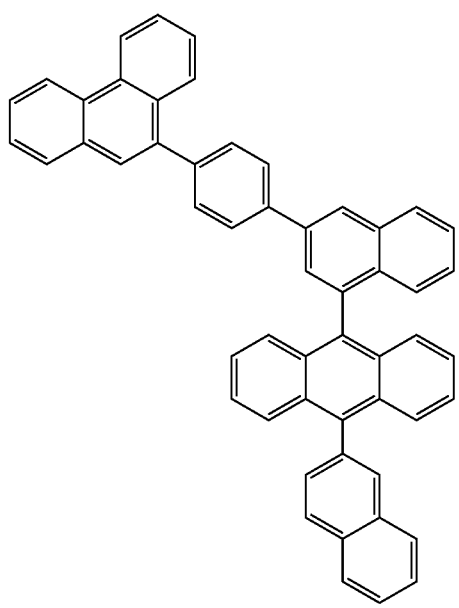

[Chemical Formula 44]
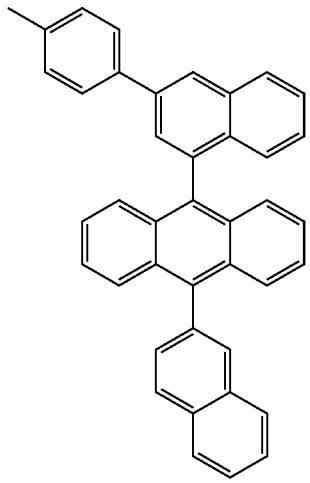
[Chemical Formula 45]
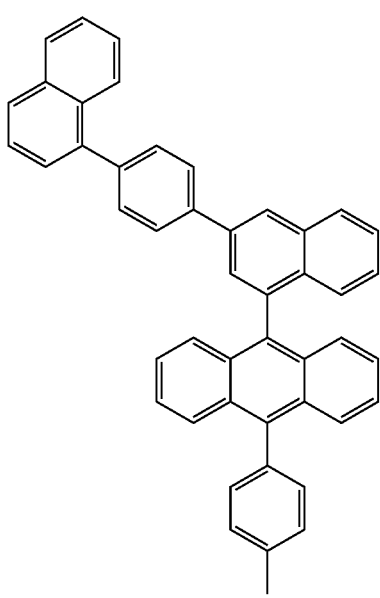
[Chemical Formula 46]
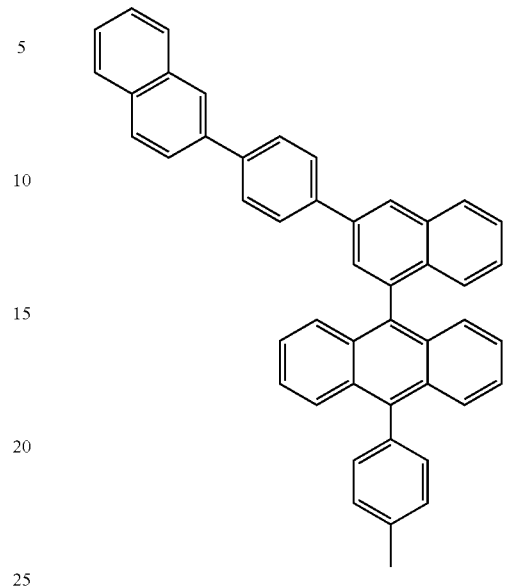
[Chemical Formula 47]
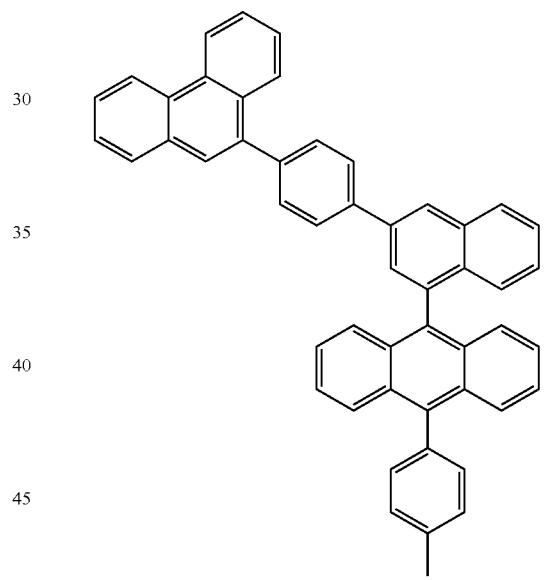
[Chemical Formula 48]
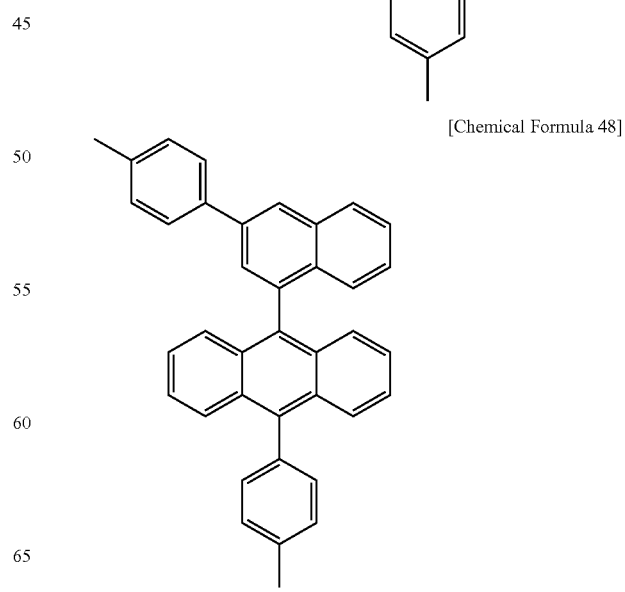

[Chemical Formula 49]
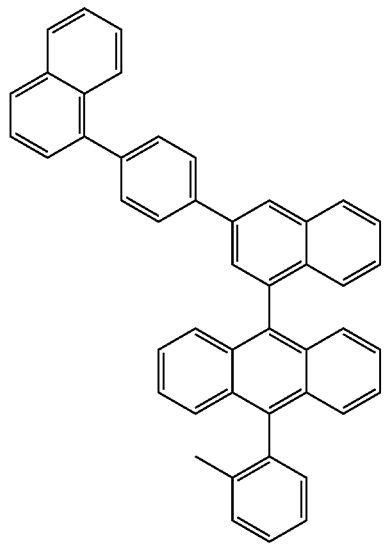
[Chemical Formula 50]
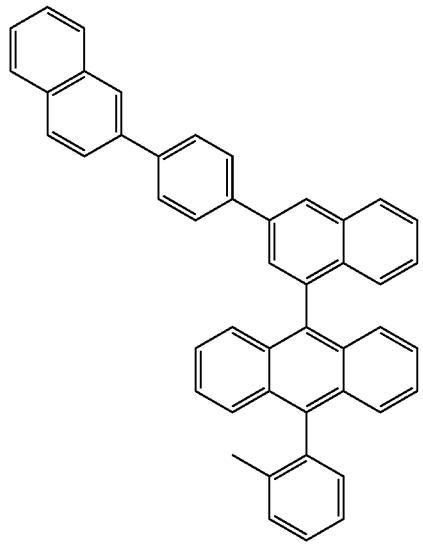
[Chemical Formula 51]
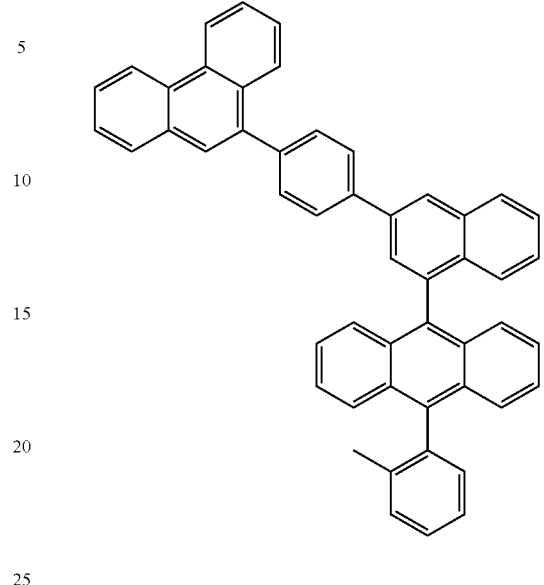
[Chemical Formula 52]
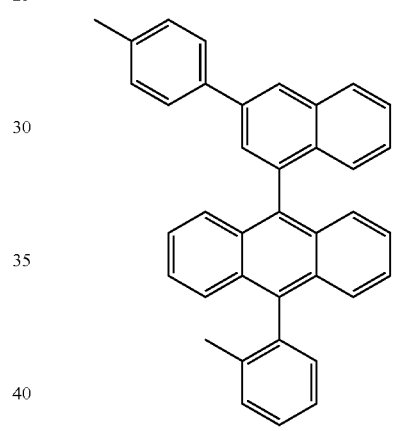
[Chemical Formula 53]
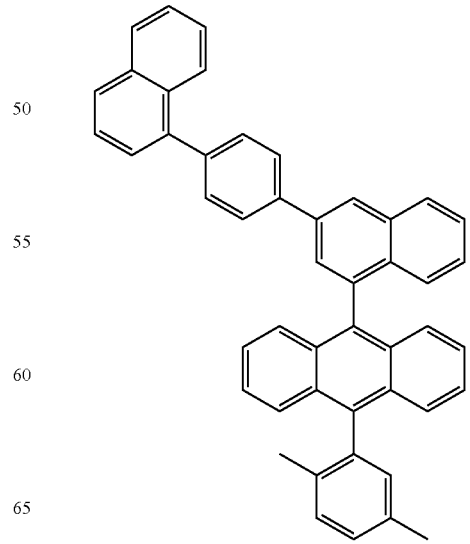

[Chemical Formula 54]
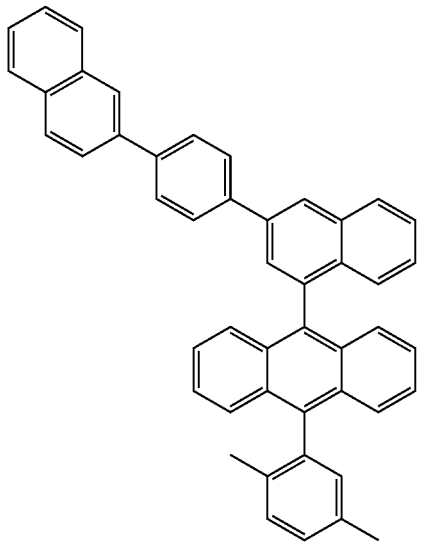
[Chemical Formula 55]
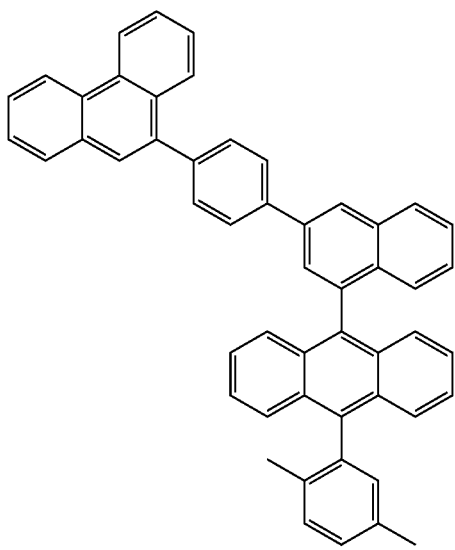
[Chemical Formula 56]
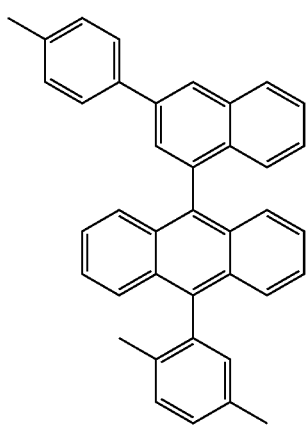
[Chemical Formula 57]
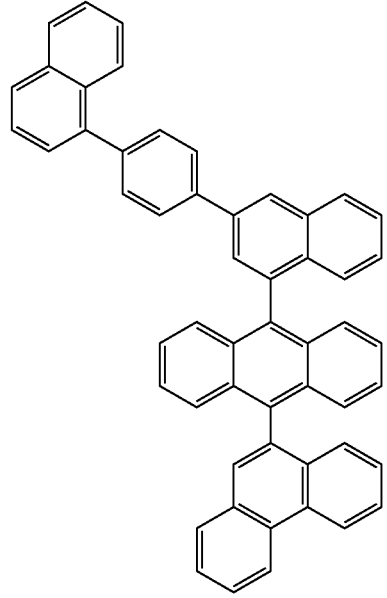
[Chemical Formula 58]
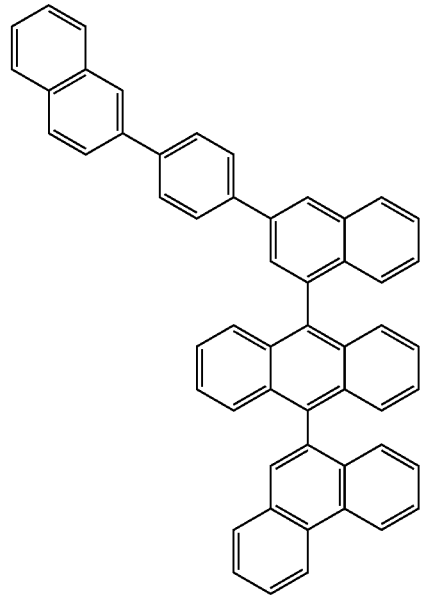

[Chemical Formula 59]
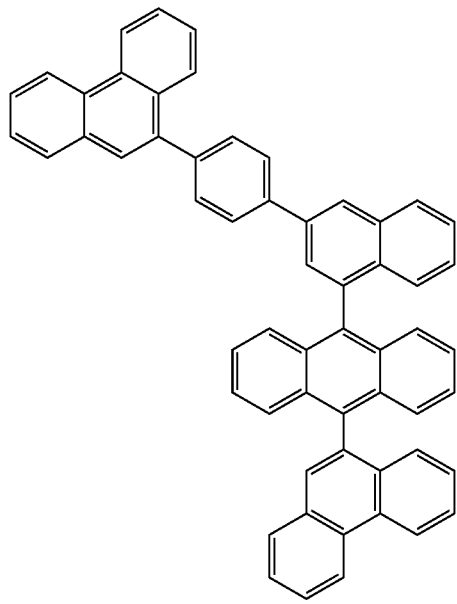
[Chemical Formula 60]
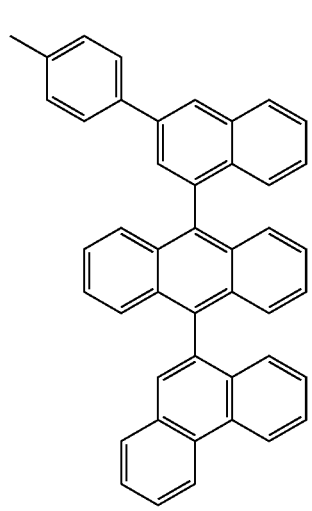
[Chemical Formula 61]
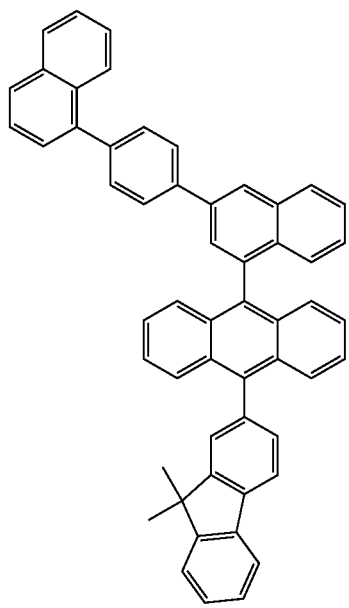
[Chemical Formula 62]
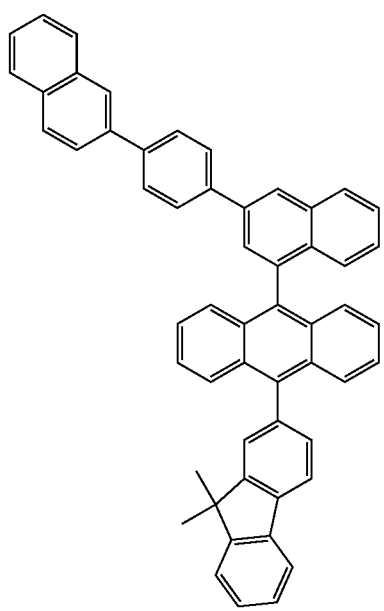

[Chemical Formula 63]
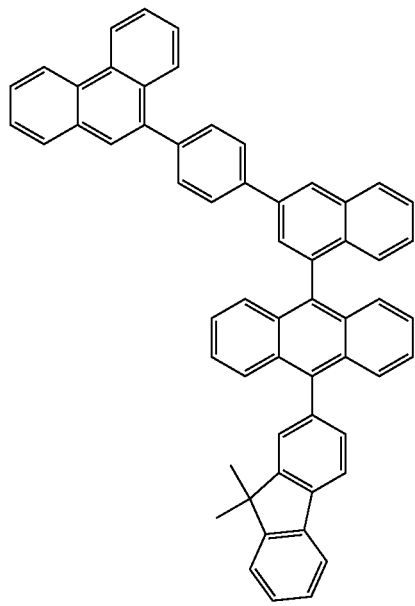
[Chemical Formula 64]
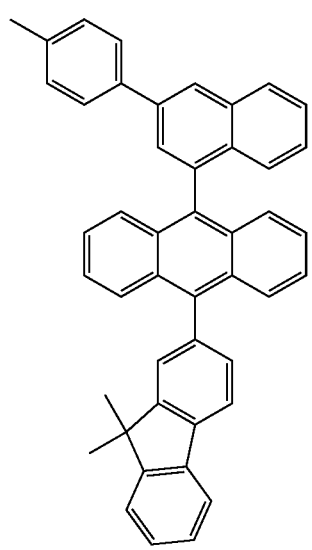
[Chemical Formula 65]
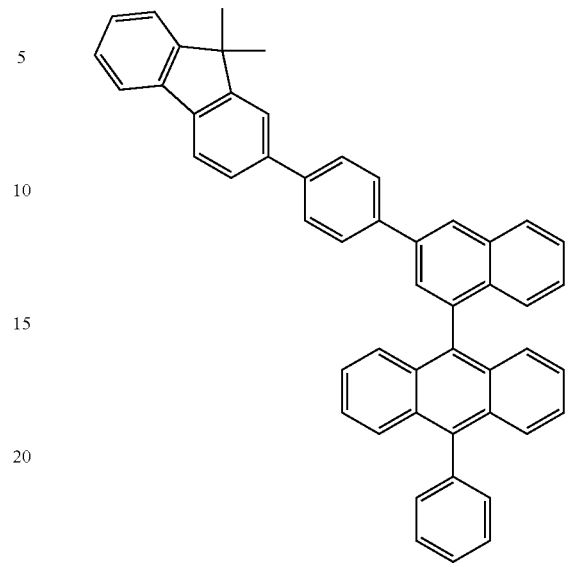
[Chemical Formula 66]
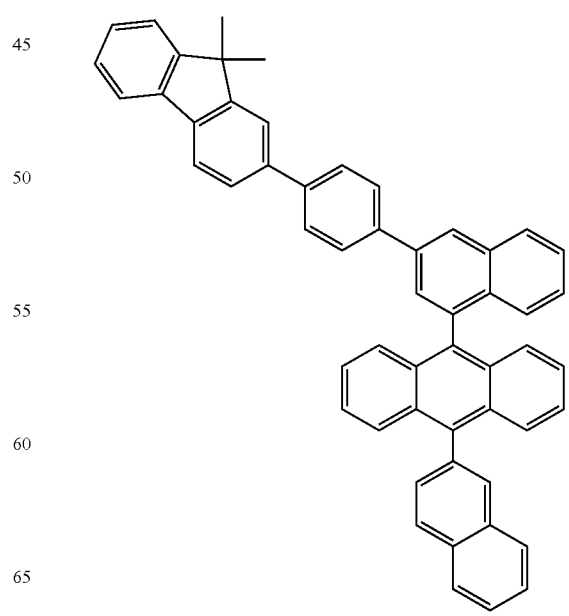

-continued
[Chemical Formula 67]
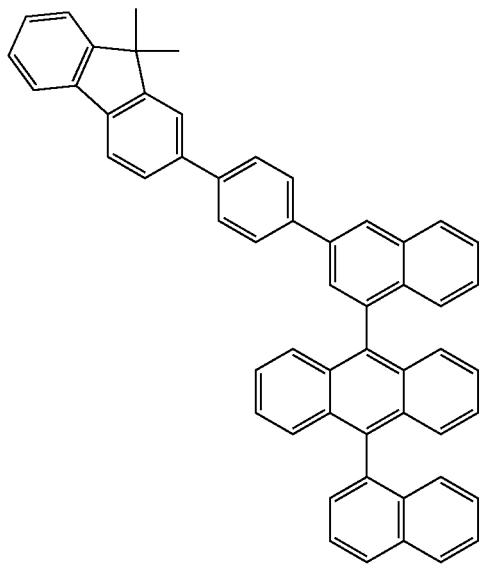
[Chemical Formula 68]
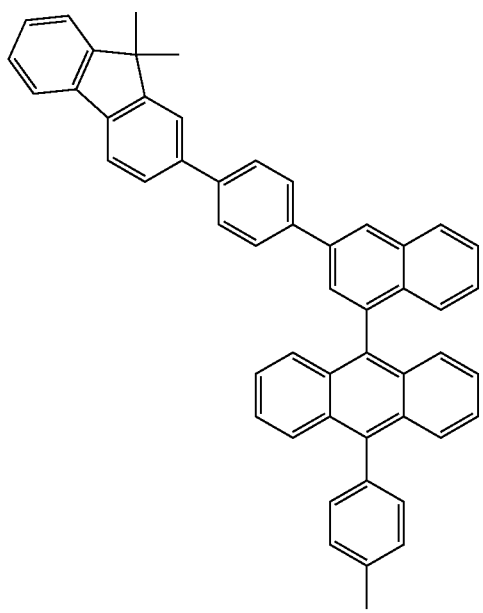
-continued
[Chemical Formula 69]
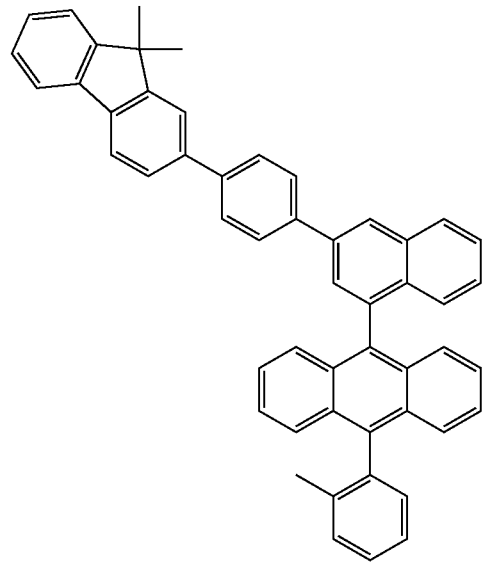
[Chemical Formula 70]
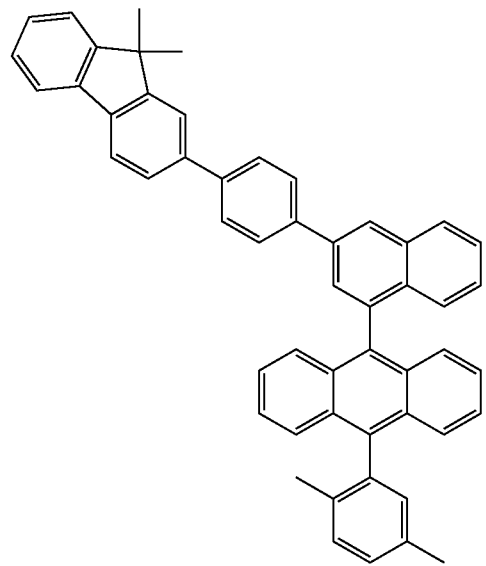

[Chemical Formula 71]
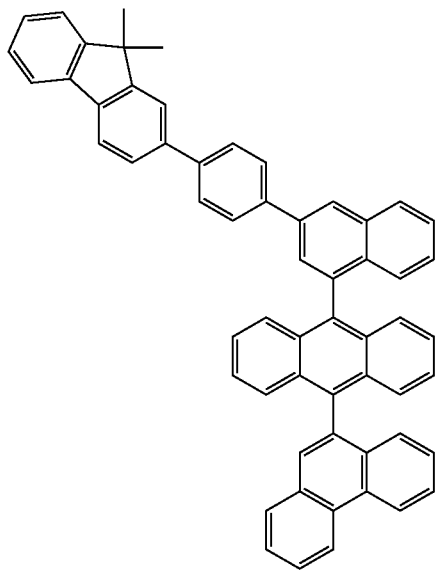
[Chemical Formula 72]
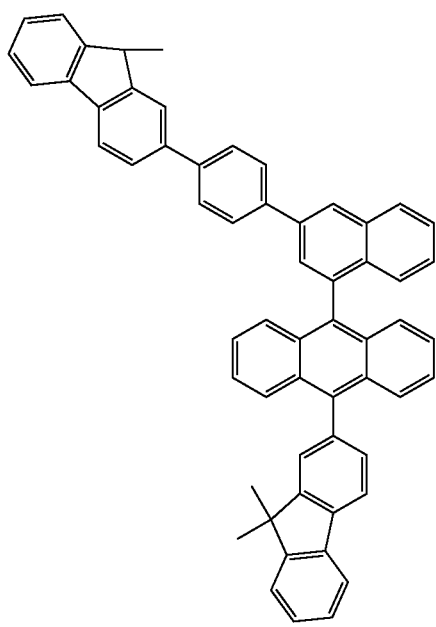
[Chemical Formula 73]
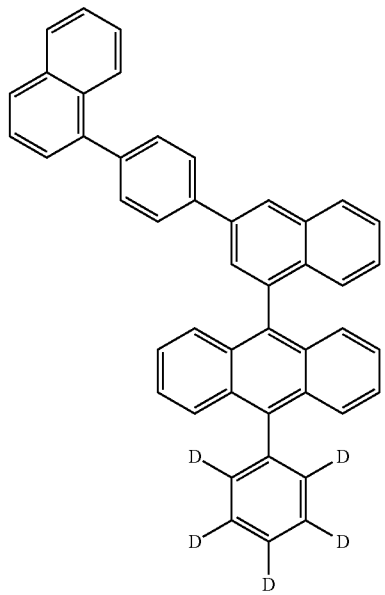
[Chemical Formula 74]
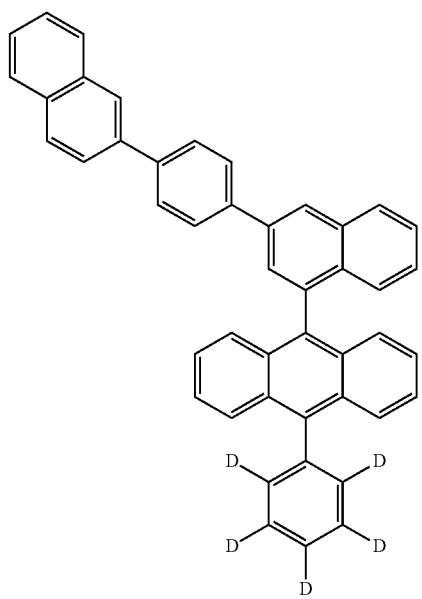

[Chemical Formula 75]
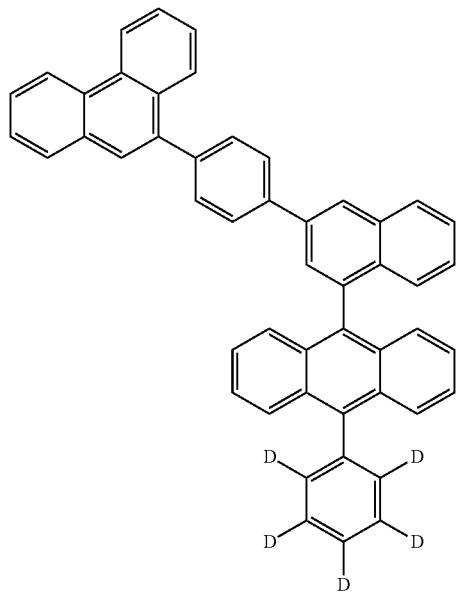
[Chemical Formula 76]
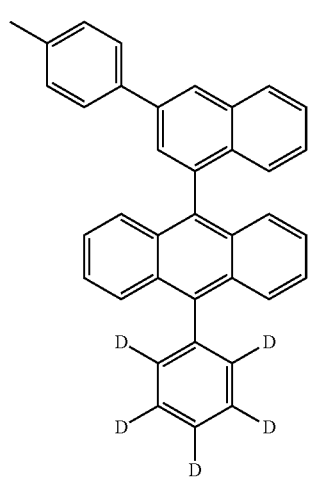
[Chemical Formula 77]
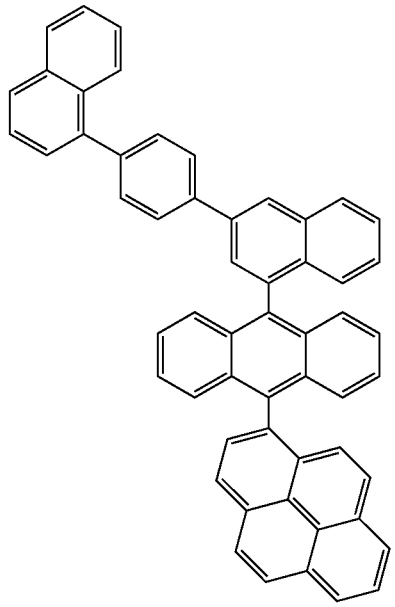
[Chemical Formula 78]
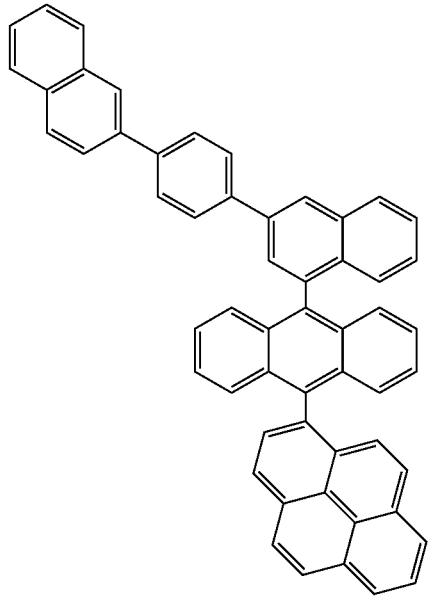

[Chemical Formula 79]

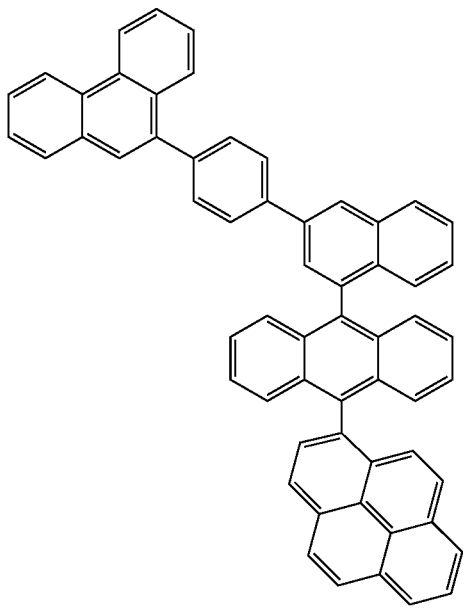

[Chemical Formula 80]

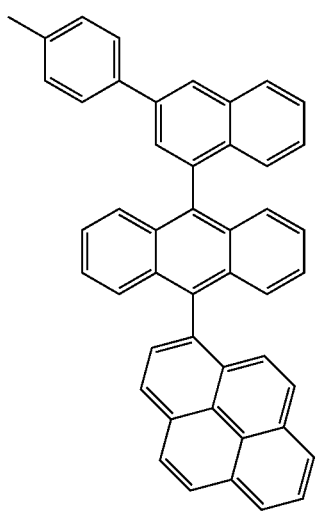

Meanwhile, each of the compounds represented by Chemical Formulas A to D, which account for materials useful for the electron density control layer of the present disclosure, has a substituted or unsubstituted arylene of 6 to 50 carbon atoms or a substituted or unsubstituted heteroarylene of 2 to 50 carbon atoms bonded at position 10 on the anthracene ring moiety, and a linker L bonded at position 9 on the anthracene ring moiety, the linker L being linked to the dibenzofuran ring of the following Diagram 1 at the position 1 or 2 of the dibenzofuran ring.

[Diagram 1]

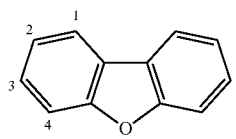

In one embodiment, the substituents $Ar_1$ and $Ar_2$ of Chemical Formulas A to D may be a substituted or unsubstituted aryl of 6 to 50 carbon atoms and preferably a substituted or unsubstituted aryl of 6 to 18 carbon atoms.

As illustrated in Chemical Formulas B and D, the dibenzofuran ring connected (through the linker L) to the anthracene moiety of the anthracene derivative according to the present disclosure forms a 5-membered ring with the structural formula $Q_1$ or $Q_2$. In Chemical Formula B, for example, the substituents $R_{12}$ and $R_{13}$, or an adjacent two of the substituents $R_{14}$ to $R_{17}$ within the dibenzofuran ring moiety may be respective single bonds to form a 5-membered ring as a fused ring together with a carbon atom to which substituents $R_{22}$ and $R_{23}$ of Structural Formula $Q_1$ are bonded. In Chemical Formula D, an adjacent two of the substituents $R_{41}$ to $R_{43}$ or an adjacent two of the substituents $R_{44}$ to $R_{47}$ within the dibenzofuran ring moiety may be respective single bonds to form a 5-membered ring as a fused ring together with a carbon to which substituents $R_{52}$ and $R_{53}$ of Structural Formula $Q_2$ are bonded. In both cases, an adjacent two of the intracyclic carbon atoms that are not bonded with the linker L within the dibenzofuran ring may further form a fused ring.

According to some embodiments of the present disclosure, the substituents $R_{22}$ and $R_{23}$ of Structural Formula $Q_1$ in Chemical Formula B may be the same or different, and are each independently a substituted or unsubstituted aryl of 6 to 24 carbon atoms, and the substituents $R_{52}$ and $R_{53}$ of Structural Formula $Q_2$ in Chemical Formula D may be the same or different, and are each independently a substituted or unsubstituted aryl of 6 to 24 carbon atoms.

Meanwhile, the compound of Chemical Formula B or D may include an additional fused ring as the substituents $R_{22}$ and $R_{23}$ in Chemical Formula B may be connected to each other to form a ring or as the substituents $R_{52}$ and $R_{53}$ in Chemical Formula D may be connected to each other to form a ring.

For instance, when the substituents $R_{52}$ and $R_{53}$ are connected to each other, the compound represented by Chemical Formula D may include a substituted or unsubstituted spirobisfluorene ring as illustrated in the following Diagram 2. Likewise, the compound represented by Chemical Formula B may include a substituted or unsubstituted spirobisfluorene ring when the substituents $R_{22}$ and $R_{23}$ are connected to each other.

[Diagram 2]

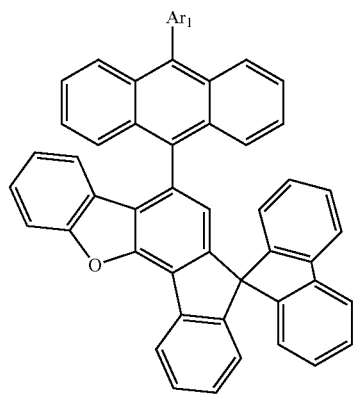

In greater detail, the compound, represented by one of Chemical Formulas A to D, available for the electron density control layer, may be selected from among Compounds 201 to 338, but is not limited thereto.
<Compound 201>
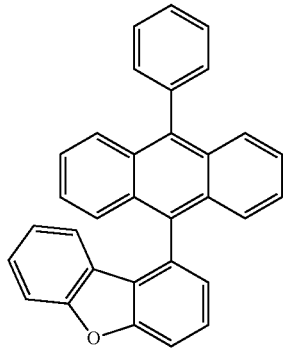
<Compound 202>
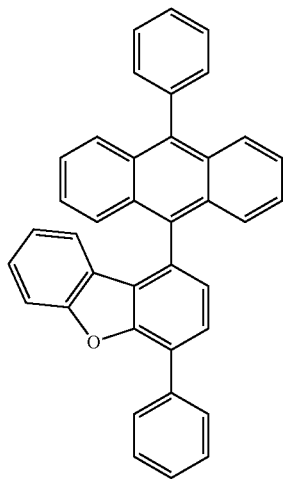
<Compound 203>
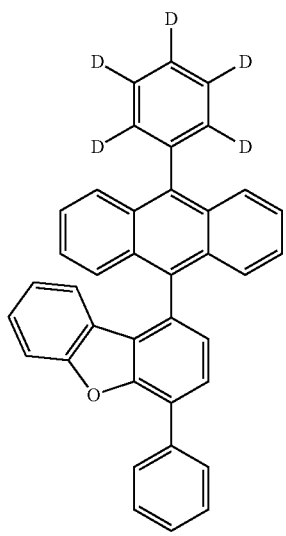
<Compound 204>
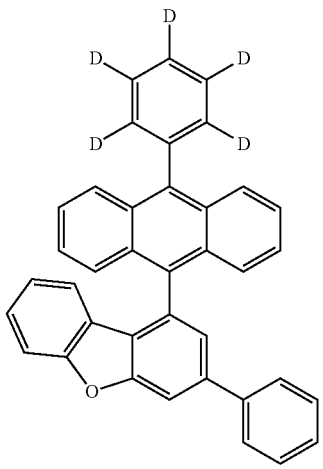
<Compound 205>
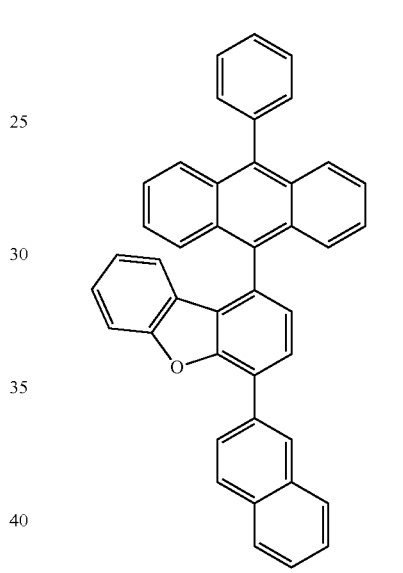
<Compound 206>
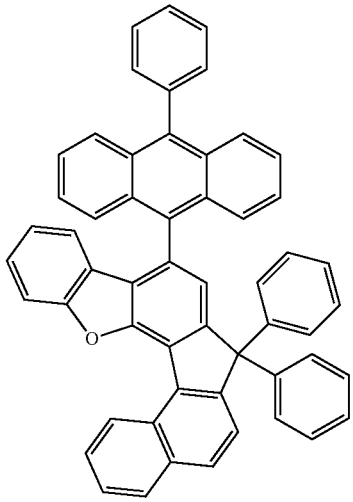

<Compound 207>
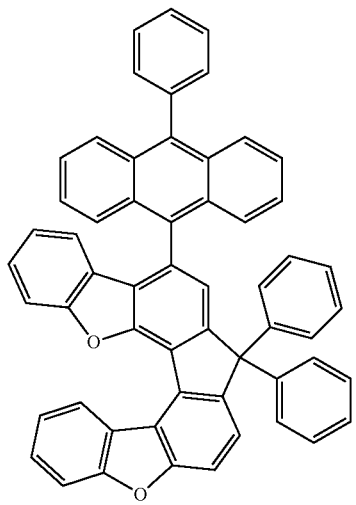
<Compound 208>
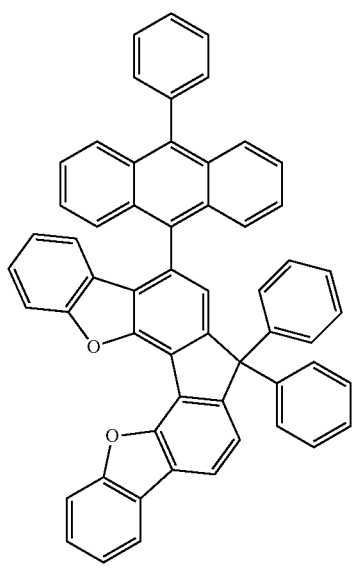
<Compound 209>
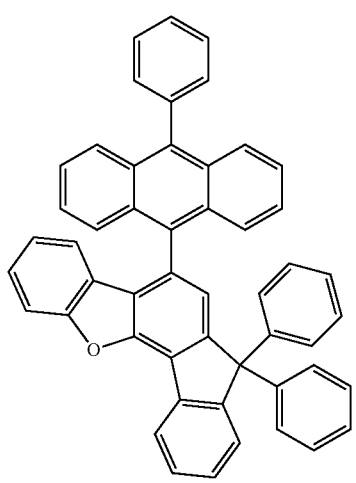
<Compound 210>
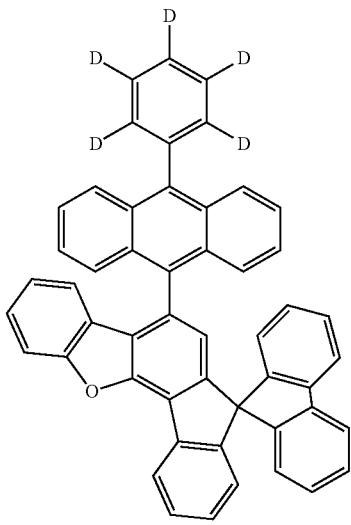
<Compound 211>
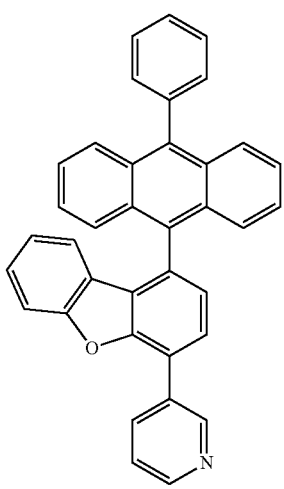
<Compound 212>
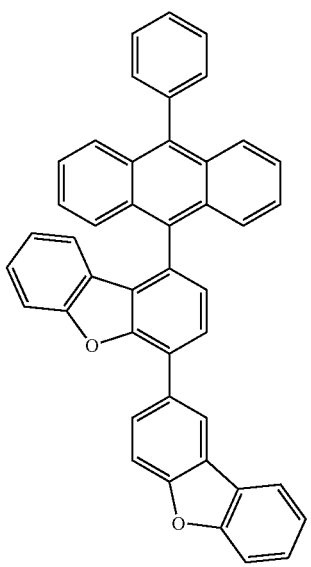

<Compound 213>
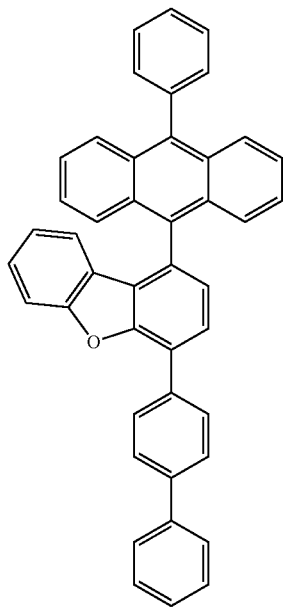
<Compound 214>
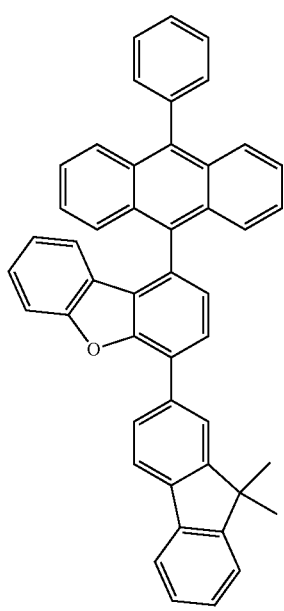
<Compound 215>
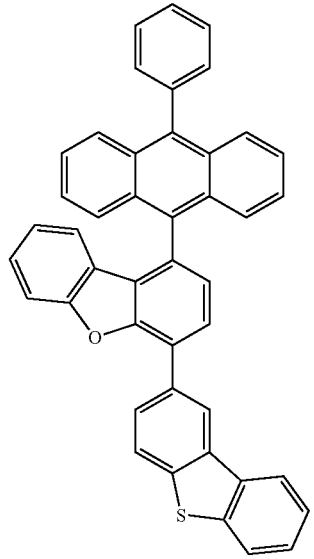
<Compound 216>
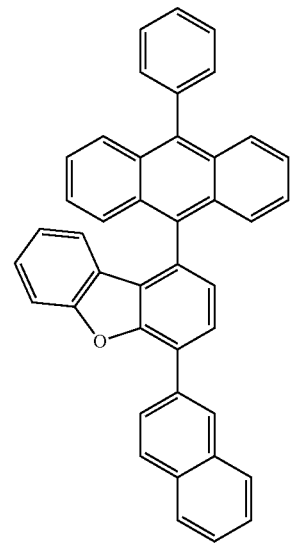
<Compound 217>
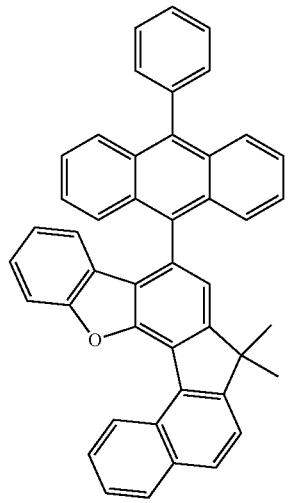

<Compound 218>
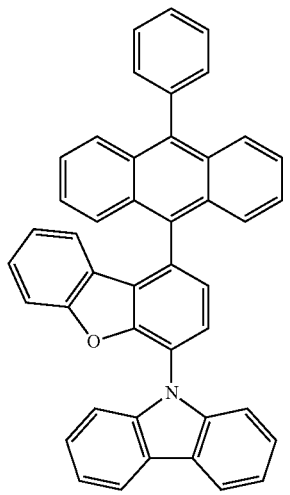
<Compound 219>
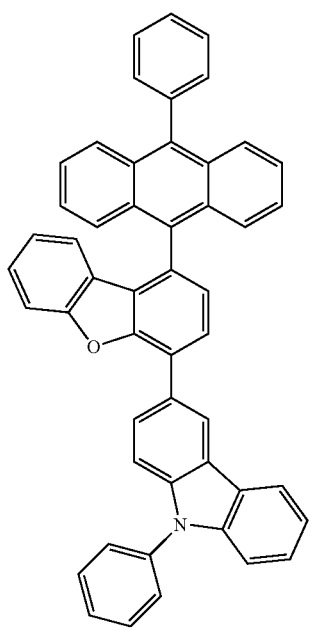
<Compound 220>
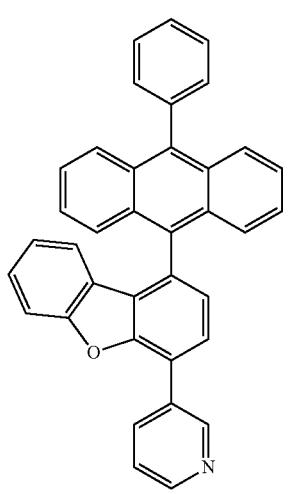
<Compound 221>
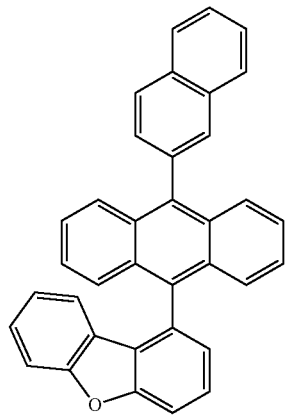
<Compound 222>
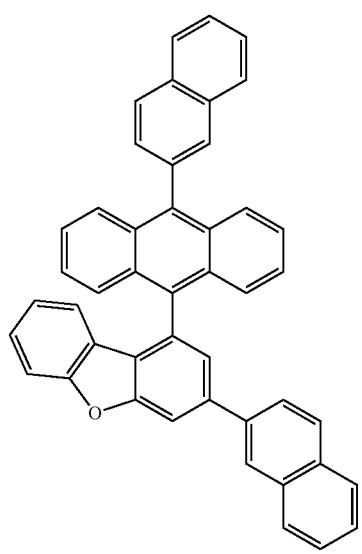
<Compound 223>
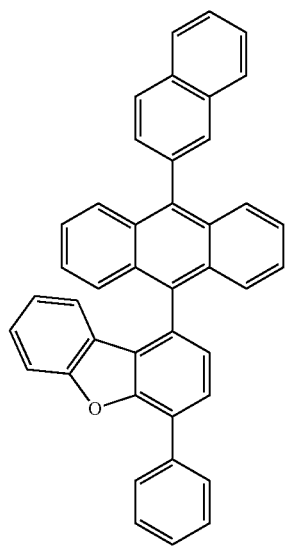

<Compound 224>
<Compound 225>
<Compound 226>
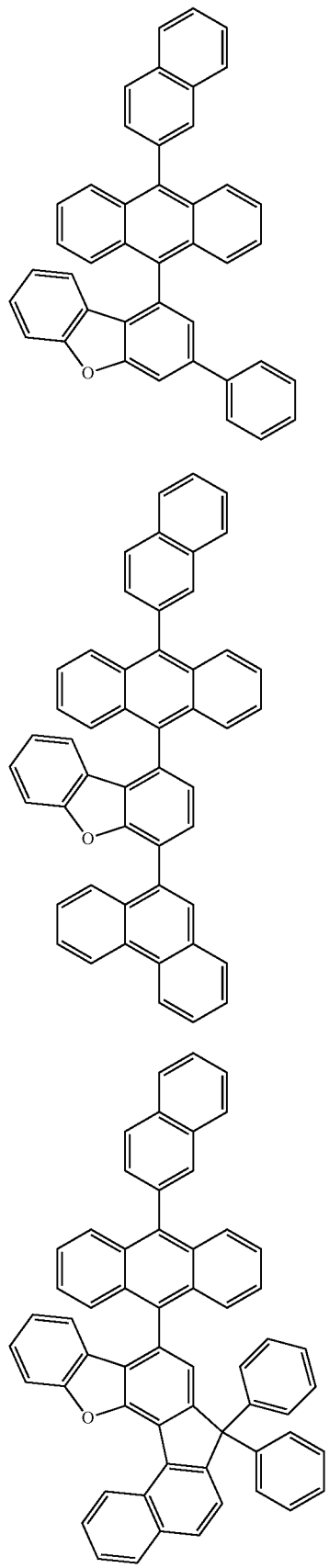
<Compound 227>
<Compound 228>

<Compound 229>
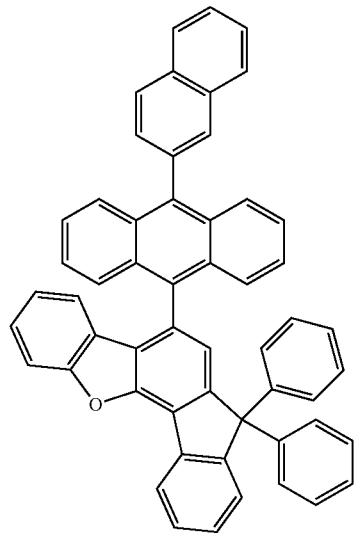
<Compound 230>
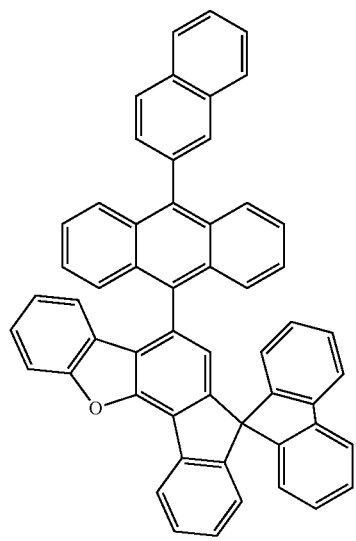
<Compound 231>
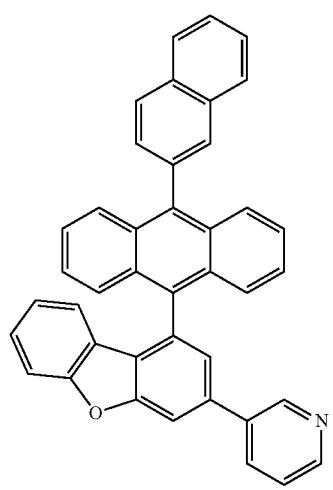
<Compound 232>
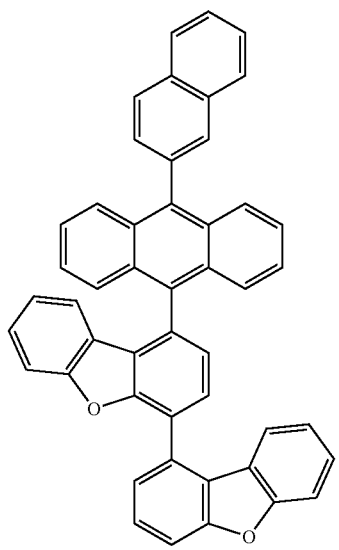
<Compound 233>
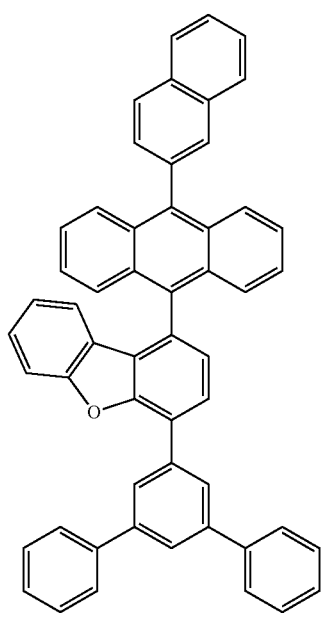

<Compound 234>
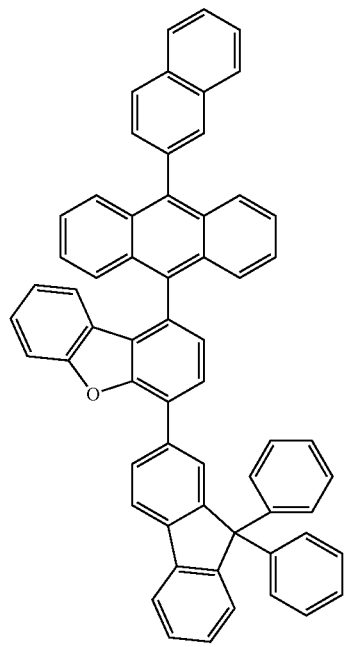
<Compound 236>
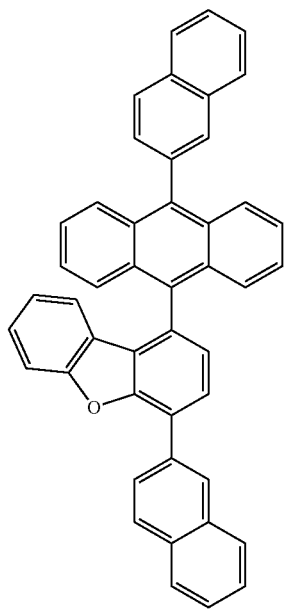
<Compound 235>
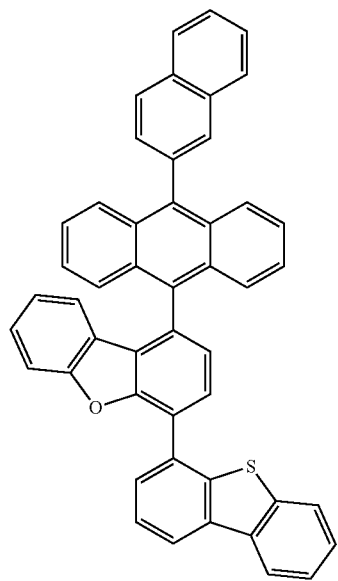
<Compound 237>
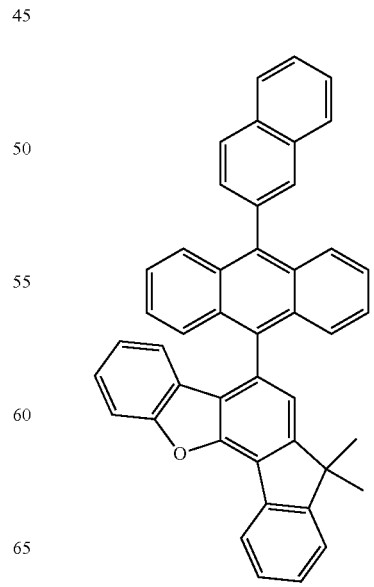

-continued
<Compound 238>
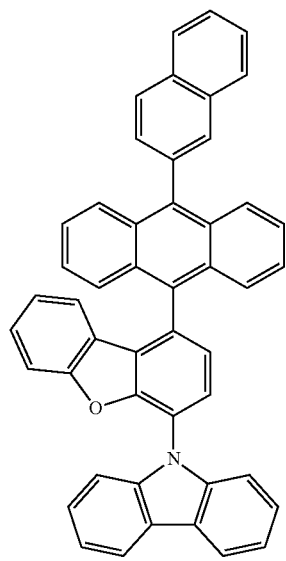
<Compound 239>
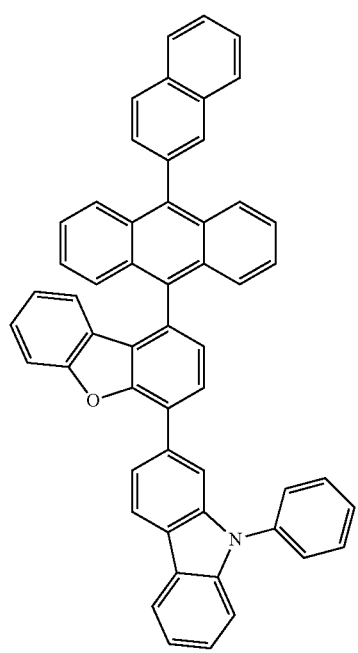
-continued
<Compound 240>
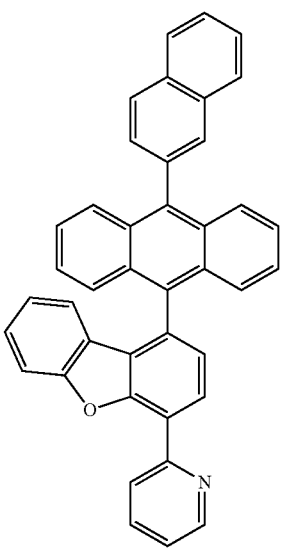
<Compound 241>
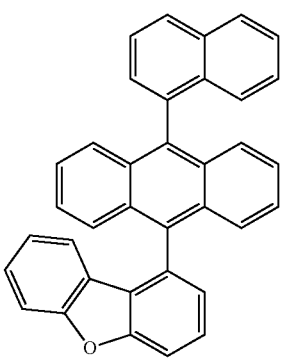
<Compound 242>

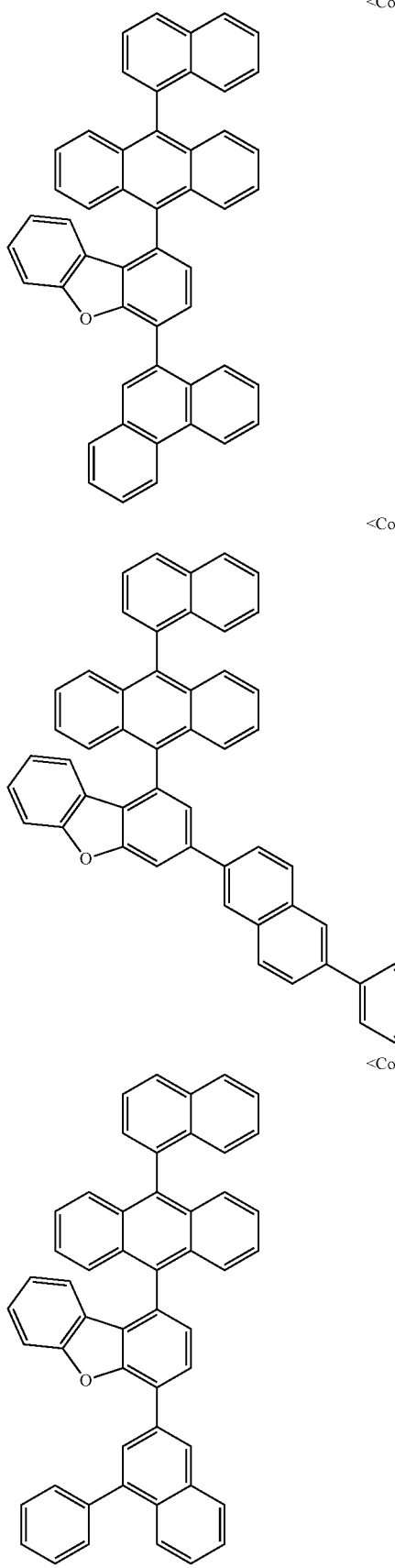
<Compound 243>
<Compound 244>
<Compound 245>
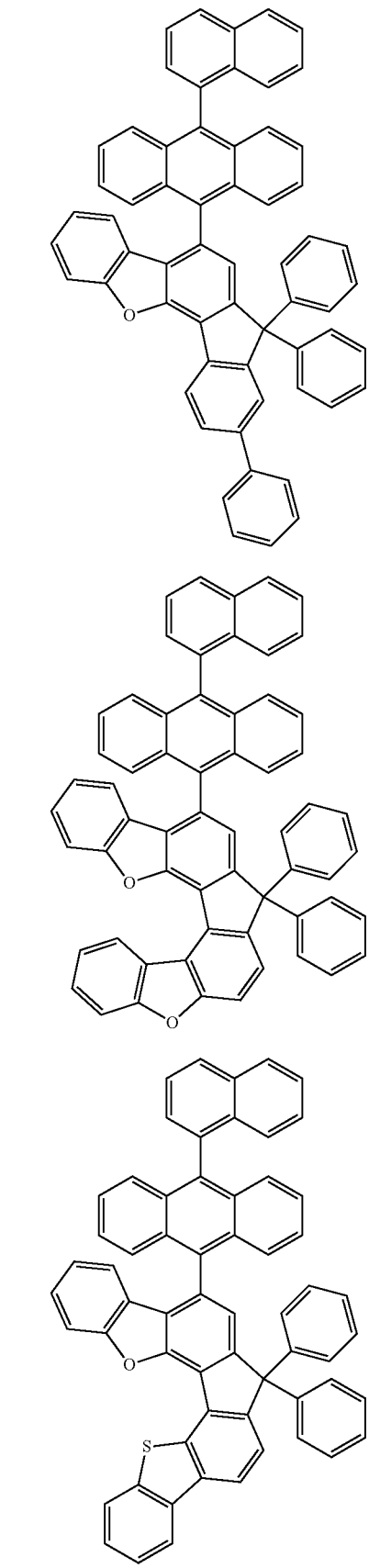
<Compound 246>
<Compound 247>
<Compound 248>

<Compound 249>
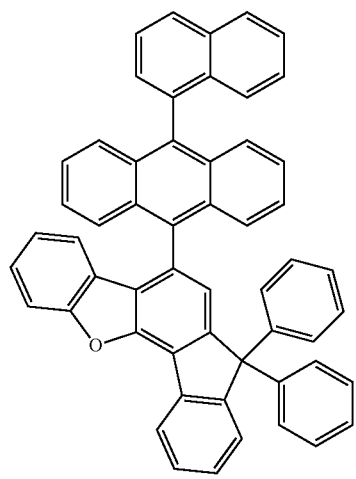
<Compound 250>
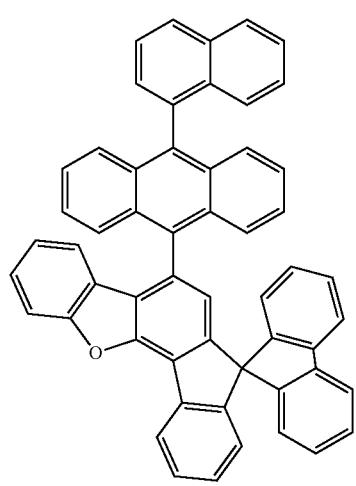
<Compound 251>
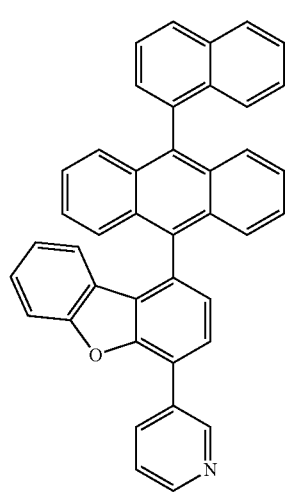
<Compound 252>
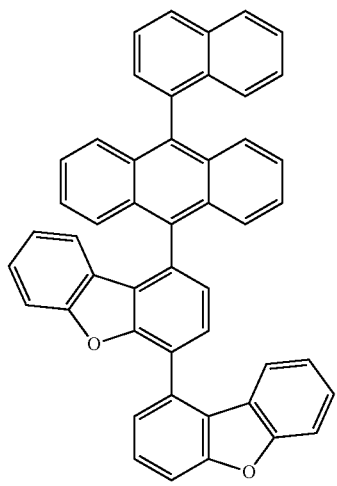
<Compound 253>
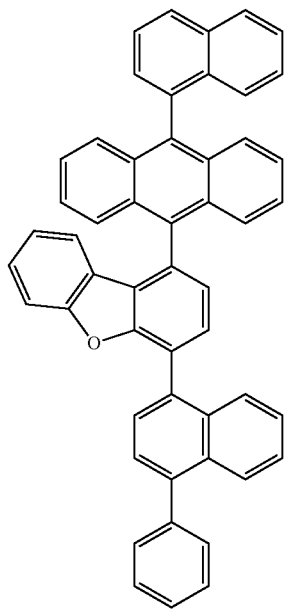

<Compound 254>
<Compound 255>
<Compound 256>
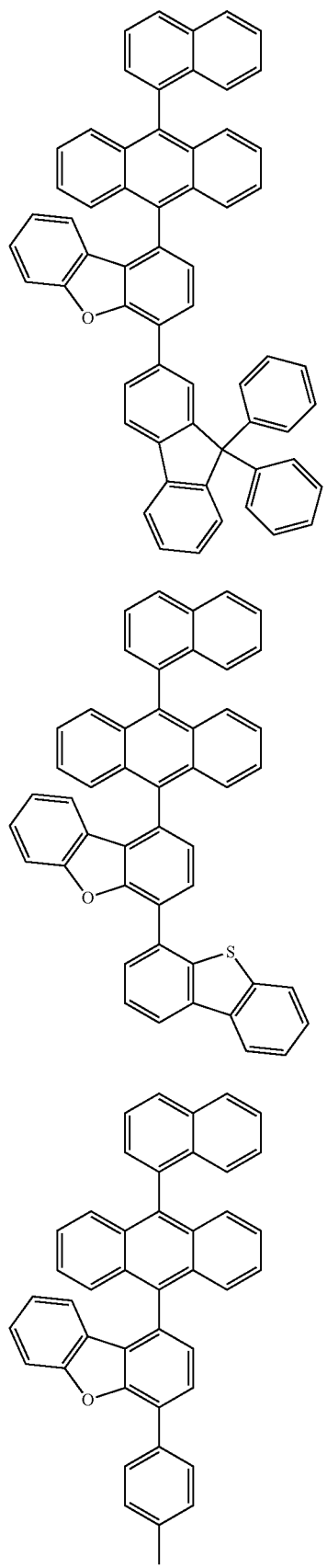
<Compound 257>
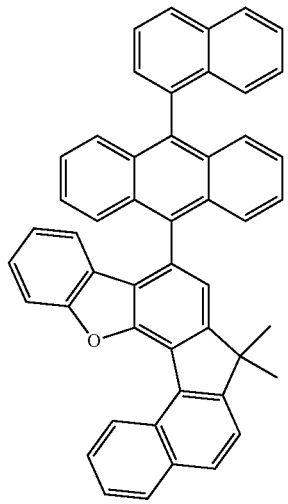
<Compound 258>
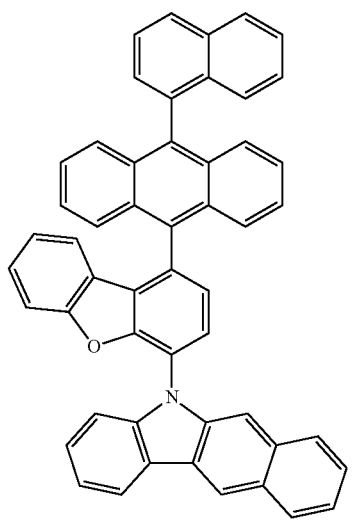
<Compound 259>
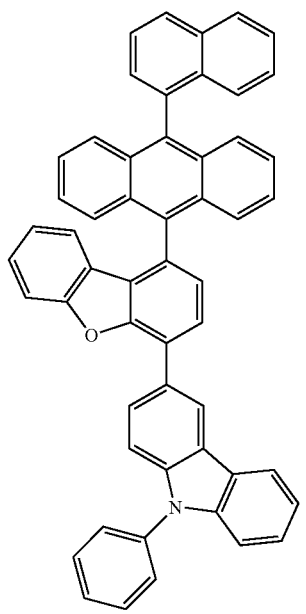

<Compound 260>
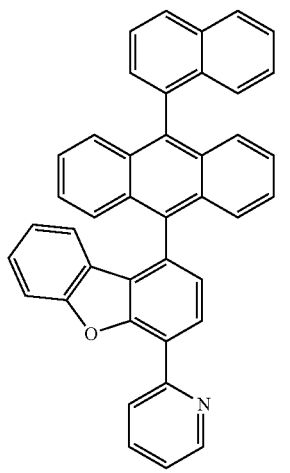
<Compound 261>
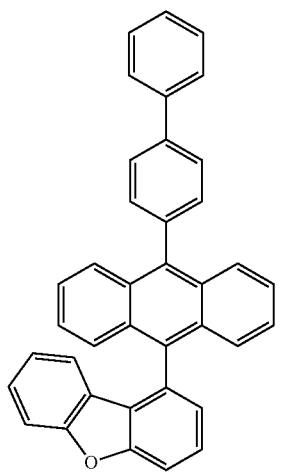
<Compound 262>
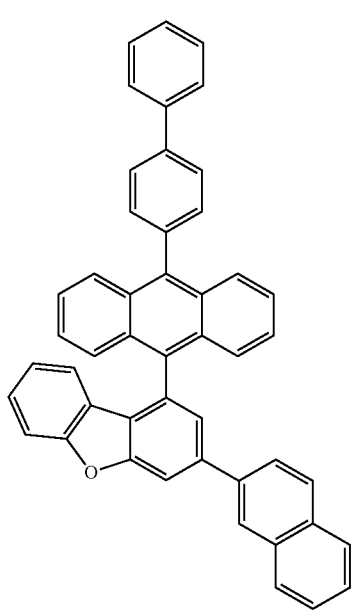
<Compound 263>
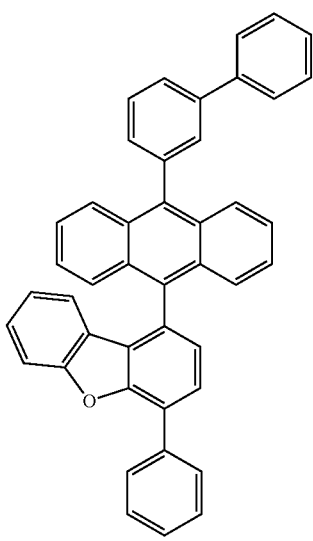
<Compound 264>
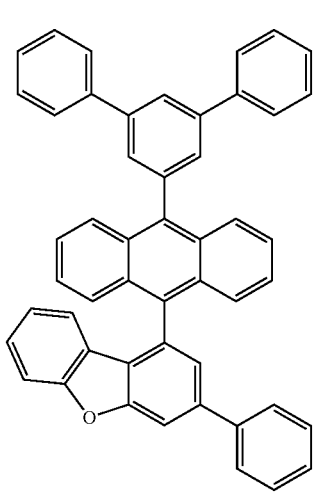
<Compound 265>
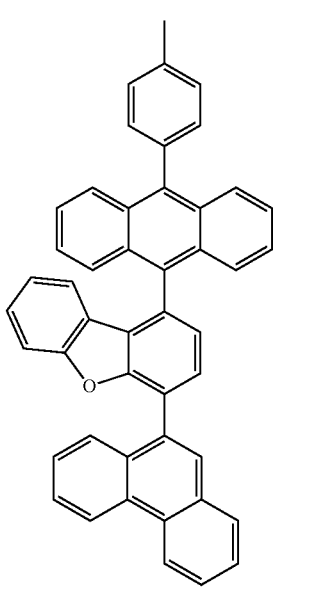

<Compound 266>
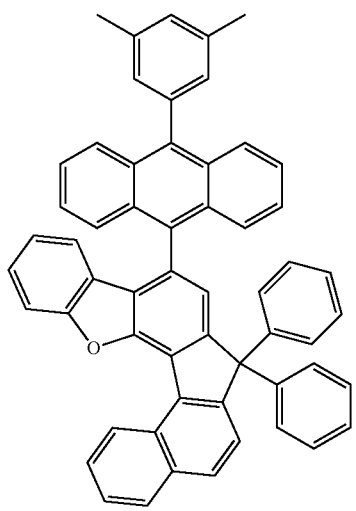
<Compound 267>
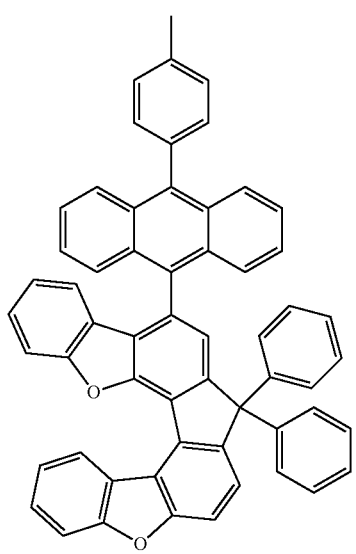
<Compound 268>
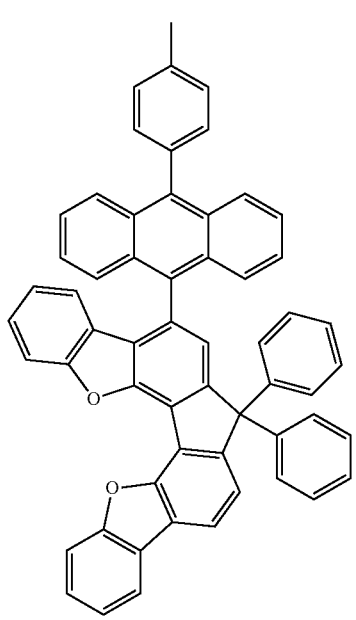
<Compound 269>
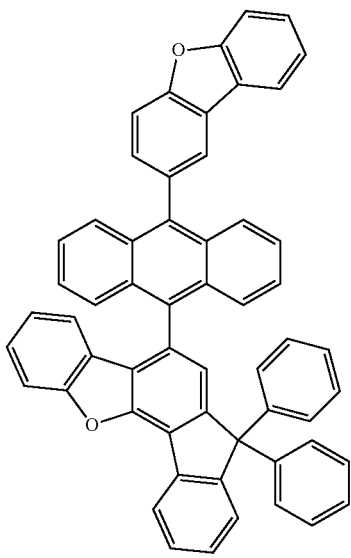
<Compound 270>
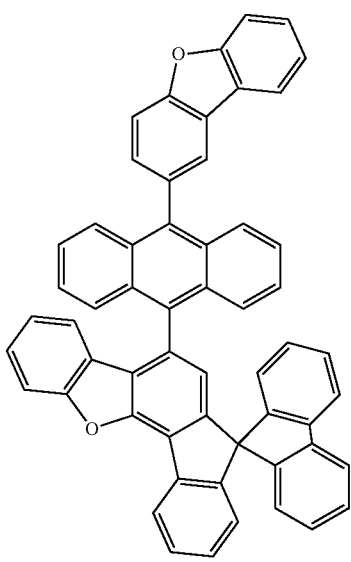
<Compound 271>
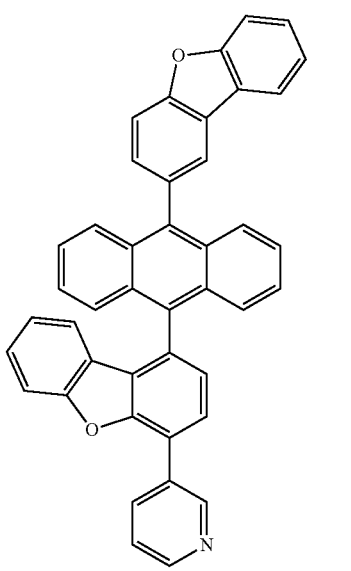

<Compound 272>
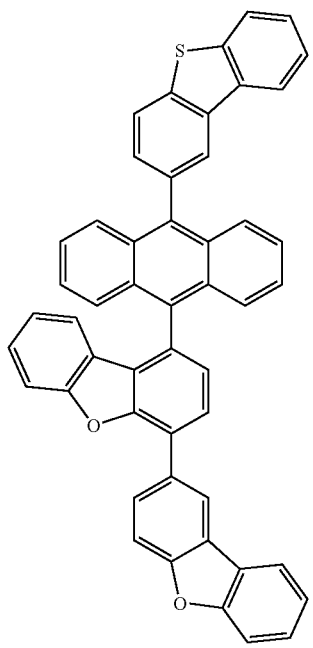
<Compound 273>
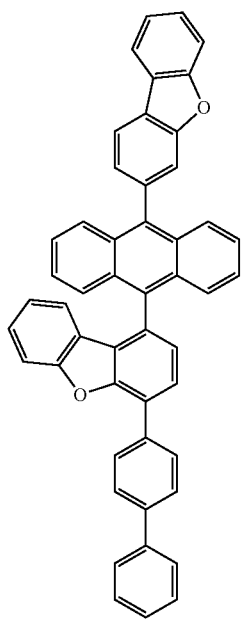
<Compound 274>
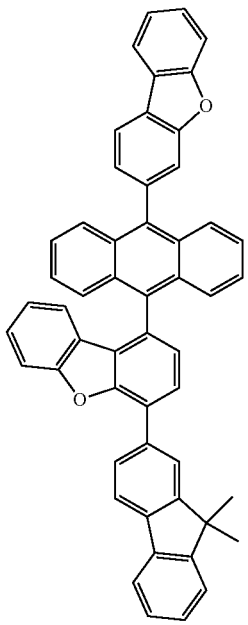
<Compound 275>
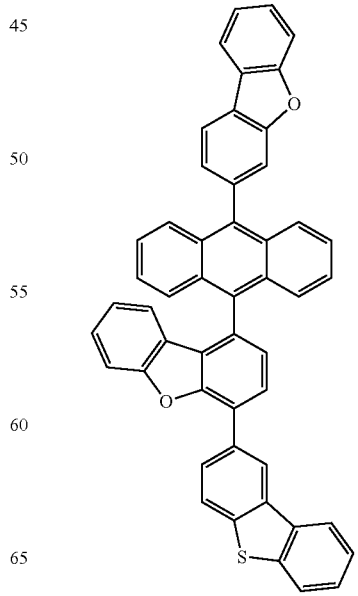

<Compound 276>
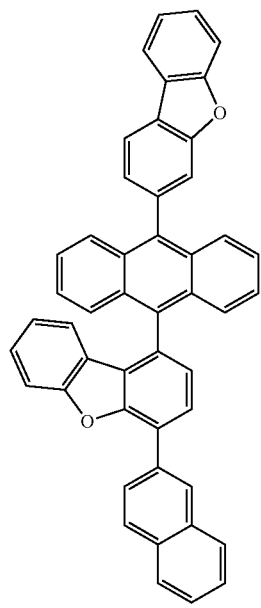
<Compound 278>
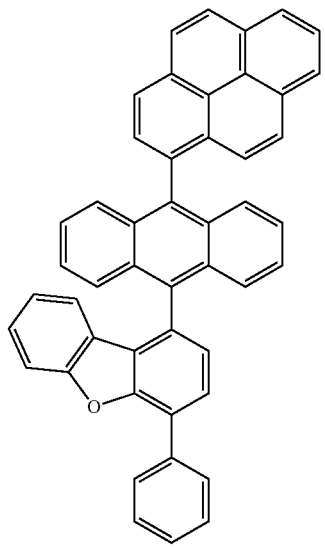
<Compound 279>
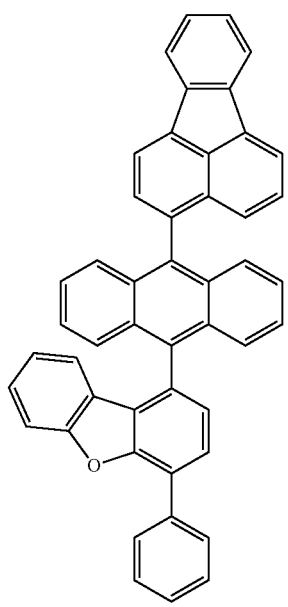
<Compound 277>
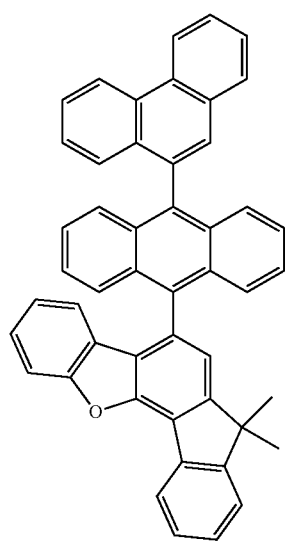
<Compound 280>
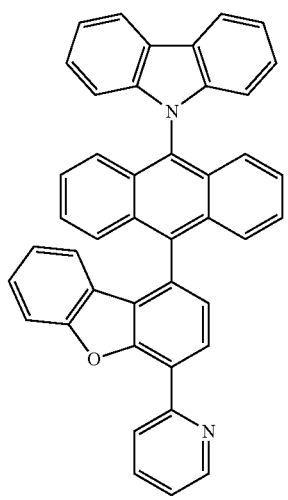

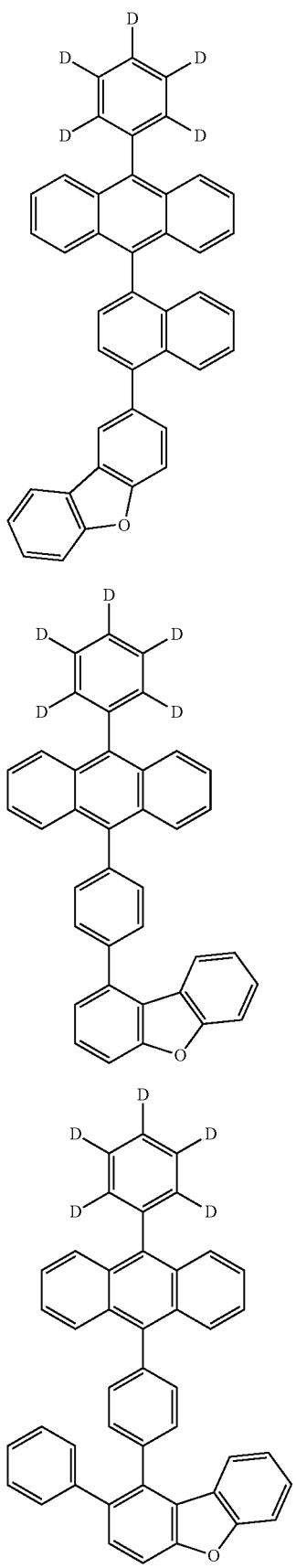
<Compound 281>
<Compound 282>
<Compound 283>
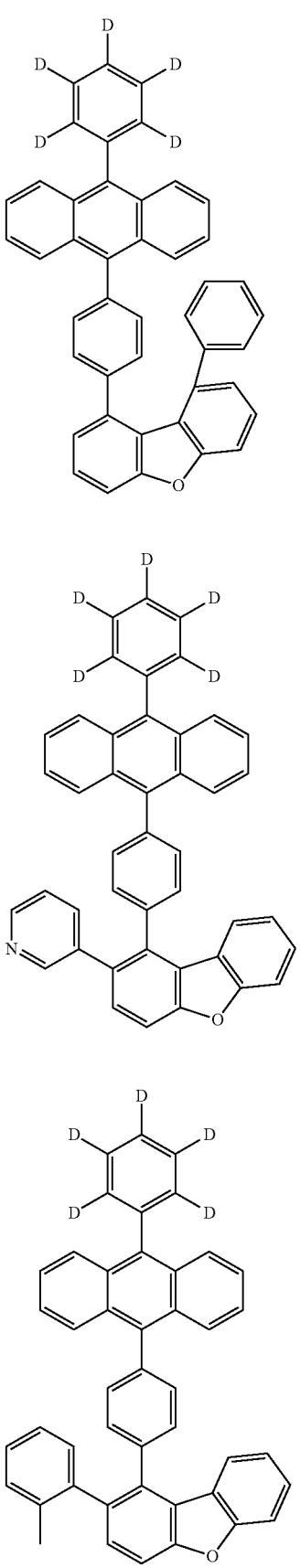
<Compound 284>
<Compound 285>
<Compound 286>

<Compound 287>
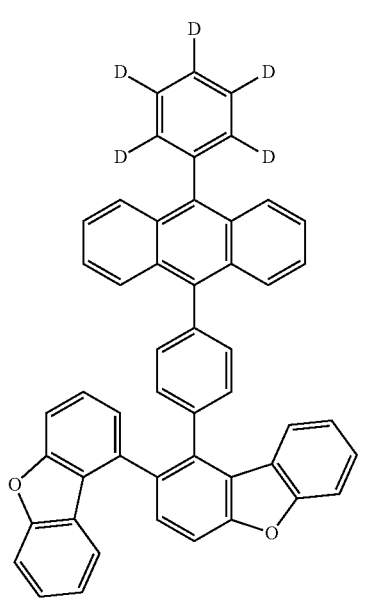
<Compound 288>
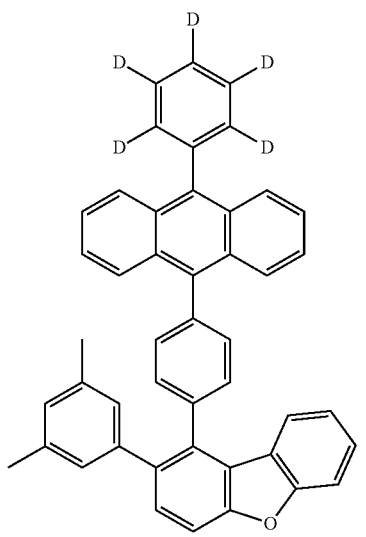
<Compound 289>
<Compound 290>
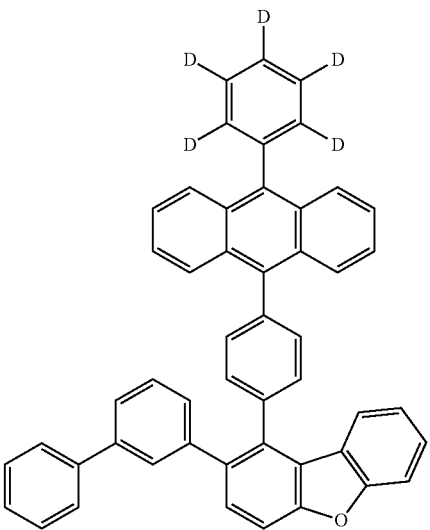
<Compound 291>
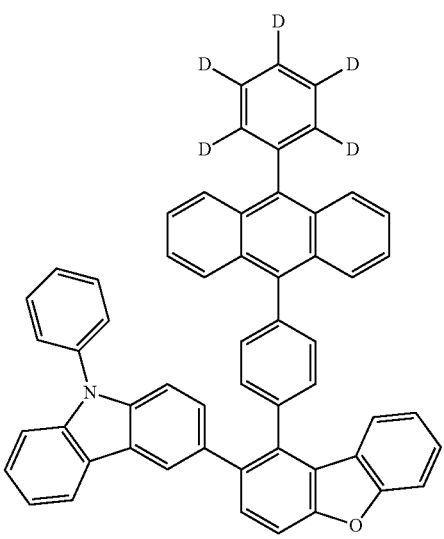
<Compound 292>
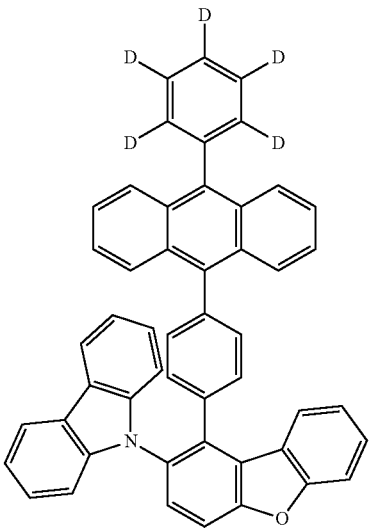

<Compound 293>
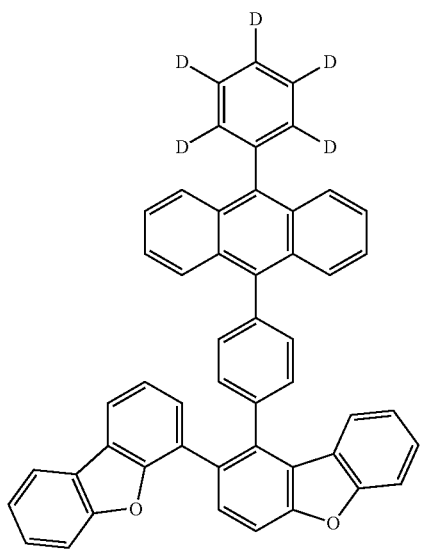
<Compound 294>
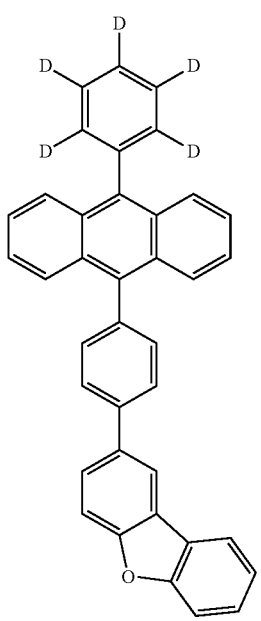
<Compound 295>
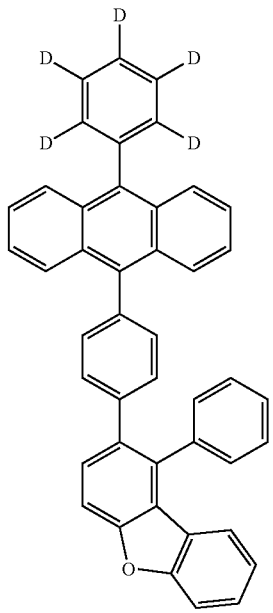
<Compound 296>
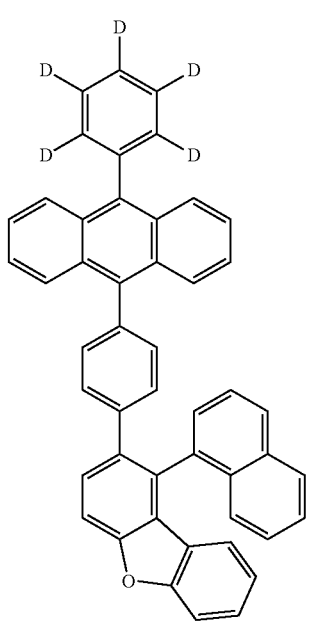

<Compound 297>
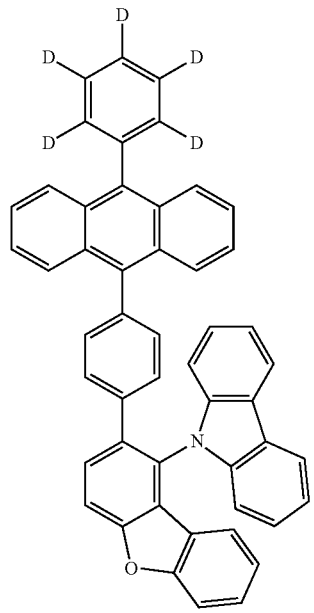
<Compound 299>
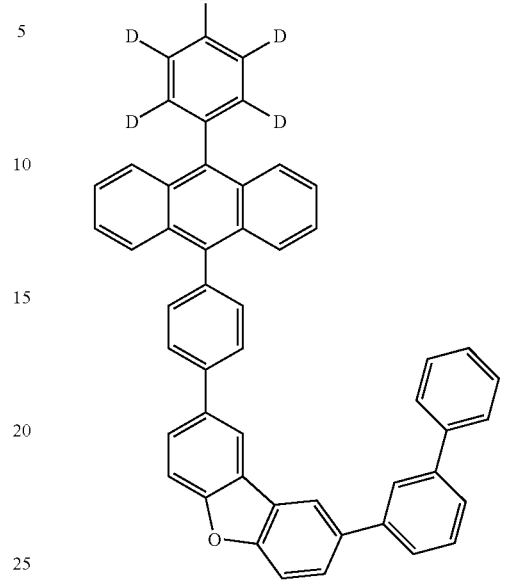
<Compound 298>
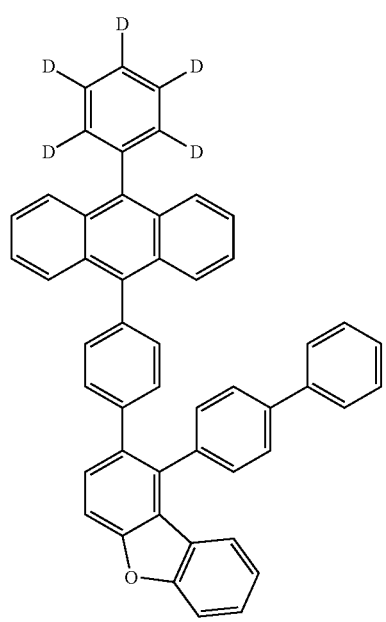
<Compound 300>
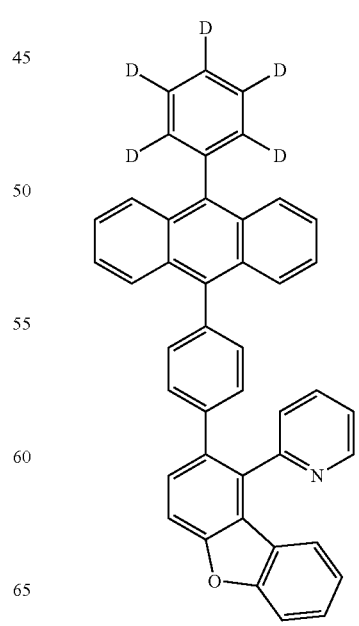

<Compound 301>
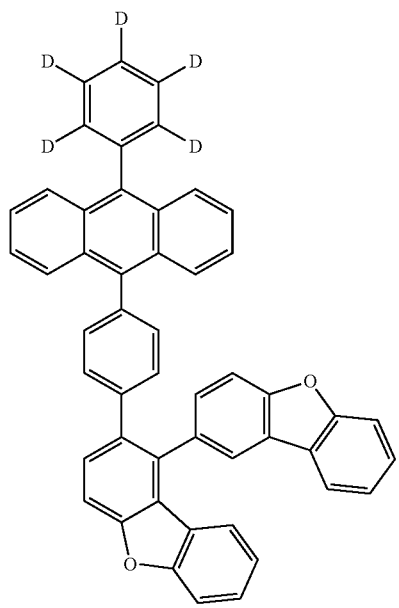
<Compound 302>
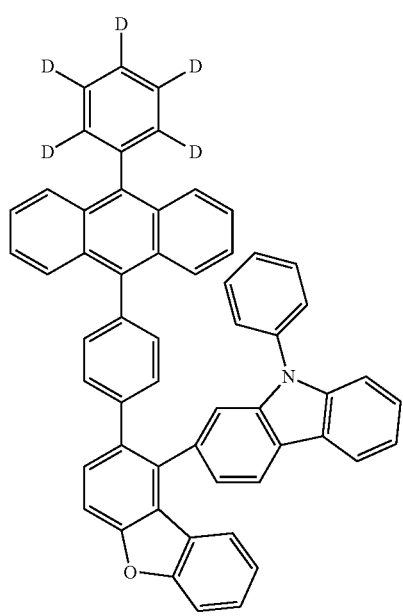
<Compound 303>
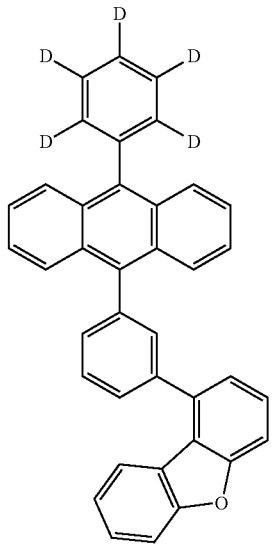
<Compound 304>
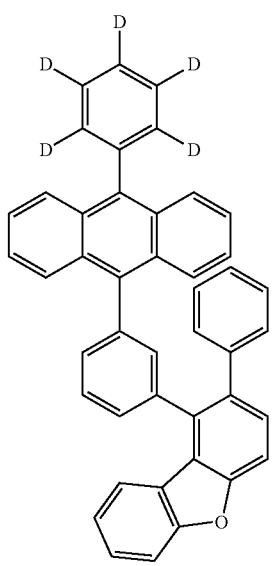

<Compound 305>
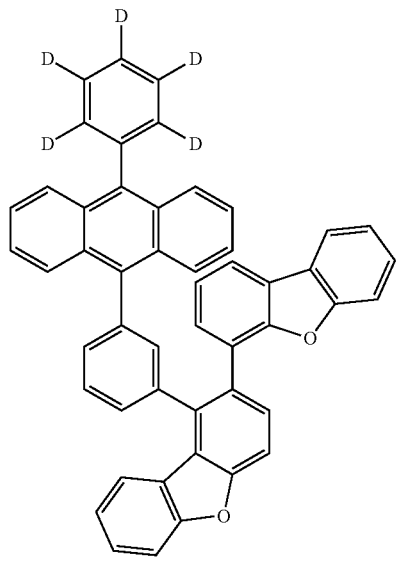
<Compound 306>
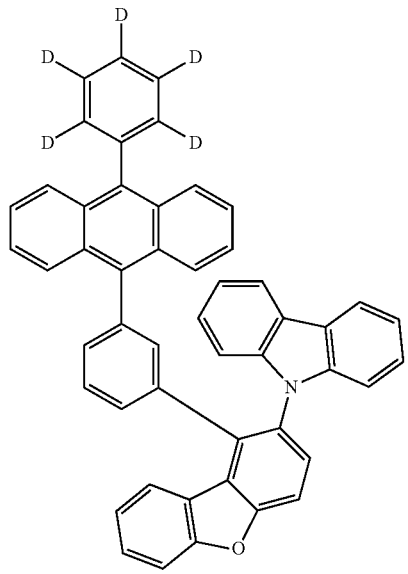
<Compound 307>
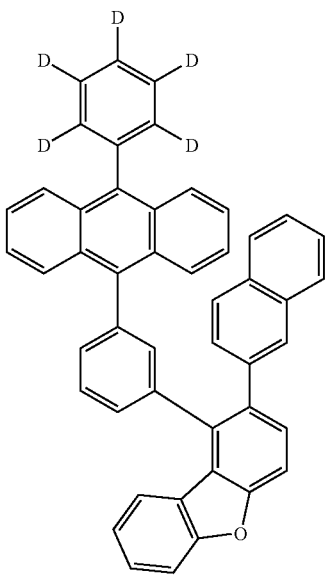
<Compound 308>
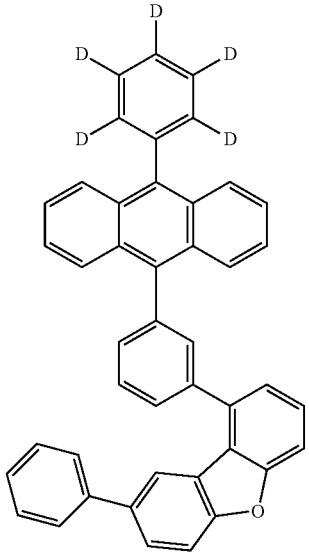

<Compound 309>
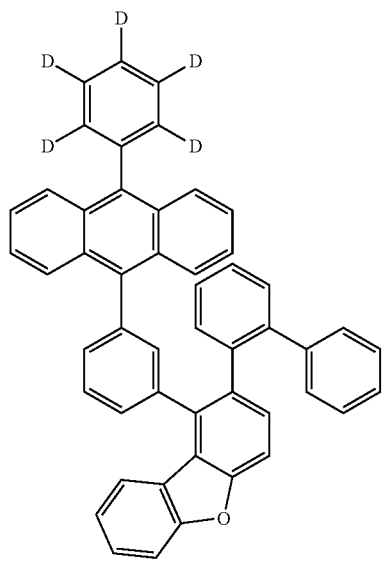
<Compound 311>
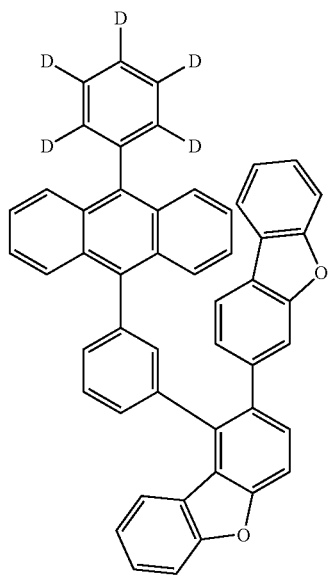
<Compound 310>
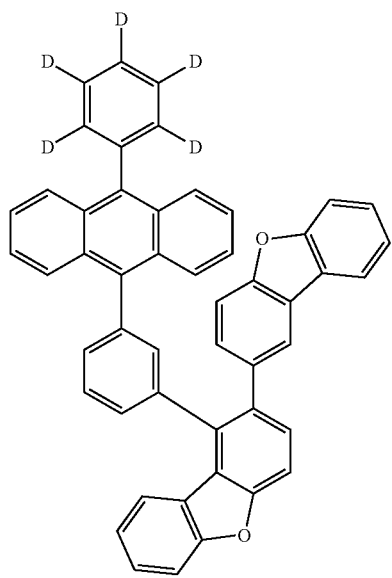
<Compound 312>
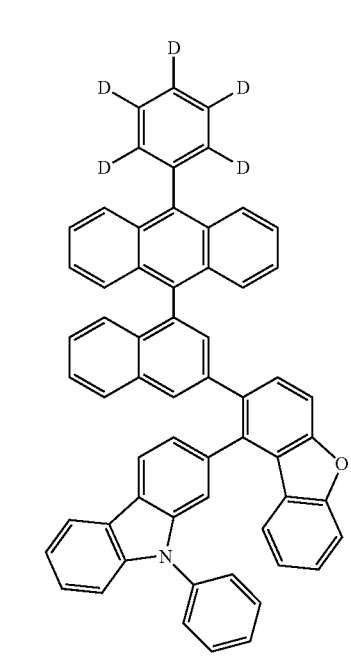

<Compound 313>
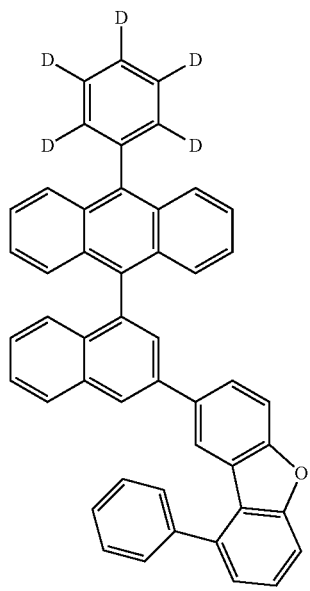
<Compound 315>
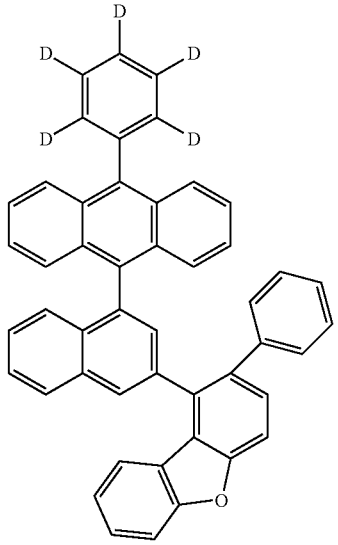
<Compound 314>
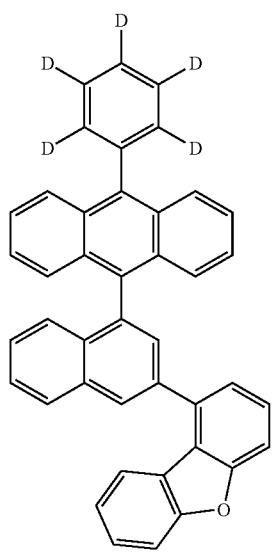
<Compound 316>
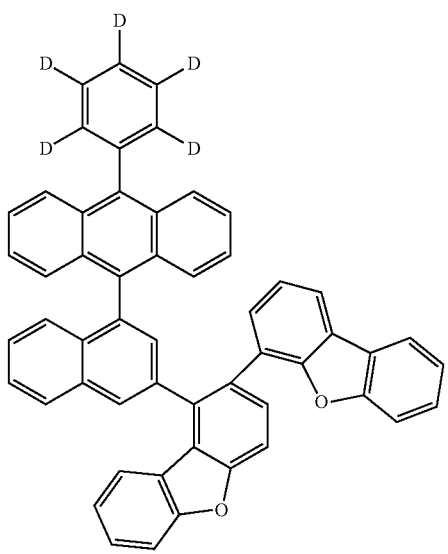

<Compound 317>
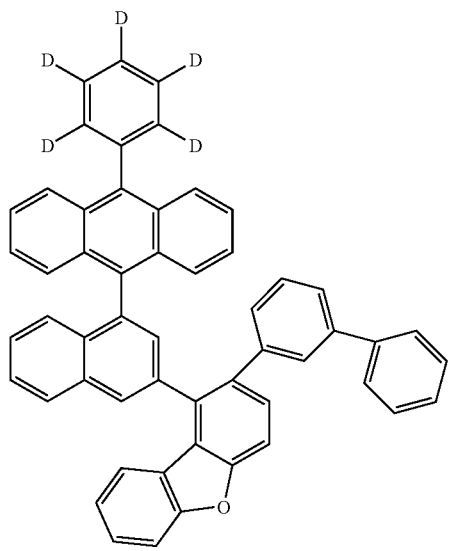
<Compound 318>
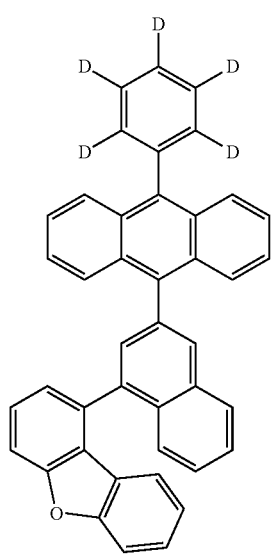
<Compound 319>
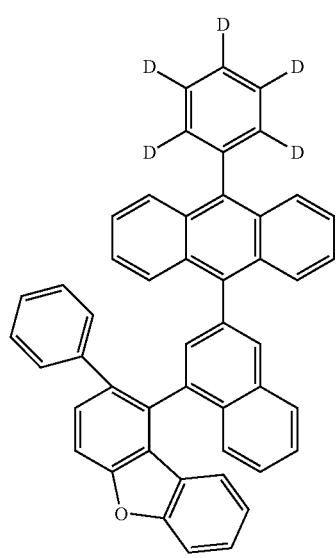
<Compound 320>
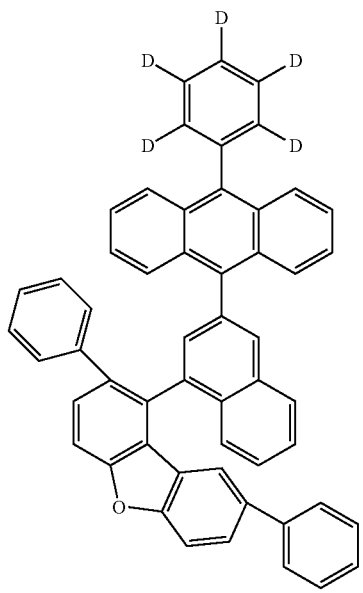
<Compound 321>
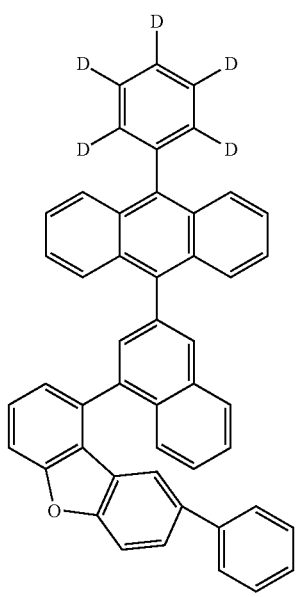

<Compound 322>
<Compound 323>
<Compound 324>
<Compound 325>
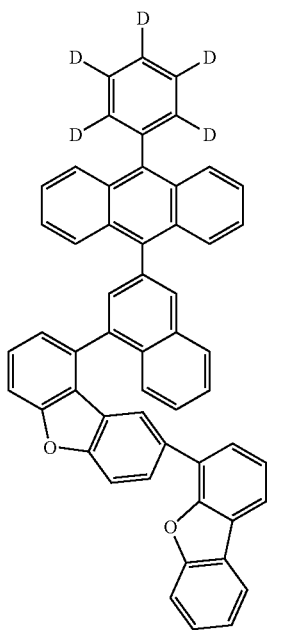
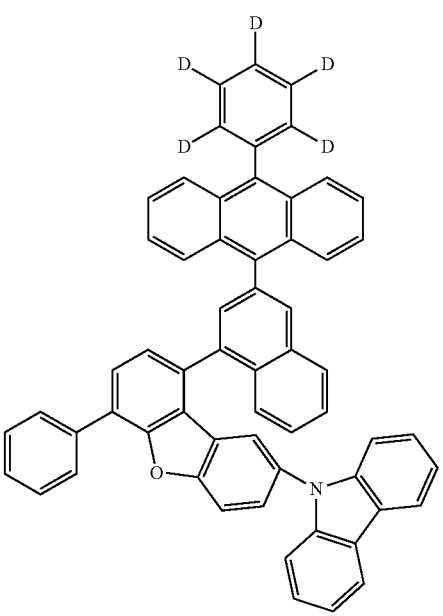

<Compound 326>
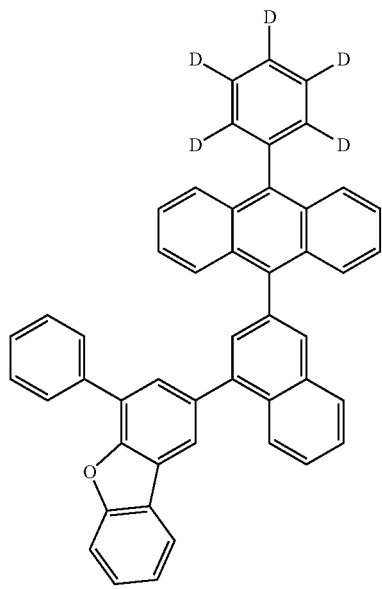
<Compound 328>
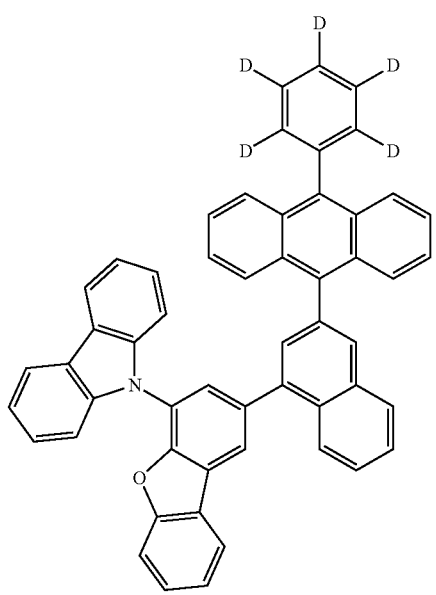
<Compound 327>
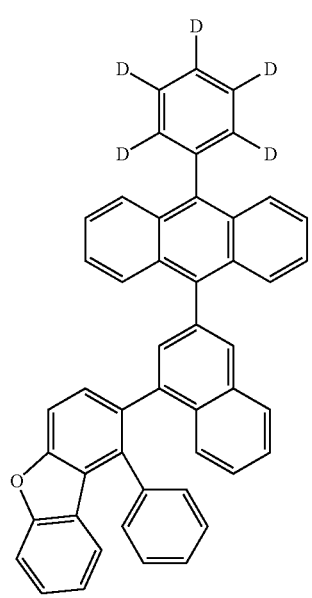
<Compound 329>
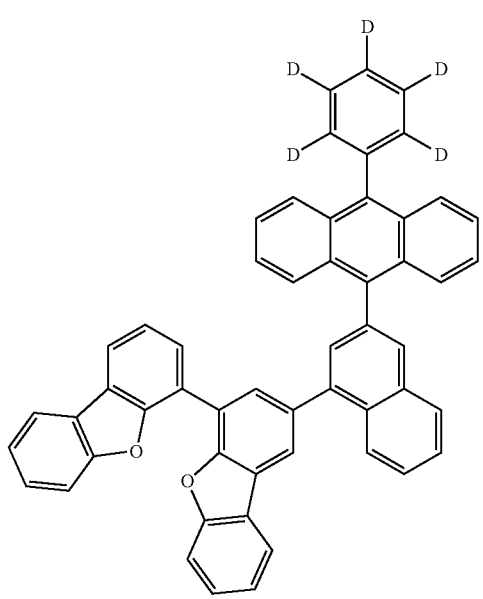

<Compound 330>
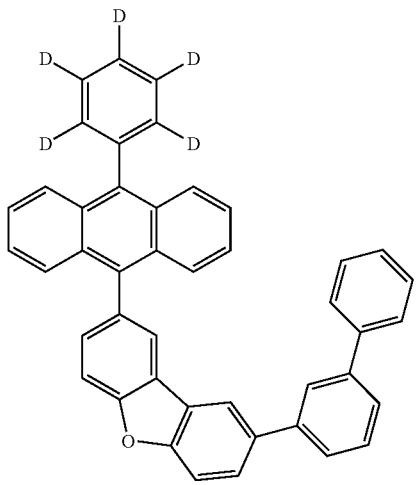
<Compound 333>
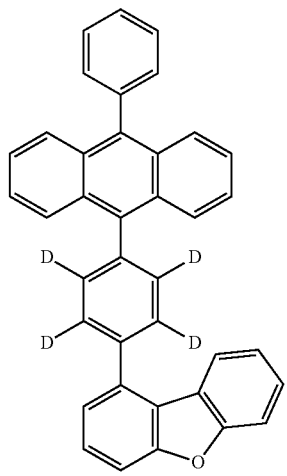
<Compound 331>
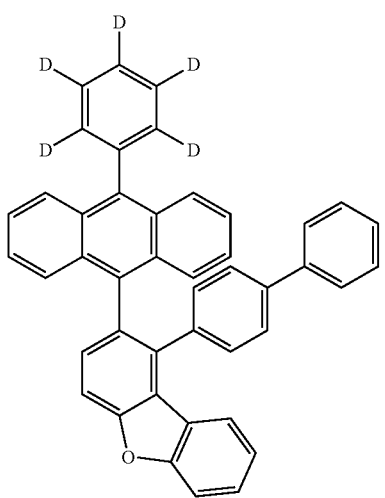
<Compound 334>
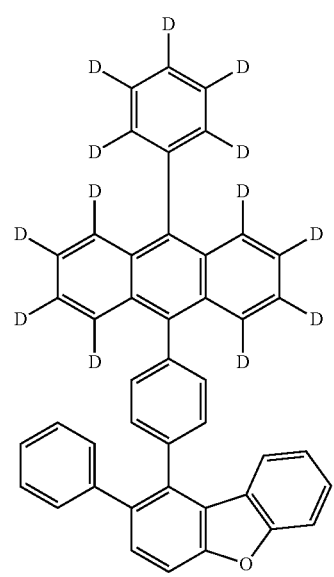
<Compound 332>
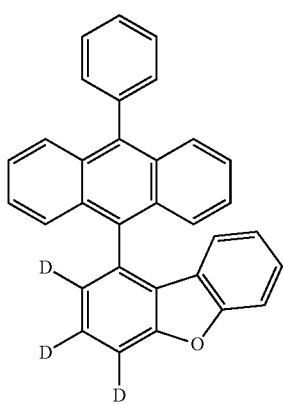
<Compound 335>
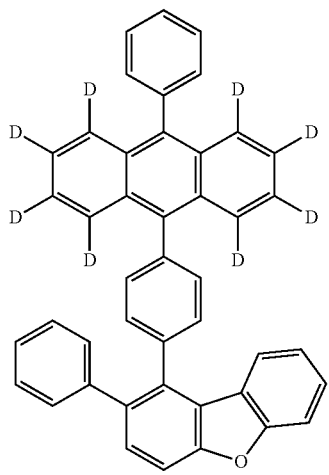

<Compound 336>
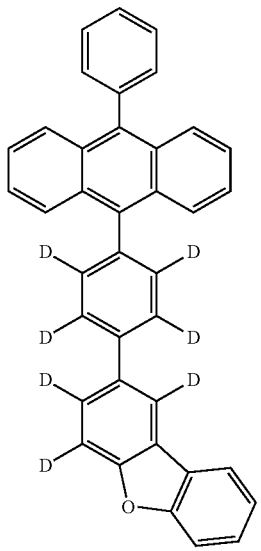
<Compound 337>
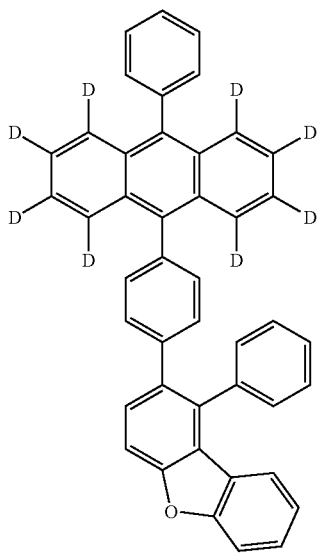
<Compound 338>
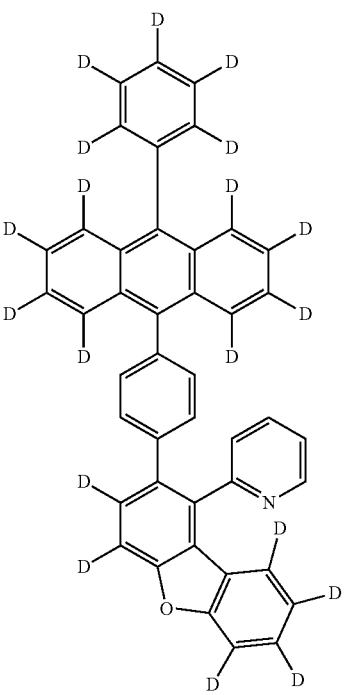
In addition, the dopant useful as another component in the light-emitting layer may include at least one selected from among compounds represented by the following Chemical Formulas I to K:
[Chemical Formula I]
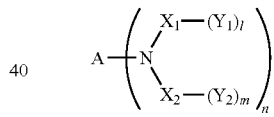
[Chemical Formula J]
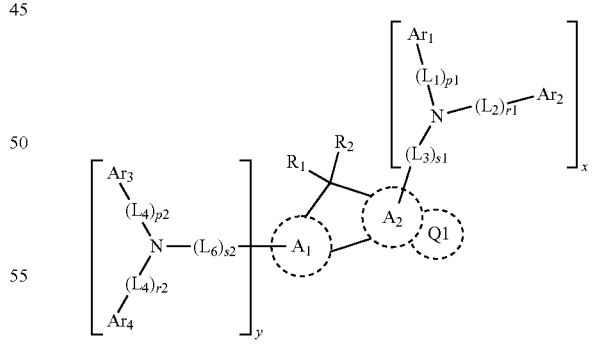

[Chemical Formula K]

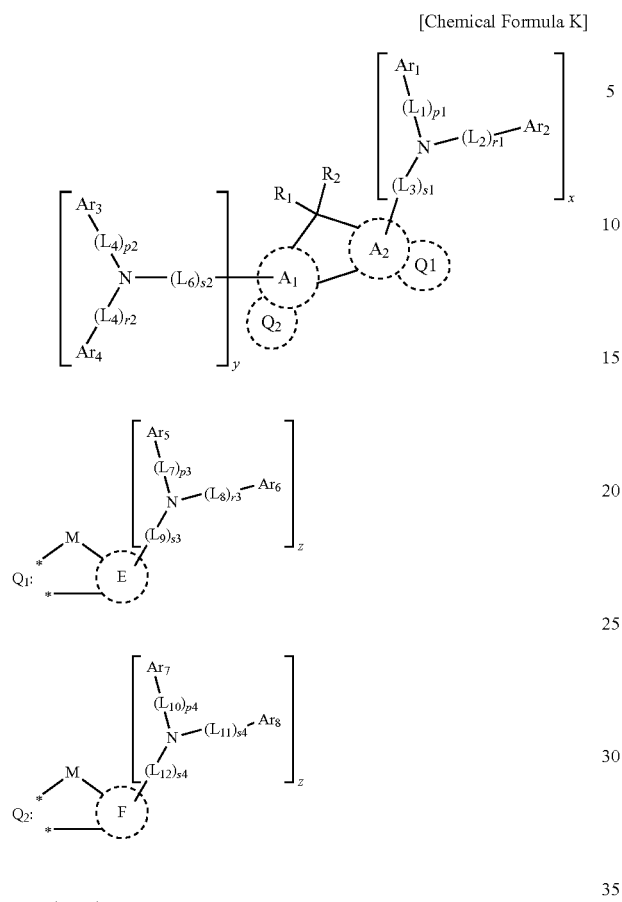

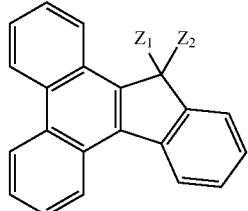
[Chemical Formula A3]

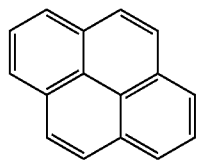
[Chemical Formula A4]

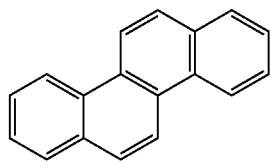
[Chemical Formula A5]

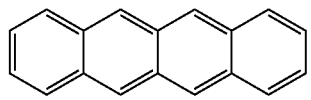
[Chemical Formula A6]

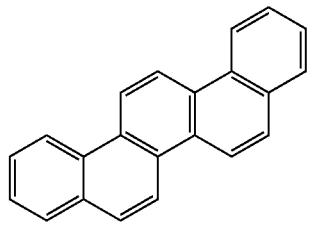
[Chemical Formula A7]

wherein moiety A in [Chemical Formula I] is any one selected from among a substituted or unsubstituted aryl of 5 to 50 carbon atoms, a substituted or unsubstituted heteroaryl of 3 to 50 carbon atoms bearing O, N, or S as a heteroatom, a substituted or unsubstituted arylene of 6 to 60 carbon atoms, and a substituted or unsubstituted heteroarylene of 3 to 50 carbon atoms bearing O, N, or S as a heteroatom;

According to some particular embodiments, the moiety A may be anthracene, pyrene, phenanthrene, indenophenanthrene, chrysene, naphthacene, picene, triphenylene, perylene, or pentacene. In this regard, the moiety A may be any one of the compound represented by the following Chemical Formulas $A_1$ to $A_{10}$:

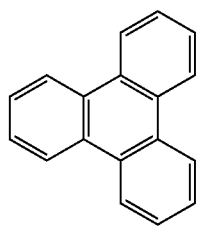
[Chemical Formula A8]

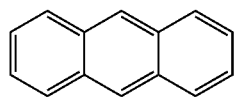
[Chemical Formula A1]

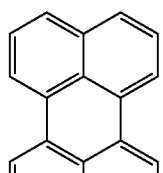
[Chemical Formula A9]

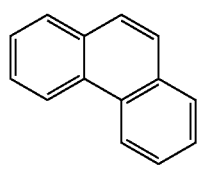
[Chemical Formula A2]

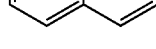
[Chemical Formula A10]

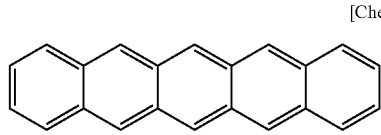

In [Chemical Formula A3],

Z1 and Z1, which may be the same or different, are each independently selected from the group consisting of a hydrogen atom, a deuterium atom, a substituted or unsubstituted alkyl of 1 to 60 carbon atoms, a substituted or unsubstituted alkenyl of 2 to 60 carbon atoms, a substituted or unsubstituted alkynyl of 2 to 60 carbon atoms, a substituted or unsubstituted alkoxy of 1 to 60 carbon atom, a substituted or unsubstituted alkylthio of 1 to 60 carbon atoms, a substituted or unsubstituted cycloalkyl of 3 to 60 carbon atoms, a substituted or unsubstituted aryl of 6 to 60 carbon atoms, a substituted or unsubstituted aryloxy of 5 to 60 carbon atoms, a substituted or unsubstituted arylthio of 5 to 60 carbon atoms, a substituted or unsubstituted heteroaryl of 2 to 60 carbon atoms, a substituted or unsubstituted (alkyl)amino of 1 to 60 carbon atoms, a di(substituted or unsubstituted alkyl)amino of 1 to 60 carbon atoms or a (substituted or unsubstituted aryl)amino of 6 to 60 carbon atoms, and a di(substituted or unsubstituted aryl)amino of 6 to 60 carbon atoms, and may each form a fused ring with an adjacent radical.

In [Chemical Formula I], $X_1$ and $X_2$, which may be the same or different, are each independently any one selected from among a substituted or unsubstituted arylene of 6 to 30 carbon atoms and a single bond; and may be bonded to each other;

$Y_1$ and $Y_2$, which may be the same or different, are each independently selected from the group consisting of a substituted or unsubstituted aryl of 6 to 24 carbon atoms, a substituted or unsubstituted heteroaryl of 2 to 24 carbon atoms, a substituted or unsubstituted alkyl of 1 to 24 carbon atoms, a substituted or unsubstituted heteroalkyl of 1 to 24 carbon atoms, a substituted or unsubstituted cycloalkyl of 3 to 24 carbon atoms, a substituted or unsubstituted alkoxy of 1 to 24 carbon atoms, a cyano, a halogen, a substituted or unsubstituted aryloxy of 6 to 24 carbon atoms, a substituted or unsubstituted alkylsilyl of 1 to 40 carbon atoms, a substituted or unsubstituted arylsilyl of 6 to 30 carbon atoms, a germanium, a phosphorus, a boron, a deuterium, and a hydrogen atom, with a proviso that Y and Y2 may each form with an aliphatic, aromatic, heteroaliphatic, or heteroaromatic fused ring with an adjacent radical; and l and m are each an integer of 1 to 20, and n is an integer of 1 to 4.

In Chemical Formulas J and K, $A_1$, $A_2$, E, and F, which may be the same or different, are each independently a substituted or unsubstituted aromatic hydrocarbon of 6 to 50 carbon atoms or a substituted or unsubstituted heteroaromatic ring of 2 to 40 carbon atoms, wherein two adjacent carbon atoms of the aromatic ring $A_1$ and two adjacent carbon atoms of the aromatic ring $A_2$ form a 5-membered fused ring together with a carbon atom to which substituents $R_1$ and $R_2$ are bonded;

linkers $L_1$ to $L_{12}$, which may be the same or different, are each independently selected from among a single bond, a substituted or unsubstituted alkylene of 1 to 60 carbon atoms, a substituted or unsubstituted alkenylene of 2 to 60 carbon atoms, a substituted or unsubstituted alkynylene of 2 to 60 carbon atoms, a substituted or unsubstituted cycloalkylene of 3 to 60 carbon atoms, a substituted or unsubstituted heterocycloalkylene of 2 to 60 carbon atoms, a substituted or unsubstituted arylene of 6 to 60 carbon atoms, and a substituted or unsubstituted heteroarylene of 2 to 60 carbon atoms;

M is any one selected from among N—$R_3$, $CR_4R_5$, $SiR_6R_7$, $GeR_8R_9$, O, S, and Se;

substituents $R_1$ to $R_9$, and $Ar_1$ to $Ar_8$, which may be the same or different, are each independently any one selected from among a hydrogen atom, a deuterium atom, a substituted or unsubstituted alkyl of 1 to 30 carbon atoms, a substituted or unsubstituted aryl of 6 to 50 carbon atoms, a substituted or unsubstituted alkenyl of 2 to 30 carbon atoms, a substituted or unsubstituted alkynyl of 2 to 20 carbon atoms, a substituted or unsubstituted cycloalkyl of 3 to 30 carbon atoms, a substituted or unsubstituted cycloalkenyl of 5 to 30 carbon atoms, a substituted or unsubstituted heteroaryl of 2 to 50 carbon atoms, a substituted or unsubstituted heterocycloalkyl of 2 to 30 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 6 to 30 carbon atoms, a substituted or unsubstituted alkylamine of 1 to 30 carbon atoms, a substituted or unsubstituted arylamine of 6 to 30 carbon atoms, a substituted or unsubstituted alkylsilyl of 1 to 30 carbon atoms, a substituted or unsubstituted arylsilyl of 5 to 30 carbon atoms, a substituted or unsubstituted alkylgermanium of 1 to 30 carbon atoms, a substituted or unsubstituted arylgermanium of 1 to 3 carbon atoms, a cyano, a nitro, and a halogen, with a proviso that $R_1$ and $R_2$ together may form a mono- or polycyclic aliphatic or aromatic ring, which may be a heterocyclic ring having a heteroatom selected from among N, O, P, Si, S, Ge, Se, and Te as a ring member;

p1 to p4, r1 to r4, and s1 to s4 are each independently an integer of 1 to 3, with a proviso that when any of them is 2 or greater, the corresponding linkers $L_1$ to $L_{12}$ may be the same or different;

x is an integer of 1 or 2, and y and z may be the same or different and are each independently an integer of 0 to 3; and $Ar_1$ may form a ring with $Ar_2$, $Ar_3$ may form a ring with $Ar_4$, $Ar_5$ may form a ring with $Ar_6$, and $Ar_7$ may form a ring with $Ar_8$.

In Chemical Formula J, two adjacent carbon atoms of the $A_2$ ring occupy respective positions*of Structural Formula $Q_1$ to form a fused ring.

In Chemical Formula K, two adjacent carbon atoms of the $A_1$ ring occupy respective positions*of Structural Formula $Q_2$ to form a fused ring, and two adjacent carbon atoms of the $A_2$ ring occupy respective positions*of Structural Formula $Q_1$ to form a fused ring.

The amine radical of Chemical Formulas I to K may be represented by any one selected from among, but not limited to, the following Substituents 1 to 52:

[Substituent 1]

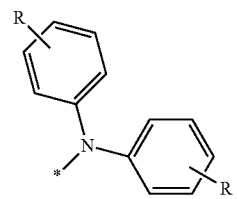

[Substituent 2]

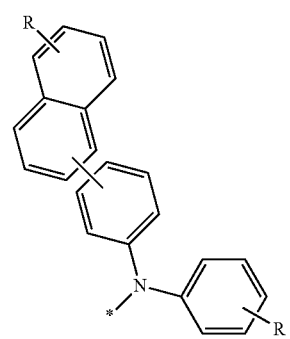

-continued
[Substituent 3]
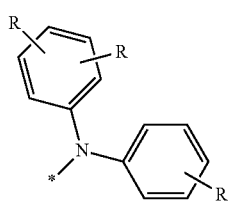
[Substituent 4]
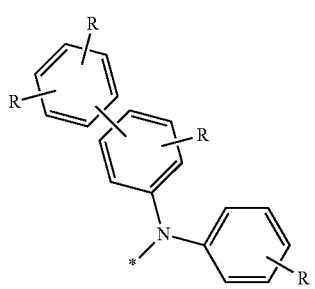
[Substituent 5]
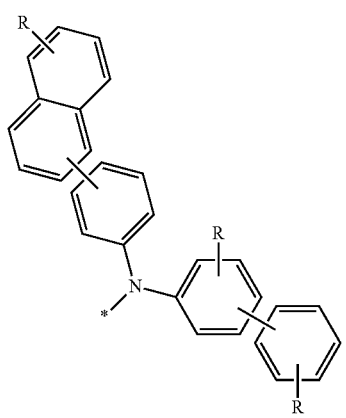
[Substituent 6]
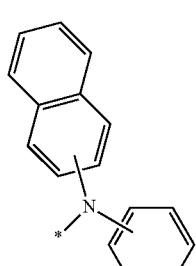
[Substituent 7]
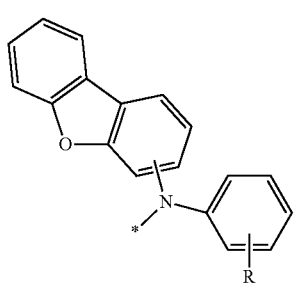
[Substituent 8]
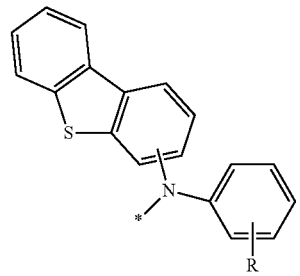
[Substituent 9]
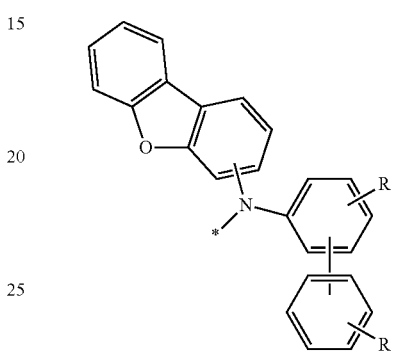
[Substituent 10]
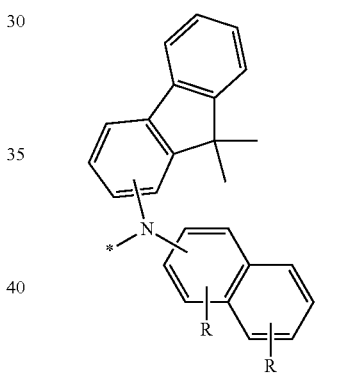
[Substituent 11]
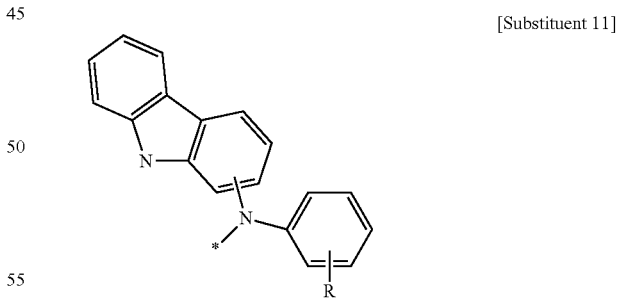
[Substituent 12]
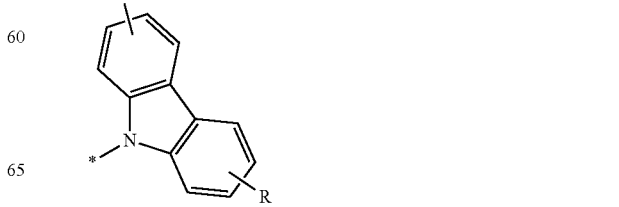

[Substituent 13]
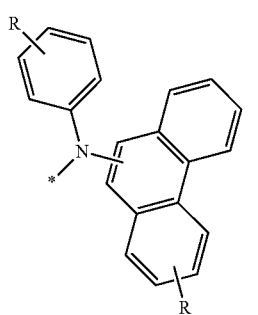
[Substituent 14]
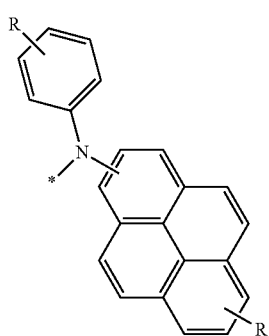
[Substituent 15]
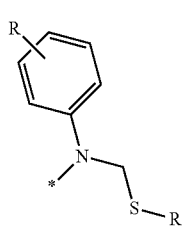
[Substituent 16]
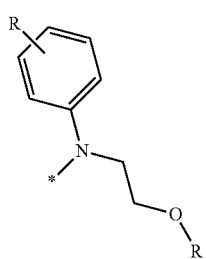
[Substituent 17]
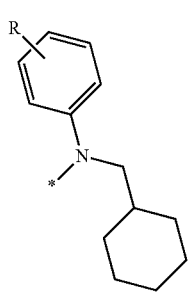
[Substituent 19]
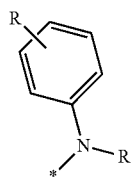
[Substituent 20]
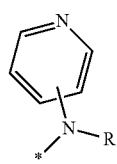
[Substituent 21]
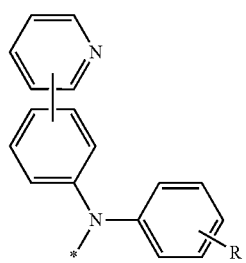
[Substituent 22]
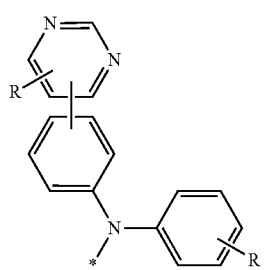
[Substituent 23]
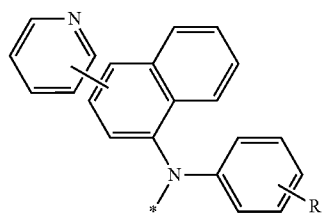
[Substituent 24]
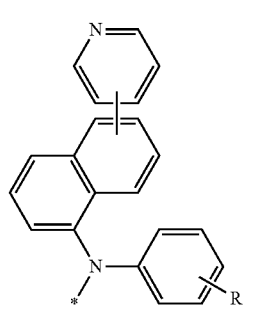

[Substituent 25]
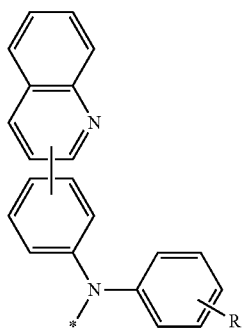
[Substituent 26]
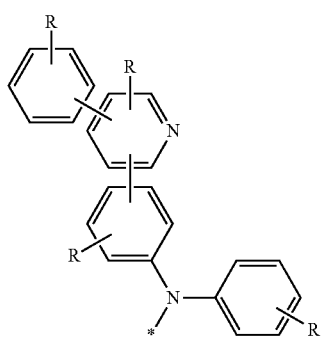
[Substituent 27]
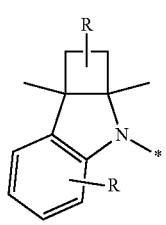
[Substituent 28]
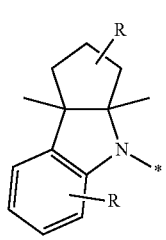
[Substituent 29]
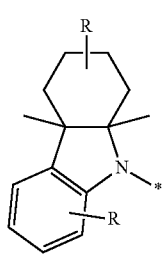
[Substituent 30]
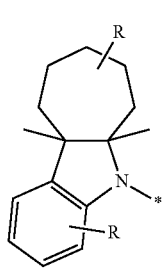
[Substituent 31]
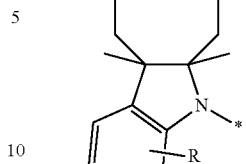
[Substituent 32]
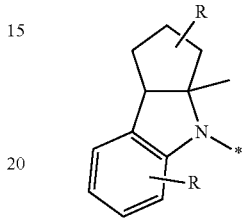
[Substituent 33]
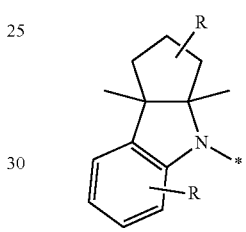
[Substituent 34]
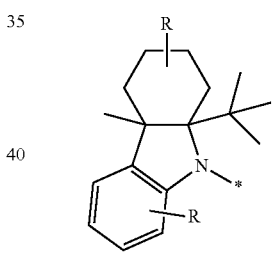
[Substituent 35]
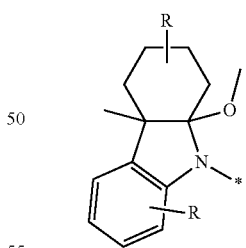
[Substituent 36]
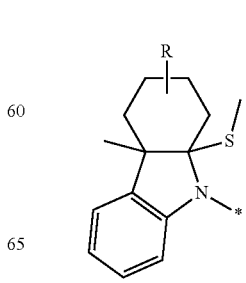

[Substituent 37]
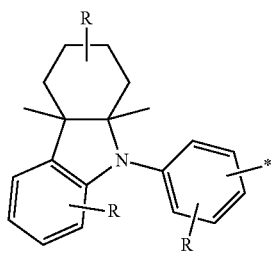
[Substituent 38]
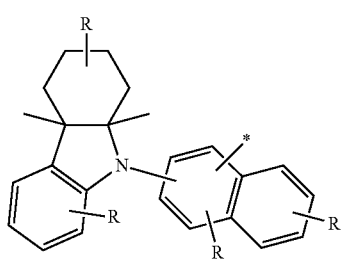
[Substituent 39]
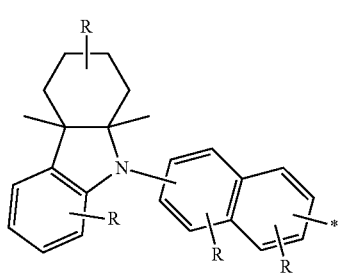
[Substituent 40]
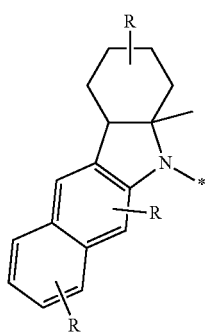
[Substituent 41]
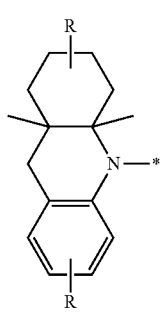
[Substituent 42]
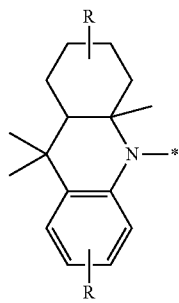
[Substituent 43]
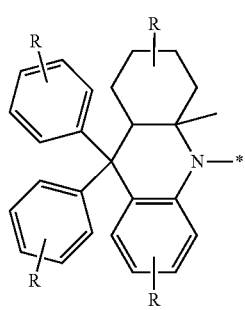
[Substituent 44]
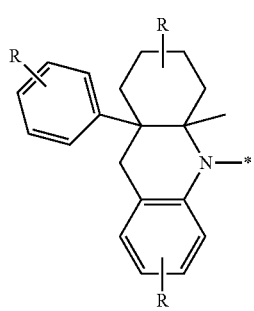
[Substituent 45]
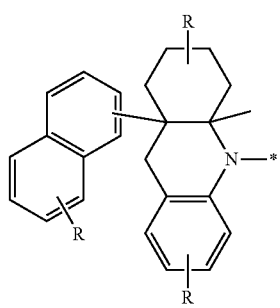
[Substituent 46]
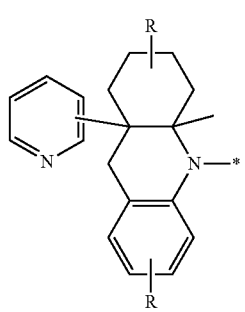

[Substituent 47]

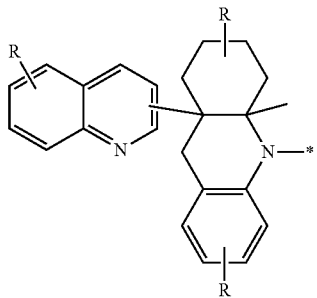

[Substituent 48]

[Substituent 49]

[Substituent 50]

[Substituent 51]

[Substituent 52]

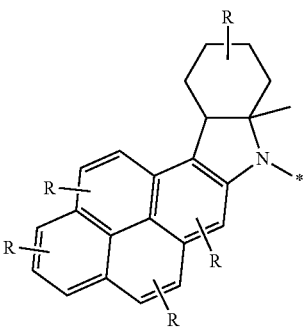

wherein R's, which may be the same or different, are each independently selected from among a hydrogen atom, a deuterium atom, a halogen atom, a hydroxyl, a cyano, a nitro, an amino, an amidino, a hydrazine, a hydrazone, a carboxyl or a salt thereof, a sulfonic acid or a salt thereof, a phosphoric acid or a salt thereof, a substituted or unsubstituted alkyl of 1 to 60 carbon atoms, a substituted or unsubstituted alkenyl of 2 to 60 carbon atoms, a substituted or unsubstituted alkynyl of 2 to 60 carbon atoms, a substituted or unsubstituted alkoxy of 1 to 60 carbon atom, a substituted or unsubstituted alkylthio of 1 to 60 carbon atoms, a substituted or unsubstituted cycloalkyl of 3 to 60 carbon atoms, a substituted or unsubstituted aryl of 6 to 60 carbon atoms, a substituted or unsubstituted aryloxy of 5 to 60 carbon atoms, a substituted or unsubstituted arylthio of 5 to 60 carbon atoms, a substituted or unsubstituted heteroaryl of 2 to 60 carbon atoms, a substituted or unsubstituted (alkyl)amino of 1 to 60 carbon atoms, a di(substituted or unsubstituted alkyl)amino of 1 to 60 carbon atoms or a (substituted or unsubstituted aryl)amino of 6 to 60 carbon atoms, a di(substituted or unsubstituted aryl)amino of 6 to 60 carbon atoms, a substituted or unsubstituted alkylsilyl of 1 to 40 carbon atoms, a substituted or unsubstituted arylsilyl of 6 to 30 carbon atoms, a germanium, a phosphorus, and a boron, may each have 1 to 12 substituents, and may each form a fused ring with an adjacent radical.

Further, the light-emitting layer may contain various host and dopant materials in addition to the aforementioned dopant and host materials.

Below, the organic light-emitting diode of the present disclosure is explained with reference to FIG. 1.

FIG. 1 is a schematic cross-sectional view of the structure of an organic light-emitting diode according to some embodiments of the present disclosure.

As can be seen in FIG. 1, the light-emitting diode according to some embodiments of the present disclosure comprises an anode 20 corresponding to the first electrode, a hole transport layer 40, a light-emitting layer 50 including a host and a dopant, an electron density control layer 55, an electron transport layer 60, and a cathode 80 corresponding to the second electrode in that order, wherein the electron density control layer includes at least one selected from among compounds represented by the following Chemical Formulas A to D, and the light-emitting layer includes at least one compound represented by the following Chemical Formula H as the host.

In addition, an organic light-emitting diode according to some embodiments of the present disclosure may further comprise a hole injection layer 30 between the anode 20 and the hole transport layer 40, and an electron injection layer between the electron transport layer 60 and the cathode 80.

Reference is made to FIG. 1 with regard to the structure and fabrication of the organic light-emitting diode of the present disclosure. First, a substrate 10 is coated with a positive electrode (anode) material to form an anode 20. So long as it is used in a typical organic EL device, any substrate may be taken as the substrate 10. Preferable is an organic substrate or a transparent plastic substrate that exhibits excellent transparency, surface smoothness, ease of handling, and water resistance. As the anode material, indium tin oxide (ITO), indium zinc oxide (IZO), tin oxide (SnO2), or zinc oxide (ZnO) may be used because of the high transparency and conductivity thereof.

A hole injection layer material is applied on the anode 20 by thermal deposition in a vacuum or by spin coating to form a hole injection layer 30. Subsequently, thermal deposition in a vacuum or spin coating may also be conducted so as to deposit a hole transport layer material on the hole injection layer 30, resulting in the formation of a hole transport layer 40.

No particular limitations are imparted to the hole injection layer material that is typically used in the art. For example, mention may be made of, but is not limited to, 2-TNATA [4,4',4"-tris(2-naphthylphenyl-phenylamino)-triphenylamine], NPD[N,N'-di(1-naphthyl)-N,N'-diphenylbenzidine)], TPD[N,N'-diphenyl-N,N'-bis(3-methylphenyl)-1,1'-biphenyl-4,4'-diamine], and DNTPD[N,N'-diphenyl-N,N'-bis-[4-(phenyl-m-tolyl-amino)-phenyl]-biphenyl-4,4'-diamine].

So long as it is typically used in the art, any material may be selected for the hole transport layer without particular limitation. Examples include, but are not limited to, N,N'-bis(3-methylphenyl)-N,N'-diphenyl-[1,1-biphenyl]-4,4'-diamine (TPD) and N,N'-di(naphthalen-1-yl)-N,N'-diphenyl-benzidine (a-NPD).

Then, a light-emitting layer 50 is deposited on the hole transport layer 40 by vacuum deposition or spin coating, followed by the formation of a thin electron density control layer 55 on the organic light-emitting layer 50 by vacuum deposition or spin coating.

In some embodiments of the present disclosure, the light-emitting layer may comprise a host and a dopant, and the materials therefor are as described above.

In some embodiments of the present disclosure, the light-emitting layer particularly ranges in thickness from 50 to 2,000 Å.

Together with a dopant, a host material may be employed in the light-emitting layer. When the light-emitting layer comprises a host and a dopant, the content of the dopant may range from about 0.01 to 20 parts by weight based on 100 parts by weight of the host, but is not limited thereto.

Meanwhile, after being formed on the light-emitting layer, an electron density control layer 55 is covered with an electron transport layer 60 by vacuum deposition or spin coating and then with an electron injection layer 70. A cathode metal is deposited on the electron injection layer 70 by thermal vacuum deposition to form a cathode 80, thus obtaining an organic light-emitting diode (OLED).

In accordance with some embodiments of the present disclosure, the affinity $A_{ed}$ (eV) of the electron density control layer, the affinity $A_h$ (eV) of the host of the light-emitting layer, and the affinity $A_e$ (eV) of the electron transport layer satisfy the relationship $A_h \geq A_{ed} \geq A_e$.

Figure 2:
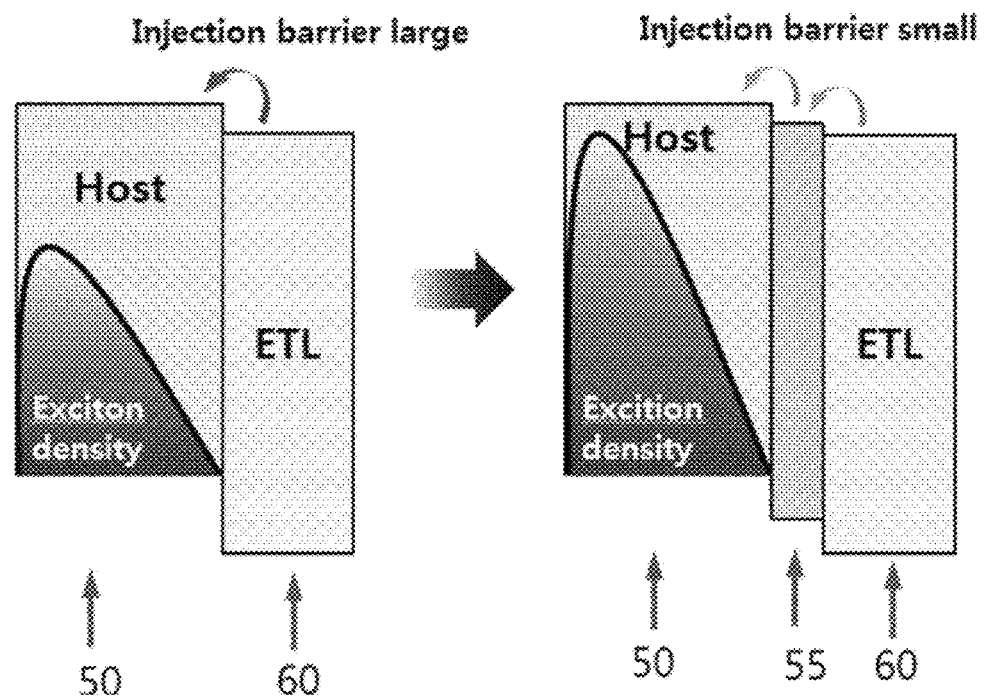
FIG. 2 shows the structures of light-emitting diodes in which an electron density control layer is absent or present in accordance with some embodiments of the present disclosure.

This can be elucidated in greater detail with reference to FIG. 2. FIG. 2 shows the structure of a light-emitting diode in which an electron density control layer is absent (left panel) or present (right panel).

As shown in the left panel of FIG. 2, when the electron transport layer 60 is in direct contact with the light-emitting layer 50, the electrons injected from the cathode are less prone to move through the electron transport layer 60 to the host 50 because there is a large electron injection barrier between the cathode and the host 50, resulting in low exciton density in the host of the light-emitting layer. In contrast, as in the present disclosure, when an affinity $A_{ed}$ (eV) of the electron density control layer is set to be between an affinity $A_h$ (eV) of the host in the light-emitting layer and an affinity $A_e$ (eV) of the electron transport layer ($A_h \geq A_{ed} \geq A_e$), smaller interlayer electron injection barriers exist, resulting in greater exciton density in the host of the light-emitting layer.

Structured to have an electron density control layer for lowering a barrier to electron injection between a light-emitting layer and an electron transport layer, the organic light-emitting diode of the present disclosure allows for the effective injection of electrons into the light-emitting layer so that it can increase the electron density of the light-emitting layer and the density of excitons generated in the light-emitting layer, resulting in an improvement in external quantum efficiency (EQE).

Figure 3:
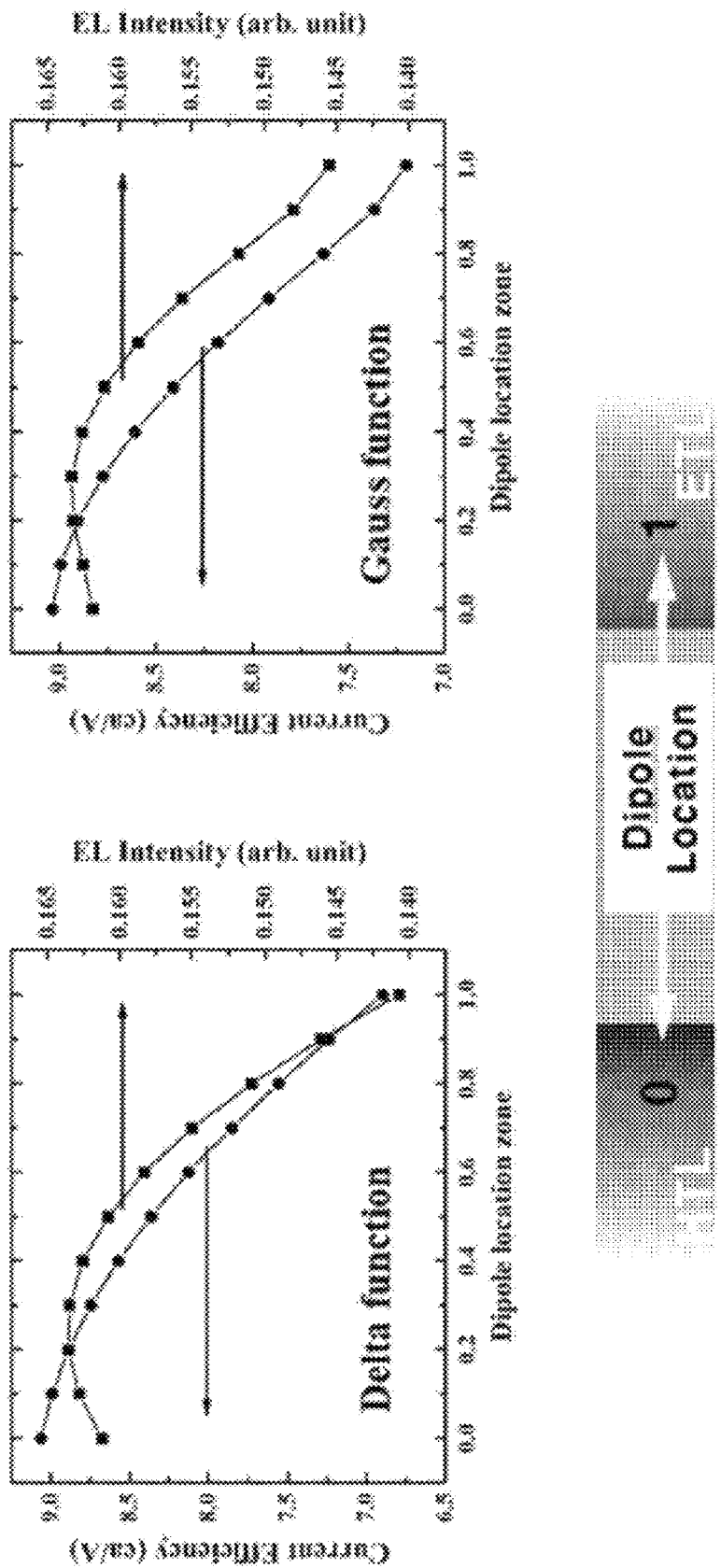
FIG. 3 shows the results of simulation of changes in current efficiency (left) and EL intensity (right) against dipole location zones of excitons in the light-emitting layer of the organic light-emitting diode according to the present disclosure.

A further explanation may be made in FIG. 3. FIG. 3 shows the simulation results of changes in current efficiency (left) and EL intensity (right) against dipole location zones of excitons in the light-emitting layer of the organic lighting emitting diode according to the present disclosure.

In FIG. 3, the X-axis for the dipole location zone within the light-emitting layer in which excitons recombine is divided from 0 (zero) for the side of the hole transport layer to 1 for the side of the electron transport layer. As can be seen, higher current efficiency and EL intensities are detected at positions of excitons nearer to the hole transport layer.

Similar patterns are drawn whether the current efficiency and the EL intensity follow a delta function (left) or a Gaussian function, as can be seen in FIG. 3.

That is, given the condition that the affinity $A_{ed}$ (eV) of the electron density control layer is between the affinity $A_h$ (eV) of the host of the light-emitting layer and the affinity $A_e$ (eV) of the electron transport layer ($A_h \geq A_{ed} \geq A_e$), the organic light-emitting diode of the present disclosure can increase the electron density in the light-emitting layer, which shifts the dipole location zone toward the hole transport layer, with the consequent improvement of current efficiency and EL intensity.

Meanwhile, the organic light-emitting diode of the present disclosure is advantageous over that of Korean Patent No. 10-2012-0092555 A in that the electron density control layer (corresponding to the blocking layer of the conventional art) need not be made of a material that is greater in triplet energy than the host of the light-emitting layer in order to effectively induce the TTF phenomenon.

Figure 4:
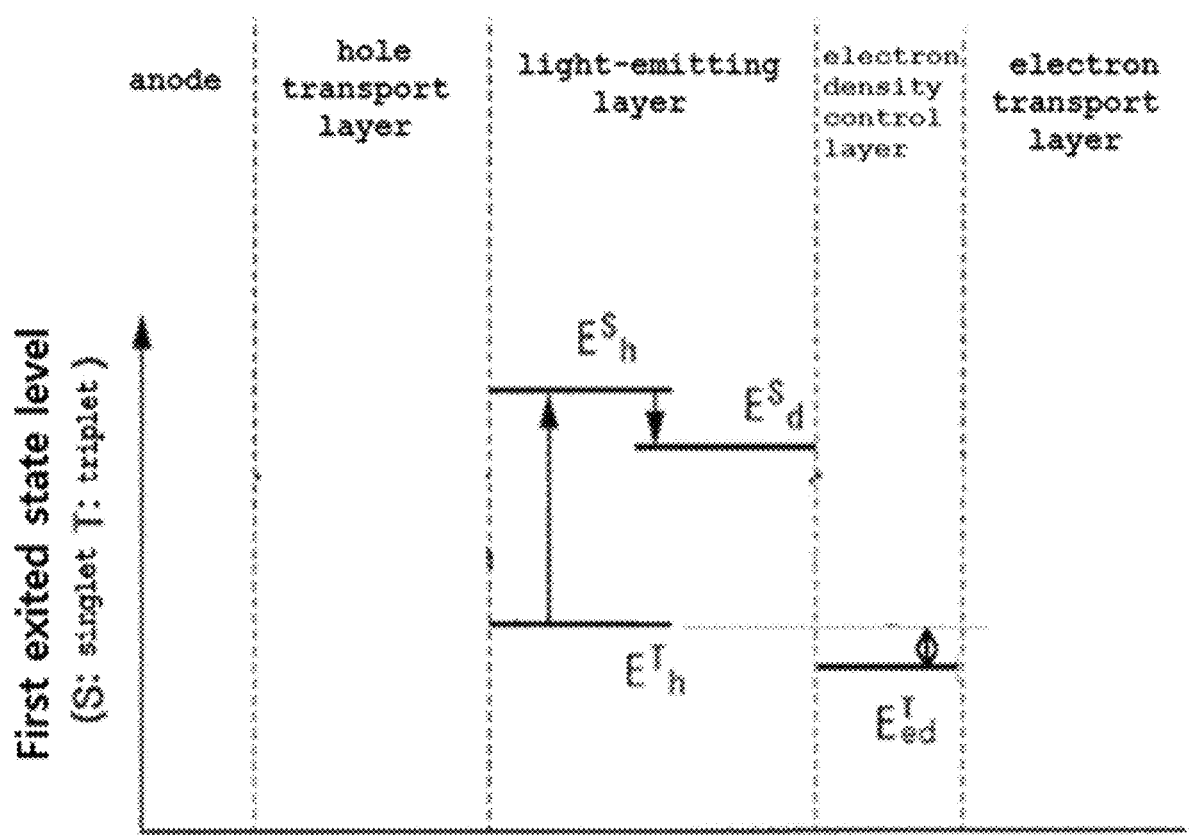
FIG. 4 is a diagram of an energy level structure of a light-emitting diode in which the triplet energy of an electron density control layer is lower than that of the host of a light-emitting layer in accordance with one embodiment of the present disclosure.

This advantage can be elucidated in detail with reference to FIG. 4. FIG. 4 is a diagram of the energy level structure of a light-emitting diode in which the triplet energy ($E^T_{ed}$) of an electron density control layer is lower than that ($E^T_h$) of the host of a light-emitting layer in accordance with one embodiment of the present disclosure. As shown in FIG. 4, the material of the electron density control layer may be lower in triplet energy than that of the host of the light-emitting layer.

In one exemplary embodiment, the difference in triplet energy between the host of the light-emitting layer ($E^T_h$ (eV)) and an anthracene derivative of the electron density control layer ($E^T_{ed}$ (eV)) may range from 0 to 0.4 (0.4 eV $\geq E^T_h - E^T_{ed} \geq 0$ eV) and more particularly from 0 to 0.3 ((0.3 eV $\geq E^T_h - E^T_{ed} \geq 0$ eV).

According to one embodiment of the present disclosure, the electron mobility of the anthracene derivative of the electron density control layer may be the same as or greater than that of the material of the electron transport layer. Since the electron density control layer is not smaller in electron mobility than the electron transport layer, the electrons supplied from the electron transport layer can move quickly toward the light-emitting layer without delay in the electron density control layer, thereby facilitating the elevation of exciton density in the light-emitting layer.

Figure 5:
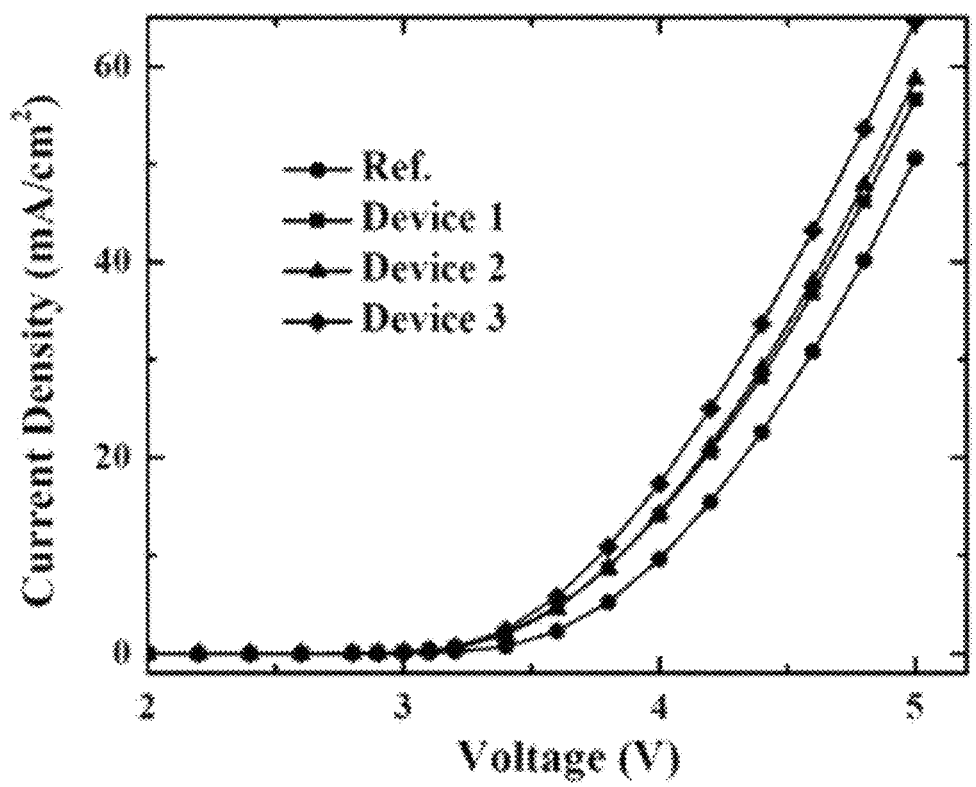
FIG. 5 shows changes in current efficiency with voltage in organic light-emitting diodes in which an electron density control layer is present or absent.
Figure 5:
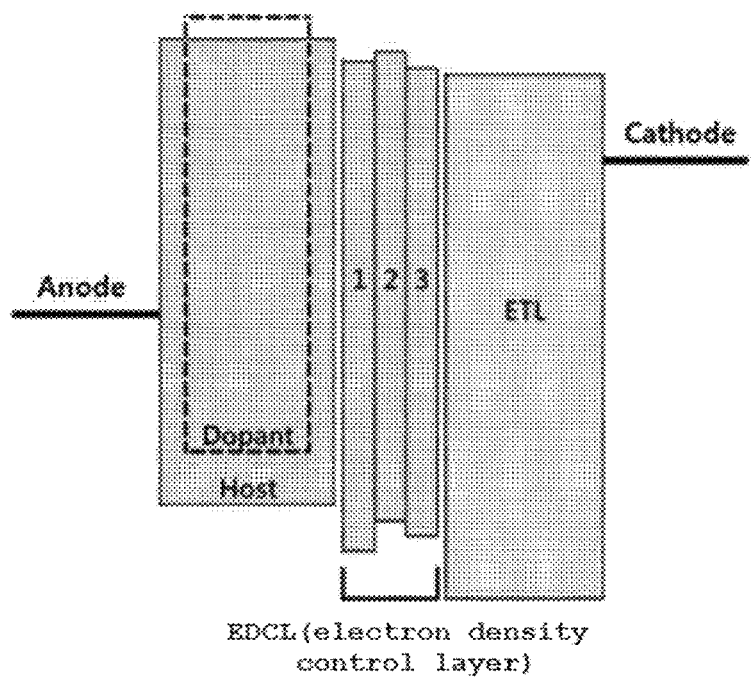

With regard to details of current density, reference may be made to FIG. 5.

FIG. 5 shows changes in current efficiency with voltage according to the presence or absence (Ref.) of an electron density control layer in an organic light-emitting diode. In order to obtain the effect of the electron density control layer on electron mobility, an electron-only device (EOD), fabricated as shown in the lower panel of FIG. 5, was measured for current density while applying direct voltages thereto. As can be understood from the upper diagram of FIG. 5, an electron density control layer helps increase the current density at the same voltage.

Thus, it has been discovered that the introduction of an electron density control layer enhances the electron injection properties of the device.

For more accurate arithmetic comparison, the electron mobility ($\mu$) in each device may be measured. In this regard, whether or not an electron density control layer is introduced thereinto, all the devices to be tested were fabricated to have the same overall thickness so as to exclude an error factor in calculating electron mobility.

To calculate the electron mobility from the data measured in EOD devices, the following relationship between mobility and electric conductivity ($\sigma$) was used (G. Paasch et al. Synthetic Metals Vol. 132, pp. 97-104 (2002)).

First, the device was measured for resistance (R) from the current-voltage data, and for electric conductivity from the overall thickness (d) and pixel area (A) using the following Equation 1. Based on the electric conductivity, electron mobility was obtained according to the following Equation 2. The results are depicted in FIG. 6.

$$\sigma = \frac{1}{R} \times \frac{d}{A}, \quad R = \frac{V}{I} \qquad \text{Equation (1)}$$

$$\mu(cm^2/Vs) = \sigma^{0.76}(S/cm) \qquad \text{Equation (2)}$$

Figure 6:
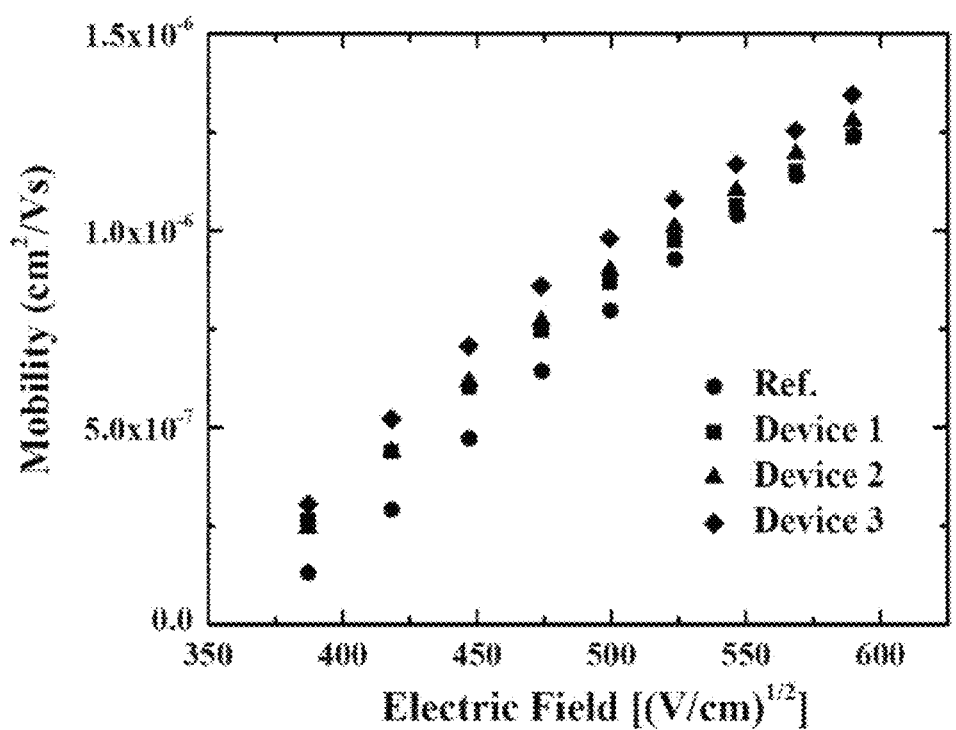
FIG. 6 is a diagram of electron mobility plotted against electric field for the organic light-emitting diodes in which an electron density control layer is present or absent.

FIG. 6 is a diagram of mobility plotted against electric field according to the presence or absence of an electron density control layer in an organic light-emitting diode.

It is therefore understood from the data of FIG. 6 that when the electron density control layer is not lower in electron mobility than the electron transport layer, the electrons supplied from the electron transport layer can move quickly toward the light-emitting layer without a delay in the electron density control layer, thereby facilitating the increase of exciton density in the light-emitting layer.

According to exemplary embodiments of the present disclosure, the electron density control layer and the electron transport layer may have electron mobility of at least $10^{-6}$ cm$^2$/Vs at an electronic field strength of 0.04 MV/cm to 0.5 MV/cm.

So long as it functions to stably transport the electrons from the cathode, any known material may be used for the electron transport layer. Examples of the known electron transport material include quinoline derivatives, particularly tris(8-quinolinolate)aluminum (Alq3), Liq, TAZ, Balq, beryllium bis(benzoquinolin-10-oate: BebQ$_2$), ADN, compound 101, compound 102, BCP, and the oxadiazole derivatives PBD, BMD, and BND, but are not limited thereto.

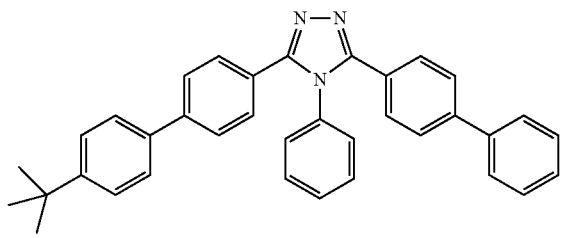

TAZ

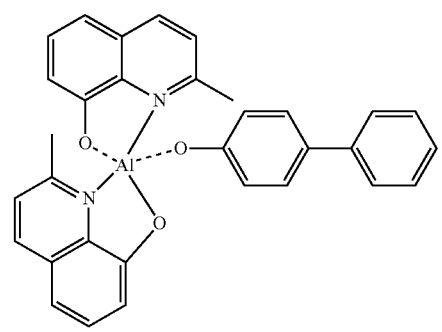

BAlq

<Compound 101>

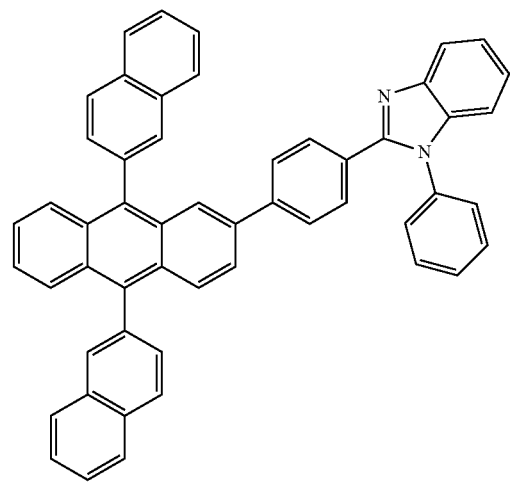

-continued

<Compound 102>

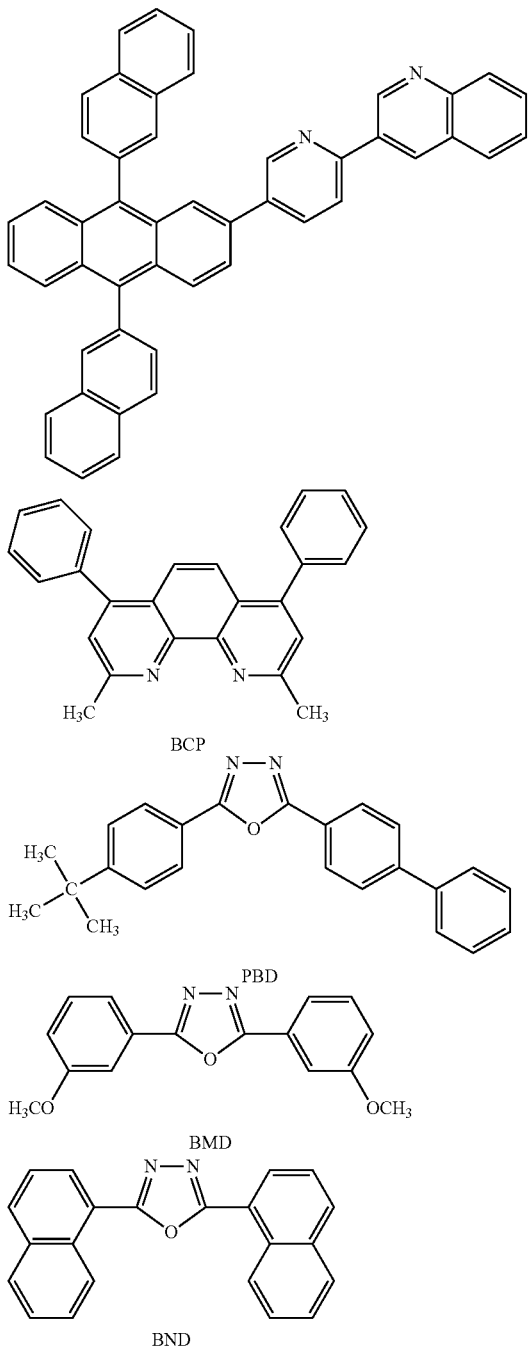

BCP

PBD

BMD

BND

As described above, an electron injection layer (EIL) is positioned on the electron transport layer in the organic light-emitting diode of the present disclosure. So long as it functions to facilitate the injection of electrons from the cathode, any known material may be available for forming the electron injection layer, without particular limitation.

By way of example, a material for the electron injection layer may be CsF, NaF, LiF, NaCl, $Li_2O$, or BaO. The condition for depositing the electron injection layer is dependent on the compound that is employed, but may fall within the range of conditions for the formation of the hole injection layer.

The electron injection layer may range in thickness from about 1 Å to about 100 Å, and particularly from about 3 Å to about 90 Å. Given this thickness range, the electron injection layer can exhibit satisfactory electron injection properties without an actual increase in driving voltage.

The cathode may be made of a metal or metal alloy such as lithium (Li), magnesium (Mg), aluminum (Al), aluminum-lithium (Al—Li), calcium (Ca), magnesium-indium (Mg—In), and magnesium-silver (Mg—Ag). Alternatively, ITO or IZO may be employed to form a transparent cathode for a top-emitting organic light-emitting diode.

In another embodiment, the light-emitting diode of the present disclosure may further comprise a light-emitting layer, made of a blue light-emitting material, a green light-emitting material, or a red light-emitting material, which can emit light in a wavelength range of 380 nm to 800 nm. That is, the light-emitting layer in the organic light-emitting diode of the present disclosure may have a multilayer structure in which the additional blue, green, and/or red light-emitting layer may be made of a fluorescent or phosphorescent material.

Further, one or more layers selected from among the hole injection layer, the hole transport layer, the light-emitting layer, the electron density control layer, the electron transport layer, and the electron injection layer may be deposited using a single molecule deposition process or a solution process.

Here, the deposition process is a process by which a material is vaporized in a vacuum or at a low pressure and deposited to form a layer, and the solution process is a method in which a material is dissolved in a solvent and applied for the formation of a thin film by means of inkjet printing, roll-to-roll coating, screen printing, spray coating, dip coating, spin coating, etc.

Also, the organic light-emitting diode of the present disclosure may be applied to a device selected from among flat display devices, flexible display devices, monochrome or white flat illumination devices, and monochrome or white flexible illumination devices.

A better understanding of the light-emitting diode according to the present disclosure may be obtained through the following examples which are set forth to illustrate, but are not to be construed as limiting the present disclosure.

EXAMPLES

*Preparation of Host Compounds Useful for Light-Emitting Layer

Synthesis Example 1: Synthesis of Compound of [Chemical Formula 1]

Synthesis Example 1-(1): Synthesis of Intermediate 1-a

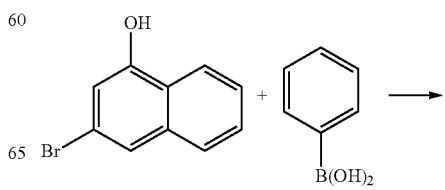

-continued

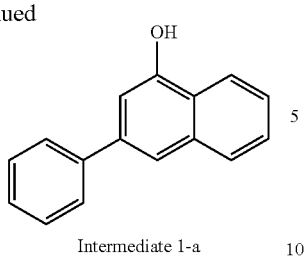

Intermediate 1-a

In a 1000-mL round-bottom flask, 3-bromo-1-naphthol (33.5 g, 0.15 mol), Pd(PPh$_3$)$_4$ (3.35 g, 3.1 mmol), potassium carbonate (43 g, 0.31 mol), and phenyl boronic acid (24.6 g, 0.2 mol) were stirred together with toluene (200 mL), 1,4-dioxane (200 mL) and water (100 mL) for 16 hrs under reflux. After completion of the reaction, the organic layer was separated and the aqueous layer was exacted twice with toluene (100 mL). The pooled organic layer was concentrated in a vacuum, and recrystallized in toluene and methanol to afford Intermediate 1-a as a solid (33 g, 75%).

Synthesis Example 1-(2): Synthesis of Intermediate 1-b

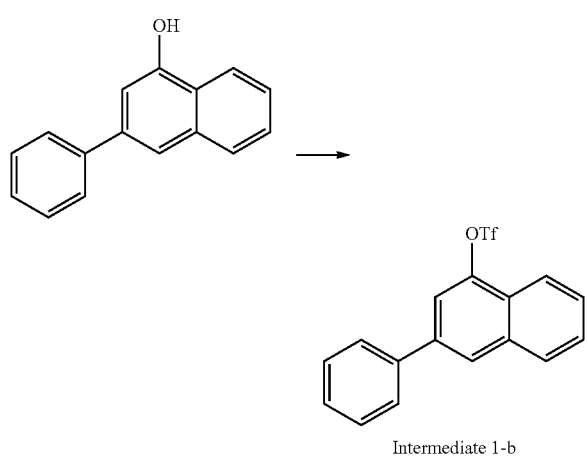

Intermediate 1-b

In a 1000-mL three-neck, round-bottom flask, Intermediate 1-a (30 g, 0.14 mol) was dissolved in dichloromethane (300 mL). Pyridine (14 g, 0.18 mol) was added to the solution which was then cooled to 0° C. Drops of (CF$_3$SO$_2$)$_2$O (42.3 g, 0.15 mol) were slowly added to the reaction mixture which was then stirred for hrs at room temperature before adding water (150 mL). The organic layer was separated and concentrated in a vacuum. Purification by column chromatography afforded Intermediate 1-b (35 g, 72.9%).

Synthesis Example 1-(3): Synthesis of Intermediate 1-c

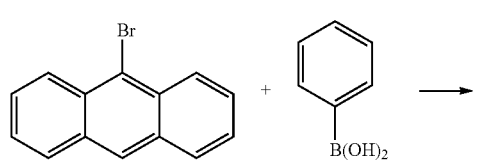

-continued

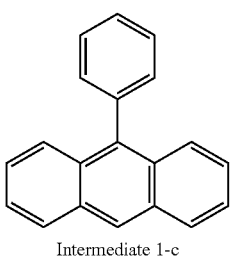

Intermediate 1-c

In a 10-L 4-neck round-bottom flask, 9-bromoanthracene (400 g, 1.55 mol), Pd(PPh$_3$)$_4$ (35.99 g, 0.031 mol), potassium carbonate (430.7 g, 3.11 mol), and phenyl boronic acid (246.6 g, 2.02 mol) were stirred together with toluene (2000 mL), 1,4-dioxane (2000 mL), and water (1000 mL) for 16 hrs under reflux. After completion of the reaction, the organic layer was separated and concentrated in a vacuum. Recrystallization in toluene and methanol afforded Intermediate 1-c as a solid (298 g, 75.3%).

Synthesis Example 1-(4): Synthesis of Intermediate 1-d

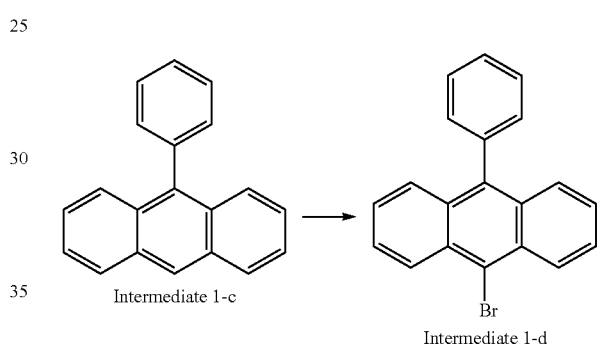

Intermediate 1-c    Intermediate 1-d

In a 10-L 4-neck round-bottom flask, Intermediate 1-c (298 g, 1.17 mol) was dissolved in dichloromethane (4000 mL). The solution was cooled to 0° C. and mixed slowly with drops of bromine (206 g, 1.29 mol). Subsequently, the reaction mixture was stirred at room temperature for 2 hrs. After completion of the reaction, an aqueous sodium hydrogen carbonate solution (1000 mL) was added, and stirred for 30 min. The organic layer thus formed was separated, concentrated in a vacuum, and recrystallized in dichloromethane and methanol to afford Intermediate 1-d (313 g, 80.3%).

Synthesis Example 1-(5): Synthesis of Intermediate 1-e

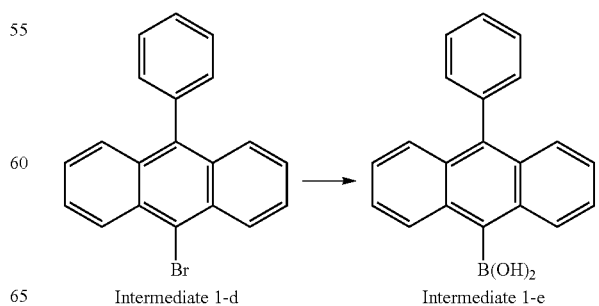

Intermediate 1-d    Intermediate 1-e

In a 10-L 4-neck, round-bottom flask, Intermediate 1-d (280 g, 0.84 mol) and THF (3000 mL) were placed and maintained at −78° C. 1.6M n-BuLi (630 mL) was slowly added to the solution which was then stirred for 2 hrs. At the same temperature, B(OMe)₃ was dropwise added. The temperature was elevated to room temperature before stirring for 12 hrs. After completion of the reaction, 2N HCl was added. The organic layer was separated, neutralized, and recrystallized in toluene to afford Intermediate 1-e (228 g, 91%).

Synthesis Example 1-(6): Synthesis of Compound of [Chemical Formula 1]

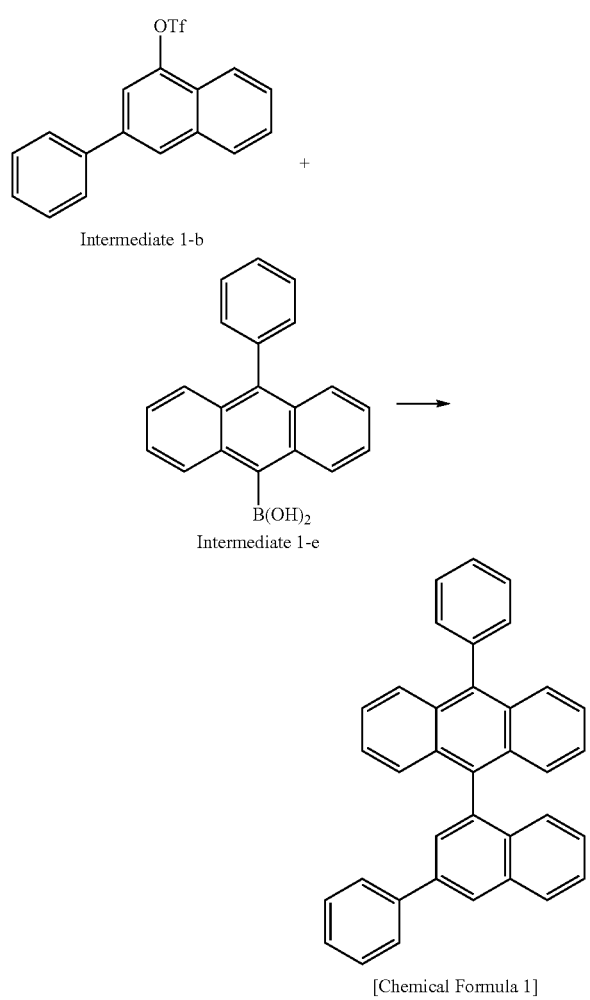

In a 1000-mL 4-neck round-bottom flask, Intermediate 1-b (30 g, 0.085 mol), Pd(PPh₃)₄ (2.5 g, 0.002 mol), potassium carbonate (29.4 g, 0.21 mol), and Intermediate 1-e (33 g, 0.11 mol) were stirred together with toluene (300 mL), ethanol (150 mL) and water (150 mL) for 12 hrs under reflux. After completion of the reaction, the organic layer was separated, concentrated in a vacuum, and recrystallized in toluene and methanol to afford the compound of [Chemical Formula 1] (22 g, 56.7%). The compound was identified through NMR.

δ 8.32 (1H), 8.12 (1H), 7.94-7.93 (1H), 7.86-7.83 (2H), 7.80 (1H), 7.77 (1H), 7.69-7.48 (11H), 7.42-7.33 (3H), 7.30-7.26 (3H)

Synthesis Example 2: Synthesis of Compound of [Chemical Formula 32]

Synthesis Example 2-(1): Synthesis of Intermediate 2-a

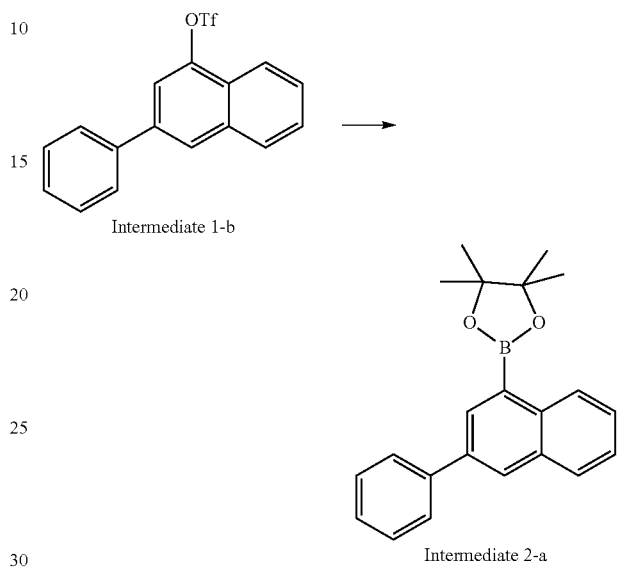

In a 1000 mL 4-neck round-bottom flask were placed Intermediate 1-b (32 g, 0.062 mole) bis(pinacolato)diborone (23.8 g, 0.094 mole) and PdCl₂ (dppf) (2.5 g, 0.003 mole), potassium acetate (21.3 g, 0.28 mole), and toluene (350 mL), followed by reflux for 12 hours. After completion of the reaction, the organic layer was separated and concentrated in a vacuum.

Column chromatography afforded Intermediate 2-a (16.8 g, 81.5%).

Synthesis Example 2-(2): Synthesis of Intermediate 2-b

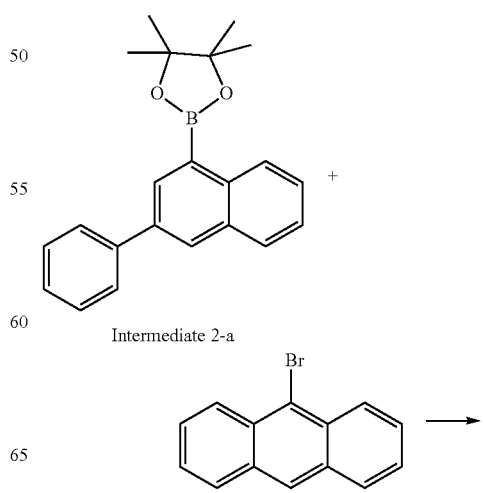

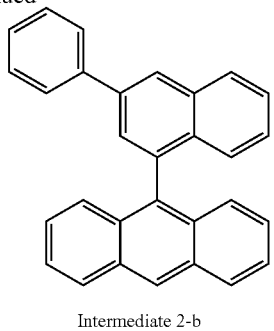

Intermediate 2-b

In a 500-mL 3-neck, round-bottom flask were placed 9-bromoanthracene (11.5 g, 0.045 mole), Intermediate 2-a (17 g, 0.051 mole), PdCl$_2$(dppf) (1.8 g, 0.002 mole), and sodium hydrogen carbonate (9.4 g, 0.11 mole), followed by tetrahydrofuran (110 mL) and water (30 mL). Reflux was conducted for 12 hrs. After completion of the reaction, the organic layer was separated while the aqueous layer was extracted once with dichloromethane (150 mL). The pooled organic layer was concentrated in a vacuum. Column chromatography afforded Intermediate 2-b (14.5 g, 85.3%).

Synthesis Example 2-(3): Synthesis of Intermediate 2-c

Intermediate 2-b
→
Intermediate 2-c

In a 500-mL 3-neck round-bottom flask, Intermediate 2-b (14.5 g, 0.038 mole) was dissolved in N,N-dimethylformaldehyde (95 mL). The reactants were cooled to 0° C. and then added with drops of a solution of N-bromosuccinimide (NBS, 8.1 g, 0.146 mole) in N,N-dimethylformaldehyde (20 mL) before stirring for 4 hrs at room temperature. After completion of the reaction, the reaction mixture was mixed with methanol (100 mL) and filtered. The filtered crystals were recrystallized in toluene and methanol to afford Intermediate 2-c (12 g, 68.6%).

Synthesis Example 2-(4): Synthesis of Compound of [Chemical Formula 32]

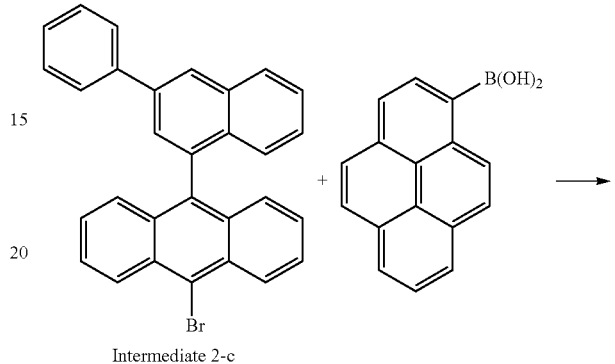

Intermediate 2-c

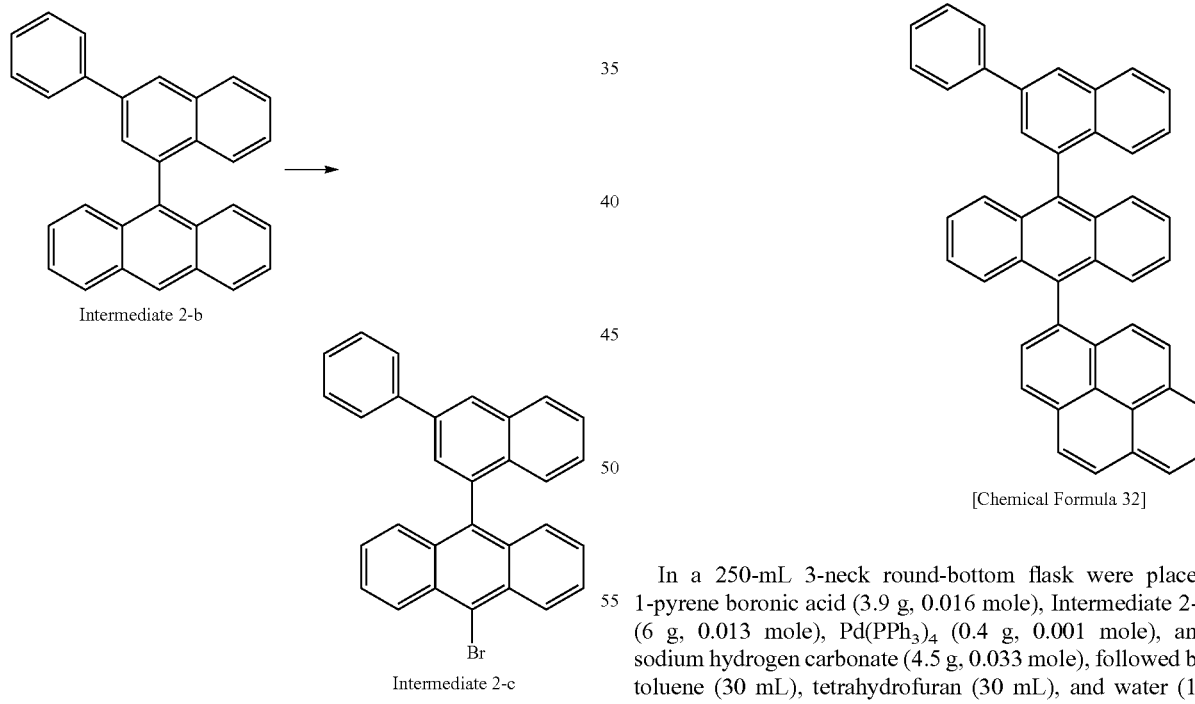

[Chemical Formula 32]

In a 250-mL 3-neck round-bottom flask were placed 1-pyrene boronic acid (3.9 g, 0.016 mole), Intermediate 2-c (6 g, 0.013 mole), Pd(PPh$_3$)$_4$ (0.4 g, 0.001 mole), and sodium hydrogen carbonate (4.5 g, 0.033 mole), followed by toluene (30 mL), tetrahydrofuran (30 mL), and water (18 mL). Reflux was conducted for 12 hrs. After completion of the reaction, the reaction mixture was cooled, added with methanol (50 mL), and filtered. The crystals thus obtained were recrystallized in dichlorobenzene to afford the compound of [Chemical Formula 32] (3.5 g, 46%). The compound was identified through NMR.

δ 8.55 (1H), 8.18-8.04 (4H), 7.91-7.85 (6H), 7.82 (1H), 7.76 (1H), 7.71 (4H), 7.55-7.41 (7H), 7.39 (4H)

Synthesis Example 3: Synthesis of Compound of [Chemical Formula 33]

Synthesis Example 3-(1): Synthesis of Intermediate 3-a

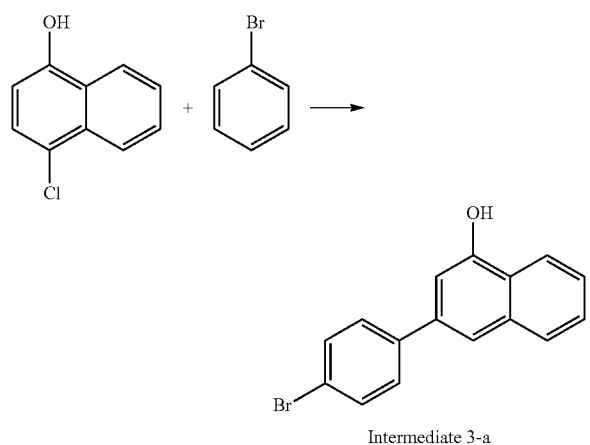

Intermediate 3-a

Intermediate 3-a was synthesized using a method known in the document Chemistry—An Asian Journal, 2011, vol. 6(8), 2130-2146.

Synthesis Example 3-(2): Synthesis of Intermediate 3-b

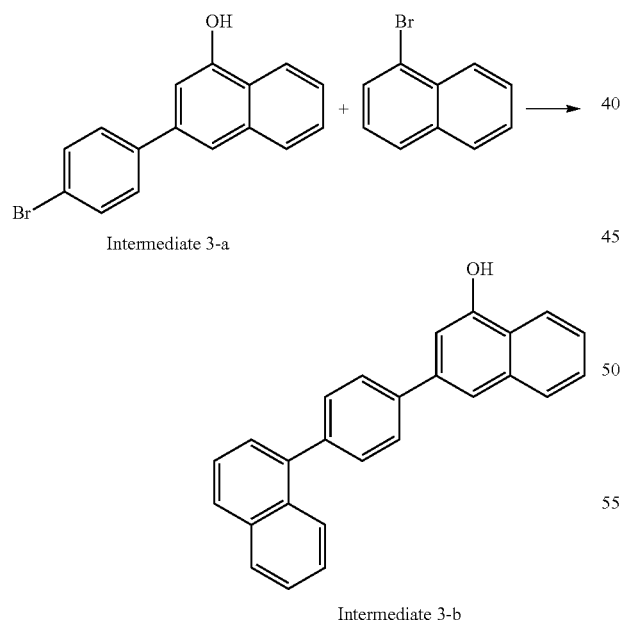

Intermediate 3-b

In a 1000 mL 4-neck round-bottom flask, Intermediate 3-a (25 g, 0.08 mole), Pd(PPh$_3$)$_4$ (2.4 g, 0.002 mole), potassium carbonate (28.9 g, 0.21 mole), and 2-naphthanlene boronic acid (18.7 g, 0.11 mole) were stirred together with toluene (150 mL), 1,4-dioxane (150 mL), and water (125 mL) for 12 hrs under reflux. After completion of the reaction, the organic layer was separated, and concentrated in a vacuum. Recrystallization in toluene and methanol afforded Intermediate 3-b (18 g, 62.2%).

Synthesis Example 3-(3): Synthesis of Intermediate 3-c

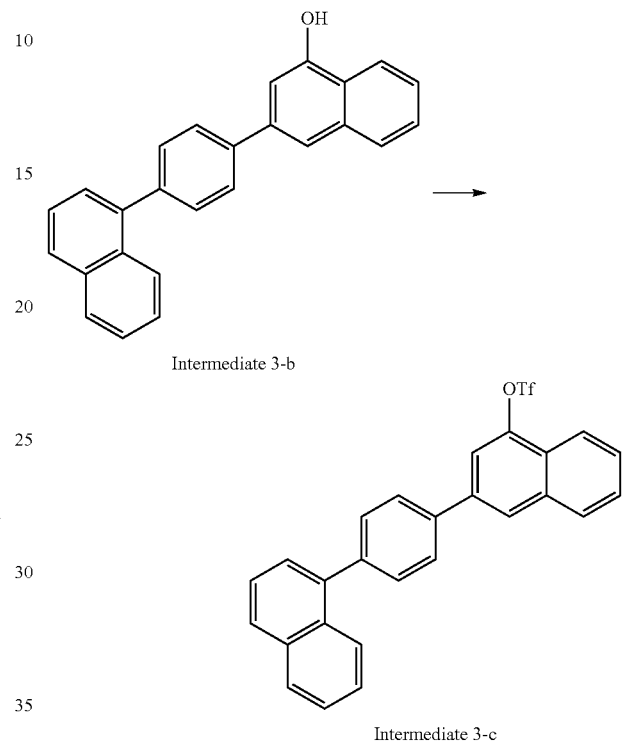

Intermediate 3-c

In a 1000-mL, 3-neck, round-bottom flask, Intermediate 3-b (18 g, 0.05 mol) was dissolved in dichloromethane (200 mL). Pyridine (5.3 g, 0.07 mol) was added to the solution which was then cooled to 0° C. (CF$_3$SO$_2$)$_2$O (16.1 g, 0.6 mole) was dropwise added to the reaction mixture which was then stirred for 1 hrs at room temperature before adding water (150 mL). The organic layer was separated and concentrated in a vacuum. Purification by column chromatography afforded Intermediate 3-c (19 g, 76.4%).

Synthesis Example 3-(4): Synthesis of Compound [Chemical Formula 33]

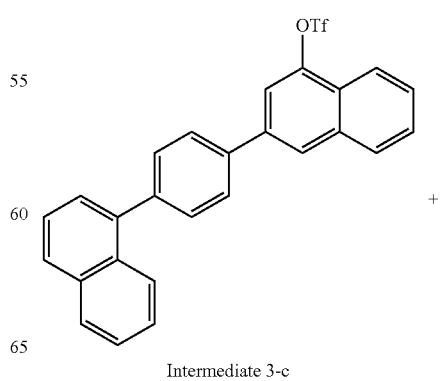

Intermediate 3-c

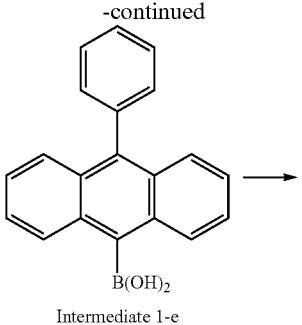

Intermediate 1-e

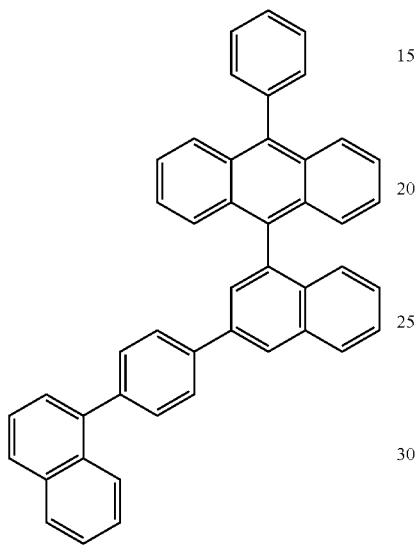

[Chemical Formula 33]

In a 1000-mL L 4-neck round-bottom flask, Intermediate 3-c (19 g, 0.04 mole), Pd(PPh$_3$)$_4$ (1.1 g, 0.001 mole), potassium carbonate (13.7 g, 0.1 mole), and Intermediate 1-e (15.4 g, 0.05 mole) were stirred together with toluene (200 mL), ethanol (100 mL) and water (100 mL) for 12 hrs under reflux. After completion of the reaction, the organic layer was separated, concentrated in a vacuum, and recrystallized in toluene and methanol to afford the compound of [Chemical Formula 33] (12 g, 51.9%). The compound was identified through NMR.

δ 8.55 (2H), 8.42 (1H), 8.08-8.04 (3H), 7.91-7.76 (6H), 7.61-7.51 (9H), 7.41-7.39 (5H), 7.25 (4H)

Synthesis Example 4: Synthesis of Compound [Chemical Formula 36]

Synthesis Example 4-(1): Synthesis of Intermediate 4-a

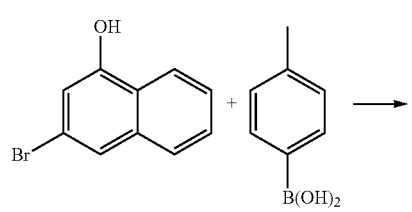

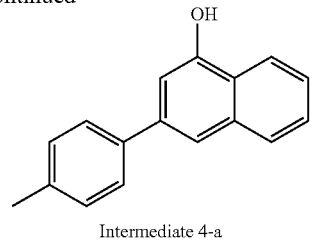

Intermediate 4-a

Intermediate 4-a was synthesized in the same manner as in Synthesis Example 1-(1), with using 3-bromo-1-naphthol and toluene-4-boronic acid.

Synthesis Example 4-(2): Synthesis of Intermediate 4-b

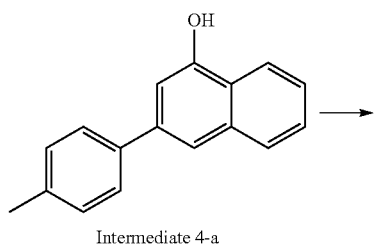

Intermediate 4-a

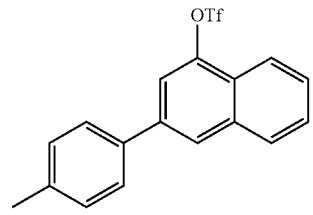

Intermediate 4-b

In a 1000-mL three-neck, round-bottom flask, Intermediate 4-a (20 g, 0.09 mole) was dissolved in dichloromethane (200 mL). Pyridine (8.8 g, 0.11 mole) was added to the solution which was then cooled to 0° C. Drops of (CF$_3$SO$_2$)$_2$O (26.5 g, 0.09 mole) were slowly added to the reaction mixture which was then stirred for 1 hrs at room temperature before adding water (150 mL). The organic layer was separated and concentrated in a vacuum. Purification by column chromatography afforded Intermediate 4-b (25 g, 79.9%).

Synthesis Example 4-(3): Synthesis of Compound of [Chemical Formula 36]

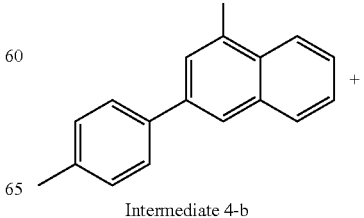

Intermediate 4-b

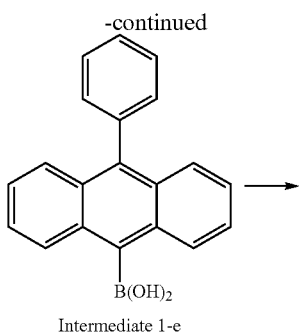

Intermediate 1-e

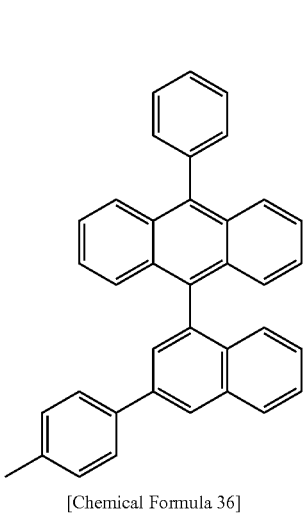

[Chemical Formula 36]

In a 1000-mL L 4-neck round-bottom flask, Intermediate 4-b (25 g, 0.082 mole), Pd(PPh₃)₄ (1.5 g, 0.001 mole), potassium carbonate (18.1 g, 0.13 mole), and Intermediate 1-e (20.3 g, 0.07 mole) were stirred together with toluene (250 mL), ethanol (125 mL), and water (125 mL) for 12 hrs under reflux. After completion of the reaction, the organic layer was separated while the aqueous layer was extracted once with toluene (200 mL). The pooled organic layer was concentrated in a vacuum and recrystallized in toluene and methanol to afford the compound of [Chemical Formula 36] (13 g, 52.9%). The compound was identified through NMR.

δ 8.32 (1H), 8.12 (1H), 7.94-7.93 (1H), 7.86-7.83 (2H), 7.80 (1H), 7.77 (1H), 7.55-7.51 (6H), 7.41-7.33 (10H), 2.34 (3H)

Synthesis Example 5: Synthesis of Compound of [Chemical Formula 40]

Synthesis Example 5-(1): Synthesis of Intermediate 5-a

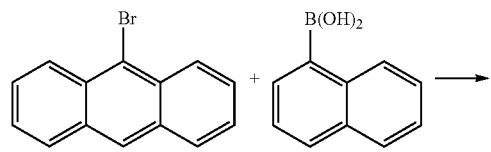

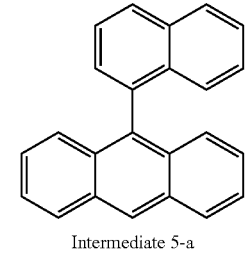

Intermediate 5-a

In a 2-L 4-neck round-bottom flask, 9-bromoanthracene (93.1 g, 0.36 mol), Pd(PPh₃)₄ (12.7 g, 0.011 mol), potassium carbonate (132 g, 0.91 mol) and 1-naphthalene boronic acid (87.2 g, 0.51 mol) were stirred together with toluene (500 mL), tetrahydrofuran (500 mL), and water (200 mL) for 16 hrs under reflux. After completion of the reaction, the organic layer was separated while the aqueous layer was extracted twice with toluene (1000 mL). The pooled organic layer was concentrated in a vacuum and recrystallized in toluene and methanol to afford Intermediate 5-a (88 g, 79.4%).

Synthesis Example 5-(2): Synthesis of Intermediate 5-b

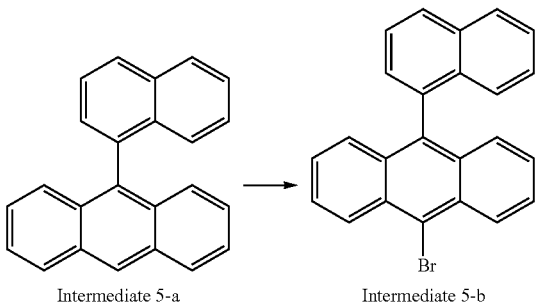

Intermediate 5-a      Intermediate 5-b

In a 2-L 4-neck round-bottom flask, Intermediate 5-a (88 g 0.29 mol) was dissolved in dimethylformamide (700 mL). Thereafter, a solution of NBS (70.7 g, 0.4 mole) in dimethylformamide (200 ml) was slowly added, followed by stirring for 2 hrs. After completion of the reaction, the reaction mixture was mixed with water to precipitate Intermediate 5-b (108 g, 97.5%).

Synthesis Example 5-(3): Synthesis of Intermediate 5-c

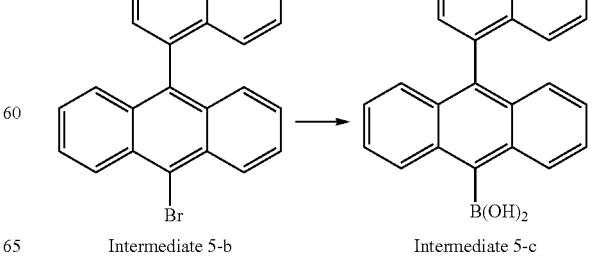

Intermediate 5-b      Intermediate 5-c

In a 4-neck round-bottom flask, Intermediate 5-b (5 g, 0.2 mol) and tetrahydrofuran (750 mL) were placed and maintained at −78° C. 1.6M n-BuLi (150 mL) was slowly added to the solution which was then stirred for 2 hrs. At the same temperature, B(OMe)₃ was dropwise added. The temperature was elevated to room temperature before stirring for 12 hrs. After completion of the reaction, 2N HCl was added. The organic layer was separated, neutralized, and recrystallized in toluene to afford Intermediate 5-c (30 g, 45%).

Synthesis Example 5-(4): Synthesis of Compound of [Chemical Formula 40]

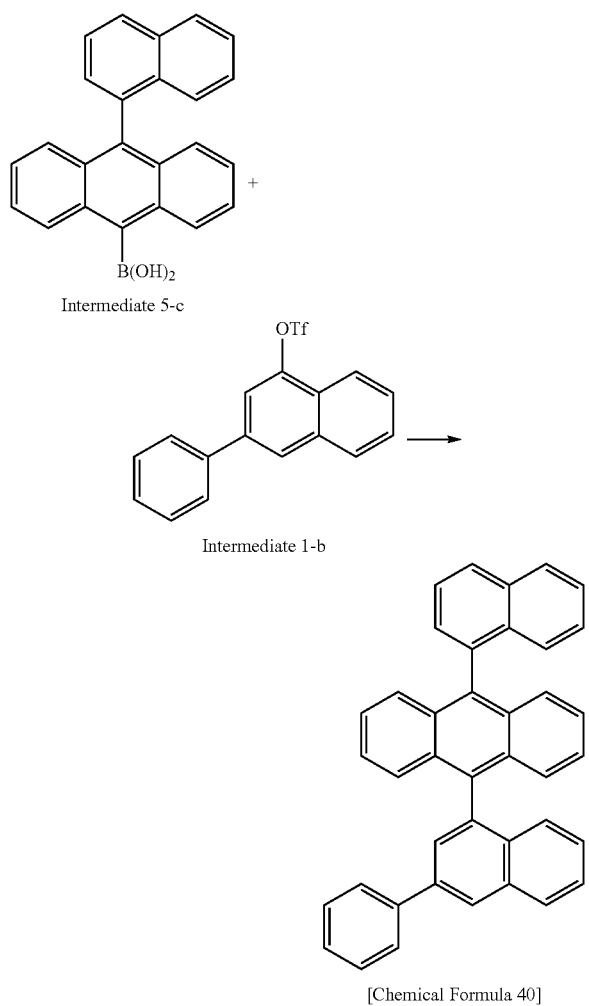

In a 1000 mL 4-neck round-bottom flask, Intermediate 5-c (28.5 g, 0.082 mol), Pd(PPh₃)₄ (1.5 g, 0.001 mol), potassium carbonate (18.1 g, 0.13 mol), and Intermediate 1-b (20.3 g, 0.07 mol) were stirred together with toluene (250 mL), ethanol (125 mL), and water (125 mL) for 12 hrs under reflux. After completion of the reaction, the organic layer was separated while the aqueous layer was extracted once with toluene (200 mL). The pooled organic layer was concentrated in a vacuum and recrystallized in toluene and methanol to afford the compound of [Chemical Formula 40] (21.1 g, 50.9%). The compound was identified through NMR.

δ 8.34 (1H), 8.13-7.97 (5H), 7.80 (1H), 7.77 (1H), 7.76-7.49 (11H), 7.48-7.23 (7H)

Preparation of Compound Useful for Electron Density Control Layer

Synthesis Example 6: Synthesis of Compound 203

Synthesis Example 6-(1): Synthesis of Intermediate 6-a

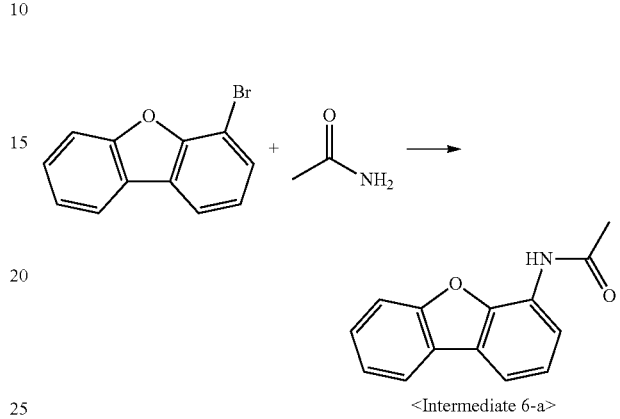

In a 2 L round-bottom flask reactor, 4-bromodibenzofuran (150.0 g, 0.607 mol), acetamide (53.8 g, 0.911 mol), copper iodide (57.8 g, 0.30 mol), trans-1,2-diaminocyclohexane (63.9 g, 0.60 mol), and potassium carbonate (167.8 g, 1.21 mol), and toluene (1500 ml) were together stirred overnight under reflux. After completion of the reaction, filtration through a silica gel pad was carried out, and the filtrate was washed many times with hot toluene. The filtrate was concentrated in a vacuum, and the concentrate was crystallized in acetonitrile, followed by filtration to afford <Intermediate 6-a>. (70.0 g, 51%)

Synthesis Example 6-(2): Synthesis of Intermediate 6-b

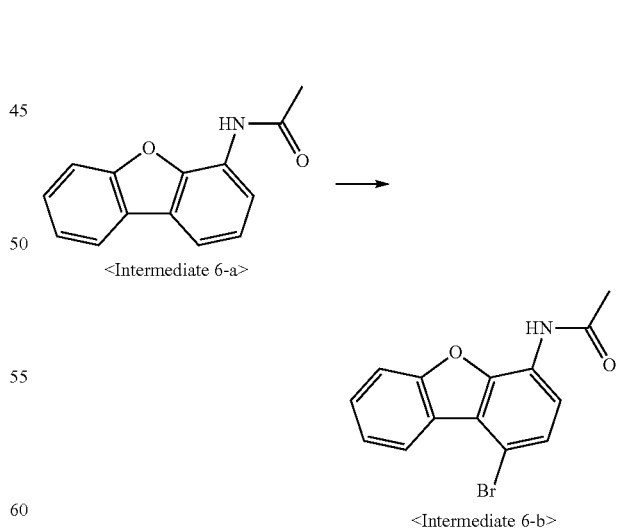

In a 2 L round-bottom flask reactor, <Intermediate 6-a> (70.0 g, 0.311 mol) was dissolved in acetic acid (630 ml). A mixture of bromine (49.7 g, 0.311 mol) and acetic acid (280 ml) was dropwise added into the reactor. At room temperature, the mixture was stirred for 2 hrs, and then water (100 ml) was added and stirred. The gray solid thus formed was slurried in ethanol (500 ml), stirred, and filtered. Dehydration of the filtrate afforded <Intermediate 6-b>. (86.0 g, 91%)

Synthesis Example 6-(3): Synthesis of Intermediate 6-c

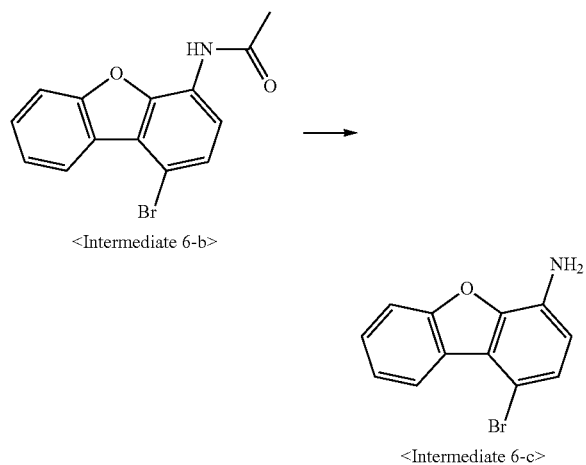

<Intermediate 6-b>

<Intermediate 6-c>

In a 2-L round-bottom flask reactor, <Intermediate 6-b> (86.0 g, 0.283 mol) was dissolved in ethanol (600 ml) and tetrahydrofuran (430 ml) and stirred. A solution of potassium hydroxide (47.6 g, 0.848 mol) in water (260 ml) was slowly added to the reactor, followed by stirring overnight under reflux. After completion of the reaction, the reaction mixture was cooled to room temperature. Extraction with ethyl acetate and water gave an organic layer which was then concentrated in a vacuum. The concentrate was stirred in excess ethanol and filtered. Recrystallization in methylene chloride and heptane afforded <Intermediate 6-c>. (73.0 g, 98%)

Synthesis Example 6-(4): Synthesis of Intermediate 6-d

<Intermediate 6-c>

<Intermediate 6-d>

In a 2-L round-bottom flask reactor, a mixture of Intermediate 6-c (73.0 g, 0.279 mol), HCl (90 ml), and water (440 ml) was cooled to 0° C. and stirred. At the same temperature, a solution of sodium nitrite (25.0 g, 0.362 mol) in water (90 ml) was dropwise added and then stirred for 1 hour. A solution of potassium iodide (92.5 g, 0.557 mol) in water (90 ml) was dropwise added to the reaction solution and then stirred at room temperature. After completion of the reaction, the reaction mixture was extracted with ethyl acetate and water. The organic layer was washed with an aqueous sodium thiosulfate pentahydrate solution, separated, and concentrated in a vacuum. Purification by column chromatography afforded Intermediate 6-d (52.3 g, 50.3%).

Synthesis Example 6-(5): Synthesis of Intermediate 6-e

<Intermediate 6-d>

<Intermediate 6-e>

In a 2-L round-bottom flask reactor were placed Intermediate 6-d (15.0 g, 40 mmol), phenyl boronic acid (5.4 g, 44 mmol), tetrakis(triphenylphosphine)palladium (0.9 g, 1 mmol), and potassium carbonate (11.1 g, 80 mmol), followed by toluene (100 mL), methanol (45 mL), and water (30 mL). The mixture was stirred overnight under reflux. After completion of the reaction, the reaction mixture was cooled to room temperature, and extracted with ethyl acetate. The organic layer thus formed was concentrated in a vacuum. Following purification by column chromatography, recrystallization in heptane afforded Intermediate 6-e (7.0 g, 53.9%).

Synthesis Example 6-(6): Synthesis of Compound 203

<Intermediate 6-d>

<Intermediate 6-e>

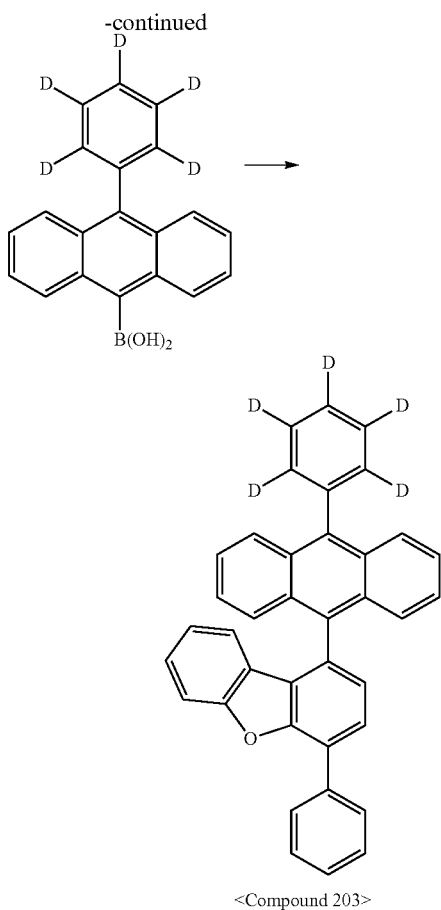

<Compound 203>

In a 250-ml round bottom flask reactor were placed Intermediate 6-e (7.0 g, 22 mmol), 10-phenyl(d5)-anthracene-9-boronic acid (7.9 g, 26 mmol), tetrakis(triphenylphosphine) palladium (0.5 g, 1 mmol), and potassium carbonate (6.0 g, 43 mmol), followed by toluene (50 ml), ethanol (21 ml), and water (14 ml). The mixture was heated to 90° C. and stirred overnight. After completion of the reaction, the reaction mixture was cooled to room temperature and stirred together with methanol (50 mL) at room temperature. The solid thus formed was filtered and washed with methanol. The solid was recrystallized in toluene and acetone to afford Compound 203.

MS (MALDI-TOF): m/z 501.21 [M+]

Synthesis Example 7: Synthesis of Compound 209

Synthesis Example 7-(1): Synthesis of Intermediate 7-a

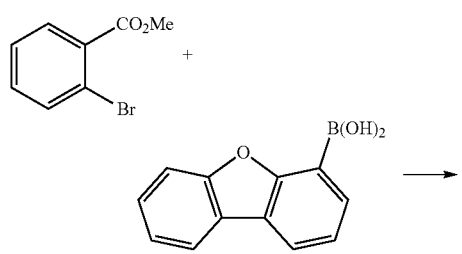

In a 500-mL round-bottom flask reactor were placed methyl 2-bromobenzoate (30.0 g, 0.140 mol), 4-dibenzofuran boronic acid (32.5 g, 0.153 mol), tetrakis(triphenylphosphine)palladium (3.2 g, 3 mmol), and potassium carbonate (38.6 g, 0.279 mol), followed by toluene (210 mL), methanol (90 mL), and water (60 mL). The mixture was stirred overnight under reflux. After completion of the reaction, the reaction mixture was cooled to room temperature and extracted with ethyl acetate. The organic layer thus formed was separated, concentrated in a vacuum, and purified by column chromatography to afford <Intermediate 7-a>. (25.0 g, 59.1%).

Synthesis Example 7-(2): Synthesis of Intermediate 7-b

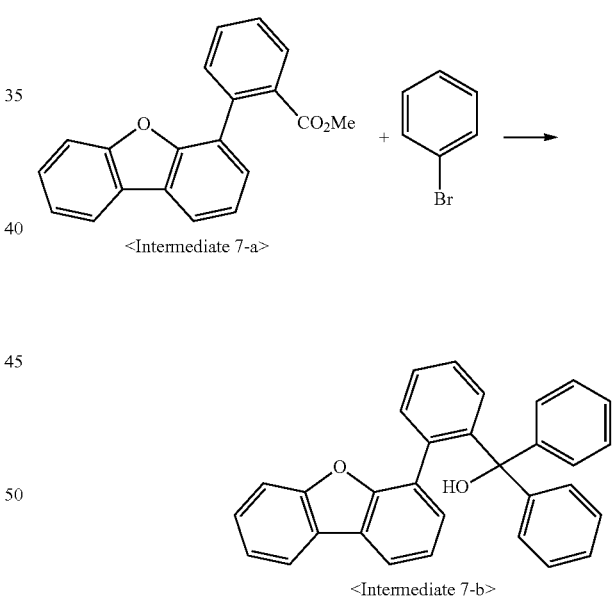

In a 500-ml round-bottom flask reactor, bromobenzene (28.6 g, 182 mmol) and tetrahydrofuran (220 ml) were cooled to −78° C. under a nitrogen atmosphere. At the same temperature, n-butyl lithium (104.6 ml, 167 mmol) was dropwise added to the chilled solution, and stirred for 2 hrs. Then, <Intermediate 7-a> (22.0 g, 73 mmol) was added little by little at room temperature while stirring. After completion of the reaction, the reaction was stopped with H2O (50 ml), and extraction with ethyl acetate and water was conducted. The organic layer thus formed was concentrated in a vacuum to afford <Intermediate 7-b>. (28.0 g, 90%)

Synthesis Example 7-(3): Synthesis of Intermediate 7-c

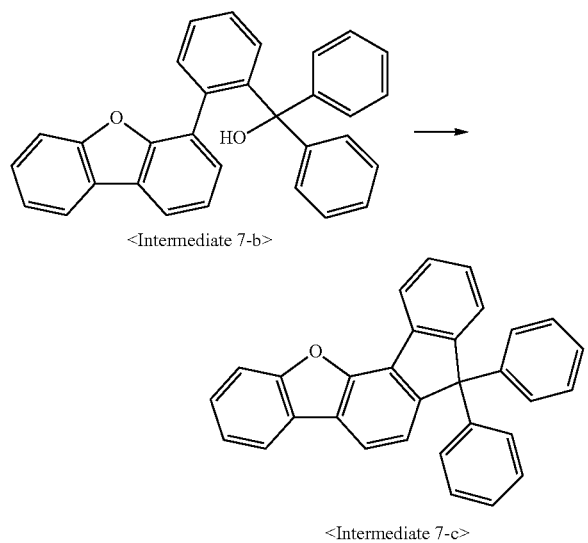

In a 500-ml round-bottom flask reactor, <Intermediate 7-b> (28.0 g, 66 mmol), acetic acid (310 ml) and HCl (2 ml) were stirred together for 1 hr under reflux. When a solid was formed, the completion of the reaction was confirmed by thin layer chromatography. After the reaction mixture was cooled to room temperature, the solid thus formed was filtered. The filtrate washed H2O and methanol, and dried to afford <Intermediate 7-c>. (22.3 g, 83.2%>

Synthesis Example 7-(4): Synthesis of Intermediate 7-d

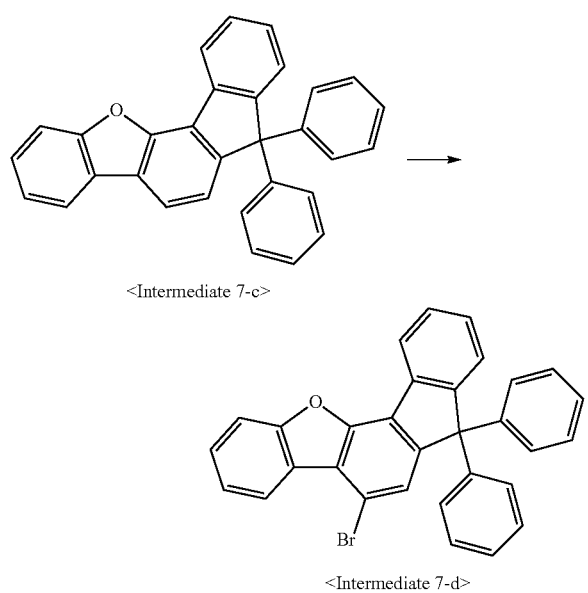

In a 2-L round-bottom flask reactor, <Intermediate 7-c> (22.3 g, 55 mmol) was dissolved in methylene chloride (500 ml). A mixture of bromine (8.72 g, 55 mmol) and methylene chloride (250 ml) was dropwise added to the reactor, followed by stirring at room temperature for 3 hrs. After completion of the reaction, the reaction mixture was washed with an aqueous sodium hydrogen carbonate solution. The solid thus formed was filtered and recrystallized in toluene and acetone to afford <Intermediate 7-d>. (25.0 g, 94%)

Synthesis Example 7-(5): Synthesis of Compound 209

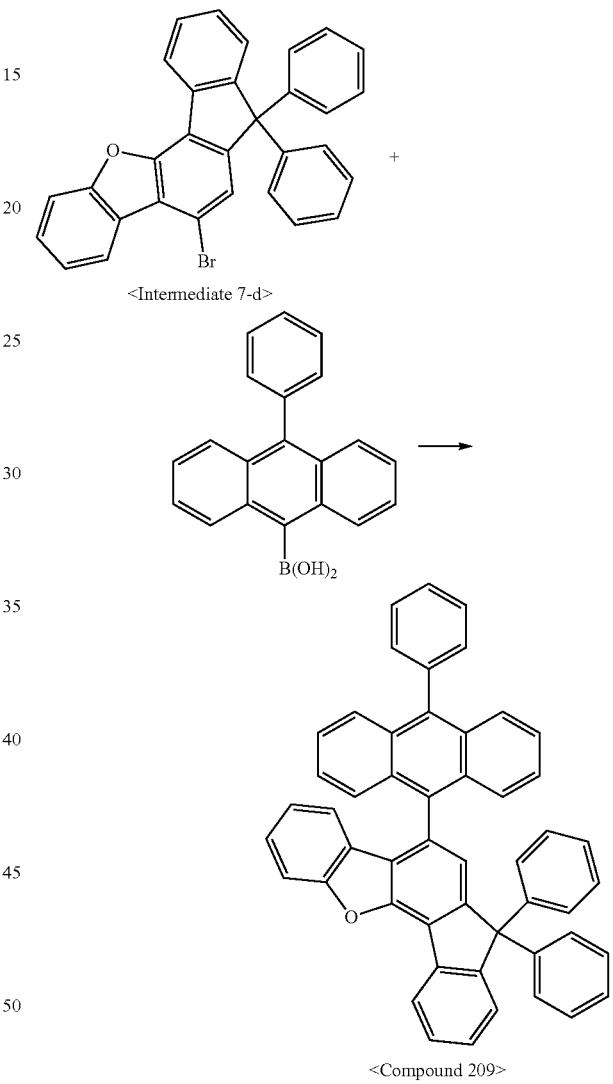

In a 250-ml round bottom flask reactor were placed Intermediate 7-d (7.0 g, 14 mmol), 10-phenyl-anthracene-9-boronic acid (5.1 g, 17 mmol), tetrakis(triphenylphosphine) palladium (0.3 g, 3 mmol), and potassium carbonate (4.0 g, 29 mmol), followed by toluene (49 ml), ethanol (21 ml), and water (14 ml). The mixture was heated to 90° C. and stirred overnight. After completion of the reaction, the reaction mixture was cooled to room temperature and extracted with ethyl acetate. The organic layer was isolated, and concentrated in a vacuum. Following purification by column chromatography, recrystallization in methylene chloride and acetone afforded Compound 209.

MS (MALDI-TOF): m/z 660.25 [M$^+$]

Synthesis Example 8: Synthesis of Compound 213

Synthesis Example 8-(1): Synthesis of Intermediate 8-a

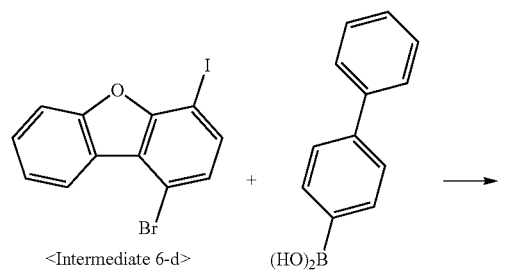

With the exception that 4-biphenyl boronic acid was used instead of phenyl boronic acid, the same procedure as in Synthesis Example 6-(5) was carried out to afford <Intermediate 8-a> (8.5 g, 55.9%).

Synthesis Example 8-(2): Synthesis of Compound 213

With the exception that <Intermediate 8-a> was used instead of <Intermediate 7-d>, the same procedure as in Synthesis Example 7-(5) was carried out to afford <Compound 213> (6.3 g, 51%).

MS (MALDI-TOF): m/z 572.21 [M$^+$]

Synthesis Example 9: Synthesis of Compound 281

Synthesis Example 9-(1): Synthesis of Intermediate 9-a

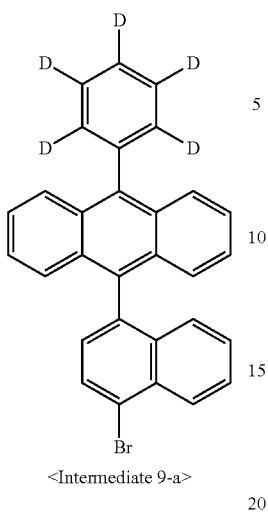

<Intermediate 9-a>

In a 500-mL round-bottom flask reactor were placed (10-phenyl (d5)-anthracene-9-boronic acid (38.6 g, 127 mmol), 1-bromo-4-iodonaphthalene (35.3 g, 106 mmol), tetrakis(triphenylphosphine)palladium (3.43 g, 3 mmol), and potassium carbonate (27.35 g, 197.9 mmol), followed by toluene (150 mL), tetrahydrofuran (150 mL), and water (60 mL). The reactor was heated to 90° C. before stirring overnight. After completion of the reaction, the reaction mixture was cooled to room temperature and extracted with ethyl acetate. The organic layer thus formed was isolated, concentrated in a vacuum, and purified by column chromatography to afford Intermediate 9-a (39.2 g, 79.7%).

Synthesis Example 9-(2): Synthesis of Intermediate 9-b

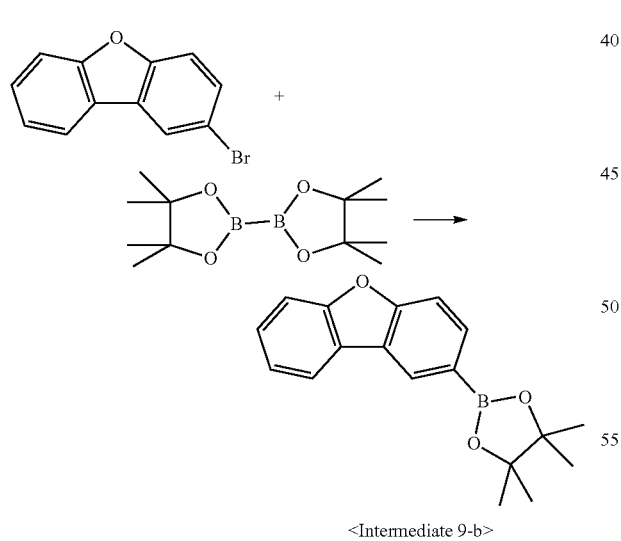

<Intermediate 9-b>

In a 2-L round-bottom flask reactor, 2-bromodibenzofuran (70.0 g, 0.283 mol), bis(pinacolato)diboron (86.3 g, 0.340 mol), 1,1′-bis(diphenylphosphino)ferrocene-dichloropalladium (II) (4.6 g, 0.006 mol), potassium acetate (56.6 g, 0.567 mol), and 1,4-dioxane (700 ml) were stirred together overnight under reflux. After completion of the reaction, filtration through a celite pad was conducted. The filtrate was concentrated in a vacuum, purified by column chromatography, and filtered to afford <Intermediate 9-b> (66.4 g, 79%).

Synthesis Example 9-(3): Synthesis of Compound 281

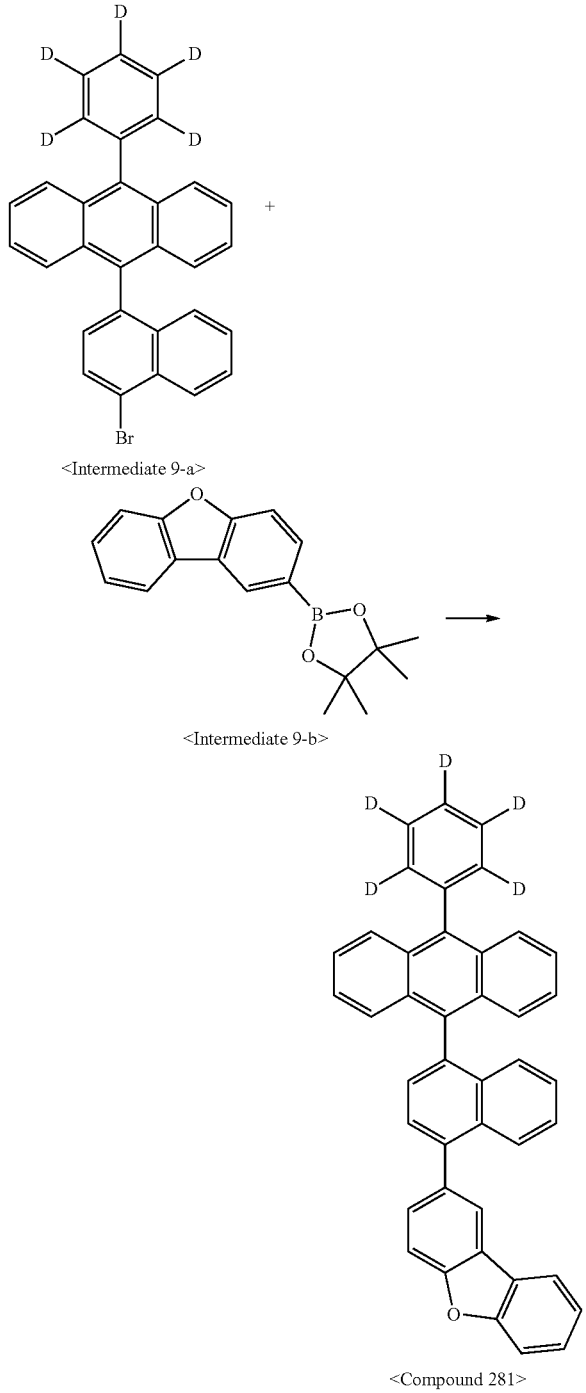

<Compound 281>

With the exception that <Intermediate 9-b> and <Intermediate 9-a> were used instead of 10-phenyl (d5)-anthracene-9-boronic acid and 1-bromo-4-iodonaphthalene, respectively, the same procedure as in Synthesis Example 9-(1) was carried out to afford <Compound 281> (8.5 g, 66.5%).

MS (MALDI-TOF): m/z 551.23 [M⁺]

Examples 1-14: Fabrication of Organic Light-Emitting Diode

An ITO glass substrate was patterned to have a luminescent area of 2 mm×2 mm and cleansed. The ITO glass was mounted in a vacuum chamber that was then set to have a base pressure of $1\times10^{-7}$ torr. On the ITO glass substrate, films of DNTPD(400 Å) and α-NPD (200 Å) were formed in that order. A light-emitting layers (200 Å) was formed of a mixture of one of the compounds listed in Table 1 as a host, and BD1 as a dopant (weight ratio 97:3). Then, the compounds shown in Table 1 were deposited to form an electron density control layer (50 Å), on which [Chemical Formula E-1] for an electron transport layer (250 Å), [Chemical Formula E-2] for an electron injection layer (5 Å), and Al (1000 Å) were deposited in the order to fabricate an organic light-emitting diode.

The organic light-emitting diode thus obtained was measured at 10 mA/cm² for luminescence properties.

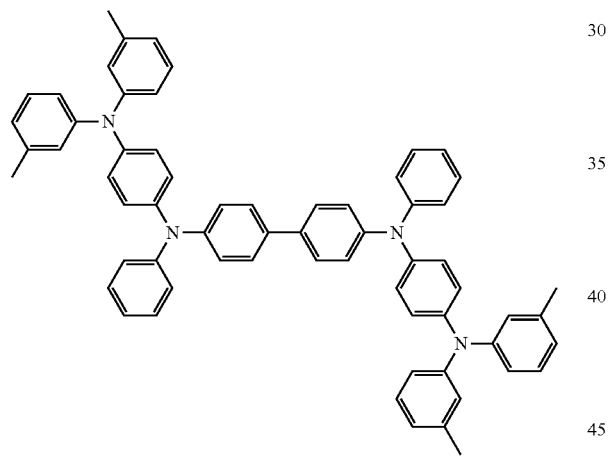

[DNTPD]

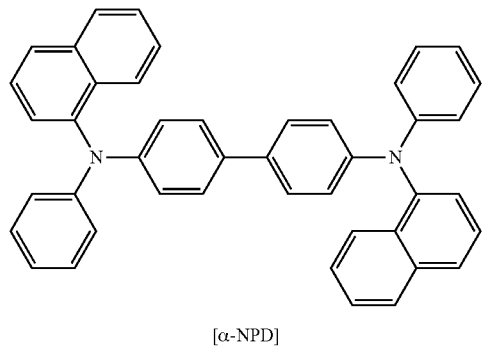

[α-NPD]

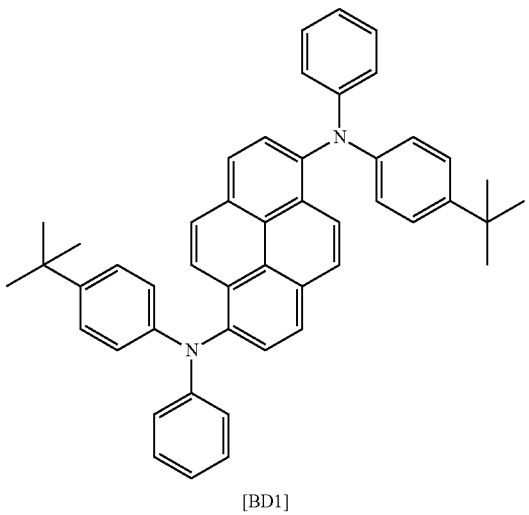

[BD1]

[Chemical Formula E-1]

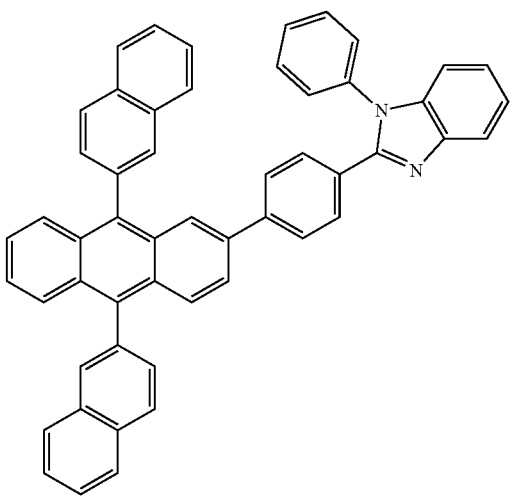

[Chemical Formula E-2]

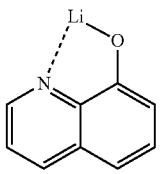

Comparative Examples 1 and 2

Organic light-emitting diodes were fabricated in the same manner as in Examples 1 and 4, with the exception that an electron density control layer was not formed.

Comparative Example 3

An organic light-emitting diode was fabricated in the same manner as in Example 4, with the exception that compound BH was used as a host in a light-emitting layer.

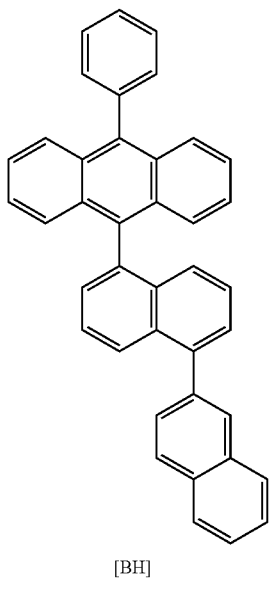

[BH]

TABLE 1

| | Host | Electron Density Control Layer | V | CIEx | CIEy | EQE |
|---|---|---|---|---|---|---|
| Ex. 1 | Chemical Formula 1 | Compound 203 | 3.85 | 0.137 | 0.111 | 11.51 |
| Ex. 2 | Chemical Formula 1 | Compound 209 | 3.85 | 0.137 | 0.109 | 11.37 |
| Ex. 3 | Chemical Formula 1 | Compound 213 | 3.77 | 0.137 | 0.110 | 11.44 |
| Ex. 4 | Chemical Formula 1 | Compound 281 | 3.89 | 0.137 | 0.110 | 10.96 |
| Ex. 5 | Chemical Formula 32 | Compound 203 | 3.81 | 0.138 | 0.110 | 11.25 |
| Ex. 6 | Chemical Formula 32 | Compound 209 | 3.83 | 0.138 | 0.108 | 11.01 |
| Ex. 7 | Chemical Formula 33 | Compound 213 | 3.79 | 0.138 | 0.111 | 11.12 |
| Ex. 8 | Chemical Formula 33 | Compound 281 | 3.80 | 0.138 | 0.110 | 10.96 |
| Ex. 9 | Chemical Formula 36 | Compound 203 | 3.77 | 0.137 | 0.110 | 10.94 |
| Ex. 10 | Chemical Formula 36 | Compound 209 | 3.81 | 0.137 | 0.109 | 11.05 |
| Ex. 11 | Chemical Formula 40 | Compound 203 | 3.85 | 0.138 | 0.110 | 11.32 |
| Ex. 12 | Chemical Formula 40 | Compound 209 | 3.84 | 0.138 | 0.110 | 11.18 |
| Ex. 13 | Chemical Formula 40 | Compound 213 | 3.82 | 0.138 | 0.111 | 11.21 |
| Ex. 14 | Chemical Formula 40 | Compound 281 | 3.90 | 0.138 | 0.111 | 11.05 |
| C. Ex. 1 | Chemical Formula 1 | — | 4.01 | 0.137 | 0.114 | 10.34 |
| C. Ex. 2 | Chemical Formula 40 | — | 3.98 | 0.137 | 0.111 | 10.36 |
| C. Ex. 3 | BH | Compound 281 | 3.97 | 0.138 | 0.109 | 10.54 |

In FIG. 5, measurement results of Examples 1 to 3 (Devices 1 to 3) and Comparative Example 1 (Ref.) are depicted to change in current efficiency with voltage according to the presence or absence of an electron density control layer in an organic light-emitting diode. In FIG. 6, measurement results of Examples to 3 (Devices 1 to 3) and Comparative Example 1 (Ref.) are depicted to show the electron mobility plotted against electric field for the organic light-emitting diodes in which an electron density control layer is present or absent.

Figure 7:
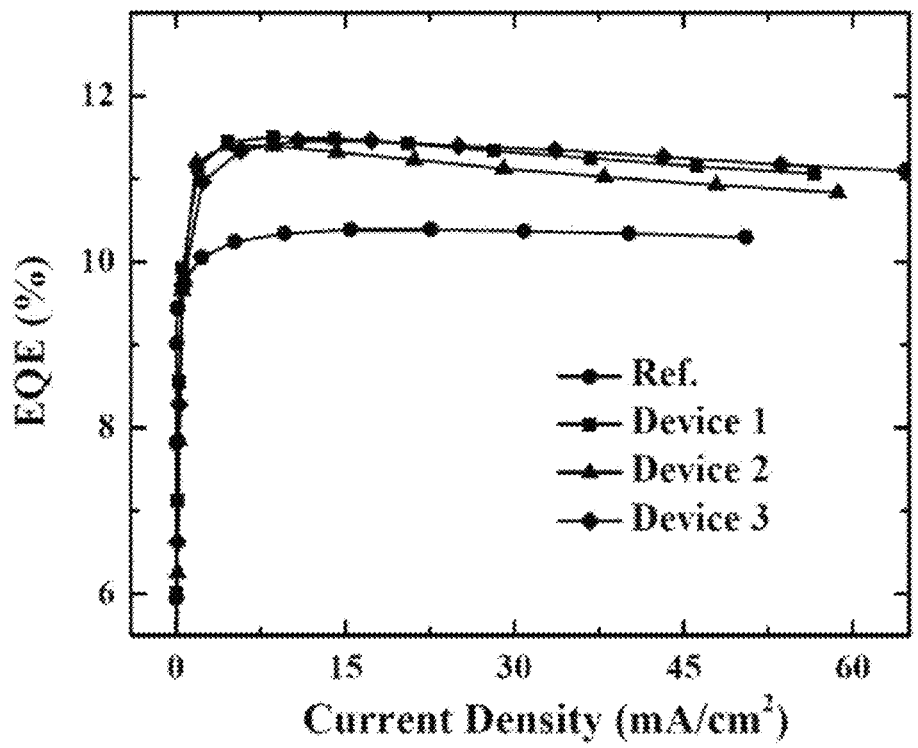
FIG. 7 shows changes in external quantum efficiency with current density in the organic light-emitting diodes in which an electron density control layer is present or absent.

Also, measurement results of Examples 1 to 3 (Devices 1 to 3) and Comparative Example 1 (Ref.) are depicted in FIG. 7 to show changes in external quantum efficiency with current density in the organic light-emitting diodes in which an electron density control layer is present or absent.

As shown in Table 1 and FIG. 7, the organic light-emitting diodes of the present disclosure are superior in terms of low-voltage operation and external quantum efficiency to those of Comparative Examples lacking an the electron density control layer. Further, the organic light-emitting diodes of the present disclosure exhibited higher external quantum efficiency, compared to that of Comparative Example 3, which is provided with an electron density control layer, but employs a host different from that used in the light-emitting layer of the present disclosure. Hence, organic light-emitting diodes of high efficiency can be fabricated according to the present disclosure.

INDUSTRIAL APPLICABILITY

Capable of fabricating organic light-emitting diodes that exhibit high luminous efficiency and excellent low-voltage operation, the present disclosure is industrially available.

The invention claimed is:

1. An organic light-emitting diode comprising: a first electrode; a second electrode facing the first electrode; a light-emitting layer and an electron density control layer sequentially arranged between the first electrode and the second electrode wherein the electron density control layer includes at least one of the compounds represented by the following Chemical Formulas A to D and the light-emitting layer includes at least one of the anthracene compounds represented by the following Chemical Formula H:

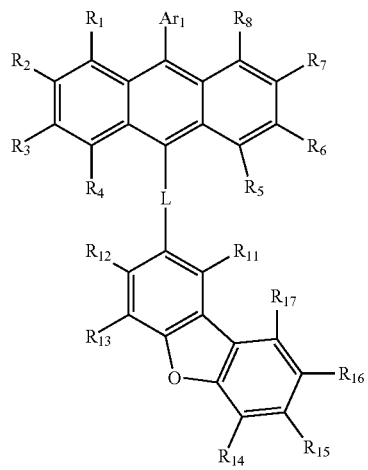

[Chemical Formula A]

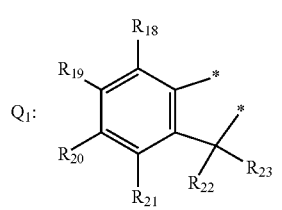

[Chemical Formula B]

-continued

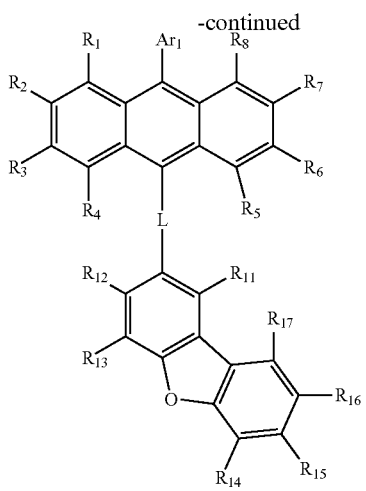

[Chemical Formula C]

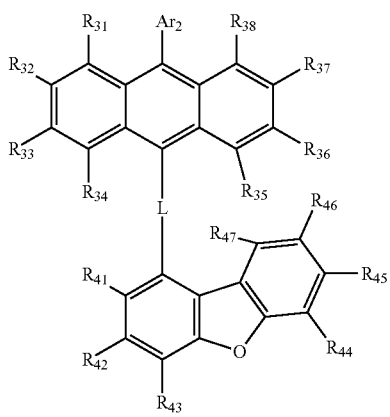

[Chemical Formula D]

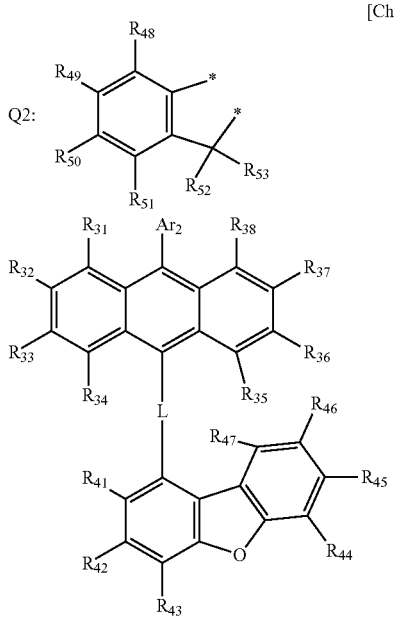

wherein,
$R_1$ to $R_8$, $R_{11}$ to $R_{23}$, $R_{31}$ to $R_{38}$, and $R_{41}$ to $R_{53}$, which may be the same or different, are each independently any one selected from among a hydrogen atom, a deuterium atom, a substituted or unsubstituted alkyl of 1 to 30 carbon atoms, a substituted or unsubstituted alkenyl of 2 to 30 carbon atoms, a substituted or unsubstituted alkynyl of 2 to 30 carbon atoms, a substituted or unsubstituted cycloalkyl of 3 to 30 carbon atoms, a substituted or unsubstituted cycloalkenyl of 5 to 30 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 6 to 30 carbon atoms, a substituted or unsubstituted alkylamine of 1 to 30 carbon atoms, a substituted or unsubstituted arylamine of 6 to 30 carbon atoms, a substituted or unsubstituted aryl of 6 to 50 carbon atoms, a substituted or unsubstituted heteroaryl of 2 to 50 carbon atoms bearing O, N, or S as a heteroatom, a cyano, a nitro, a halogen, a substituted or unsubstituted silyl of 1 to 30 carbon atoms, a substituted or unsubstituted germanium of 1 to 30 carbon atoms, a substituted or unsubstituted boron of 1 to 30 carbon atoms, a substituted or unsubstituted aluminum of 1 to 30 carbon atoms, a carbonyl, a phosphoryl, an amino, a thiol, a hydroxy, a selenium, a tellurium, an amide, an ether, and an ester, substituents $Ar_1$ and $Ar_2$, which may be the same or different, are each independently a substituted or unsubstituted aryl of 6 to 50 carbon atoms, or a substituted or unsubstituted heteroaryl of 2 to 50 carbon atoms; and linker L is selected from among a single bond, a substituted or unsubstituted arylene of 6 to 60 carbon atoms, and a substituted or unsubstituted heteroarylene of 2 to 60 carbon atoms, wherein substituents $R_{12}$ and $R_{13}$ or two adjacent ones among substituents $R_{14}$ to $R_{17}$ in Chemical Formula B are respective single bonds for forming a 5-membered ring as a fused ring together with a carbon atom to which substituents $R_{22}$ and $R_{23}$ of Structural Formula $Q_1$ are bonded, and two adjacent ones among substituents $R_{41}$ to $R_{43}$ in Chemical Formula D are respective single bonds for forming a 5-membered ring as a fused ring together with a carbon to which substituents $R_{52}$ and $R_{53}$ of Structural Formula $Q_2$ are bonded, wherein a bond may be formed between substituents $R_{22}$ and $R_{23}$ and between substituents $R_{52}$ and $R_{53}$ to form respective rings,

[Chemical Formula H]

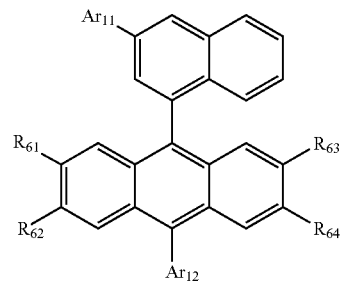

wherein,
$Ar_{11}$ and $Ar_{12}$, which may be the same or different, are each independently selected from among a substituted or unsubstituted aryl of 6 to 50 carbon atoms and a substituted or unsubstituted heteroaryl of 3 to 50 carbon atoms bearing O, N, or S as a heteroatom, R$_{61}$ to R$_{64}$, which may be the same or different, are each independently selected from the group consisting of a hydrogen atom, a deuterium atom, a substituted or unsubstituted alkyl of 1 to 30 carbon atoms, a substituted or unsubstituted alkenyl of 2 to 30 carbon atoms, a substituted or unsubstituted cycloalkyl of 3 to 30 carbon atoms, a substituted or unsubstituted cycloalkenyl of 5 to 30 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 6 to 30 carbon atoms, a substituted or unsubstituted alkylamine of 1 to 30 carbon atoms, a substituted or unsubstituted arylamine of 6 to 30 carbon atoms, a substituted or unsubstituted aryl of 6 to 50 carbon atoms, a substituted or unsubstituted heteroaryl of 3 to 50 carbon atoms bearing O, N, or S as a heteroatom, a substituted or unsubstituted silicon, a substituted or unsubstituted boron, a substituted or unsubstituted silane, a carbonyl, a phosphoryl, an amino, a nitrile, a hydroxy, a nitro, a halogen, an amide, and an ester, with the proviso that a hydrogen atom is positioned on each of the aromatic ring carbon atoms to which none of the substituents Ar$_{11}$, Ar$_{12}$, and R$_{61}$ to R$_{64}$ are bonded, and
wherein a bond may be between R$_{61}$ and R$_{62}$ to form a saturated or unsaturated ring and between R$_{63}$ and R$_{64}$ to form a saturated or unsaturated ring,
wherein the term 'substituted' in the expression 'substituted or unsubstituted' means having at least one substituent selected from the group consisting of a deuterium atom, a cyano, a halogen, a hydroxy, a nitro, an alkyl of 1 to 24 carbon atoms, a halogenated alkyl of 1 to 24 carbon atoms, an alkenyl of 2 to 24 carbon atoms, an alkynyl of 2 to 24 carbon atoms, a heteroalkyl of 1 to 24 carbon atoms, an aryl of 6 to 24 carbon atoms, an arylalkyl of 7 to 24 carbon atoms, a heteroaryl of 2 to 24 carbon atoms or a heteroarylalkyl of 2 to 24 carbon atoms, an alkoxy of 1 to 24 carbon atoms, an alkylamino of 1 to 24 carbon atoms, an arylamino of 6 to 24 carbon atoms, a hetero arylamino of 2 to 24 carbon atoms, an alkylsilyl of 1 to 24 carbon atoms, an arylsilyl of 6 to 24 carbon atoms, and an aryloxy of 6 to 24 carbon atoms.

2. The organic light-emitting diode of claim 1, wherein the first electrode is an anode and the second electrode is a cathode, with the interposition of a hole transport layer between the cathode and the light-emitting layer and an electron transport layer between the electron density control layer and the anode.

3. The organic light-emitting diode of claim 2, wherein the light-emitting layer includes a host and a dopant, and the anthracene compound represented by Chemical Formula H is used as a host.

4. The organic light-emitting diode of claim 3, wherein an affinity A$_{ed}$ (eV) of the electron density control layer, an affinity A$_h$ (eV) of the host of the light-emitting layer, and an affinity A$_e$ (eV) of the electron transport layer satisfy a relationship of A$_h$≥A$_{ed}$≥A$_e$.

5. The organic light-emitting diode of claim 2, wherein the material of the electron density controlling layer is not less in electron mobility than that of the electron transport layer.

6. The organic light-emitting diode of claim 2, wherein a hole injection layer is introduced between the anode and the hole transport layer, and an electron injection layer is disposed between the electron transport layer and the cathode.

7. The organic light-emitting diode of claim 6, wherein at least one of the layers is formed using a deposition process or a solution process.

8. The organic light-emitting diode of claim 1, wherein substituents Ar$_1$ and Ar$_2$ in Chemical Formulas A to D are each independently a substituted or unsubstituted aryl of 6 to 18 carbon atoms.

9. The organic light-emitting diode of claim 1, wherein substituents Ar$_{11}$ and Ar$_{12}$ in Chemical Formula H may be same or different and are each independently a substituted or unsubstituted aryl of 6 to 18 carbon atoms.

10. The organic light-emitting diode of claim 1, wherein the compound represented by Chemical Formula H is selected from among compounds represented by the following Chemical Formulas 1 to 80:

[Chemical Formula 1]

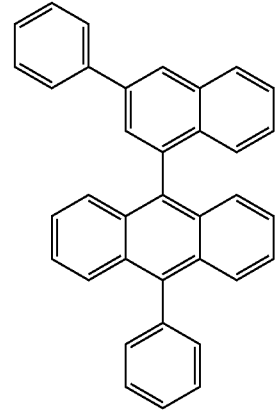

[Chemical Formula 2]

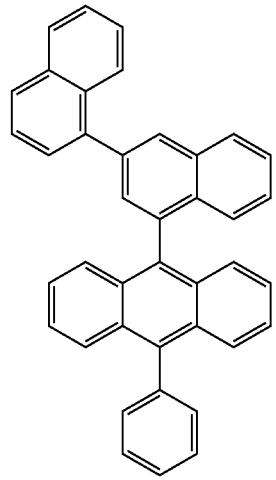

[Chemical Formula 3]
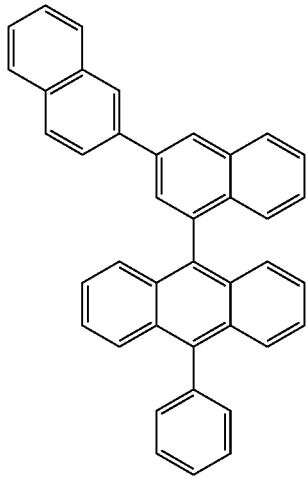
[Chemical Formula 4]
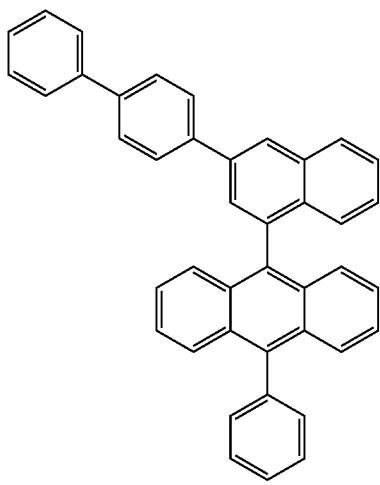
[Chemical Formula 5]
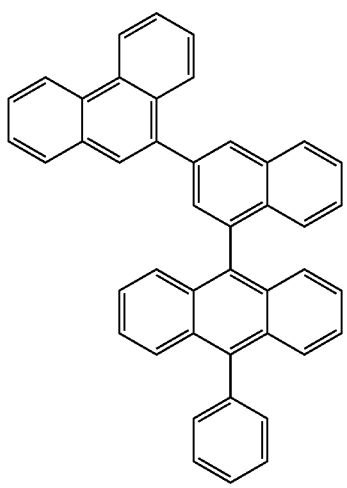
[Chemical Formula 6]
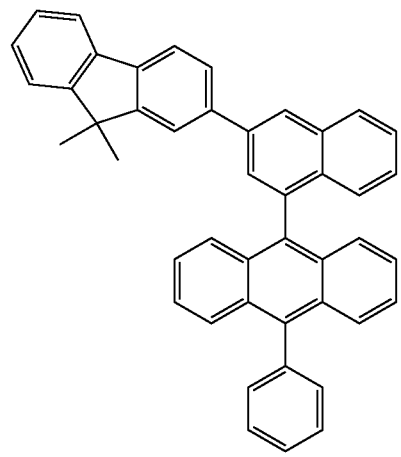
[Chemical Formula 7]
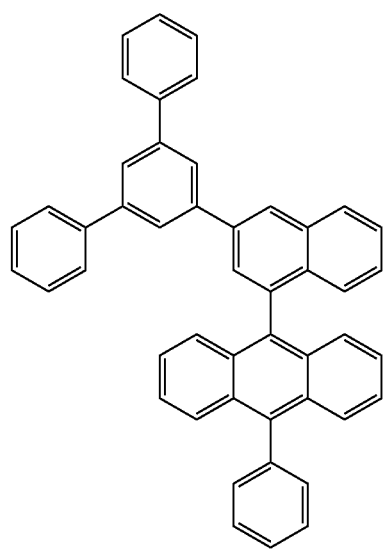
[Chemical Formula 8]
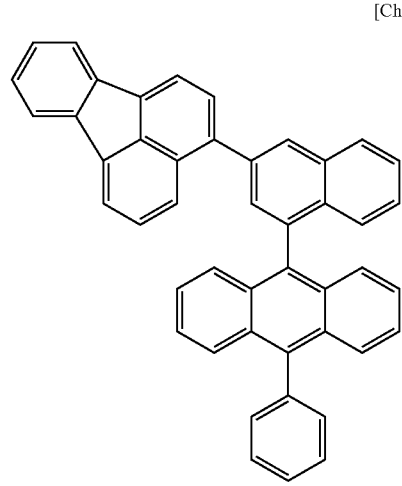

[Chemical Formula 9]
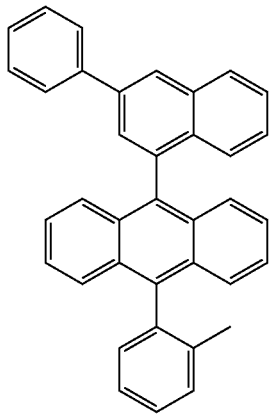
[Chemical Formula 10]
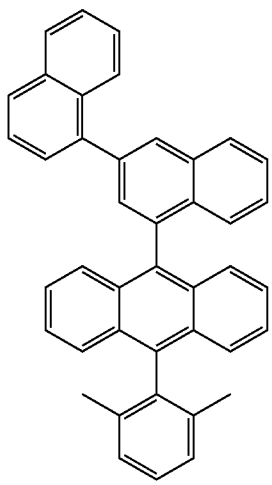
[Chemical Formula 11]
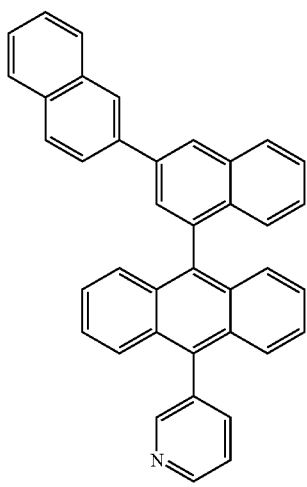
[Chemical Formula 12]
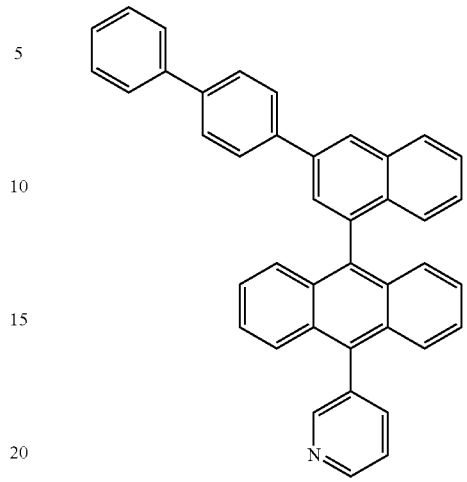
[Chemical Formula 13]
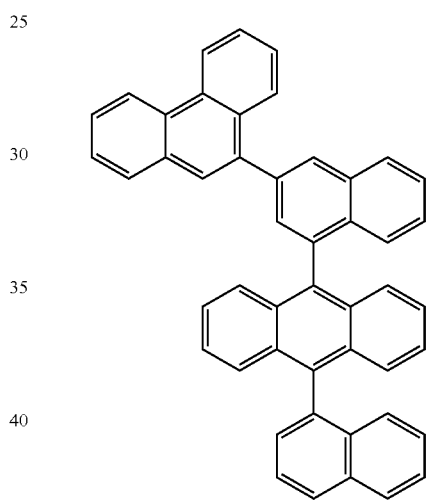
[Chemical Formula 14]
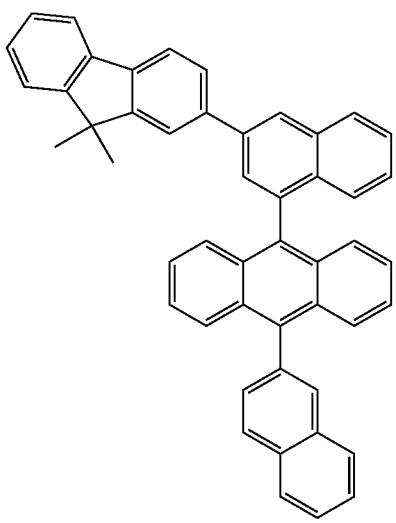

-continued
[Chemical Formula 15]
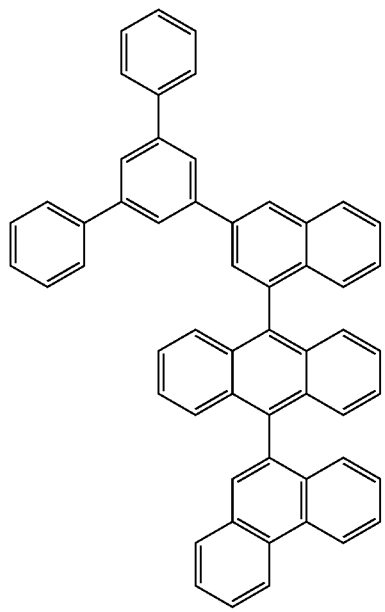
[Chemical Formula 16]
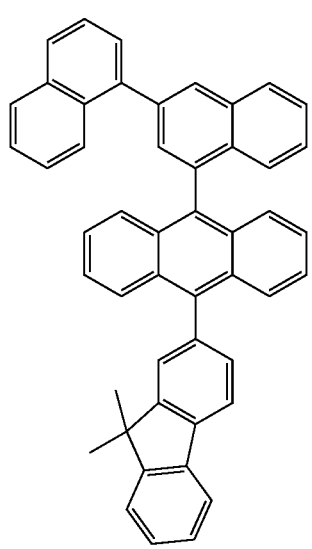
-continued
[Chemical Formula 17]
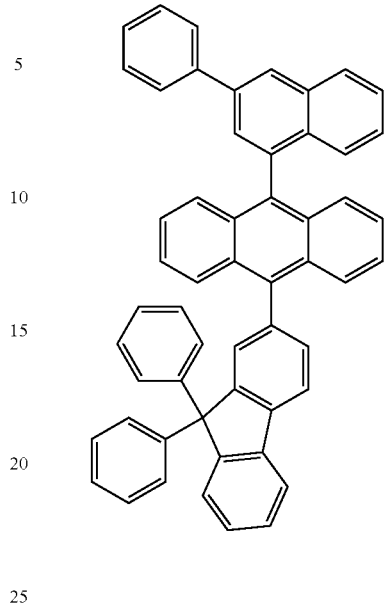
[Chemical Formula 18]
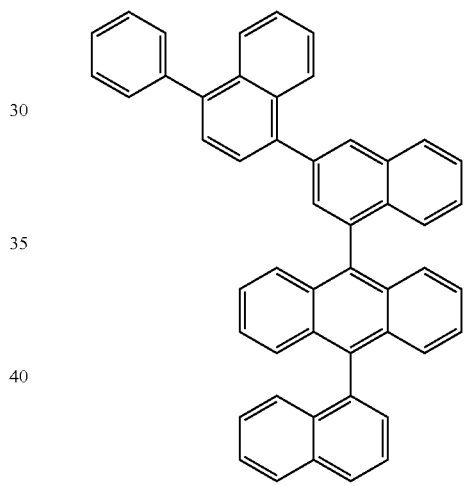
[Chemical Formula 19]
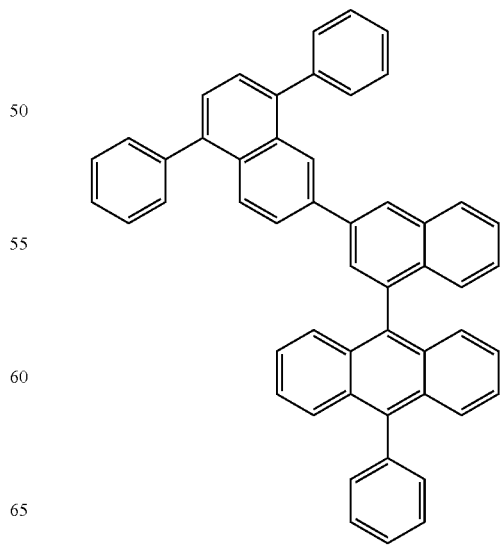

[Chemical Formula 20]
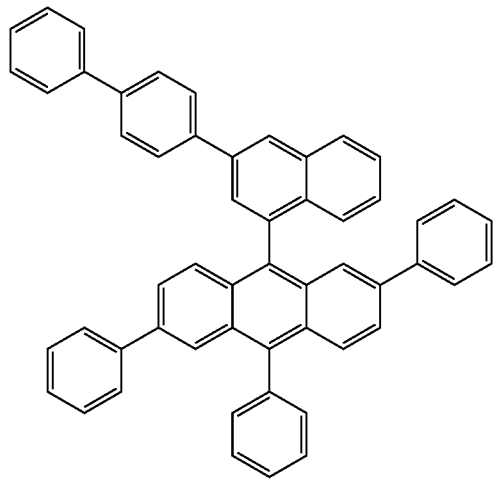
[Chemical Formula 21]
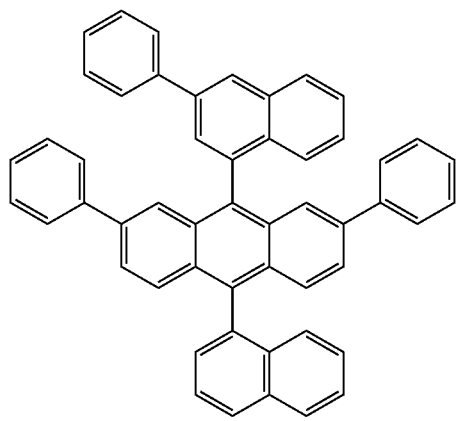
[Chemical Formula 22]
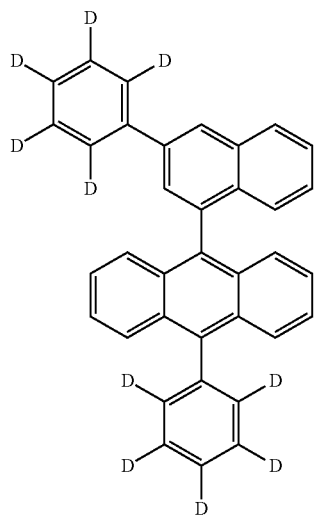
[Chemical Formula 23]
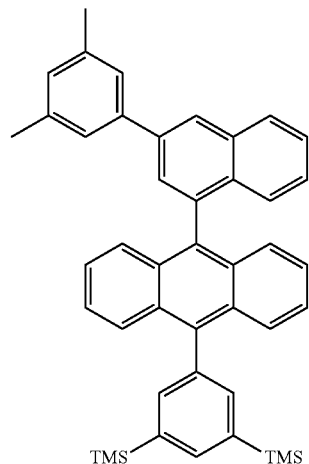
[Chemical Formula 24]
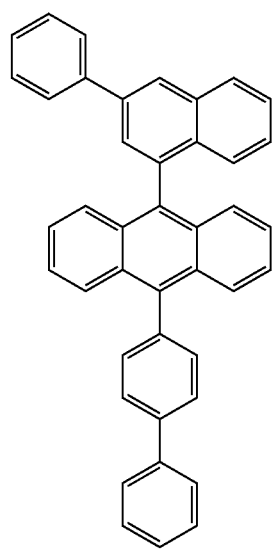
[Chemical Formula 25]
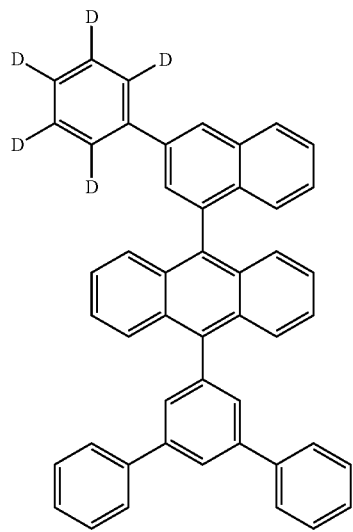

[Chemical Formula 26]
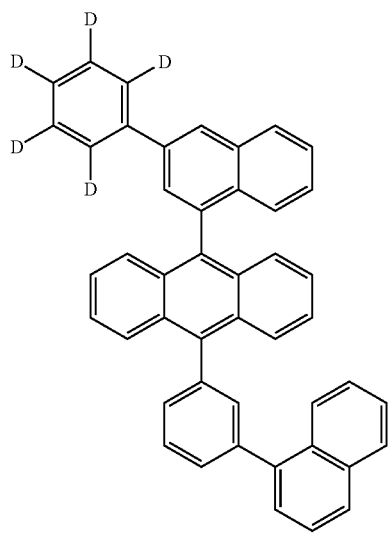
[Chemical Formula 27]
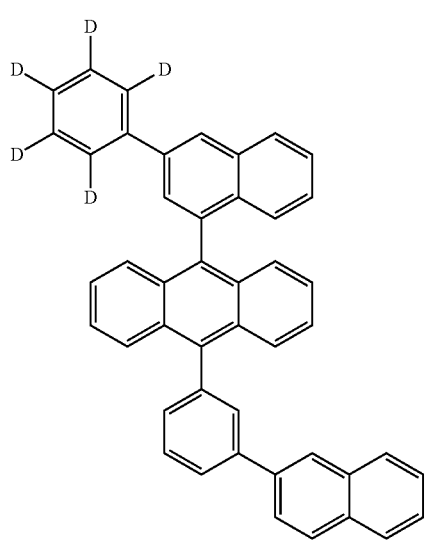
[Chemical Formula 28]
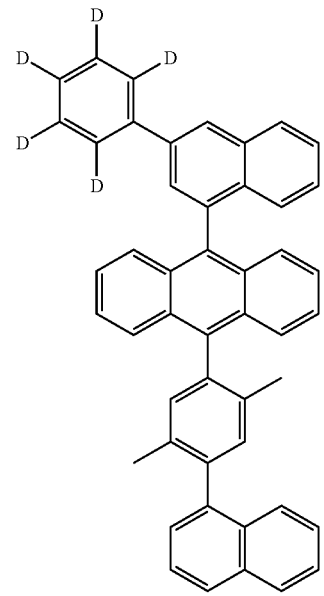
[Chemical Formula 29]
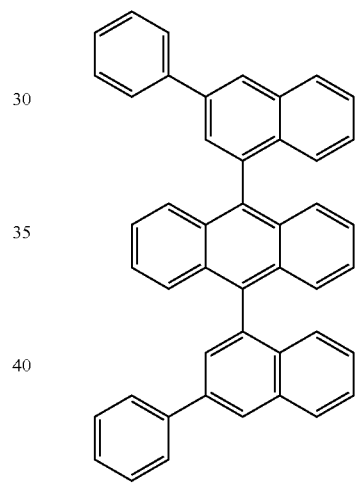
[Chemical Formula 30]
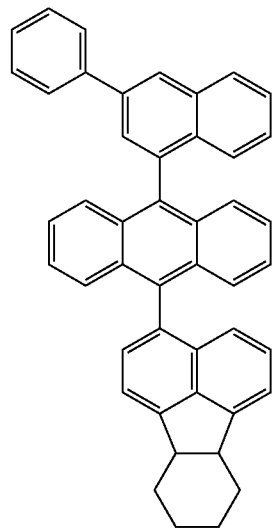

[Chemical Formula 31]
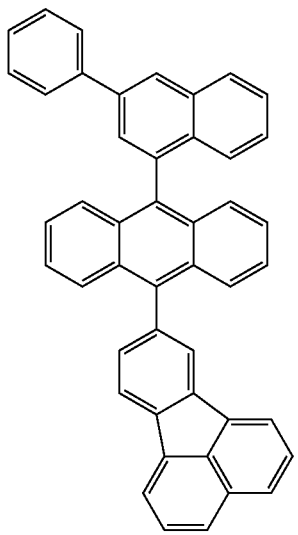
[Chemical Formula 32]
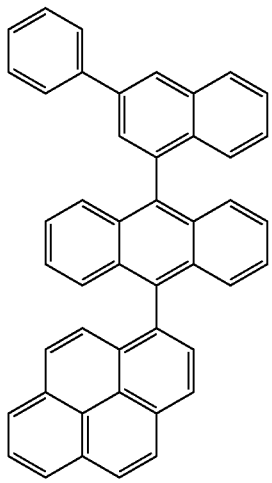
[Chemical Formula 33]
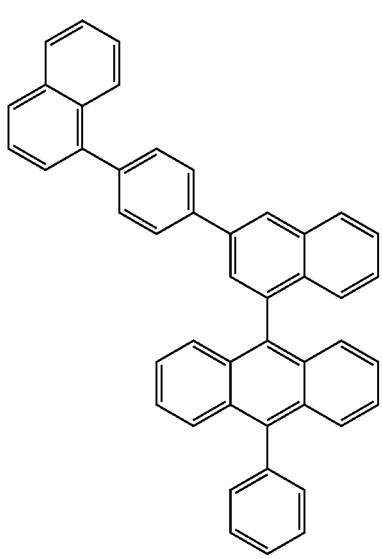
[Chemical Formula 34]
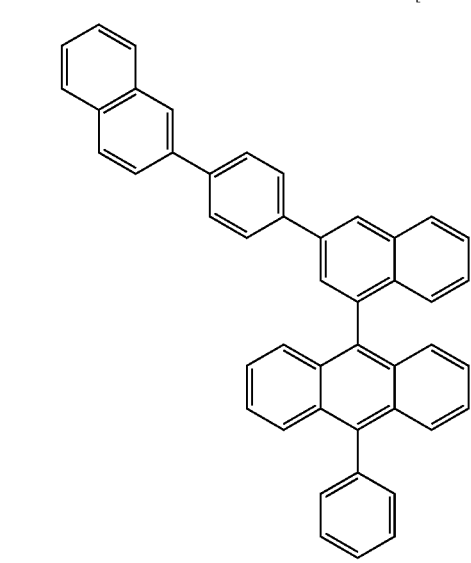
[Chemical Formula 35]
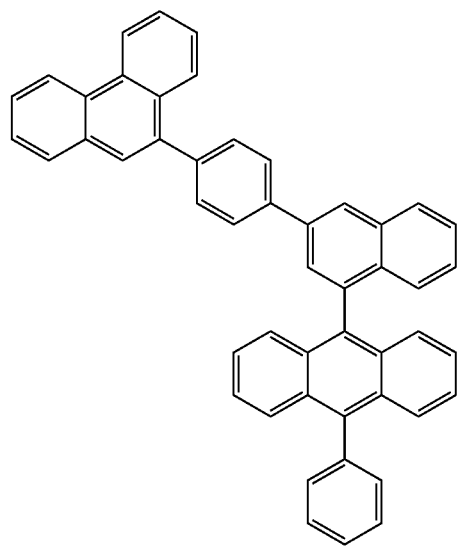
[Chemical Formula 36]
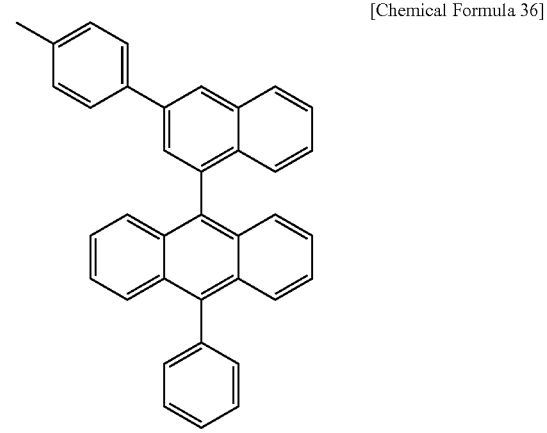

-continued
[Chemical Formula 37]
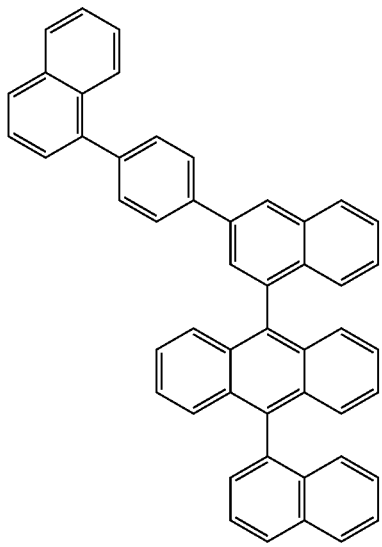
[Chemical Formula 38]
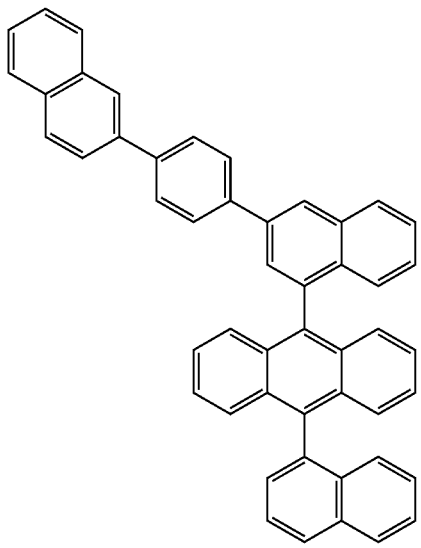
-continued
[Chemical Formula 39]
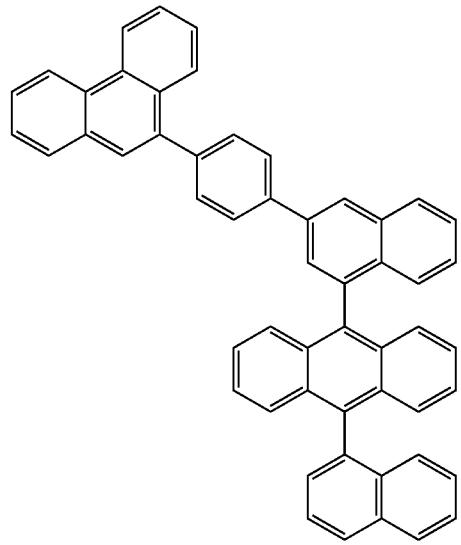
[Chemical Formula 40]
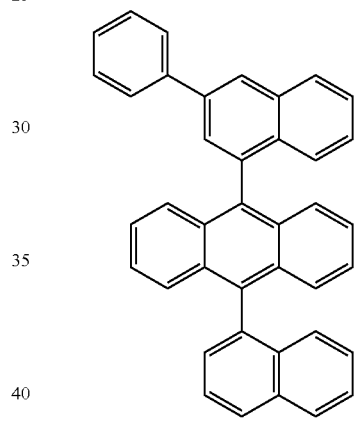
[Chemical Formula 41]
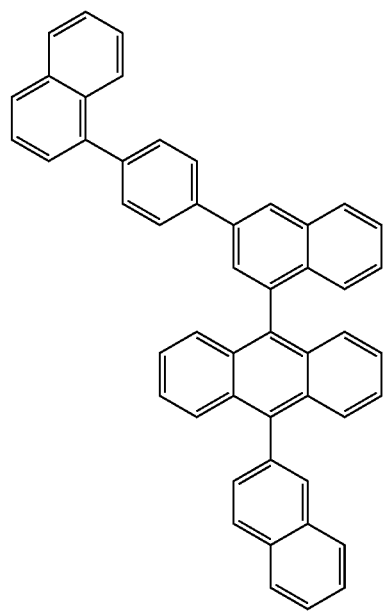

[Chemical Formula 42]
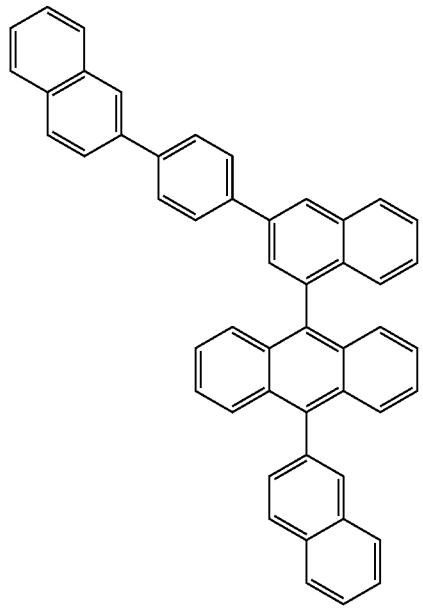
[Chemical Formula 43]
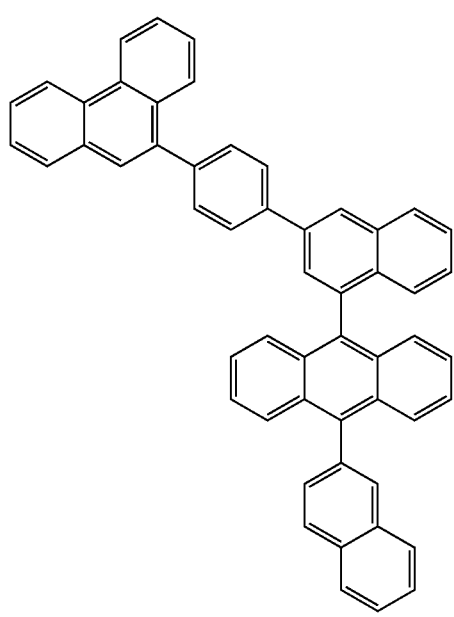
[Chemical Formula 44]
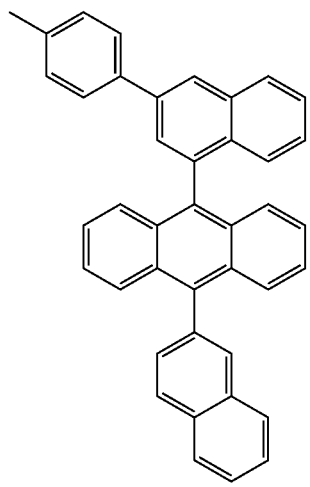
[Chemical Formula 45]
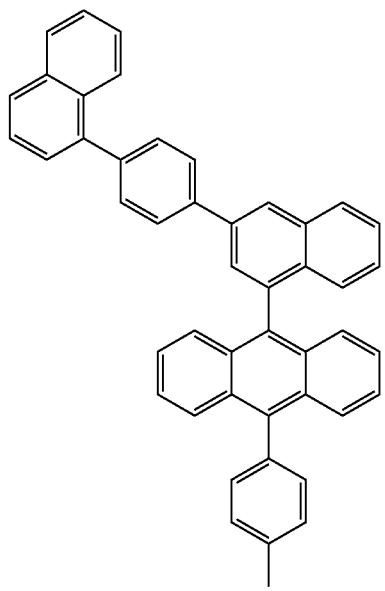

[Chemical Formula 46]
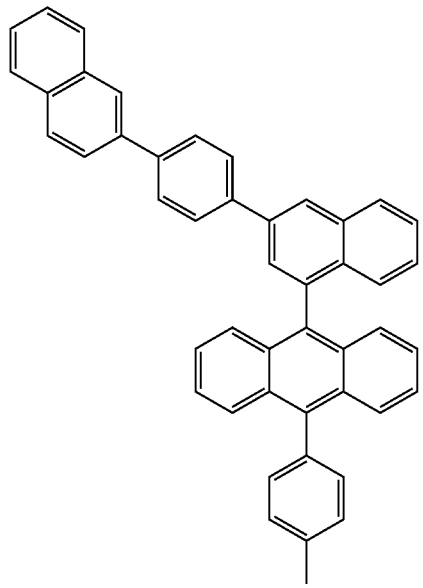
[Chemical Formula 47]
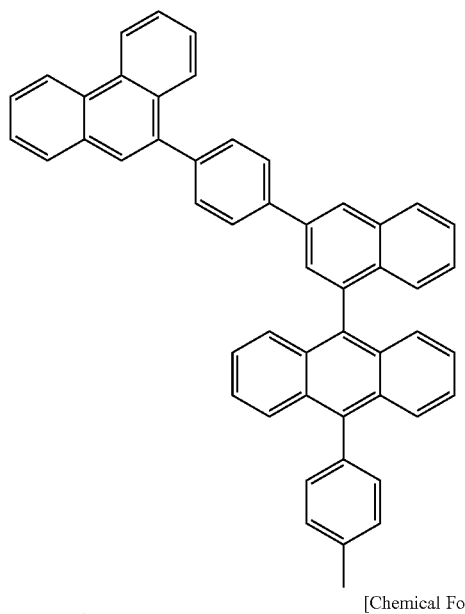
[Chemical Formula 48]
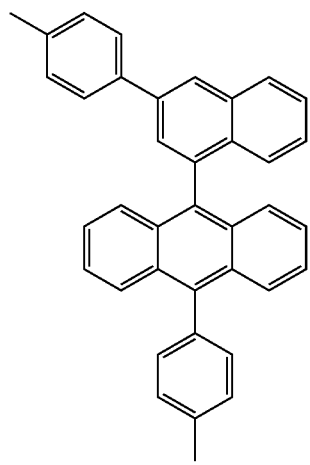
[Chemical Formula 49]
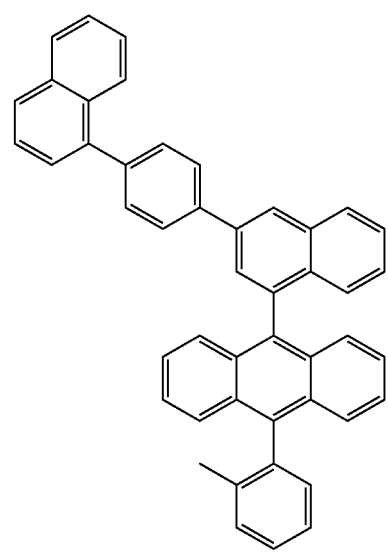
[Chemical Formula 50]
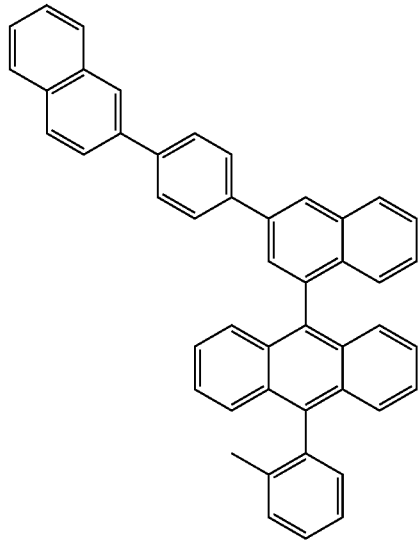

[Chemical Formula 51]
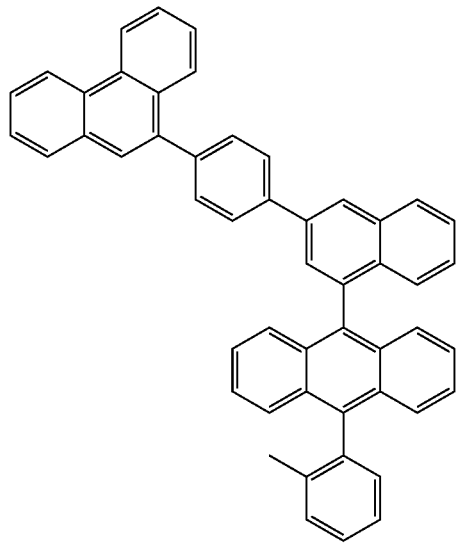
[Chemical Formula 52]
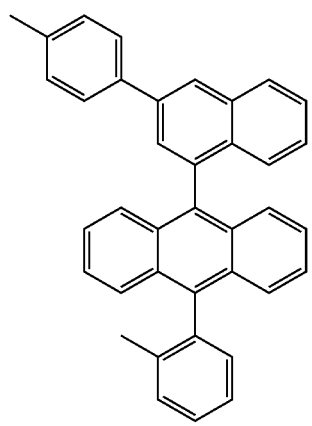
[Chemical Formula 53]
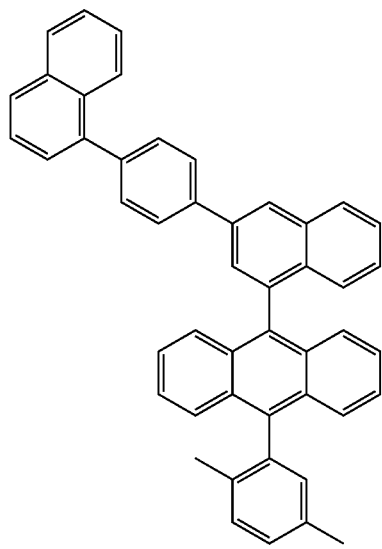
[Chemical Formula 54]
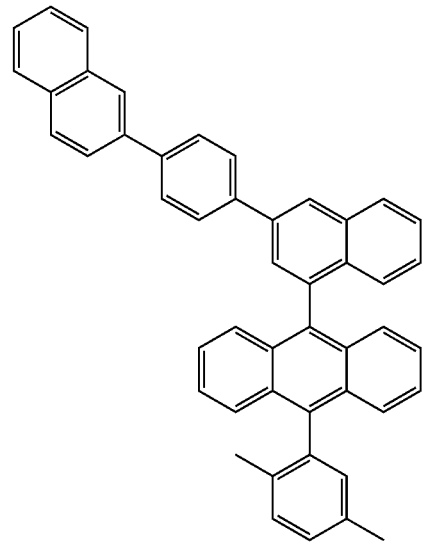
[Chemical Formula 55]
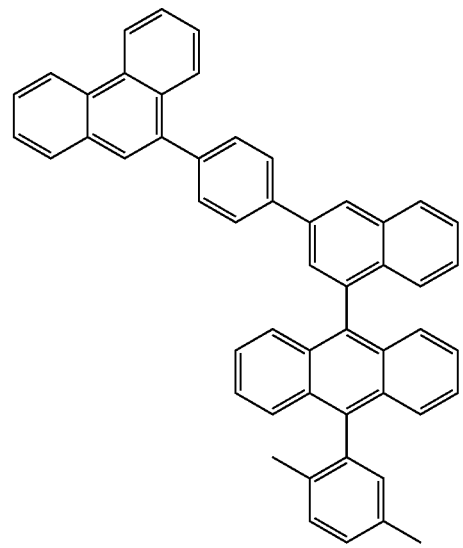
[Chemical Formula 56]
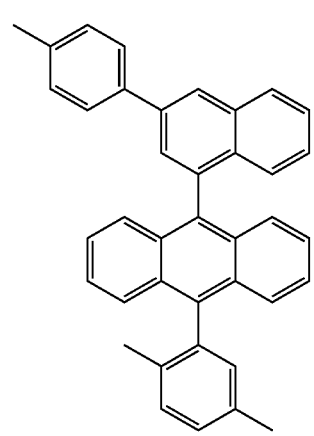

[Chemical Formula 57]
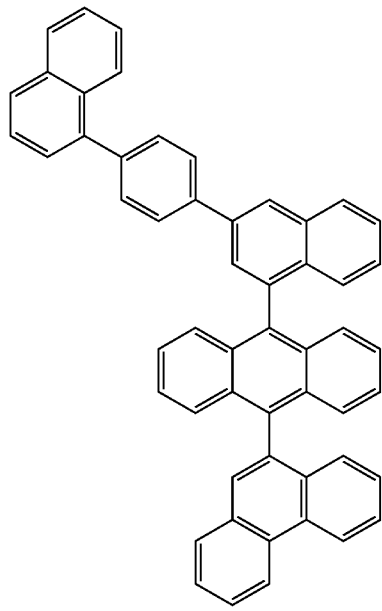
[Chemical Formula 58]
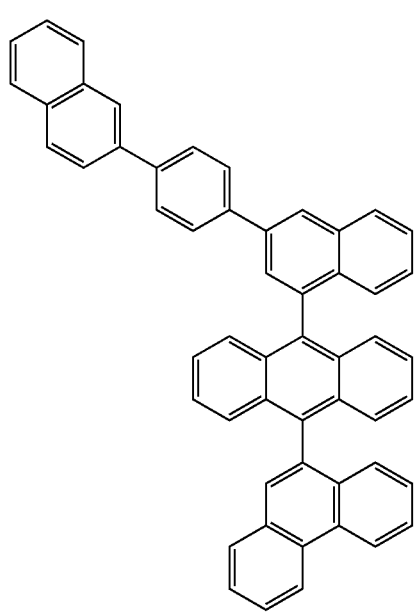
[Chemical Formula 59]
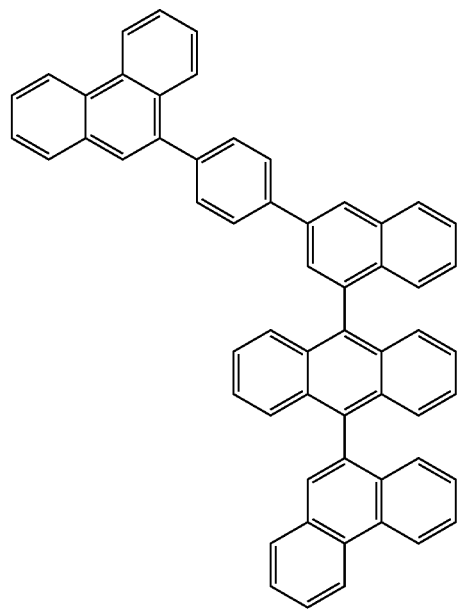
[Chemical Formula 60]
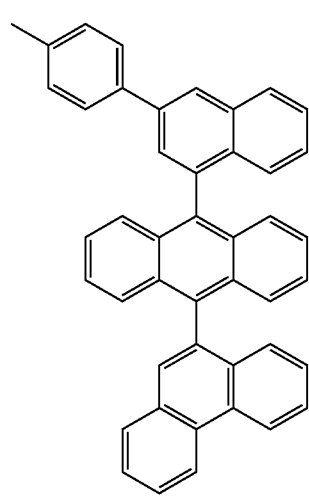

175
-continued
[Chemical Formula 61]
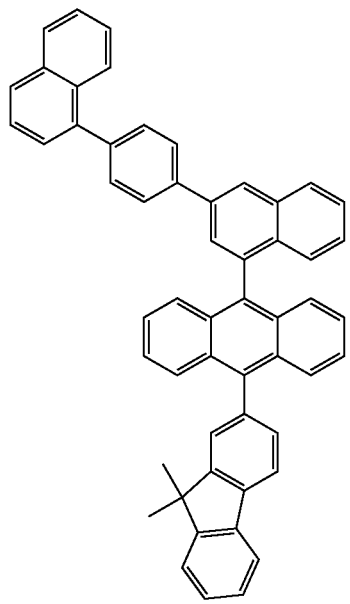
[Chemical Formula 62]
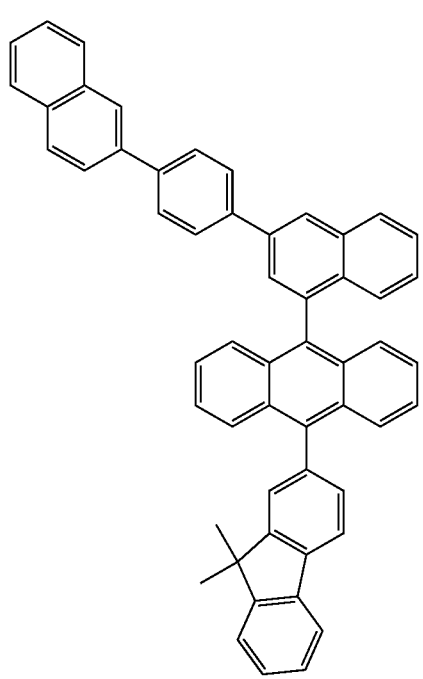
176
-continued
[Chemical Formula 63]
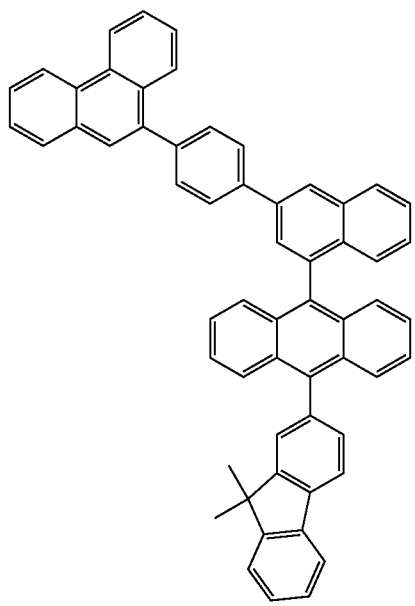
[Chemical Formula 64]
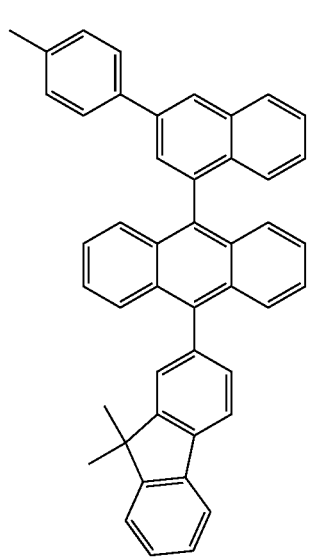

-continued
[Chemical Formula 65]
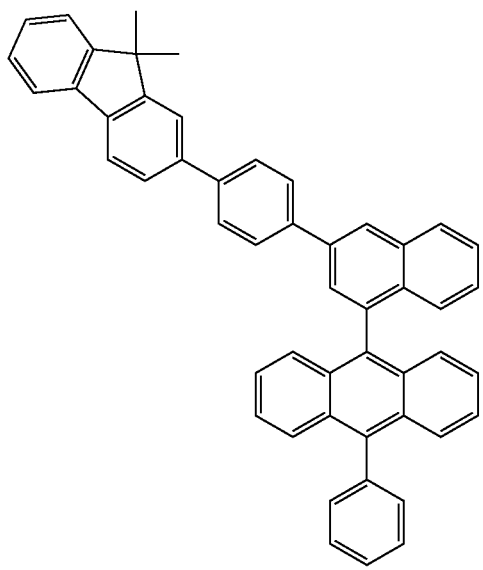
[Chemical Formula 66]
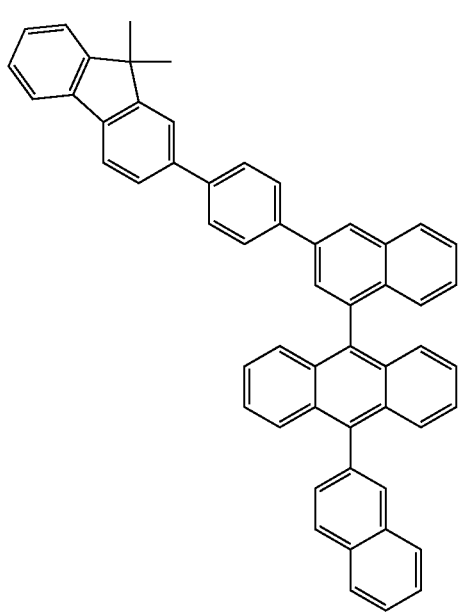
-continued
[Chemical Formula 67]
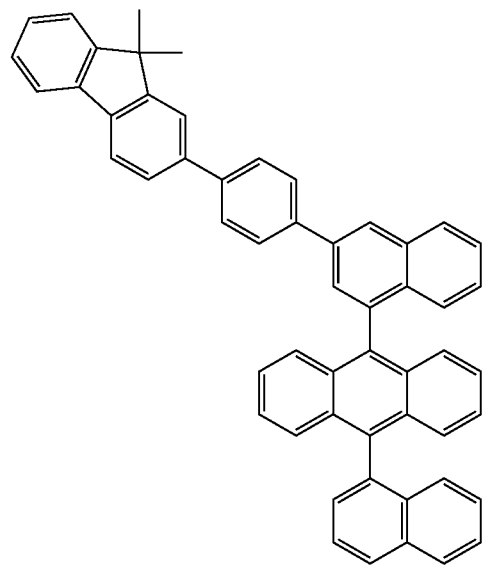
[Chemical Formula 68]
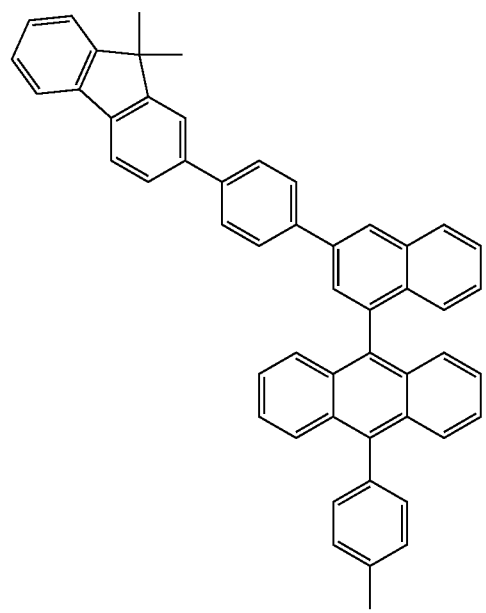

[Chemical Formula 69]
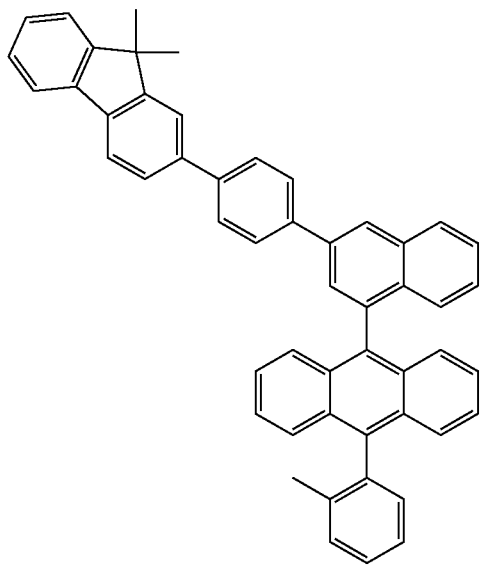
[Chemical Formula 70]
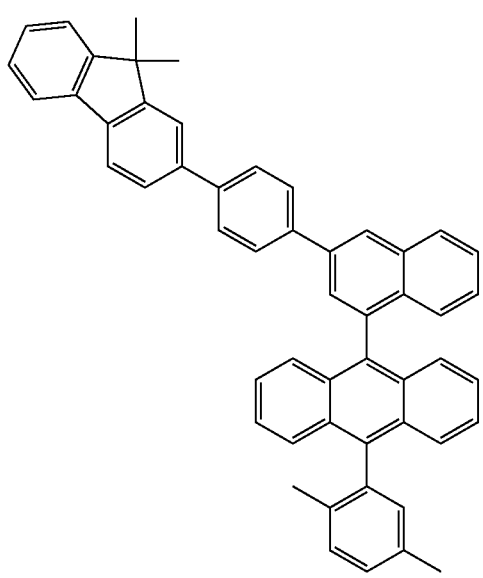
[Chemical Formula 71]
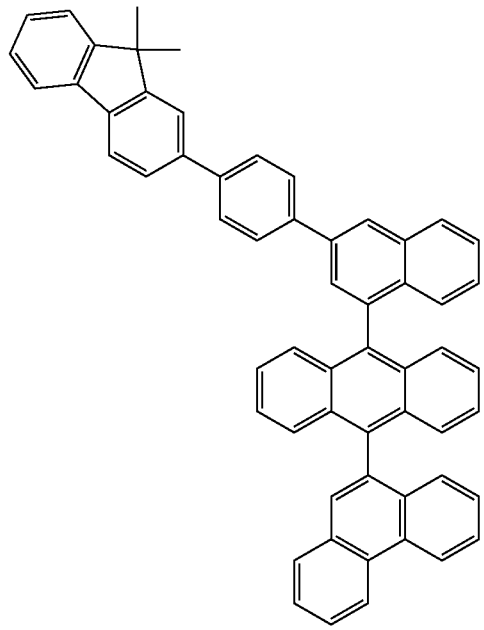
[Chemical Formula 72]
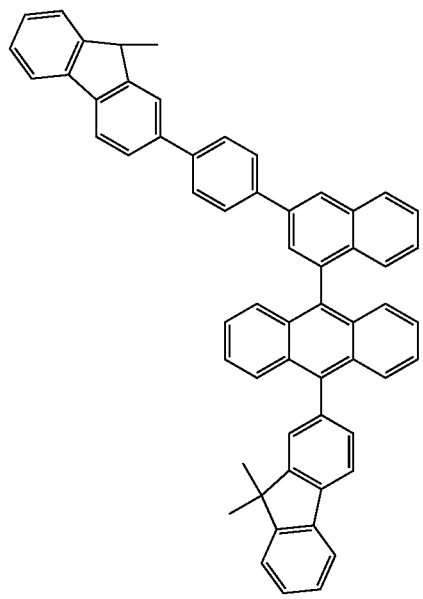

-continued
[Chemical Formula 73]
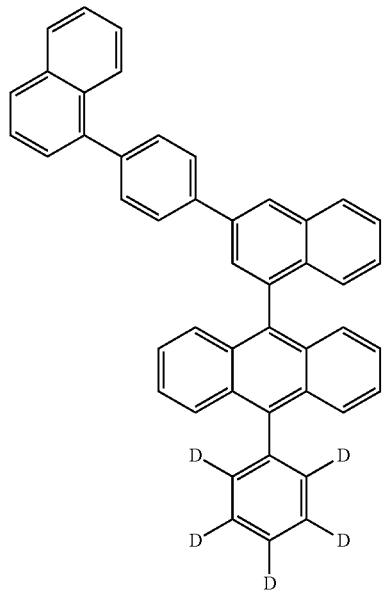
[Chemical Formula 74]
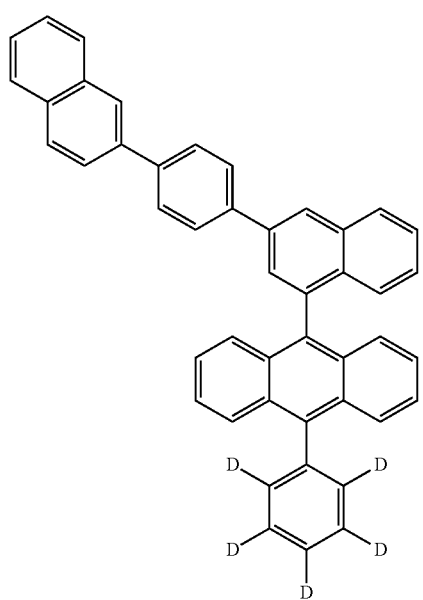
-continued
[Chemical Formula 75]
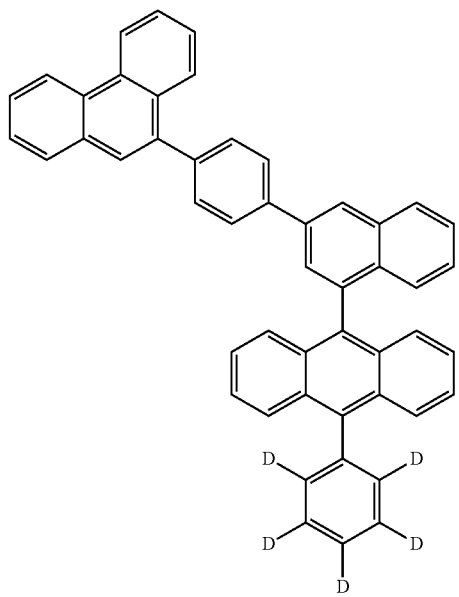
[Chemical Formula 76]

[Chemical Formula 77]
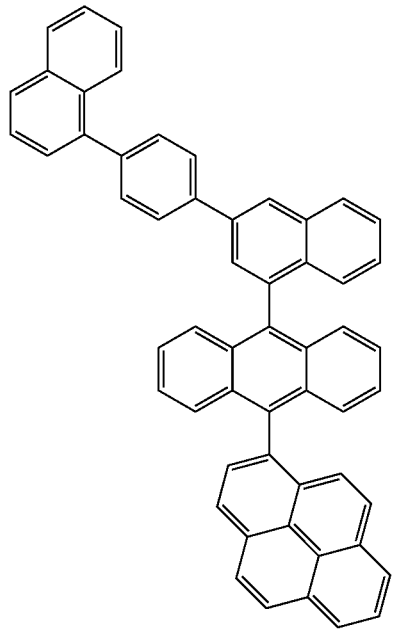
[Chemical Formula 78]
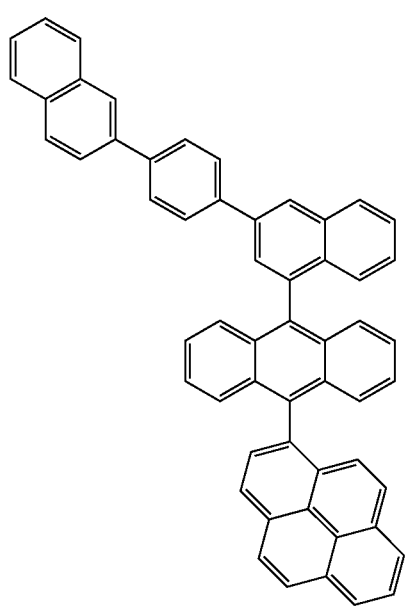
[Chemical Formula 79]
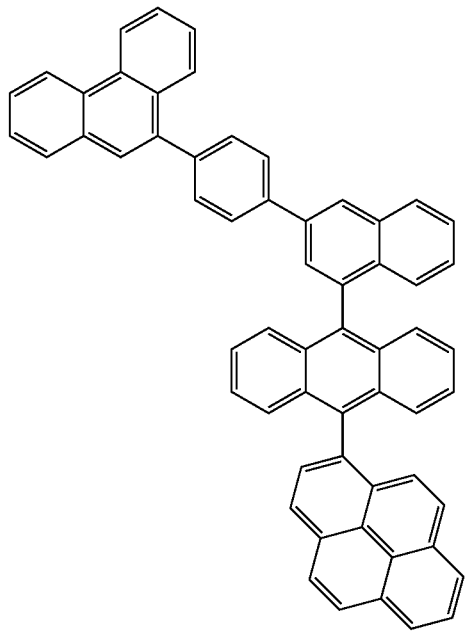
[Chemical Formula 80]
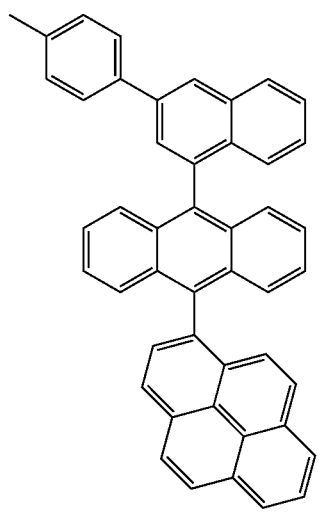
11. The organic light-emitting diode of claim 1, wherein the electron density control layer includes at least one selected from among the following Compounds 201 to 338:

<Compound 201>
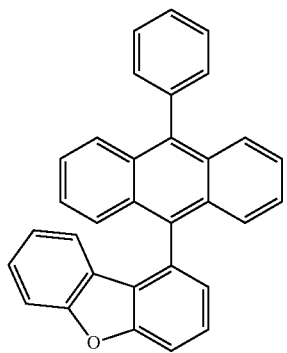
<Compound 202>
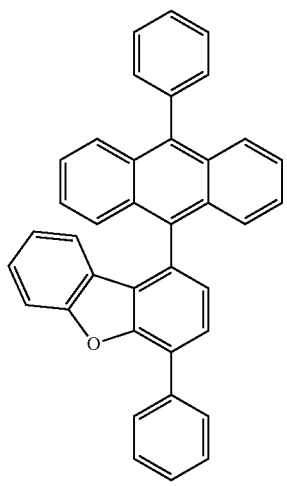
<Compound 203>
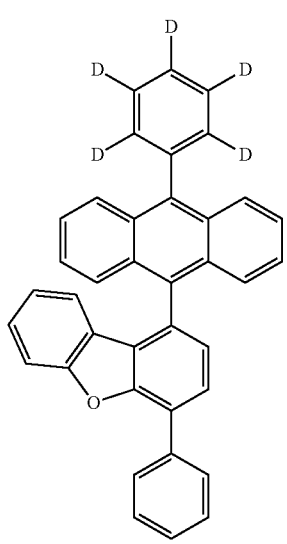
<Compound 204>
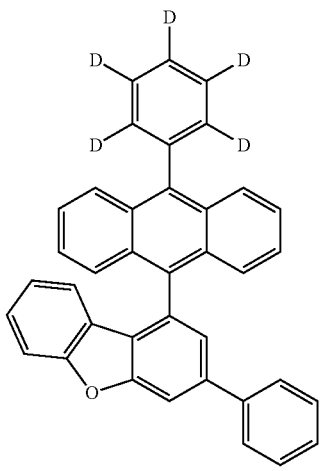
<Compound 205>
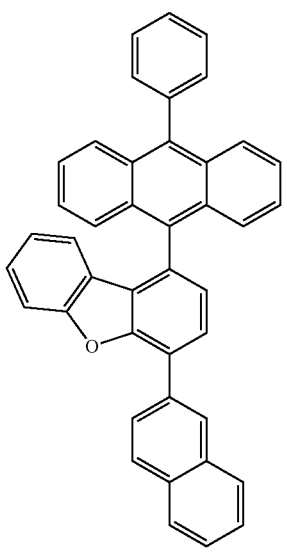
<Compound 206>
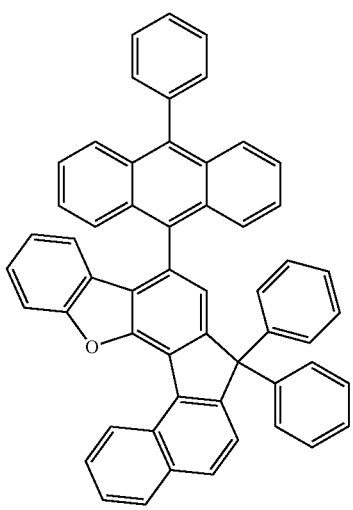

<Compound 207>
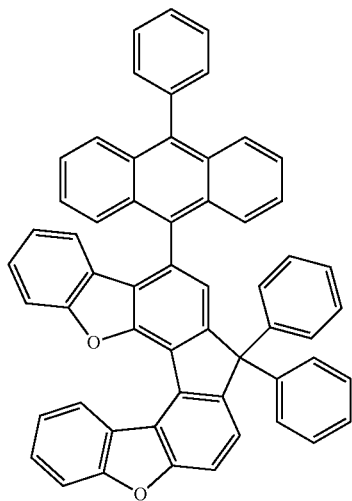
<Compound 208>
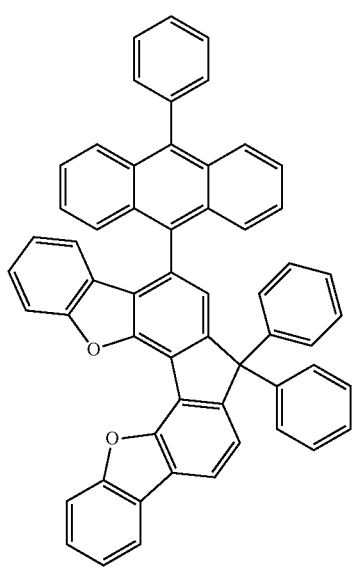
<Compound 209>
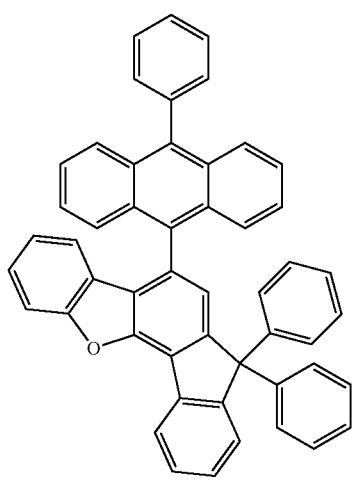
<Compound 210>
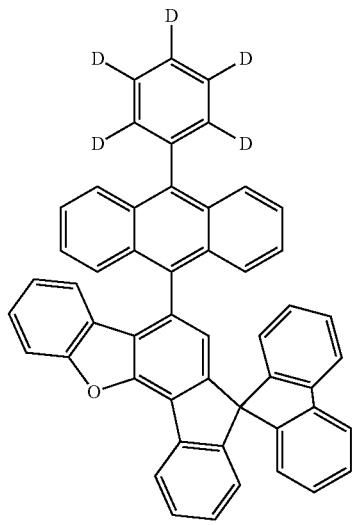
<Compound 211>
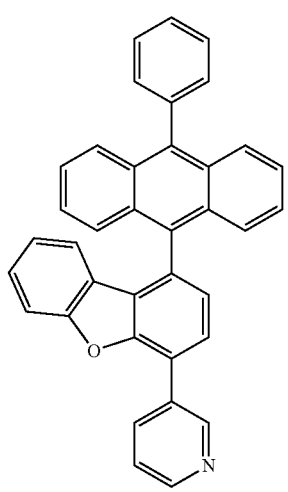
<Compound 212>
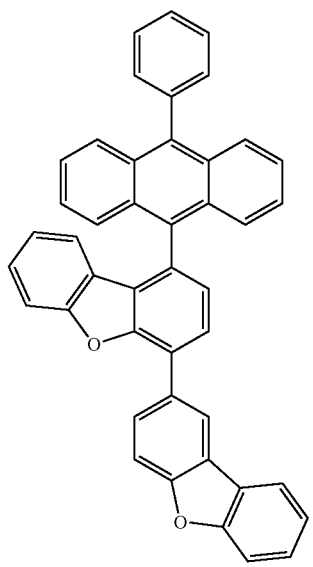

<Compound 213>
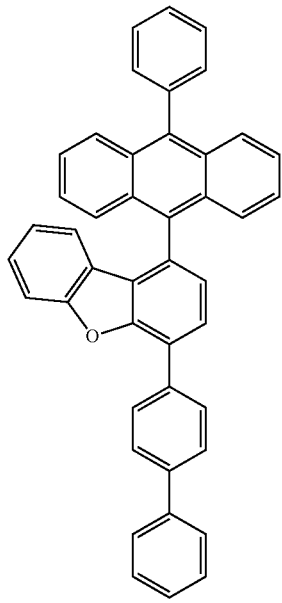
<Compound 214>
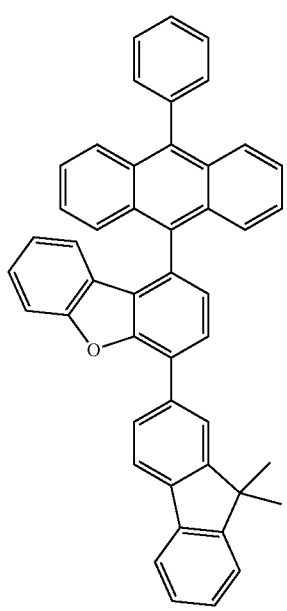
<Compound 215>
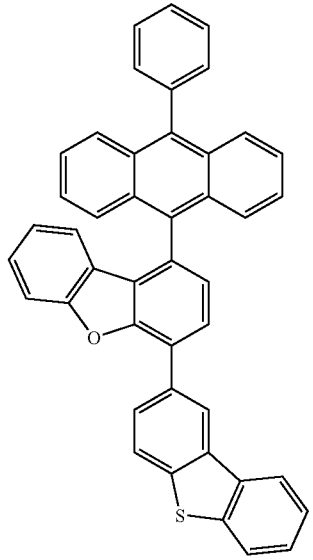
<Compound 216>
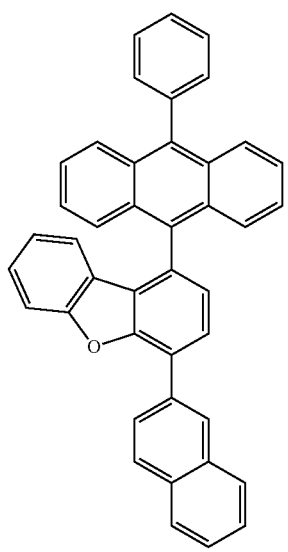
<Compound 217>
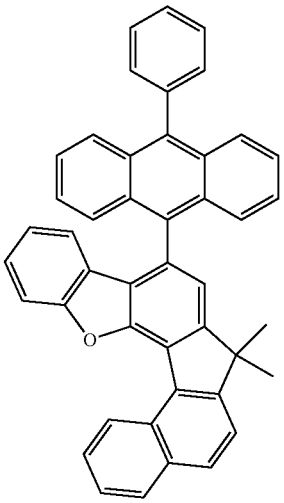

<Compound 218>
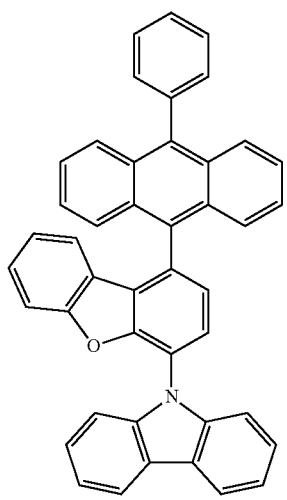
<Compound 219>
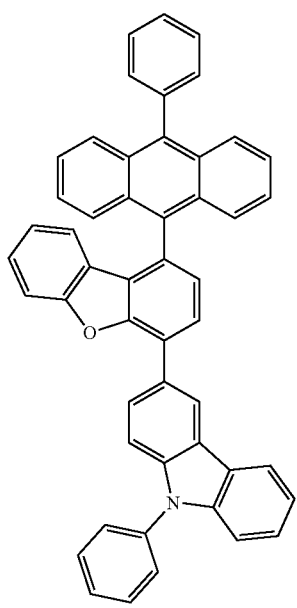
<Compound 220>
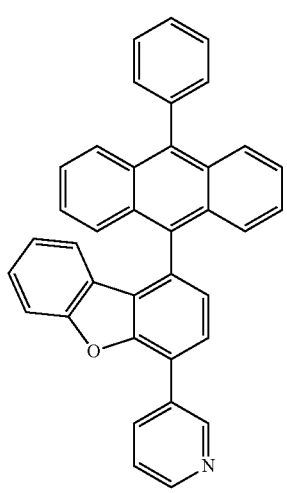
<Compound 221>
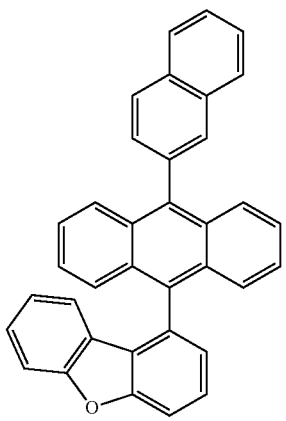
<Compound 222>
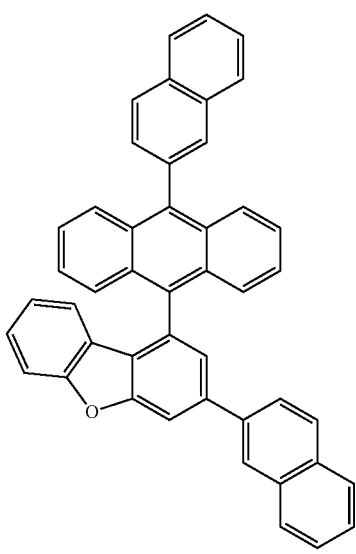
<Compound 223>
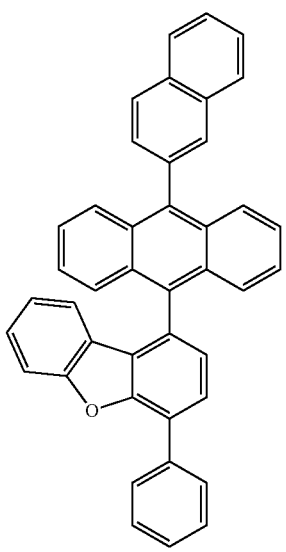

<Compound 224>
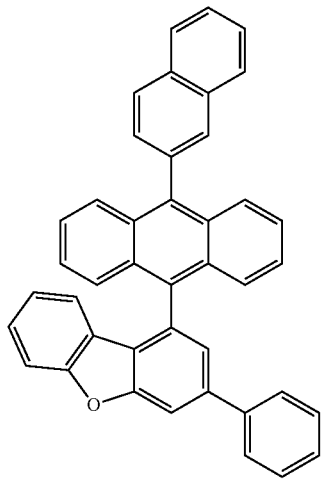
<Compound 225>
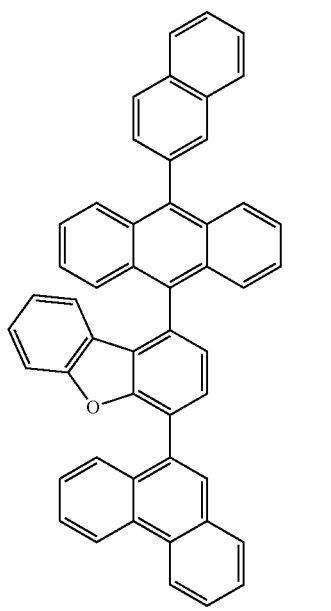
<Compound 226>
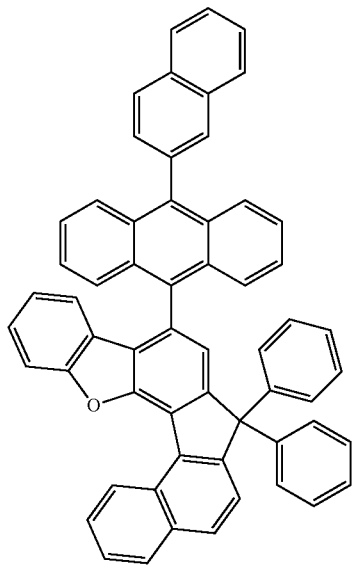
<Compound 227>
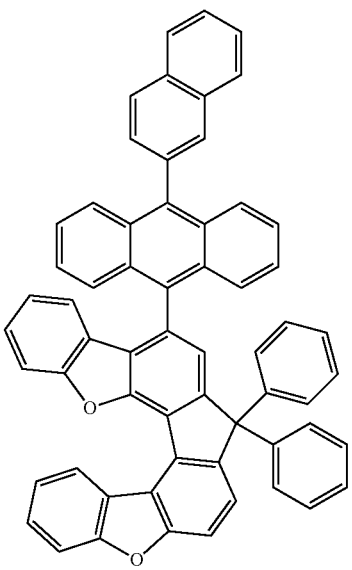
<Compound 228>
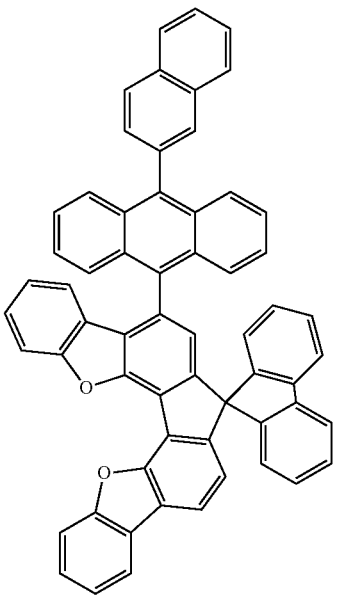

<Compound 229>
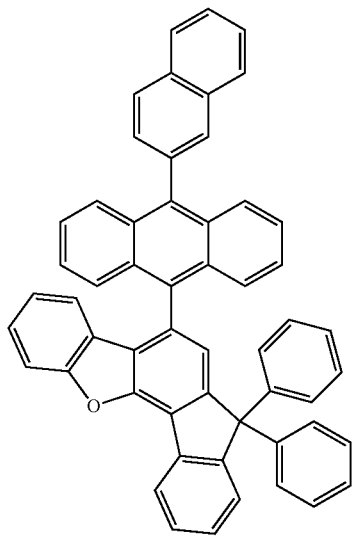
<Compound 230>
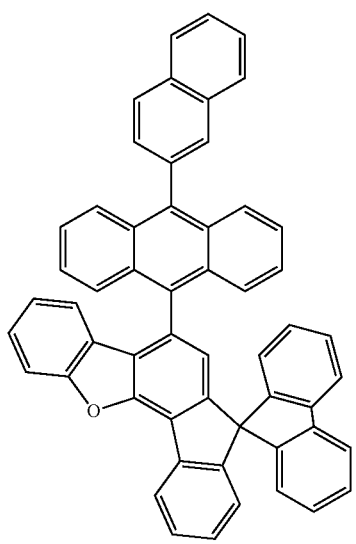
<Compound 231>
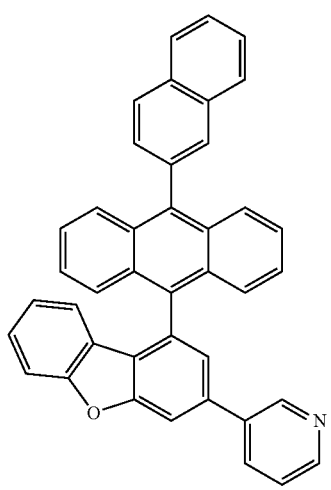
<Compound 232>
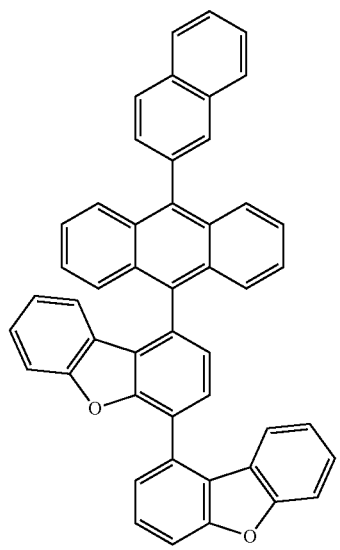
<Compound 233>
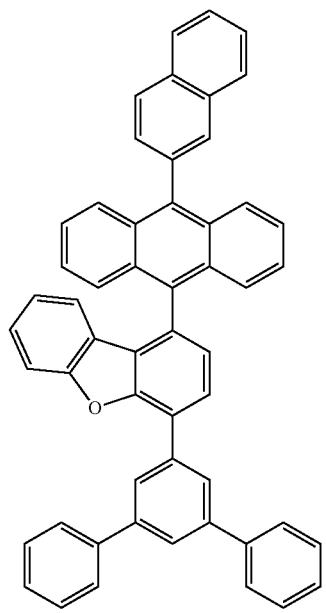

<Compound 234>
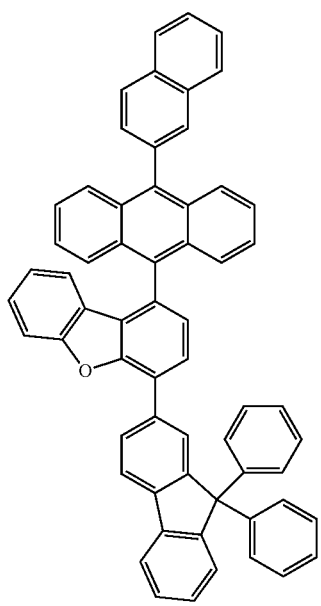
<Compound 235>
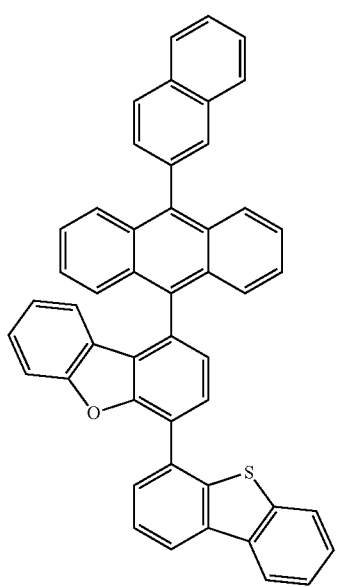
<Compound 236>
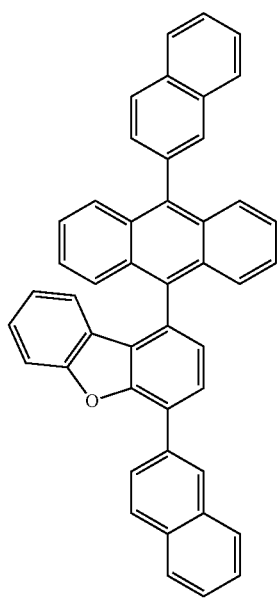
<Compound 237>
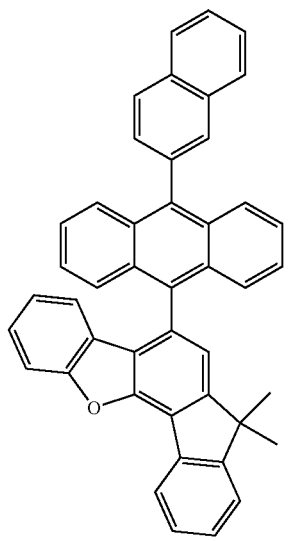

<Compound 238>
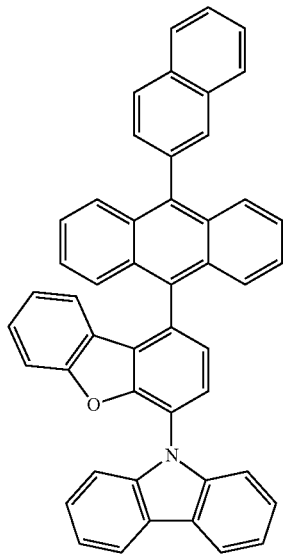
<Compound 238>
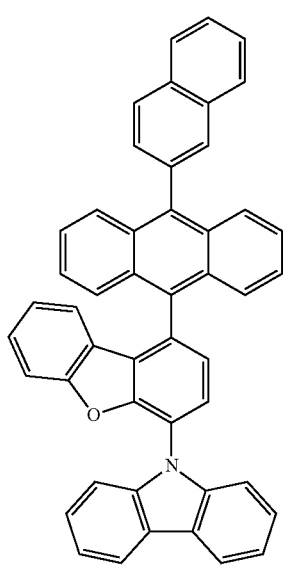
<Compound 239>
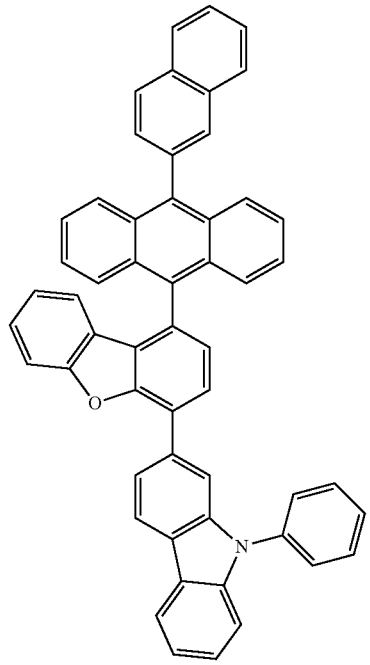
<Compound 240>
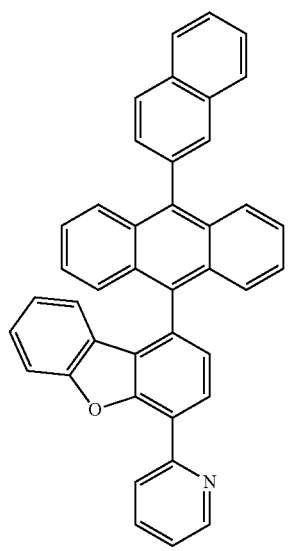
<Compound 241>
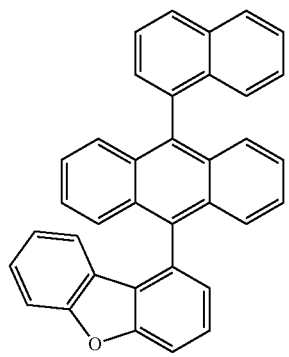

<Compound 242>
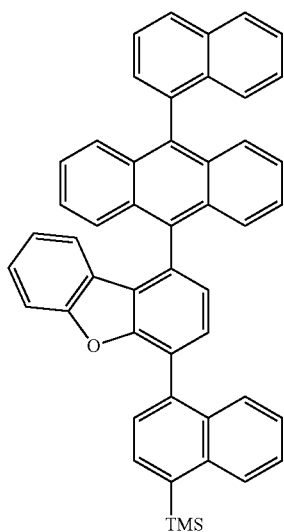
<Compound 243>
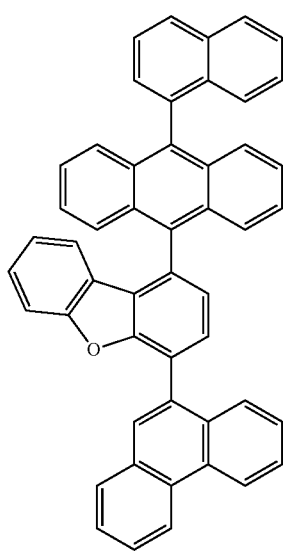
<Compound 244>
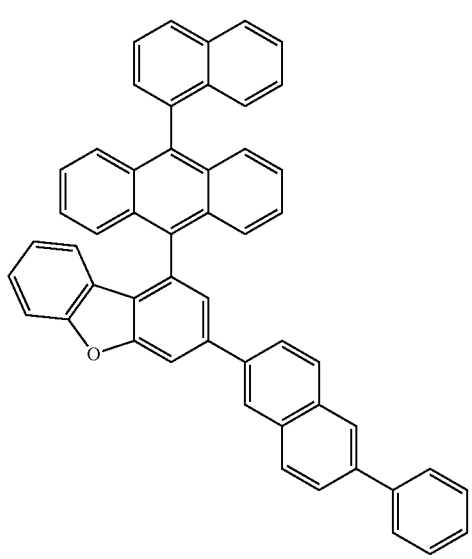
<Compound 245>
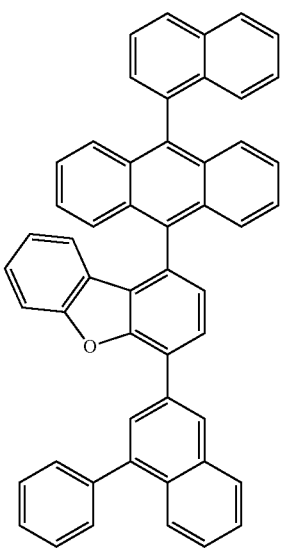
<Compound 246>
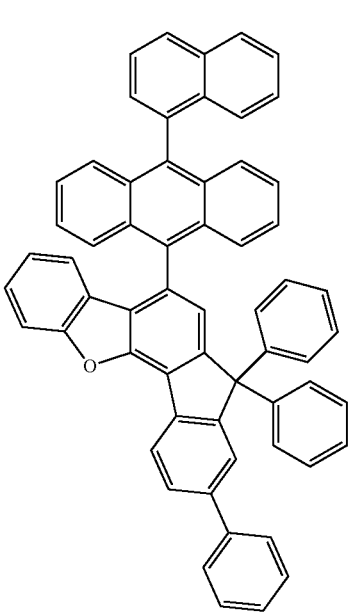
<Compound 247>
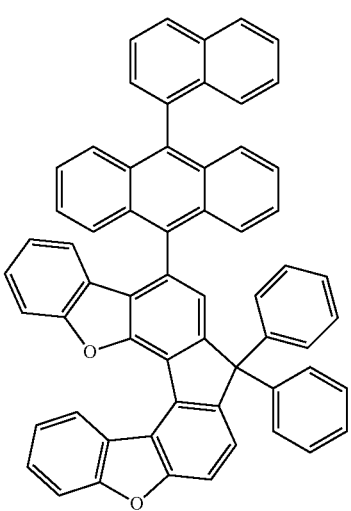

<Compound 248>
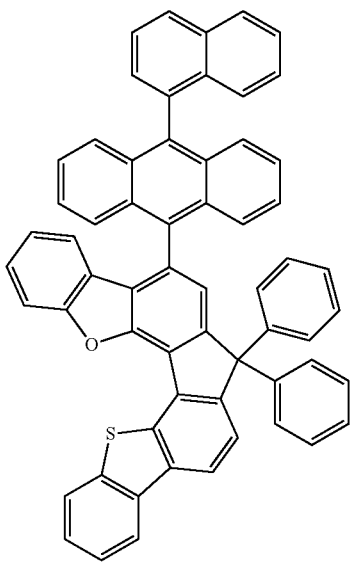
<Compound 249>
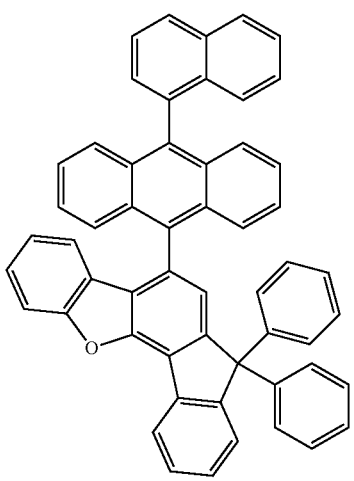
<Compound 250>
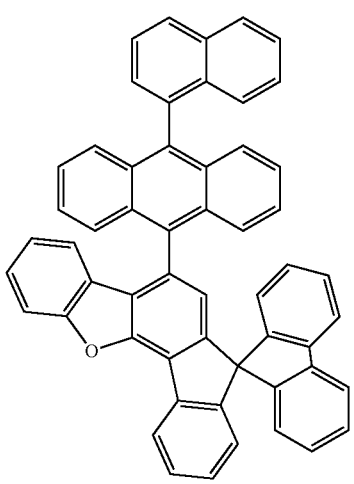
<Compound 251>
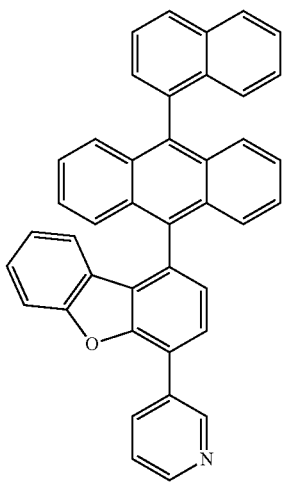
<Compound 252>
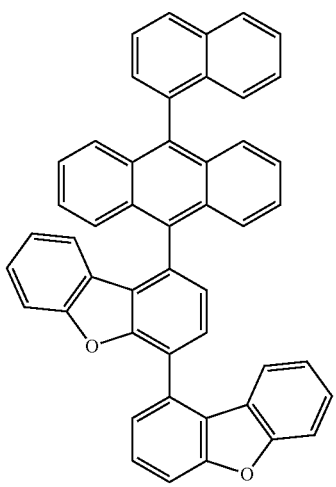
<Compound 253>
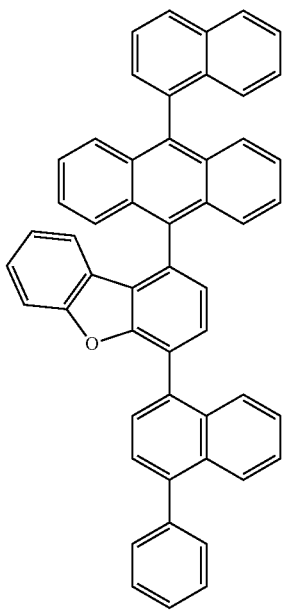

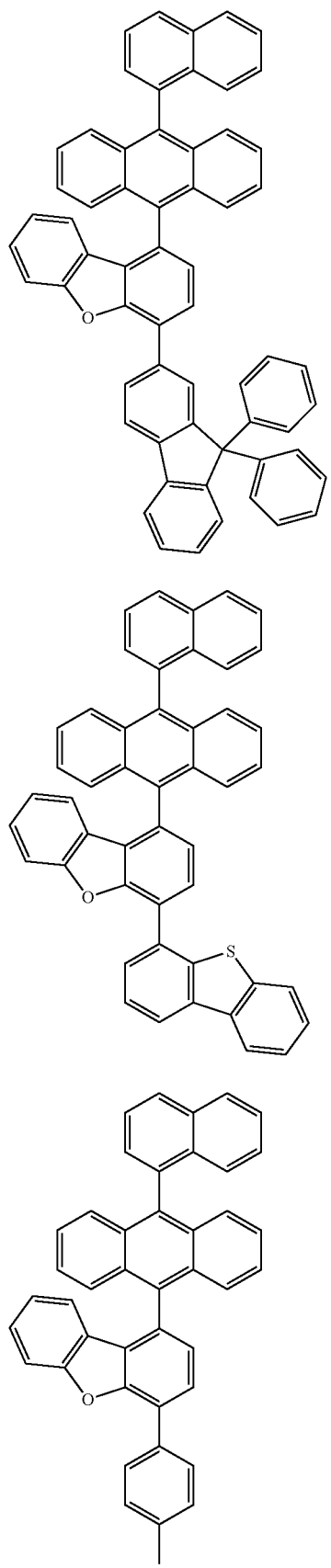
<Compound 254>
<Compound 255>
<Compound 256>
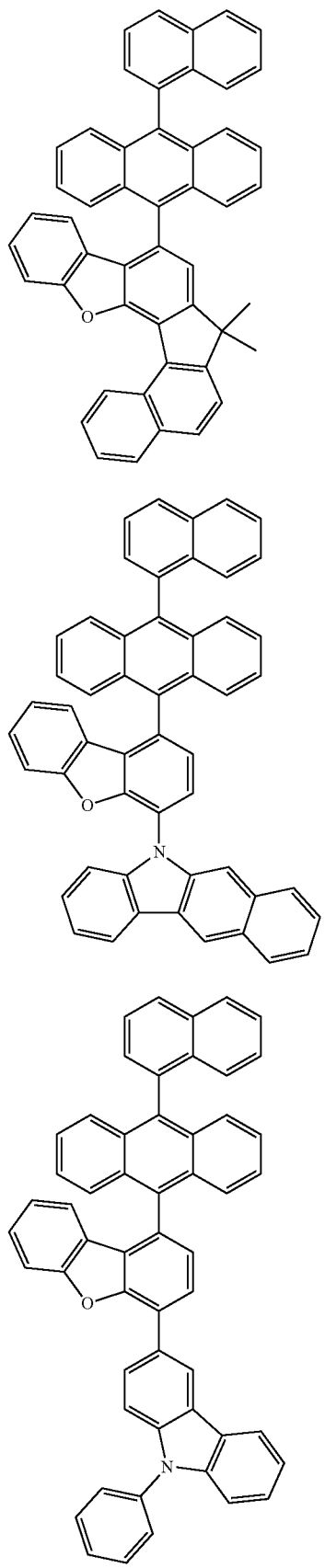
<Compound 257>
<Compound 258>
<Compound 259>

<Compound 260>
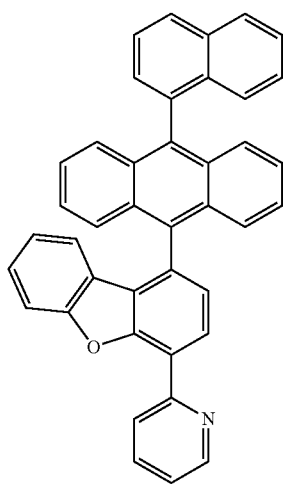
<Compound 261>
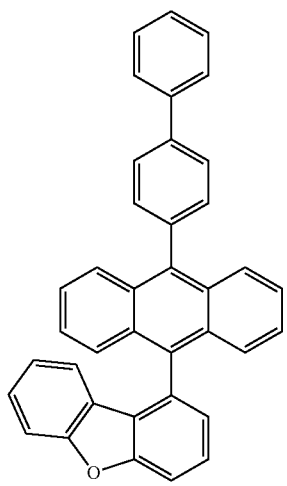
<Compound 262>
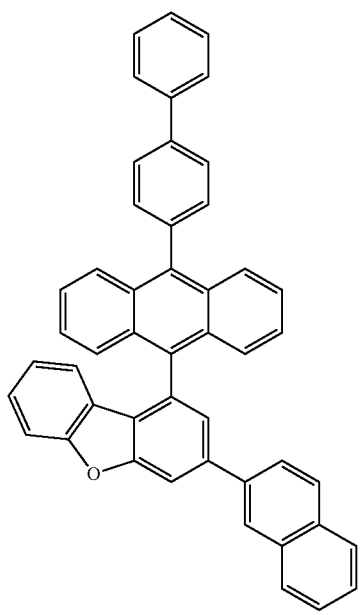
<Compound 263>
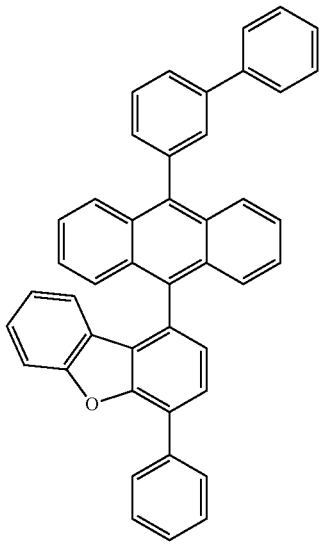
<Compound 264>
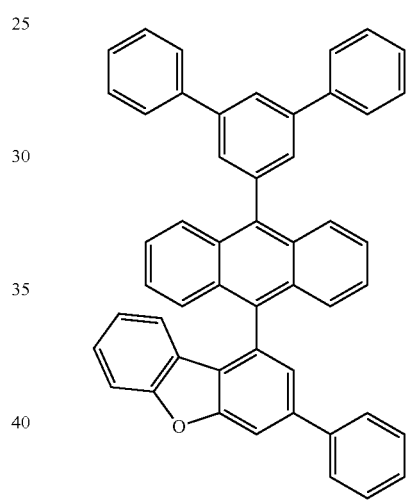
<Compound 265>
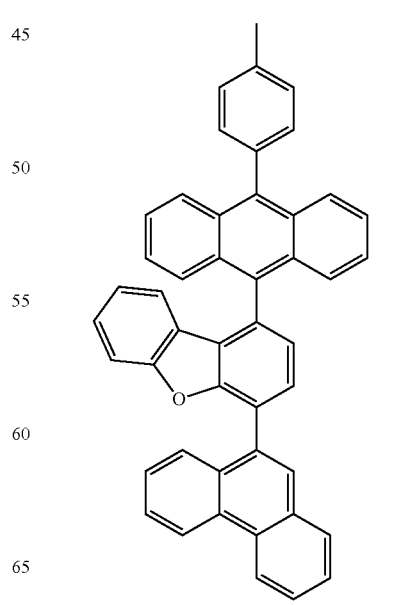

<Compound 266>
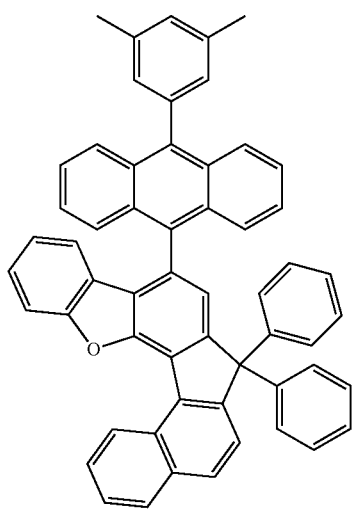
<Compound 267>
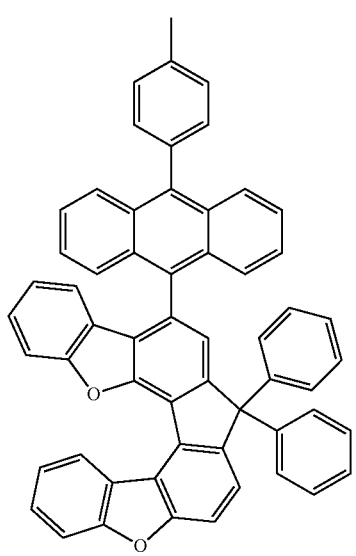
<Compound 268>
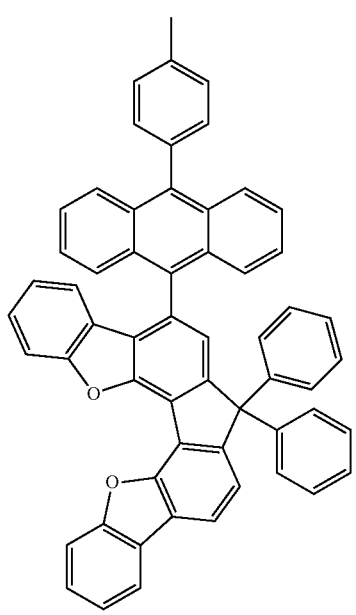
<Compound 269>
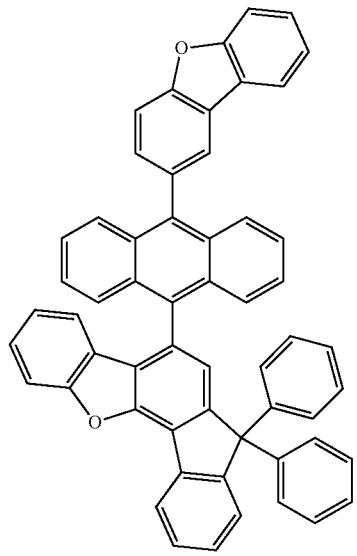
<Compound 270>
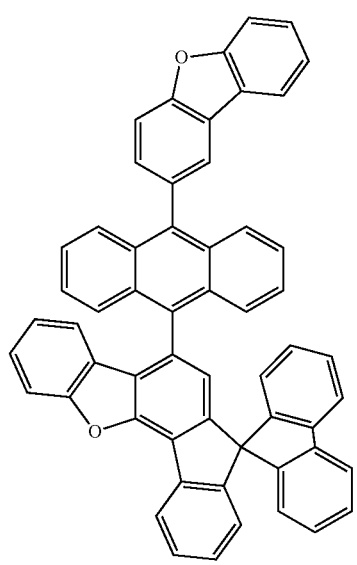
<Compound 271>
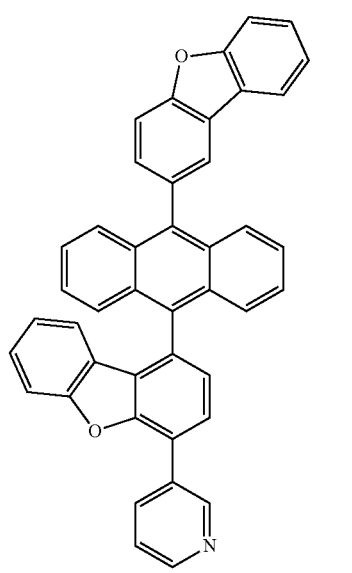

<Compound 272>
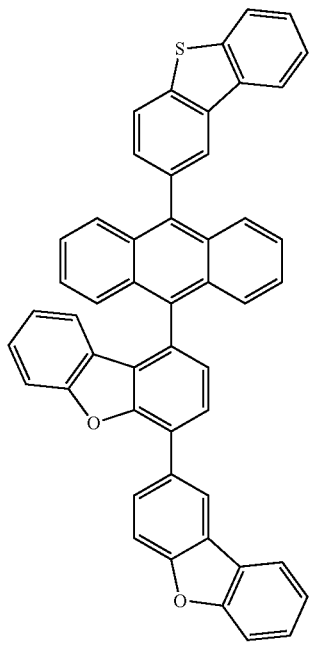
<Compound 273>
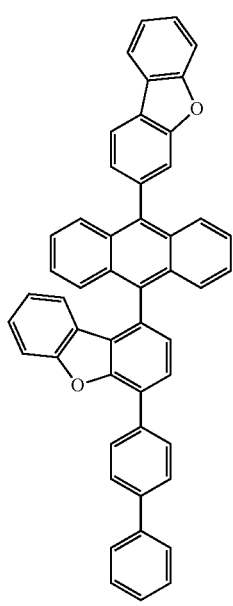
<Compound 274>
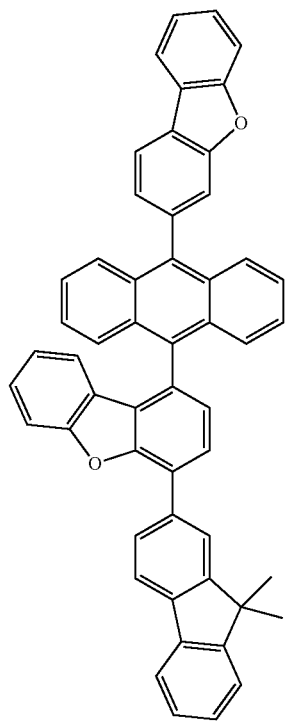
<Compound 275>
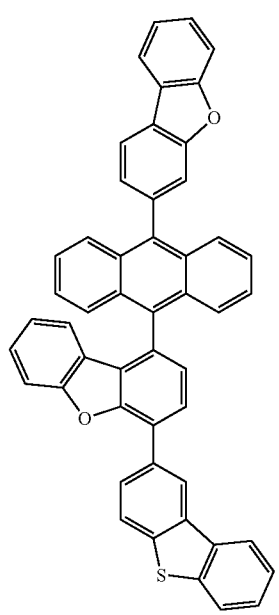

<Compound 276>
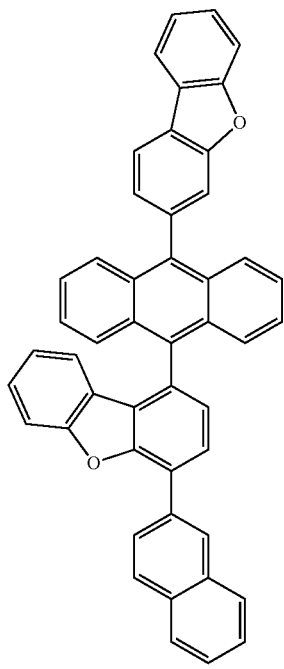
<Compound 277>
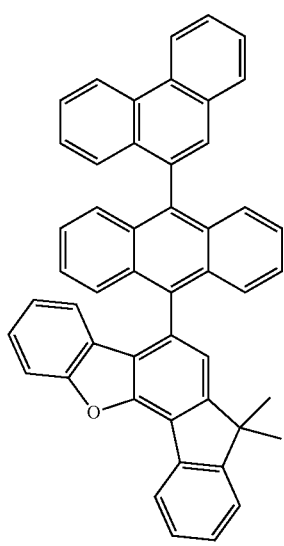
<Compound 278>
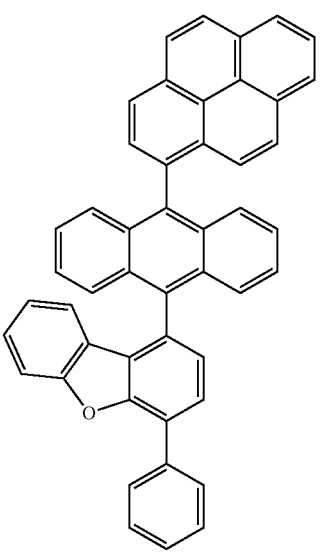
<Compound 279>
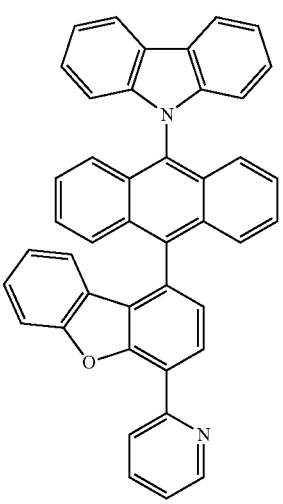
<Compound 280>

<Compound 281>
<Compound 282>
<Compound 283>
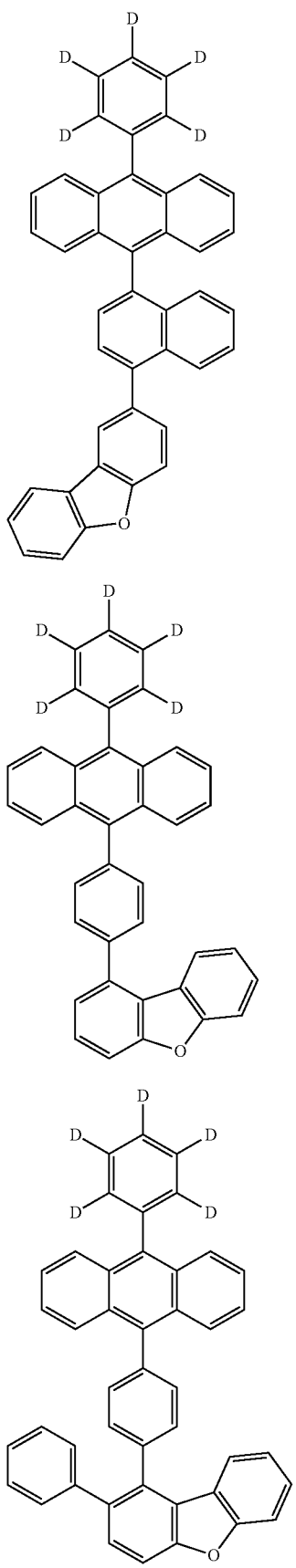
<Compound 284>
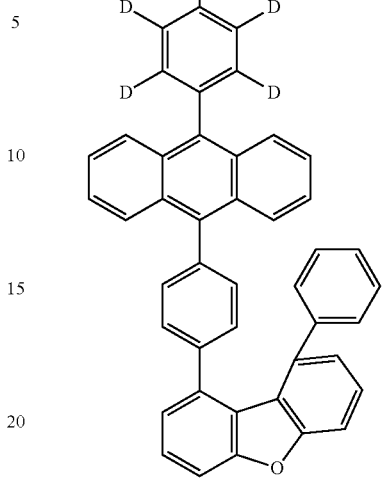
<Compound 285>
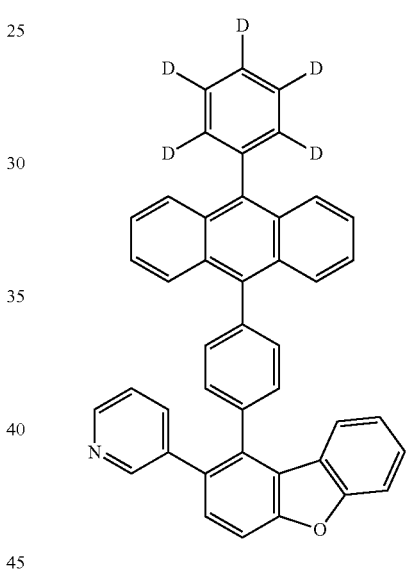
<Compound 286>
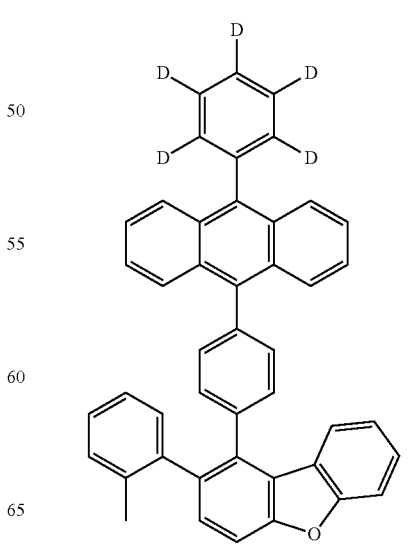

<Compound 287>
<Compound 290>
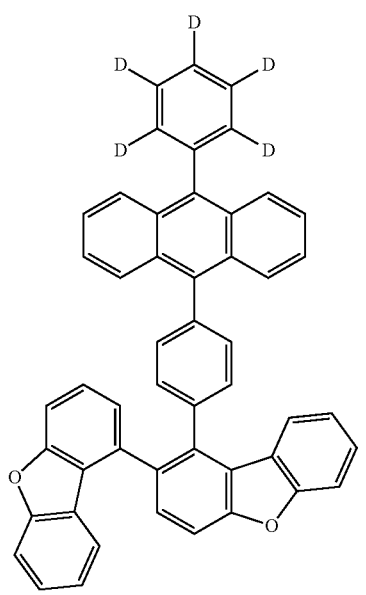
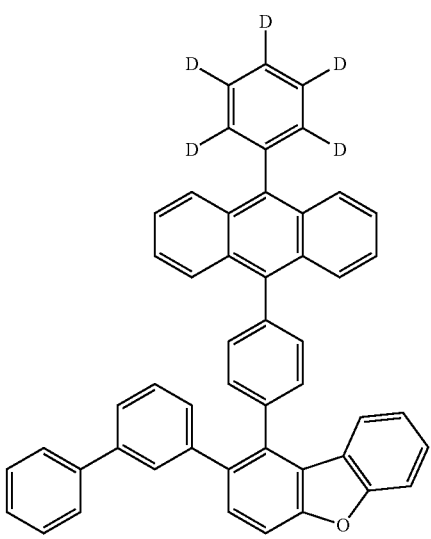
<Compound 288>
<Compound 291>
<Compound 289>
<Compound 292>
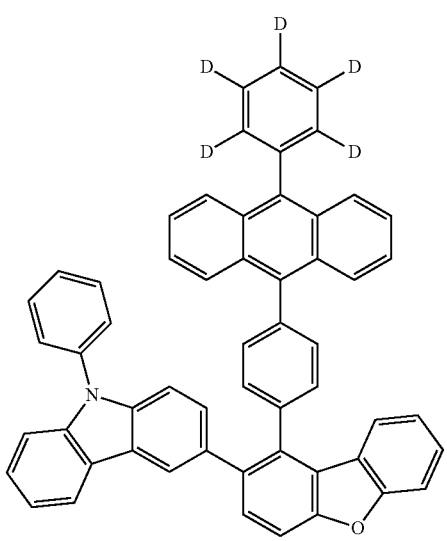
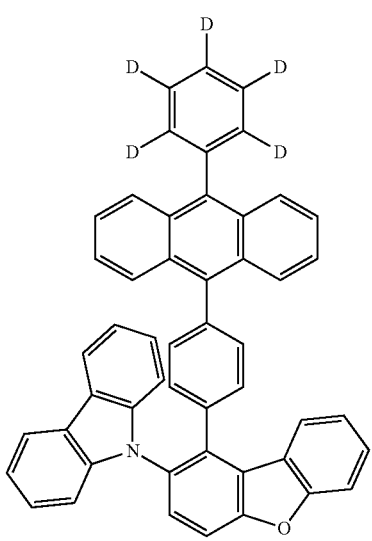

<Compound 293>
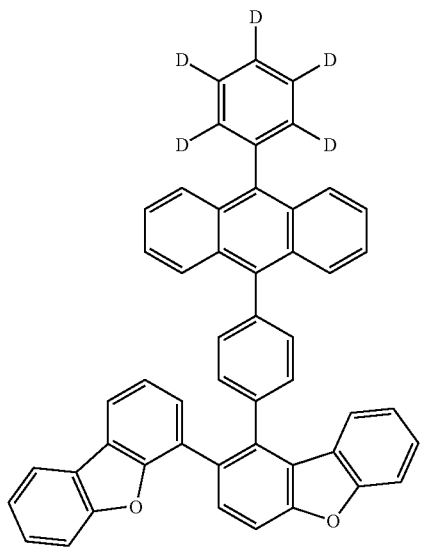
<Compound 295>
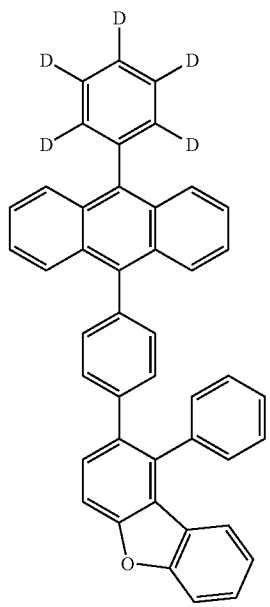
<Compound 294>
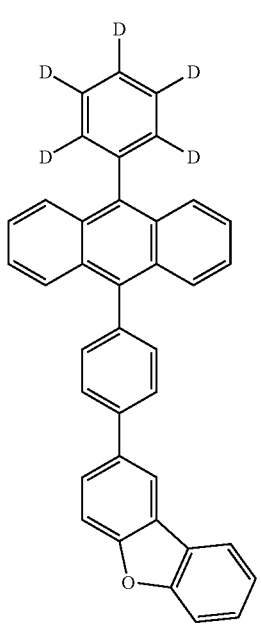
<Compound 296>
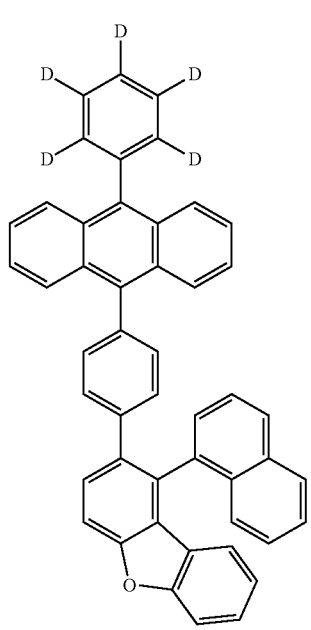

<Compound 297>
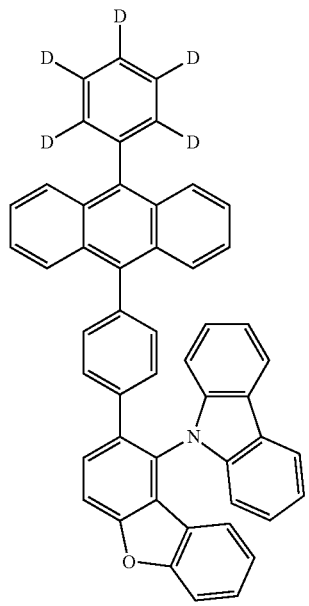
<Compound 299>
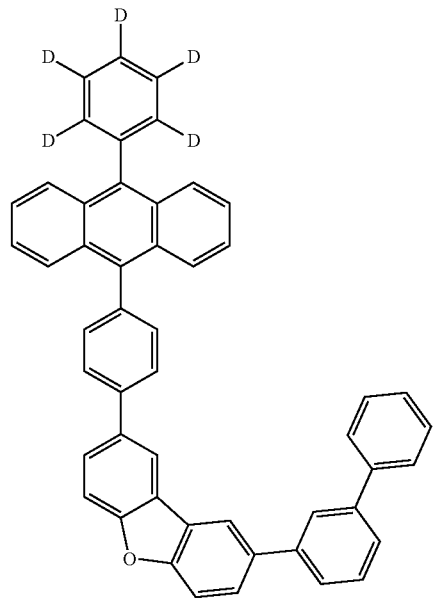
<Compound 298>
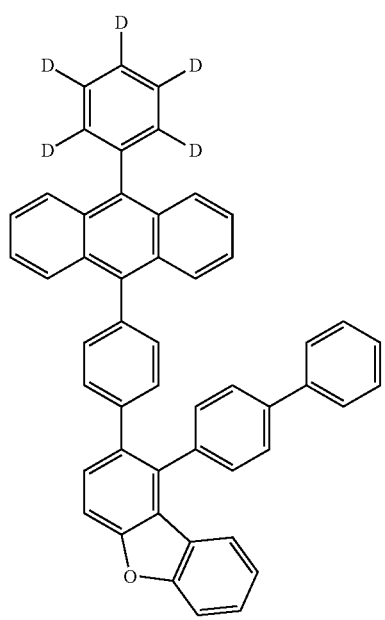
<Compound 300>
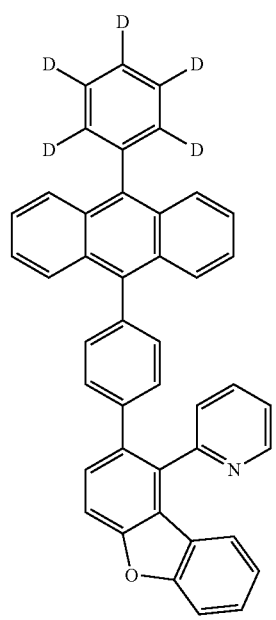

<Compound 301>
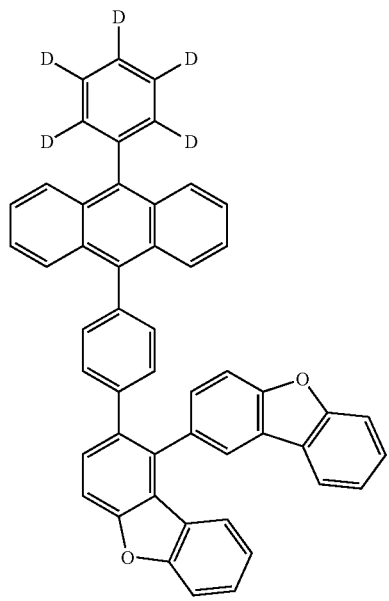
<Compound 302>
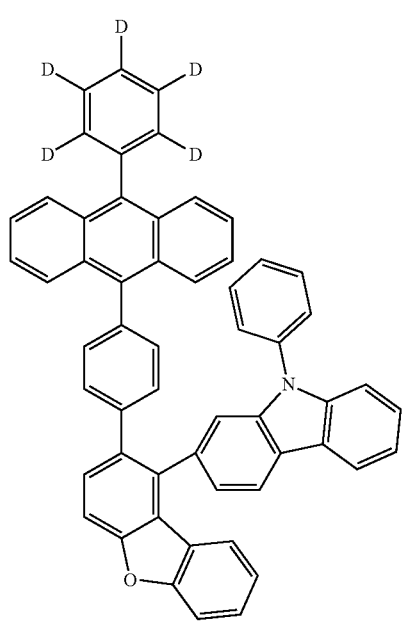
<Compound 303>
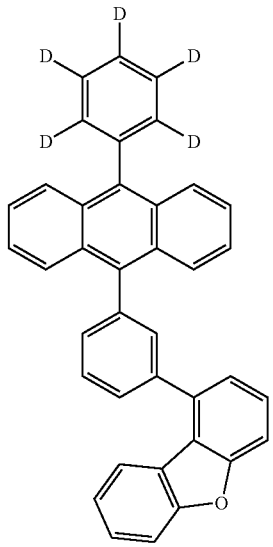
<Compound 304>
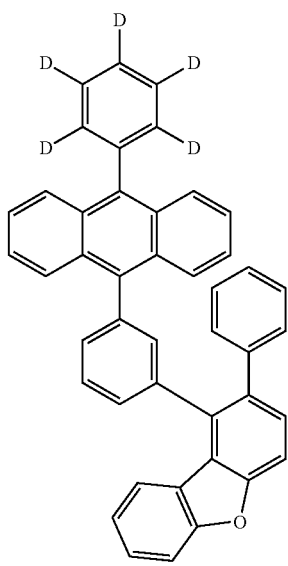

<Compound 305>
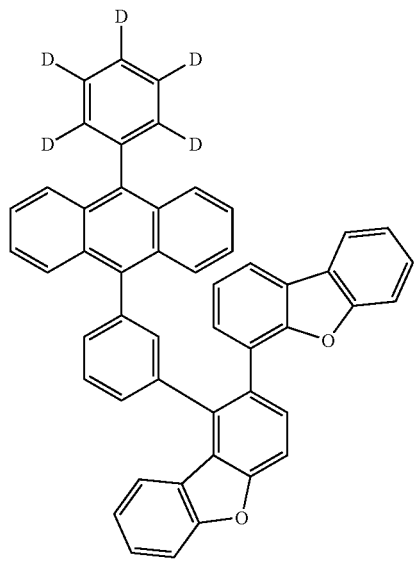
<Compound 306>
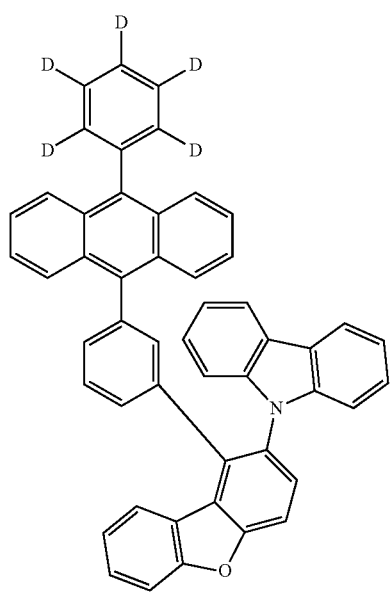
<Compound 307>
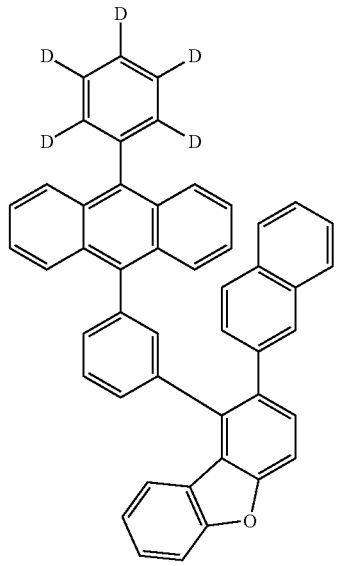
<Compound 308>
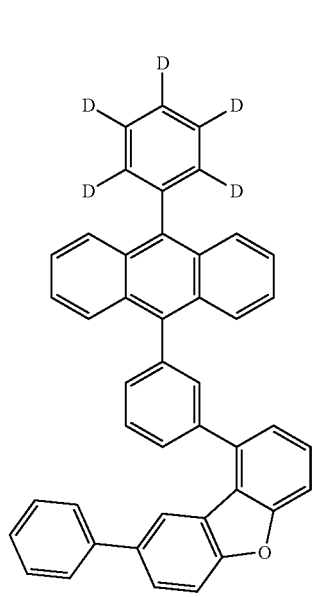

<Compound 309>
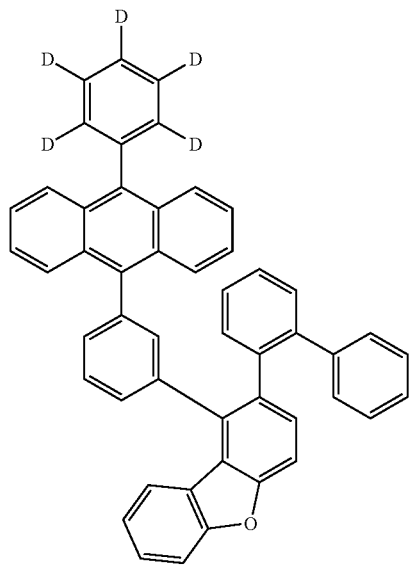
<Compound 310>
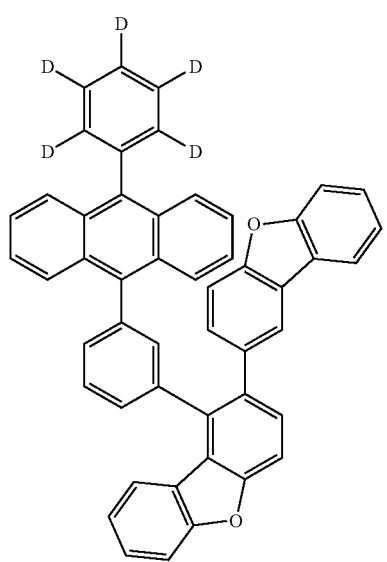
<Compound 311>
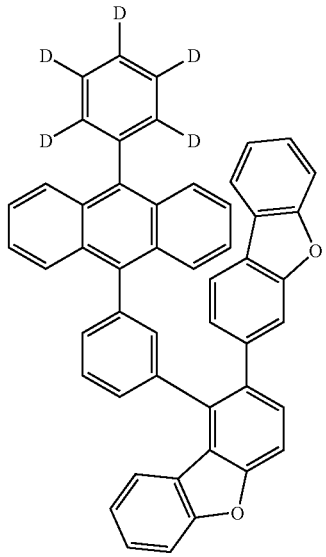
<Compound 312>
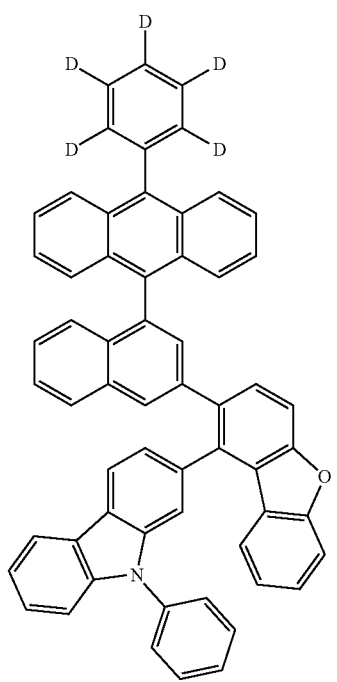

<Compound 313>
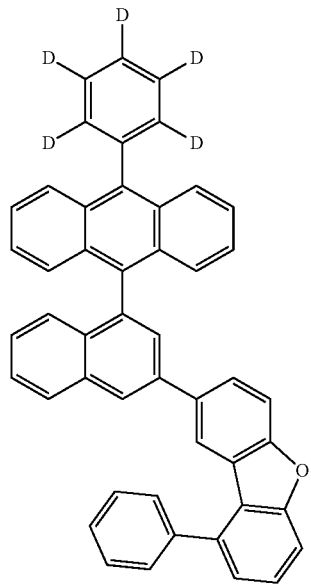
<Compound 314>
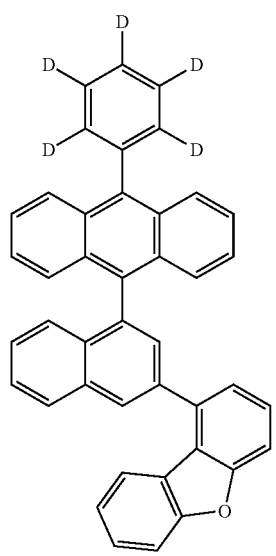
<Compound 315>
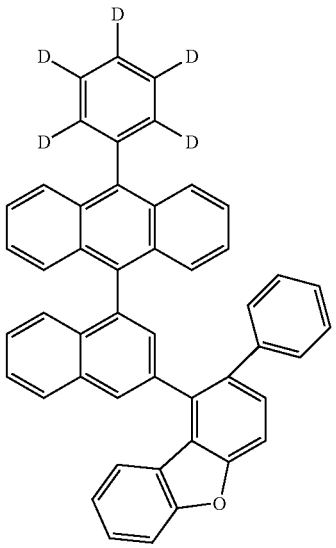
<Compound 316>
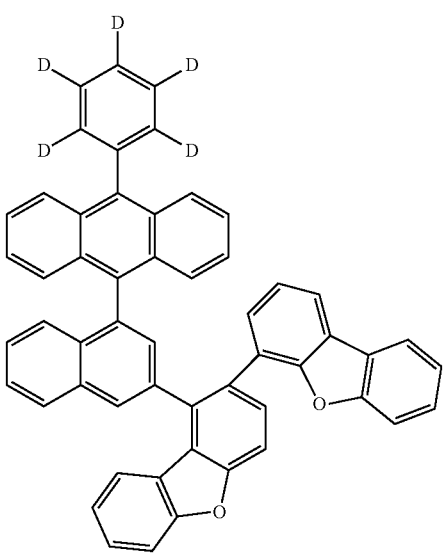

<Compound 317>
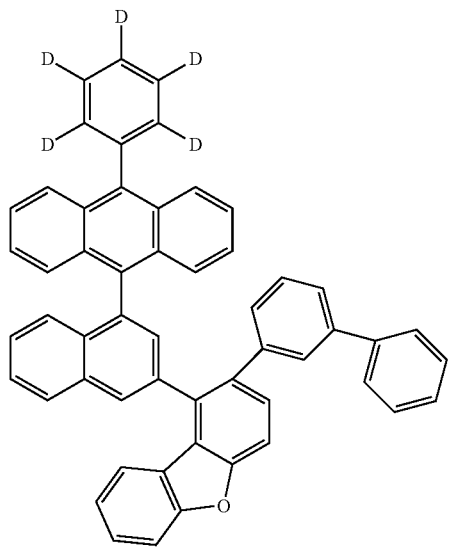
<Compound 318>
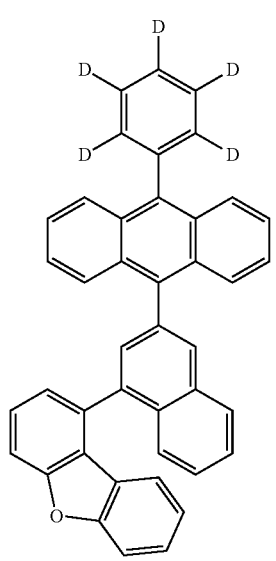
<Compound 319>
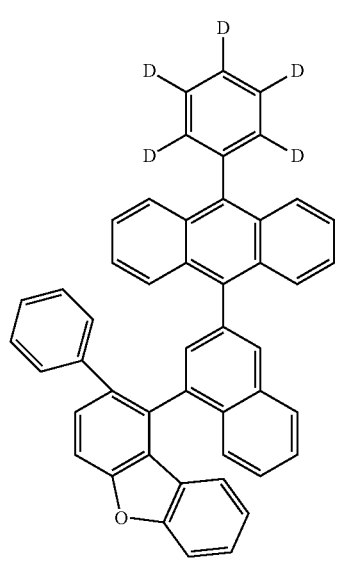
<Compound 320>
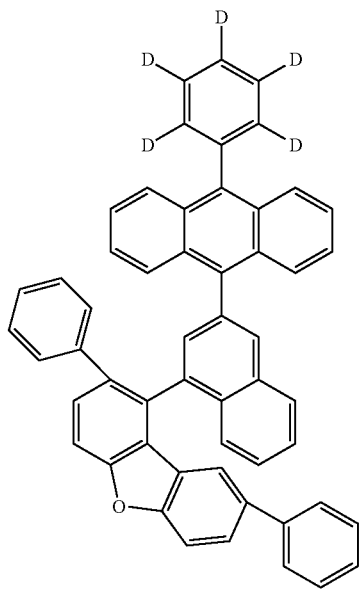
<Compound 321>
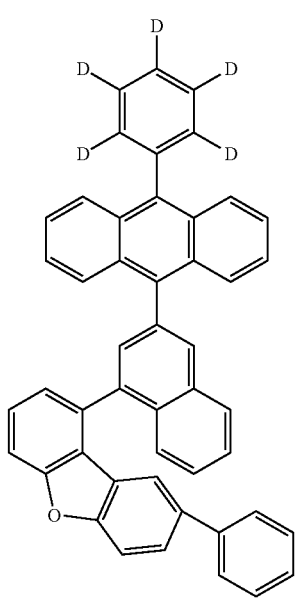

<Compound 322>
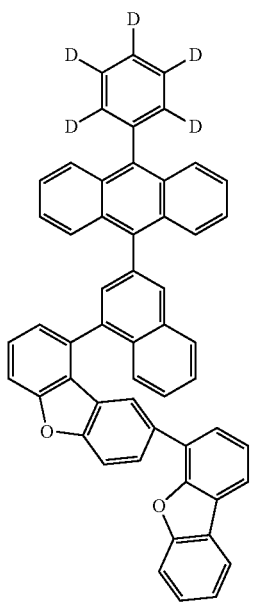
<Compound 323>
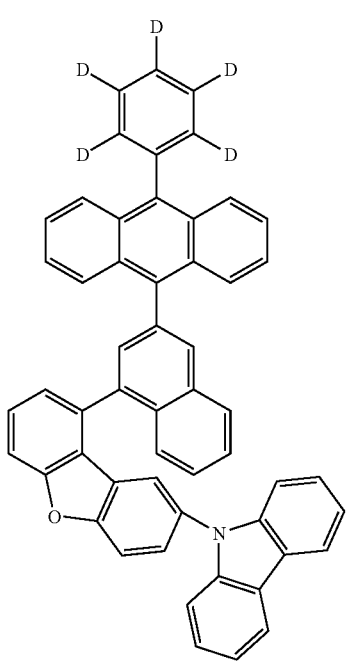
<Compound 324>
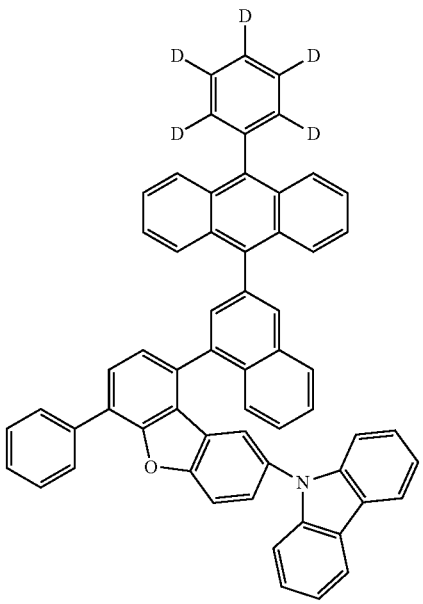
<Compound 325>
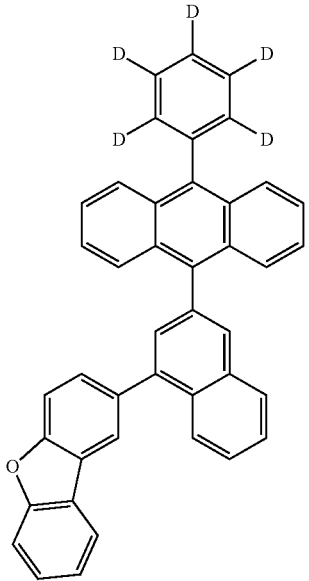

<Compound 326>
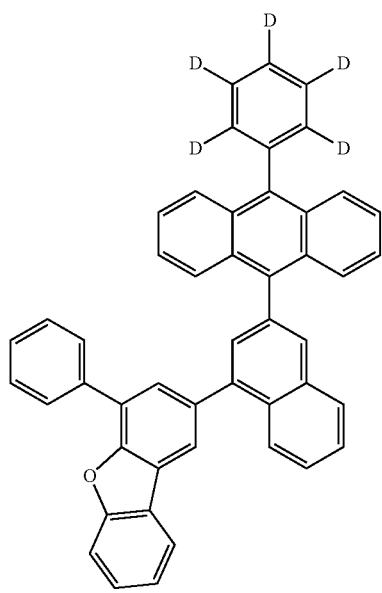
<Compound 328>
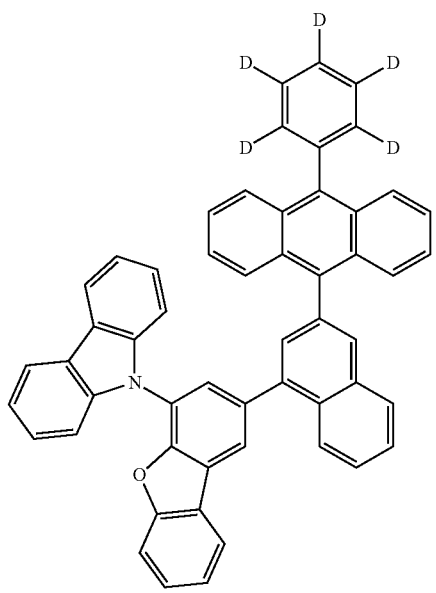
<Compound 327>
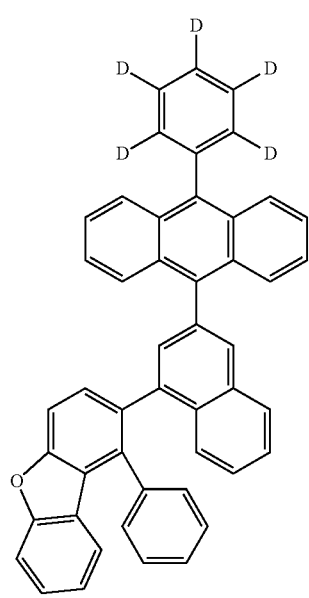
<Compound 329>
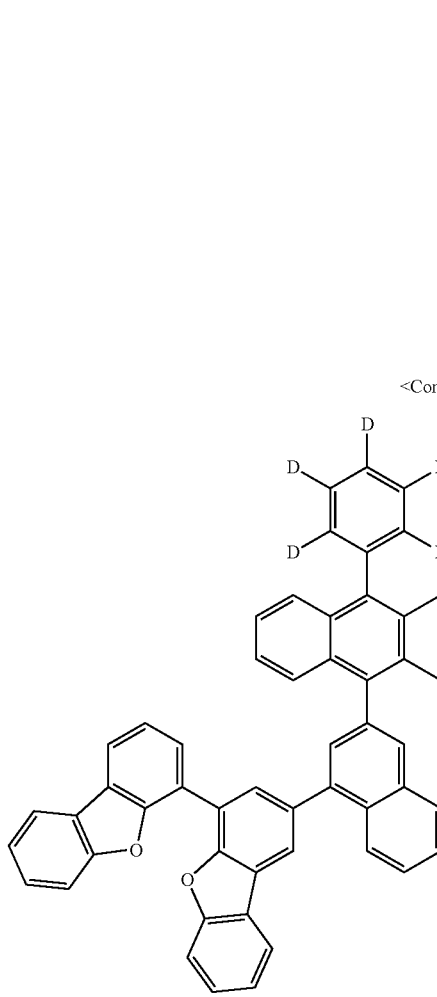

<Compound 330>
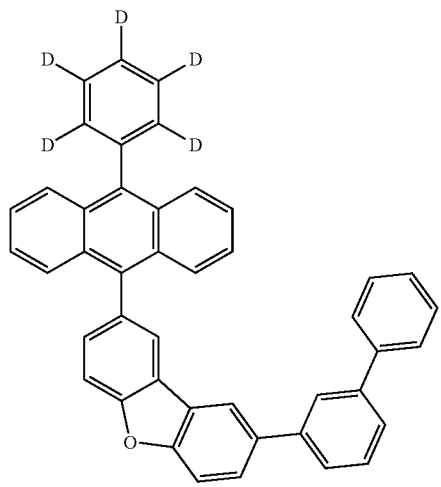
<Compound 333>
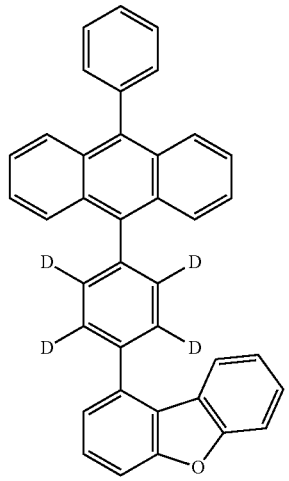
<Compound 331>
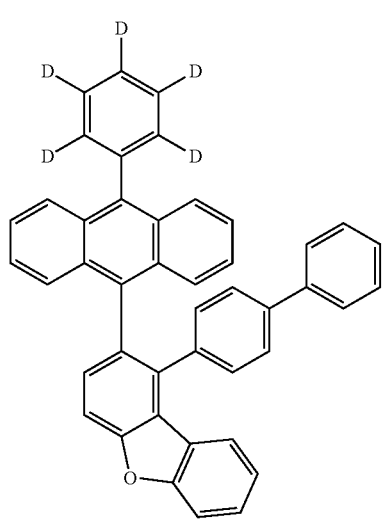
<Compound 332>
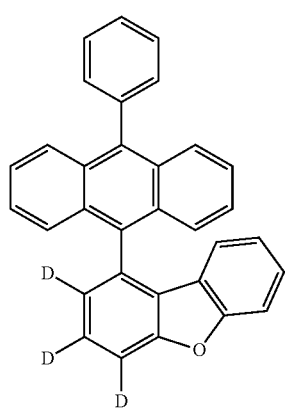
<Compound 334>
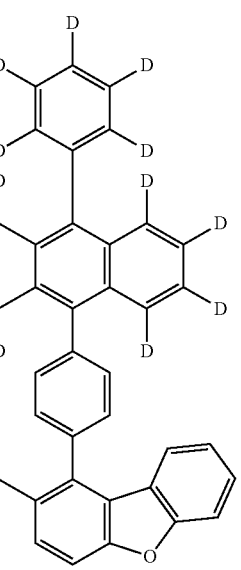

<Compound 335>
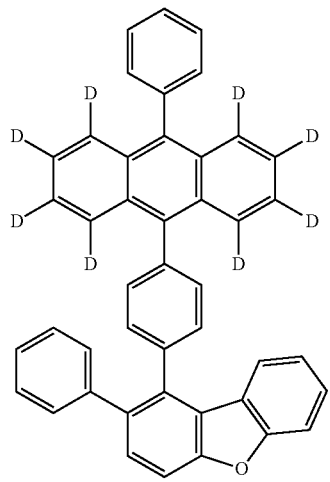
<Compound 336>
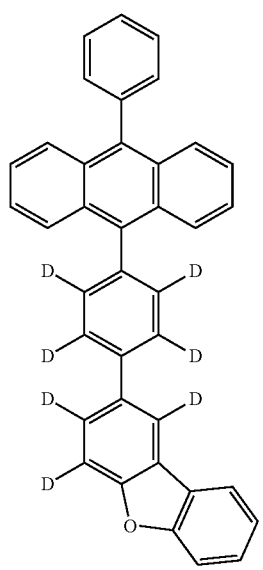
<Compound 337>
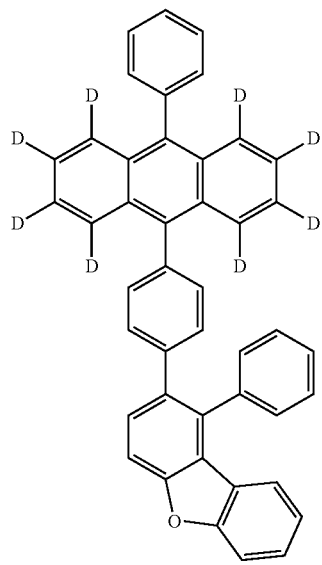
<Compound 338>
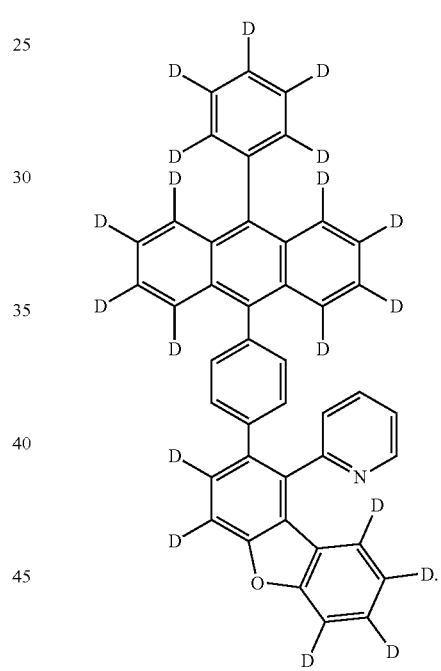
12. The organic light-emitting diode of claim 1, wherein the organic light-emitting diode is used for a device selected from among a flat display device; a flexible display device; a monochrome or white flat illumination device; and a monochrome or white flexible illumination device.
* * * * *